US009903557B2

(12) United States Patent
Matsuno

(10) Patent No.: US 9,903,557 B2
(45) Date of Patent: *Feb. 27, 2018

(54) VEHICLE LIGHTING FIXTURE

(71) Applicant: Stanley Electric Co., Ltd., Tokyo (JP)

(72) Inventor: Kiichi Matsuno, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 3 days.

This patent is subject to a terminal disclaimer.

(21) Appl. No.: 15/003,212

(22) Filed: Jan. 21, 2016

(65) Prior Publication Data

US 2016/0215947 A1 Jul. 28, 2016

(30) Foreign Application Priority Data

Jan. 22, 2015 (JP) ................. 2015-010141

(51) Int. Cl.
*F21V 11/00* (2015.01)
*F21S 8/10* (2006.01)
(Continued)

(52) U.S. Cl.
CPC ....... *F21S 48/1757* (2013.01); *F21S 48/1145* (2013.01); *F21S 48/125* (2013.01);
(Continued)

(58) Field of Classification Search
CPC . F21S 48/1145; F21S 48/1241; F21S 48/1186
(Continued)

(56) References Cited

U.S. PATENT DOCUMENTS

2011/0249460 A1 10/2011 Kushimoto
2012/0013852 A1 1/2012 Champion et al.
(Continued)

FOREIGN PATENT DOCUMENTS

DE         103 44 173 A1    4/2005
DE    10 2004 032 095 A1    2/2006
(Continued)

OTHER PUBLICATIONS

The extended European search report for the related European Patent Application No. 16152261.0 dated Jun. 20, 2016.

*Primary Examiner* — Ahshik Kim
(74) *Attorney, Agent, or Firm* — Kenealy Vaidya LLP

(57) ABSTRACT

A vehicle lighting fixture can form a predetermined light distribution pattern at a position horizontally or vertically shifted with respect to a reference position. The vehicle lighting fixture include: a light source; an optical deflector configured to include a mirror part; a rotary reflecting member configured to reflect light having been reflected by the mirror part of the optical deflector; a screen member configured to form a luminance distribution by the light reflected by the rotary reflecting member; an optical system configured to project the luminance distribution formed in the screen member to form the predetermined light distribution pattern; and a rotary control unit configured to control the rotary reflecting member to form the luminance distribution at a reference position or a position shifted with respect to the reference position. The rotary control unit can control any of the rotational direction and the rotational amount of the rotary reflecting member.

46 Claims, 63 Drawing Sheets

(51) Int. Cl.
   *F21V 13/06*   (2006.01)
   *F21V 13/14*   (2006.01)
(52) U.S. Cl.
   CPC ....... *F21S 48/1241* (2013.01); *F21S 48/1275* (2013.01); *F21S 48/1388* (2013.01); *F21S 48/1747* (2013.01); *F21V 13/06* (2013.01); *F21V 13/14* (2013.01)
(58) Field of Classification Search
   USPC ........................................................ 362/510
   See application file for complete search history.

(56)         References Cited

U.S. PATENT DOCUMENTS

2013/0258689 A1   10/2013   Takahira et al.
2014/0168940 A1   6/2014    Shiomi et al.
2015/0124468 A1   5/2015    Reiners
2015/0175054 A1   6/2015    Yatsuda et al.
2016/0109074 A1*  4/2016    Hirasawa ................ F21K 9/64
                                                     362/511
2016/0238209 A1*  8/2016    Kimura ................ F21S 48/1145

FOREIGN PATENT DOCUMENTS

DE     10 2010 046 021 A1    3/2012
DE     10 2011 087 306 A1    5/2013
DE     10 2012 100 141 A1    7/2013
FR         3 010 486 A1      3/2015
JP          2008-40240 A     2/2008
JP          2013-16277 A     1/2013
JP         2013-526759 A     6/2013
JP         2013-182837 A     9/2013
JP          2015-43346 A     3/2015
WO         2011/141377 A1   11/2011
WO         2016/061599 A1    4/2016

* cited by examiner

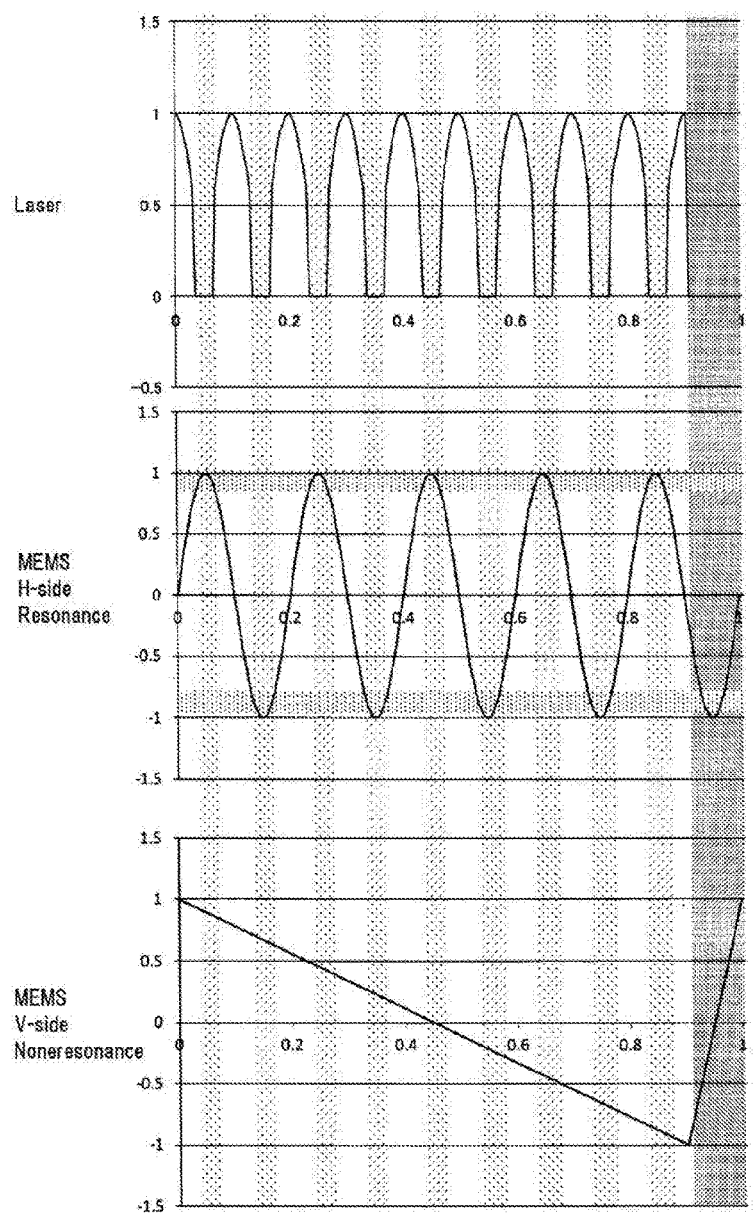

FIG. 14A (Resonance Axis) Horizontal Direction Bidiractional Lighting
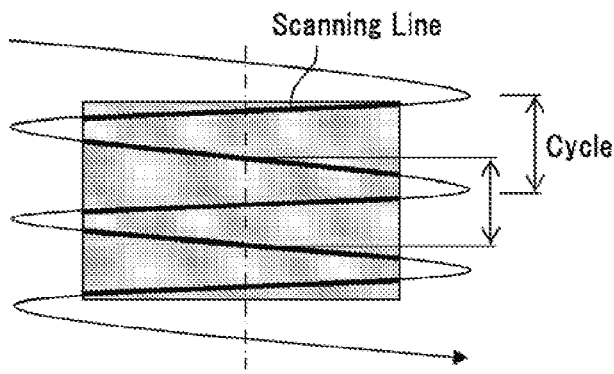
FIG. 14B (Resonance Axis) Horizontal Direction One-Way Lighting
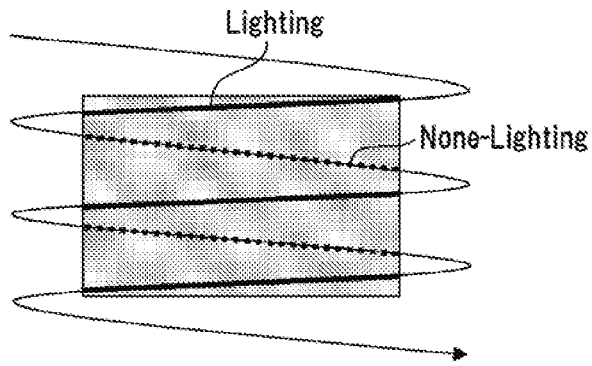
FIG. 14C (Resonance Axis) Horizontal Direction Interlace Lighting
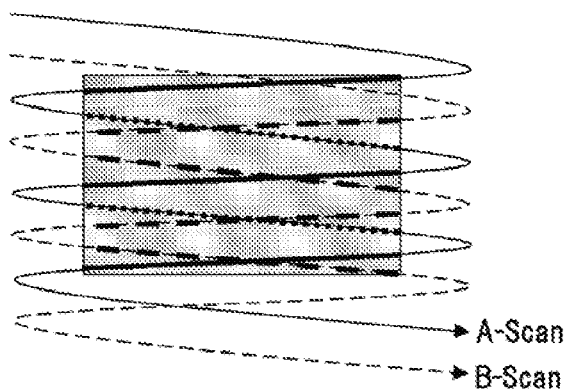

FIG. 26
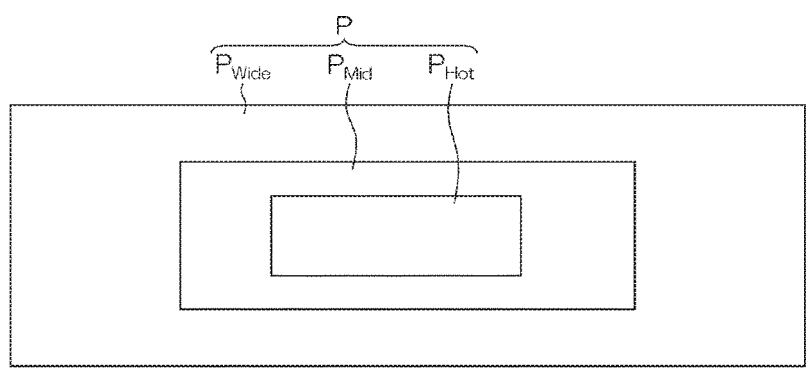
FIG. 27A
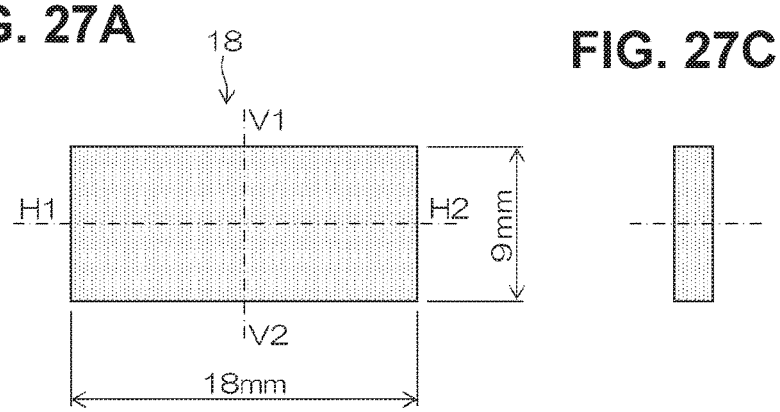
FIG. 27C
FIG. 27B
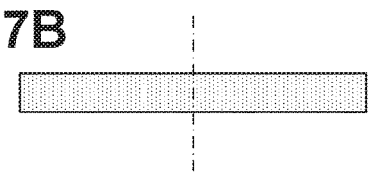

FIG. 29

| (a) | Projection Angle (αh) | Scanning Range on Wavelength Converting Member (L) | Deflection Angle of Mirror ($\beta$ h_max) | Mechanical Swing Half Angle of Mirror ($\gamma$ h_max) | Load Voltage |
|---|---|---|---|---|---|
| WIDE | ± 15 deg. | ± 8.57 mm | ± 19.7 deg. | ± 9.8 deg. | 5.41 Vpp |
| MID | ± 8.5 deg. | ± 4.78 mm | ± 11.3 deg. | ± 5.3 deg. | 2.31 Vpp |
| HOT | ± 3.5 deg. | ± 1.96 mm | ± 4.7 deg. | ± 2.3 deg. | 0.93 Vpp |

| (b) | Projection Angle (αv) | Scanning Range on Wavelength Converting Member (S) | Deflection Angle of Mirror ($\beta$ v_max) | Mechanical Swing Half Angle of Mirror ($\gamma$ v_max) | Control Voltage |
|---|---|---|---|---|---|
| WIDE | ± 6.5 deg. | ± 3.65 mm | ± 8.6 deg. | ± 4.3 deg. | 41.2 Vpp |
| MID | ± 3.5 deg. | ± 1.96 mm | ± 4.7 deg. | ± 2.3 deg. | 24.4 Vpp |
| HOT | ± 1.5 deg. | ± 0.84 mm | ± 2.0 deg. | ± 1.0 deg. | 13.3 Vpp |

VEHICLE LIGHTING FIXTURE

This application claims the priority benefit under 35 U.S.C. § 119 of Japanese Patent Application No. 2015-010141 filed on Jan. 22, 2015, which is hereby incorporated in its entirety by reference.

TECHNICAL FIELD

The presently disclosed subject matter relates to vehicle lighting fixtures, and in particular, to a vehicle lighting fixture utilizing an optical deflector.

BACKGROUND ART

FIG. 1 is a schematic view of a conventional vehicle lighting fixture.

As illustrated, the conventional vehicle lighting fixture can include: a plurality of optical deflectors 714a, 714b, and 714c; a plurality of screen members (fluorescent substance) 720a, 720b, and 720c that can be scanned with excitation light from the plurality of optical deflectors 714a, 714b, and 714c so that a light intensity distribution is formed thereon; and a plurality of projection lenses 724a, 724b, and 724c provided to correspond to the respective screen members 720a, 720b, and 720c. The projection lenses 724a, 724b, and 724c can project the respective light intensity distributions formed on the screen members 720a, 720b, and 720c forward to form a predetermined light distribution pattern 726. This type of vehicle lighting fixture can be illustrated in, for example, Japanese Translation of PCT Patent Application Publication No. 2013-526759 (or WO2011/141377A1 and US20150124468A1 corresponding thereto).

However, the vehicle lighting fixture with the above-described configuration can form the predetermined pattern 726 at a reference position (fixed position). Therefore, such a predetermined pattern 726 cannot be formed at a position shifted with respect to the reference position, for example, a horizontally or vertically shifted position.

SUMMARY

The presently disclosed subject matter was devised in view of these and other problems and features and in association with the conventional art. According to an aspect of the presently disclosed subject matter, a vehicle lighting fixture can form a predetermined light distribution pattern at a position shifted from a reference position, for example, a position horizontally or vertically shifted with respect to the reference position.

According to another aspect of the presently disclosed subject matter, the vehicle lighting fixture can be configured to form a predetermined light distribution pattern, and can include: a light source; an optical deflector configured to include a mirror part that can scan with light from the light source; a rotary reflecting member configured to reflect light having been reflected by the mirror part of the optical deflector; a screen member configured to form a luminance distribution by the light reflected by the rotary reflecting member; an optical system configured to project the luminance distribution formed in the screen member to form the predetermined light distribution pattern; and a rotary control unit configured to control the rotary reflecting member to form the luminance distribution at a reference position or a position shifted with respect to the reference position. The rotary control unit can control any of the rotational direction and the rotational amount of the rotary reflecting member.

According to the above aspect of the presently disclosed subject matter, the vehicle lighting fixture utilizing the optical deflector can form a predetermined light distribution pattern at a position shifted from a reference position, for example, a position horizontally or vertically shifted with respect to the reference position.

This configuration can be achieved by controlling the rotational direction and rotational amount of the rotary reflecting member so as to form a luminance distribution at the reference position or a position shifted with respect to the reference position, and further by causing the optical system to project the luminance distribution thus formed on the screen member (luminance distribution formed at the reference position or the position shifted with respect to the reference position). Thus, the predetermined light distribution pattern can be formed at the desired position.

According to another aspect of the presently disclosed subject matter, the vehicle lighting fixture according to the previous aspect can be configured to include a plurality of the light sources; a plurality of the optical deflectors provided to correspond to the respective light sources, each of the optical deflectors including a mirror part that can scan with light from a corresponding one of the light sources; and a plurality of the rotary reflecting members provided to correspond the respective optical deflectors, each of the rotary reflecting members configured to reflect light reflected from the mirror part of a corresponding one of the optical deflectors.

According to the above aspect of the presently disclosed subject matter, the vehicle lighting fixture utilizing the plurality of optical deflectors can be miniaturized, and the parts number, which may become a cause for cost increase, can be decreased. The use of the single screen member with respect to the plurality of optical deflectors can contribute to obtain the advantageous effects.

According to another aspect of the presently disclosed subject matter, the vehicle lighting fixture according to the previous aspect can be configured such that the vehicle lighting unit can have a reference axis so that the optical system, the screen member, the plurality of optical deflectors, the plurality of rotary reflecting members, and the plurality of light sources are disposed along the reference axis in this order. Furthermore, the plurality of light sources can be disposed to surround the reference axis with respective postures so that each of the light sources can emit light forward. The plurality of optical deflectors can be disposed to surround the reference axis and be inclined so that the light from the corresponding one of the light sources can be incident on the corresponding one of the mirror parts and be reflected by the mirror part to be directed rearward and closer to the reference axis. The plurality of rotary reflecting members can be disposed to be closer to the reference axis than the plurality of optical deflectors and surround the reference axis so that the light reflected from the corresponding one of the mirror parts of the optical deflectors can be incident thereon and be reflected by the one rotary reflecting member to be directed to the screen member. With this configuration, the same advantageous effects can be obtained.

According to another aspect of the presently disclosed subject matter, the vehicle lighting fixture according to any of the previous aspects can be configured such that the rotary control unit can separately control the rotational direction and the rotational amount of each of the plurality of rotary reflecting members.

The individual control of the rotational direction and the rotational amount of each of the plurality of rotary reflecting members can properly form the predetermined light distribution patterns at respective different positions.

According to another aspect of the presently disclosed subject matter, the vehicle lighting fixture according to the first aspect can be configured to include a plurality of the light sources; and a plurality of the optical deflectors provided to correspond to the respective light sources, each of the optical deflectors including a mirror part that can scan with light from a corresponding one of the light sources. The rotary reflecting member can be provided so as to be common to the plurality of optical deflectors, and can be configured to reflect light reflected from the mirror parts of the optical deflectors.

With this configuration, the luminance distributions formed on the screen member by the light from the respective light sources can be correctively disposed at a position shifted from the reference position.

According to still another aspect of the presently disclosed subject matter, the vehicle lighting fixture can be configured to form a predetermined light distribution pattern, and can include: a light source; an optical deflector configured to include a mirror part that can scan with light from the light source; a screen member configured to form a luminance distribution by the light reflected by the mirror part of the optical deflector; an optical system configured to project the luminance distribution formed in the screen member to form the predetermined light distribution pattern; and a rotary control unit configured to control the optical deflector to form the luminance distribution at a reference position or a position shifted with respect to the reference position. The rotary control unit can control any of the rotational direction and the rotational amount of the optical deflector.

According to the above aspect of the presently disclosed subject matter, the vehicle lighting fixture utilizing the optical deflector can form a predetermined light distribution pattern at a position shifted from a reference position, for example, a position horizontally or vertically shifted with respect to the reference position.

This configuration can be achieved by controlling the rotational direction and rotational amount of the optical deflector so as to form a luminance distribution at the reference position or a position shifted with respect to the reference position, and further by causing the optical system to project the luminance distribution thus formed on the screen member (formed at the reference position or the position shifted with respect to the reference position). Thus, the predetermined light distribution pattern can be formed at the desired position.

According to another aspect of the presently disclosed subject matter, the vehicle lighting fixture according to the previous aspect can be configured to include a plurality of the light sources; and a plurality of the optical deflectors provided to correspond to the respective light sources, each of the optical deflectors including a mirror part that can scan with light from a corresponding one of the light sources. Here, the rotary control unit can separately control the rotational direction and the rotational amount of each of the plurality of optical deflectors.

According to the above aspect of the presently disclosed subject matter, the vehicle lighting fixture utilizing the plurality of optical deflectors can be miniaturized, and the parts number, which may become a cause for cost increase, can be decreased. The use of the single screen member with respect to the plurality of optical deflectors can contribute to obtain the advantageous effects.

According to still another aspect of the presently disclosed subject matter, the vehicle lighting fixture can be configured to form a predetermined light distribution pattern, and can include an optical unit and a rotary control unit. The optical unit can include: a light source; an optical deflector configured to include a mirror part that can scan with light from the light source; a screen member configured to form a luminance distribution by the light reflected by the mirror part of the optical deflector; and an optical system configured to project the luminance distribution formed in the screen member to form the predetermined light distribution pattern. The rotary control unit can be configured to control the optical unit to form the predetermined light distribution pattern at a reference position or a position shifted with respect to the reference position. The rotary control unit can control any of the rotational direction and the rotational amount of the optical unit.

According to the above aspect of the presently disclosed subject matter, the vehicle lighting fixture utilizing the optical deflector can form a predetermined light distribution pattern at a position shifted from a reference position, for example, a position horizontally or vertically shifted with respect to the reference position.

This configuration can be achieved by controlling the rotational direction and rotational amount of the optical unit so as to form a predetermined light distribution pattern at the reference position or a position shifted with respect to the reference position.

According to still further another aspect of the presently disclosed subject matter, the vehicle lighting fixture can be configured to form a predetermined light distribution pattern, and can include an optical unit, an optical system, and a rotary control unit. The optical unit can include: a light source; an optical deflector configured to include a mirror part that can scan with light from the light source; and a screen member configured to form a luminance distribution by the light reflected by the mirror part of the optical deflector. The optical system can be configured to project the luminance distribution formed in the screen member to form the predetermined light distribution pattern. The rotary control unit can be configured to control the optical unit to form the predetermined light distribution pattern at a reference position or a position shifted with respect to the reference position. The rotary control unit can control any of the rotational direction and the rotational amount of the optical unit with respect to the optical system.

According to the above aspect of the presently disclosed subject matter, the vehicle lighting fixture utilizing the optical deflector can form a predetermined light distribution pattern at a position shifted from a reference position, for example, a position horizontally or vertically shifted with respect to the reference position.

This configuration can be achieved by controlling the rotational direction and rotational amount, with respect to the optical system, of the optical unit so as to form a predetermined light distribution pattern at the reference position or a position shifted with respect to the reference position.

According to another aspect of the presently disclosed subject matter, the vehicle lighting fixture according to the previous aspects can be configured to include a plurality of the light sources; and a plurality of the optical deflectors provided to correspond to the respective light sources, each of the optical deflectors including a mirror part that can scan with light from a corresponding one of the light sources.

According to the above aspect of the presently disclosed subject matter, the vehicle lighting fixture utilizing the plurality of optical deflectors that can scan with light can be miniaturized, and the parts number, which may become a cause for cost increase, can be decreased. The use of the single screen member with respect to the plurality of optical deflectors can contribute to obtain the advantageous effects.

According to another aspect of the presently disclosed subject matter, the vehicle lighting fixture according to the previous aspect can further include a plurality of fixed reflecting members and have a reference axis so that the optical system, the screen member, the plurality of optical deflectors, the plurality of fixed reflecting members, and the plurality of light sources are disposed along the reference axis in this order. Furthermore, the plurality of light sources can be disposed to surround the reference axis with respective postures so that each of the light sources can emit light forward. The plurality of optical deflectors can be disposed to surround the reference axis and be inclined so that the light from the corresponding one of the light sources can be incident on the corresponding one of the mirror parts and be reflected by the mirror part to be directed rearward and closer to the reference axis. The plurality of fixed reflecting members can be disposed to be closer to the reference axis than the plurality of optical deflectors and surround the reference axis so that the light reflected from the corresponding one of the mirror parts of the optical deflectors can be incident thereon and be reflected by the one fixed reflecting member to be directed to the screen member. With this configuration, the same advantageous effects can be obtained.

According to another aspect of the presently disclosed subject matter, the vehicle lighting fixture according to any one of the previous aspects can be configured such that the mirror part can scan with the light from the light source two-dimensionally, i.e., in a horizontal direction and a vertical direction, and thus the luminance distribution can be formed in the screen member by drawing a two-dimensional image with the light scanned two-dimensionally, or in the horizontal and vertical directions by the mirror part of the optical deflector. With this configuration, the same advantageous effects can be obtained.

According to another aspect of the presently disclosed subject matter, the vehicle lighting fixture according to any one of the previous aspects can further include at least one sensor attached to a vehicle body, and the rotary control unit can control the rotational direction and the rotational amount on the basis of a signal detected by the sensor.

With this configuration, the traffic environment can be grasped by the at least one sensor, and the deflection angle by the optical deflector can be changed in accordance with a preset situation. This can change the scanning range of the light, meaning that the light can be converged or diverged without loss of light.

According to another aspect of the presently disclosed subject matter, the vehicle lighting fixture according to any one of the previous aspects can be configured such that the rotary control unit can control the rotational direction and the rotational amount about at least one of a vertical axis and a horizontal axis. With this configuration, the same advantageous effects can be obtained. In particular, the control of the rotational direction and rotational amount of the control target about the vertical axis can properly form the predetermined light distribution pattern at a position horizontally shifted with respect to the reference position. Alternatively, the control of the rotational direction and rotational amount of the control target about the horizontal axis can properly form the predetermined light distribution pattern at a position vertically shifted with respect to the reference position.

According to another aspect of the presently disclosed subject matter, the vehicle lighting fixture according to any one of the previous aspects can be configured such that the light source can be configured by any of a semiconductor light emitting element and a combination of a light emitting element and an optical fiber guiding light from the light emitting element. In particular, in the latter case, the optical fiber has a light incident end face and a light exiting end face, and the light exiting end face can be located at a light source position.

The vehicle lighting fixture with the above-described configuration of the presently disclosed subject matter can utilize the light exiting end face of the optical fiber serving as a light source. Thus, the combined light emitting element can be disposed at a position away from the main body of the vehicle lighting fixture. This can achieve further miniaturization and decreased weight of the main body of the vehicle lighting fixture.

According to another aspect of the presently disclosed subject matter, the vehicle lighting fixture according to any of the previous aspects can be configured such that the optical system can be a projector lens that can be configured by a plurality of lenses so as to compensate aberration to form a flat image plane. The screen member can be configured to be a flat shape and disposed along the flat image plane.

The vehicle lighting fixture with the above-described configuration of the presently disclosed subject matter can remove the adverse effects of the aberration with respect to the predetermined light distribution pattern. Furthermore, since the screen member can be formed to be a flat plate shape, it can facilitate the production thereof when compared with the case of manufacturing a curved screen member. In addition to these, the formation (drawing) of the luminance distribution formed by the optical deflector can be facilitated when compared with the case of the curved screen member.

According to another aspect of the presently disclosed subject matter, the vehicle lighting fixture according to any one of the previous aspects can be configured such that the optical deflector can be of a one-dimensional nonresonance/one-dimensional resonance type (2-D optical scanner (fast resonant and slow static combination)), including the mirror part; a movable frame disposed to surround the mirror part while supporting the mirror part so as to allow the mirror part to be reciprocately swung about a first axis; a base disposed to surround the movable frame while supporting the movable frame so as to allow the movable frame to be reciprocately swung about a second axis perpendicular to the first axis; a first piezoelectric actuator configured to cause the mirror part to be reciprocally swung about the first axis with respect to the movable frame due to resonance driving; and a second piezoelectric actuator configured to cause the movable frame and the mirror part supported by the movable frame to be reciprocally swung about the second axis with respect to the base due to nonresonance driving. Further, the vehicle lighting fixture can be configured such that the optical deflector can be disposed such that the first axis is contained in a vertical plane and the second axis is contained in a horizontal plane.

When the optical reflector is disposed according to this configuration, a predetermined light distribution pattern wide in the horizontal direction and thin in the vertical direction that is a required pattern for a vehicle headlamp (or a luminance distribution corresponding to the predetermined light distribution pattern) can be easily formed (drawn).

According to another aspect of the presently disclosed subject matter, the vehicle lighting fixture according to any of the previous aspects can be configured such that the light source can be an excitation light source and the screen member can be a wavelength converting member.

The vehicle lighting fixture with the above-described configuration of the presently disclosed subject matter can form the luminance distributions by the respective optical deflectors with excitation light scanned by the respective mirror parts of the optical deflectors on the wavelength converting member serving as the screen member.

Alternatively, the vehicle lighting fixture according to any of the previous aspects can be configured such that the light source can be a white light source and the screen member can be a diffusion member.

The vehicle lighting fixture with the above-described configuration of the presently disclosed subject matter can form the luminance distributions by the respective optical deflectors with white light scanned by the respective mirror parts of the optical deflectors on the diffusion member serving as the screen member.

BRIEF DESCRIPTION OF DRAWINGS

These and other characteristics, features, and advantages of the presently disclosed subject matter will become clear from the following description with reference to the accompanying drawings, wherein:

FIG. 12 includes graphs showing a state in which the excitation light source 12 (laser light) is modulated at a modulation frequency $f_L$ (25 MHz) in synchronization with the reciprocal swing movement of the mirror part 202 (upper graph), showing a state in which the first piezoelectric actuators 203 and 204 are applied with first and second alternating voltages (for example, sinusoidal wave of 25 MHz) (middle graph), and showing a state in which the second piezoelectric actuators 205 and 206 are applied with a third alternating voltage (for example, sawtooth wave of 55 Hz) (lower graph);

FIGS. 14A, 14B, and 14C illustrate examples of scanning patterns of laser light (spot-shaped laser light) with which the optical deflector 201 can two-dimensionally scan (in the horizontal direction and the vertical direction);

FIG. 26 is a diagram illustrating a predetermined light distribution pattern P formed on a virtual vertical screen (assumed to be disposed in front of a vehicle body approximately 25 m away from the vehicle front face) by the vehicle lighting fixture 300 of the reference example;

FIGS. 27A, 27B, and 27C are a front view, a top plan view, and a side view of a wavelength converting member 18, respectively;

FIG. 29 is a table summarizing the conditions to be satisfied in order to change the scanning areas $A_{Wide}$, $A_{Mid}$, and $A_{Hot}$ provided that the distances between each of the optical deflectors $201_{Wide}$, $201_{Mid}$, and $201_{Hot}$ (in particular, the center of the mirror part 202 thereof) and the wavelength converting member 18 are the same (or substantially the same) as each other;

DESCRIPTION OF EXEMPLARY EMBODIMENTS

A description will now be made below to vehicle lighting fixtures of the presently disclosed subject matter with reference to the accompanying drawings in accordance with exemplary embodiments. The definition relating to directions is based on the irradiation direction of the vehicle lighting fixture that can form a light distribution pattern in front of a vehicle body on which the vehicle lighting fixture is installed.

Before discussing the presently disclosed subject matter in accordance with exemplary embodiments, the basic configuration that can be adopted by the presently disclosed subject matter will be described as several reference examples with the use of a simple system configuration.

Figure 1:
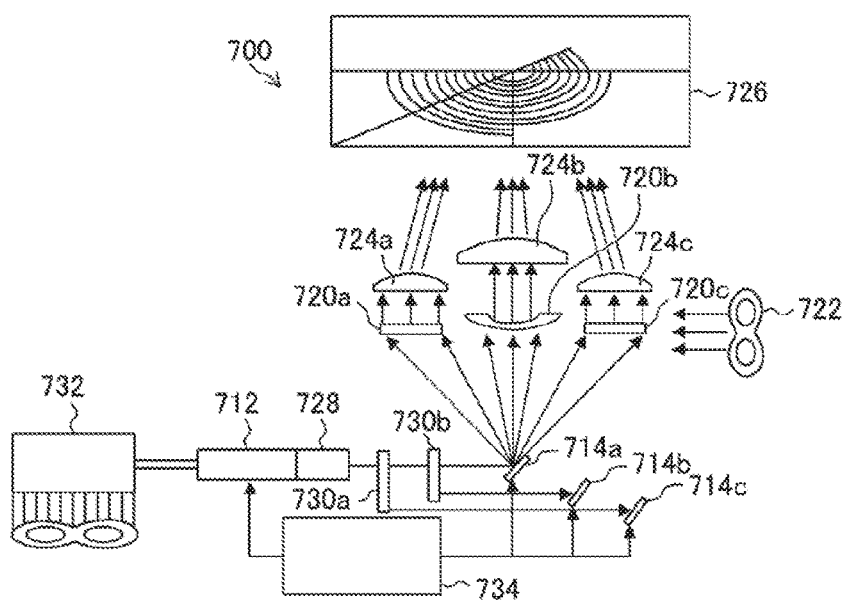
FIG. 1 is a schematic diagram illustrating a conventional vehicle lighting fixture 700.
Figure 2:
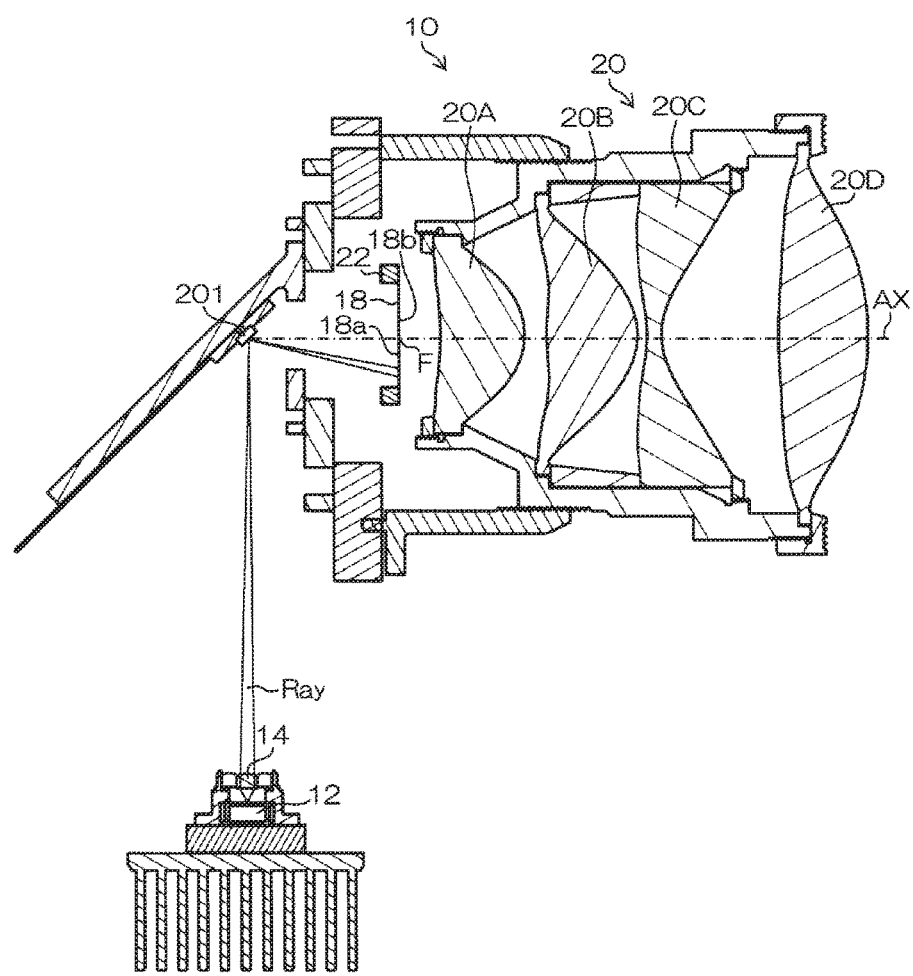
FIG. 2 is a vertical cross-sectional view illustrating a vehicle lighting fixture 10 of a reference example.

FIG. 2 is a vertical cross-sectional view illustrating a vehicle lighting fixture 10 of a reference example that can be employed in the presently disclosed subject matter.

As illustrated in FIG. 2, the vehicle lighting fixture 10 according to the reference example is configured as a vehicle headlamp. The vehicle lighting fixture 10 can include: an excitation light source 12; a condenser lens 14 configured to condense excitation light rays Ray from the excitation light source 12; an optical deflector 201 configured to scan with the excitation light rays Ray, which are condensed by the condenser lens 14, in a two-dimensional manner (in a horizontal direction and a vertical direction); a wavelength converting member 18 on which a two-dimensional image corresponding to a predetermined light distribution pattern can be drawn by the excitation light rays Ray with which the wavelength converting member 18 is scanned in the two-dimensional manner (in the horizontal and vertical directions) by the optical deflector 201; and a projection lens assembly 20 configured to project the two-dimensional image drawn on the wavelength converting member 18 forward.

The optical deflector 201, the wavelength converting member 18, and the projection lens assembly 20 can be disposed, as illustrated in FIG. 2, such that the excitation light rays Ray emitted from the excitation light source 12 and with which the optical deflector 201 scans in the two-dimensional manner (in the horizontal and vertical directions) can be incident on a rear face 18a of the wavelength converting member 18 and pass therethrough to exit a front face 18b of the wavelength converting member 18. Specifically, the optical deflector 201 can be disposed on the rear side with respect to the wavelength converting member 18 while the projection lens assembly 20 can be disposed on the front side with respect to the wavelength converting member 18. This type of arrangement is referred to as a transmission type. In this case, the excitation light source 12 may be disposed either on the front side or on the rear side with respect to the wavelength converting member 18. In FIG. 2, the projection lens assembly 20 can be configured to include four lenses 20A to 20D, but the presently disclosed subject matter is not limited thereto. The projection lens assembly 20 can be configured to include a single aspheric lens.

Figure 3:
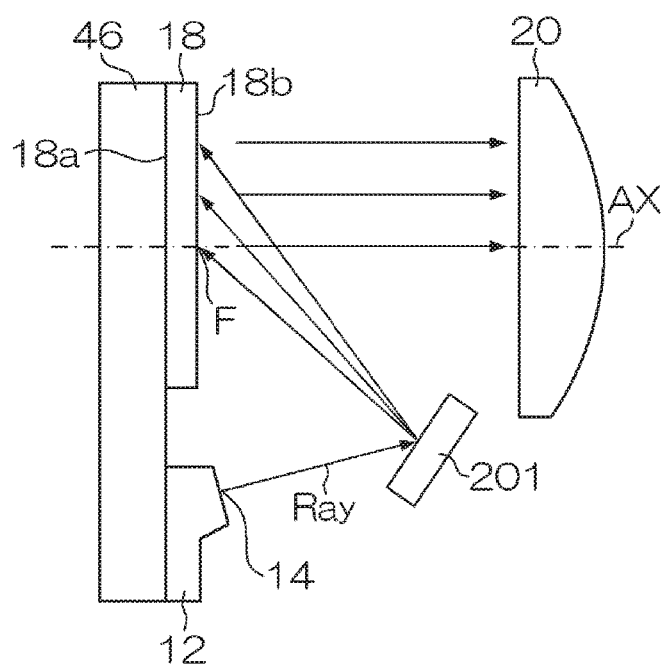
FIG. 3 is a schematic view illustrating a modified example of a vehicle lighting fixture 10.

The optical deflector 201, the wavelength converting member 18, and the projection lens assembly 20 may be disposed, as illustrated in FIG. 3, such that the excitation light rays Ray emitted from the excitation light source 12 and with which the optical deflector 201 scans in the two-dimensional manner (in the horizontal and vertical directions) can be incident on the front face 18b of the wavelength converting member 18. In this case, the optical deflector 201 and the projection lens assembly 20 may be disposed on the front side with respect to the wavelength converting member 18. This type of arrangement is referred to as a reflection type. In this case, the excitation light source 12 may be disposed either on the front side or on the rear side with respect to the wavelength converting member 18. The reflection type arrangement as illustrated in FIG. 3, when compared with the transmission type arrangement as illustrated in FIG. 2, is advantageous in terms of the dimension of the vehicle lighting fixture 10 in a reference axis Ax direction being made shorter. In FIG. 3, the projection lens assembly 20 is configured to include a single aspheric lens, but the presently disclosed subject matter is not limited thereto. The projection lens assembly 20 can be configured to include a lens group composed of a plurality of lenses.

The excitation light source 12 can be a semiconductor light emitting element such as a laser diode (LD) that can emit laser light rays of blue color (for example, having an emission wavelength of 450 nm) as excitation light. But the presently disclosed subject matter is not limited thereto. The excitation light source 12 can be a semiconductor light emitting element such as a laser diode (LD) that can emit laser light rays of near ultraviolet light (for example, having an emission wavelength of 405 nm) or an LED. The excitation light rays emitted from the excitation light source 12 can be converged by the condenser lens 14 (for example, collimated) and be incident on the optical deflector 201 (in particular, on a mirror part thereof).

The wavelength converting member 18 can be a plate-shaped or laminate-type wavelength converting member having a rectangular outer shape. The wavelength converting member 18 can be scanned with the laser light rays as the excitation light rays by the optical deflector 201 in a two-dimensional manner (in the horizontal and vertical directions) to thereby convert at least part of the excitation light rays to light rays with different wavelength. In the case of FIG. 2, the wavelength converting member 18 can be fixed to a frame body 22 at its outer periphery of the rear face 18a and disposed at or near the focal point F of the projection lens assembly 20. In the case of FIG. 3, the wavelength converting member 18 can be fixed to a support 46 at its rear face 18a and disposed at or near the focal point F of the projection lens assembly 20.

For example, when the excitation light source 12 is a blue laser diode for emitting blue laser light rays, the wavelength converting member 18 can include a plate-shaped or laminate-type phosphor that can be excited by the blue laser light rays to emit yellow light rays. With this configuration, the optical deflector 201 can scan the wavelength converting member 18 with the blue laser light rays in a two-dimensional manner (in the horizontal and vertical directions), whereby a two-dimensional white image can be drawn on the wavelength converting member 18 corresponding to a predetermined light distribution pattern. Specifically, when the blue laser light rays are irradiated on the wavelength converting member 18, the passing blue laser light rays and the yellow light rays emitted from the wavelength converting member 18 can be mixed together to thereby draw the two-dimensional white image (pseudo white light) on the wavelength converting member 18.

Further, when the excitation light source 12 is a near UV laser diode (LD) for emitting near UV laser light rays, the wavelength converting member 18 can include a plate-shaped or laminate-type phosphor that can be excited by the near UV laser light rays to emit three types of light rays, i.e., red, green, and blue light rays. With this configuration, the optical deflector 201 can scan the wavelength converting member 18 with the near UV laser light rays in a two-dimensional manner (in the horizontal and vertical directions), whereby a two-dimensional white image corresponding to a predetermined light distribution pattern can be drawn on the wavelength converting member 18. Specifically, when the near UV laser light rays are irradiated on the wavelength converting member 18, the red, green, and blue light rays emitted from the wavelength converting member 18 due to the excitation of the phosphor by the near UV laser light rays can be mixed to draw the two-dimensional white image (pseudo white light) on the wavelength converting member 18.

The projection lens assembly 20 can be composed of a group of four lenses 20A to 20D that have been aberration-corrected (have been corrected in terms of the field curvature) to provide a planar image formed, as illustrated in FIG. 2. The lenses may also be color aberration-corrected. Then, the planar wavelength converting member 18 can be disposed in alignment with the image plane. The focal point F of the projection lens assembly 20 can be located at or near the wavelength converting member 18. When the projection lens assembly 20 is a group of plural lenses, the projection lens assembly 20 can remove the adverse effect of the aberration on the predetermined light distribution pattern more than a single convex lens used. With this projection lens assembly 20, the planar wavelength converting member 18 can be employed. This is advantageous because the planar wavelength converting member 18 can be produced easier than a curved wavelength converting member. Furthermore, this is advantageous because the planar wavelength converting member 18 can facilitate the drawing of a two-dimensional image thereon easier than a curved wavelength converting member.

Further, the projection lens assembly 20 may be composed of a single aspheric lens without aberration correction (correction of the field curvature) to form a planar image. In this case, the wavelength converting member 18 should be a curved one corresponding to the field curvature and disposed along the field curvature. In this case, the focal point F of the projection lens assembly 20 can be located at or near the wavelength converting member 18.

The projection lens assembly 20 can project the two-dimensional image drawn on the wavelength converting member 18 corresponding to the predetermined light distribution pattern forward to thereby form the predetermined light distribution pattern (low-beam light distribution pattern or high-beam light distribution pattern) on a virtual vertical screen assumed to be disposed in front of the vehicle lighting fixture 10 approximately 25 m away from the vehicle body.

Next, a description will be given of the optical deflector 201. The optical deflector 201 can scan the wavelength converting member 18 in a two-dimensional manner (in the horizontal and vertical direction) with the excitation light rays Ray emitted from the excitation light source 12 and converged by the condenser lens 14 (for example, collimated).

The optical deflectors 201 can be configured by, for example, an MEMS scanner. The driving system of the optical deflectors is not limited to a particular system, and examples thereof may include a piezoelectric system, an electrostatic system, and an electromagnetic system. In this reference example, a description will be given of an optical deflector driven by a piezoelectric system as a representative example.

The piezoelectric system used in the optical deflector is not limited to a particular system, and examples thereof may include a one-dimensional nonresonance/one-dimensional resonance type, a two-dimensional nonresonance type, and a two-dimensional resonance type.

The following reference example may employ the one-dimensional nonresonance/one-dimensional resonance type (a 2-D optical scanner (fast resonant and slow static combination)) optical deflector 201, as one example.

<One-Dimensional Nonresonance/One-Dimensional Resonance Type (2-D Optical Scanner (Fast Resonant and Slow Static Combination))>

Figure 4:
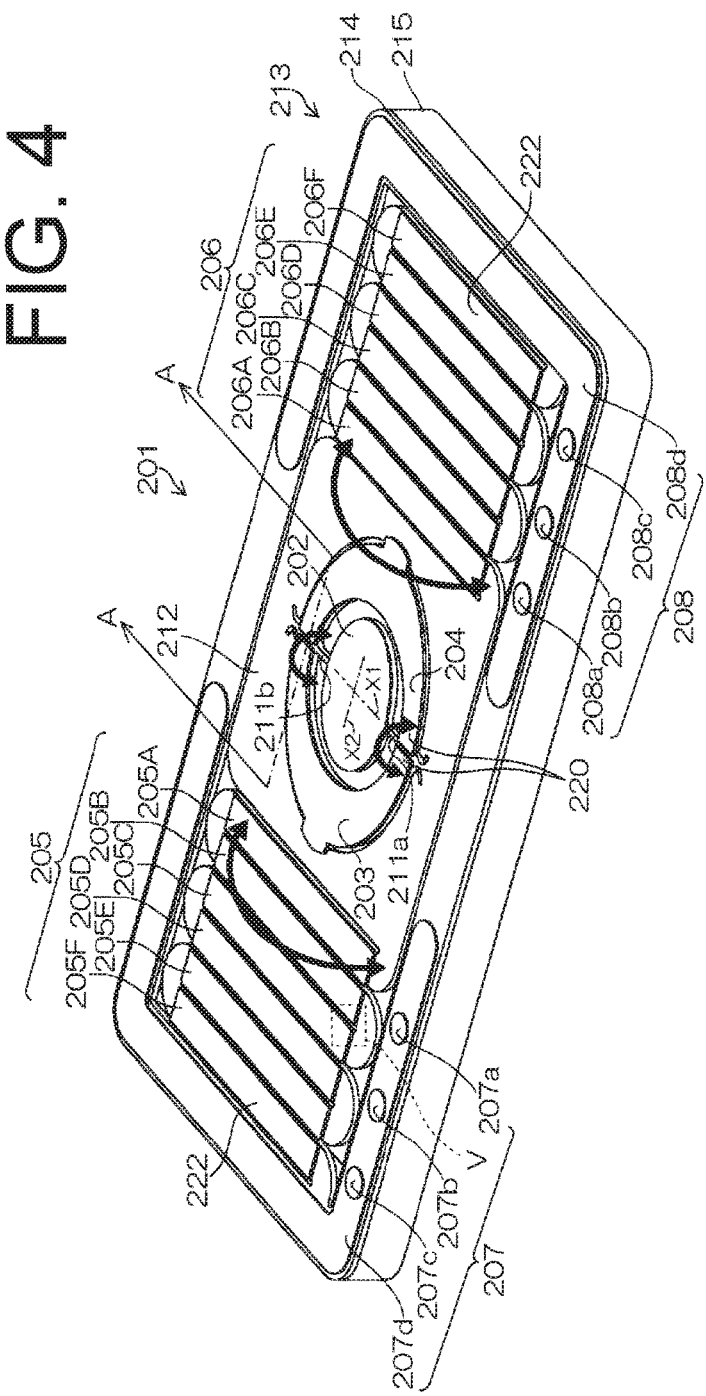
FIG. 4 is a perspective view illustrating an optical deflector 201 of a 2-D optical scanner (fast resonant and slow static combination) (an optical deflector of a one-dimensional nonresonance/one-dimensional resonance type)

FIG. 4 is a perspective view illustrating the one-dimensional nonresonance/one-dimensional resonance type (2-D optical scanner (fast resonant and slow static combination)) optical deflector 201.

As schematically illustrated in FIG. 4, the optical deflector 201 of the one-dimensional nonresonance/one-dimensional resonance type can include a mirror part 202 (also called as an MEMS mirror), first piezoelectric actuators 203 and 204, a movable frame 212, second piezoelectric actuators 205 and 206, and a base 215. The first piezoelectric actuators 203 and 204 can drive the mirror part 202 via torsion bars 211a and 211b. The movable frame 212 can support the first piezoelectric actuators 203 and 204. The second piezoelectric actuators 205 and 206 can drive the movable frame 212. The base 215 can support the second piezoelectric actuators 205 and 206.

The mirror part 202 can have a circular shape and the torsion bars 211a and 211b can be connected to the mirror part 202 so as to extend outward from respective ends of the mirror part 202. The first piezoelectric actuators 203 and 204 can be formed in a semi-circular shape so as to surround the mirror part 202 while they are provided with a gap between them. Furthermore, the first piezoelectric actuators 203 and 204 can be connected to each other with the torsion bars 211a and 211b interposed therebetween at their respective ends. The movable frame 212 can be disposed to surround the mirror part 202 and the first piezoelectric actuators 203 and 204. The first piezoelectric actuators 203 and 204 can be connected to and supported by the movable frame 212 at respective outer central portions of the arc (semi-circular) shape.

The movable frame 212 can have a rectangular shape and include a pair of sides disposed in a direction perpendicular to the directions in which the torsion bars 211a and 211b extend. At the pair of sides the movable frame 212 can be connected to the respective tip ends of the second piezoelectric actuators 205 and 206 opposite to each other with the movable frame 212 interposed therebetween. The base 215 can include a supporting base part 214 formed thereon so as to surround the movable frame 212 and the second piezoelectric actuators 205 and 206. The second piezoelectric actuators 205 and 206 can be connected to and supported by the supporting base part 214 at respective base ends thereof.

Figure 5A:
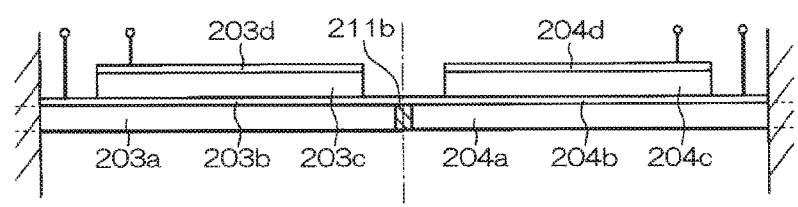
FIG. 5A is a schematic diagram illustrating the state in which first piezoelectric actuators 203 and 204 are not applied with a voltage.

The first piezoelectric actuators 203 and 204 each can include a single piezoelectric cantilever composed of a support 203a, 204a, a lower electrode 203b, 204b, a piezoelectric body 203c, 204c, and an upper electrode 203d, 204d, as illustrated in FIG. 5A.

Further, as illustrated in FIG. 4, the second piezoelectric actuators 205 and 206 each can include six piezoelectric cantilevers 205A to 205F, 206A to 206F, which are connected to adjacent ones thereof so as to be folded back at its end. As a result, the second piezoelectric actuators 205 and 206 can be formed in an accordion shape as a whole. Each of the piezoelectric cantilevers 205A to 205F and 206A to 206F can have the same configuration as those of the piezoelectric cantilevers of the first piezoelectric actuators 203 and 204.

A description will now be given of the action of the mirror part 202 (swing motion about the first axis X1).

Figure 5B:
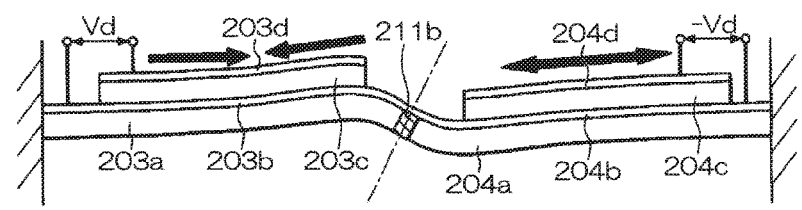
FIG. 5B is a schematic diagram illustrating the state in which they are applied with a voltage.

FIGS. 5A and 5B each show the cross-sectional view of the first piezoelectric actuators 203 and 204 taken along line A-A in FIG. 4. Specifically, FIG. 5A is a schematic diagram illustrating the state in which the first piezoelectric actuators 203 and 204 are not applied with a voltage, and FIG. 5B is a schematic diagram illustrating the state in which they are applied with a voltage.

As illustrated in FIG. 5B, voltages of +Vd and −Vd, which have respective opposite polarity, can be applied to between the upper electrode 203d and the lower electrode 203b of the first piezoelectric actuator 203 and between the upper electrode 204d and the lower electrode 204b of the first piezoelectric actuator 204, respectively. As a result, they can be deformed while being bent in mutually opposite directions. This bent deformation can rotate the torsion bar 211b in such a state as illustrated in FIG. 5B. The torsion bar 211a can receive the same rotation. According to the rotation of the torsion bars 211a and 211b, the mirror part 201 can be swung about the first axis X1 with respect to the movable frame 212.

A description will now be given of the action of the mirror part 202 (swing motion around a second axis X2).

Figure 6A:
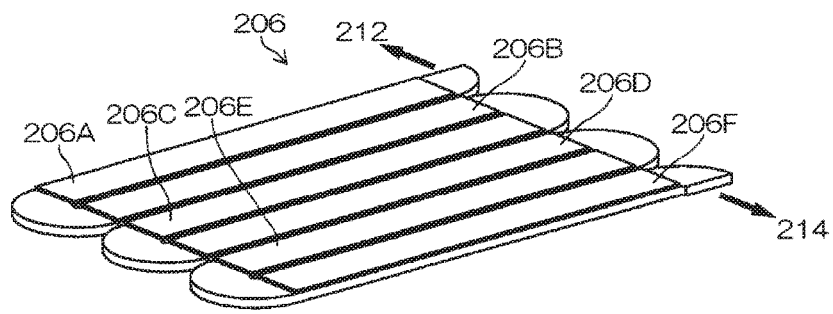
FIG. 6A is a schematic diagram illustrating the state in which second piezoelectric actuators 205 and 206 are not applied with a voltage.
Figure 6B:
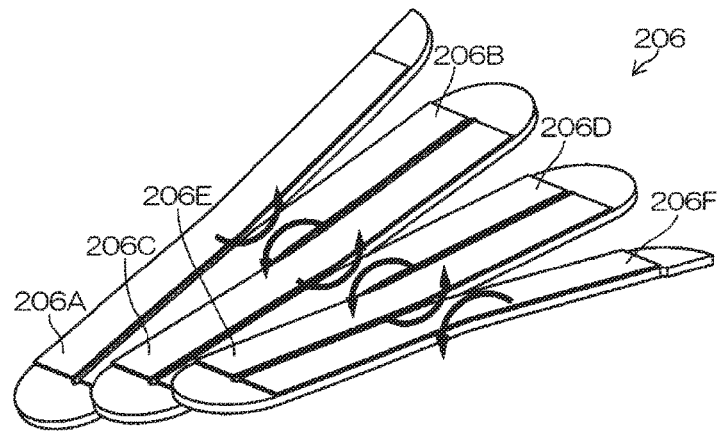
FIG. 6B is a schematic diagram illustrating the state in which they are applied with a voltage.

FIG. 6A is a schematic diagram illustrating the state in which the second piezoelectric actuators 205 and 206 are not applied with a voltage, and FIG. 6B is a schematic diagram illustrating the state in which they are applied with a voltage.

As illustrated in FIG. 6B, when the second piezoelectric actuator 206 is applied with a voltage, the odd-numbered piezoelectric cantilevers 206A, 206C, and 206E from the movable frame 212 side can be deformed and bent upward while the even-numbered piezoelectric cantilevers 206B, 206D, and 206F can be deformed and bent downward. As a result, the piezoelectric actuator 206 as a whole can be deformed with a larger angle (angular variation) derived from the accumulated magnitudes of the respective bent deformation of the piezoelectric cantilevers 206A to 206F. The second piezoelectric actuator 205 can also be driven in the same manner. This angular variation of the second piezoelectric actuators 205 and 206 can cause the movable frame 212 (and the mirror part 202 supported by the movable frame 212) to rotate with respect to the base 215 about the second axis X2 orthogonal to the first axis X1. Note that the second axis X2 is orthogonal to the first axis X1 at the center (center of gravity) of the mirror part 202.

A single support formed by processing a silicon substrate can constitute a mirror part support for the mirror part 202, the torsion bars 211a and 211b, supports for the first piezoelectric actuators 203 and 204, the movable frame 212, supports for the second piezoelectric actuators 205 and 206, and the supporting base part 214 on the base 215. Furthermore, the base 215 can be formed from a silicon substrate, and therefore, it can be integrally formed from the above single support by processing a silicon substrate. As the technique of processing such a silicon substrate, those described in, for example, Japanese Patent Application Laid-Open No. 2008-040240, which is hereby incorporated in its entirety by reference, can be employed. There can be provided a gap between the mirror part 202 and the movable frame 212, so that the mirror part 202 can be swung about the first axis X1 with respect to the movable frame 212 within a predestined angle range. Furthermore, there can be provided a gap between the movable frame 212 and the base 215, so that the movable frame 212 (together with the mirror part 202 supported by the movable frame 212) can be swung about the second axis X2 with respect to the base 215 within a predetermined angle range.

The optical deflector 201 can include electrode sets 207 and 208 to apply a drive voltage to the respective piezoelectric actuators 203 to 206.

The electrode set 207 can include an upper electrode pad 207a, a first upper electrode pad 207b, a second upper electrode pad 207c, and a common lower electrode 207d. The upper electrode pad 207a can be configured to apply a drive voltage to the first piezoelectric actuator 203. The first upper electrode pad 207b can be configured to apply a drive voltage to the odd-numbered piezoelectric cantilevers 205A, 205C, and 205E of the second piezoelectric actuator 205. The second upper electrode pad 207c can be configured to apply a drive voltage to the even-numbered piezoelectric cantilevers 205B, 205D, and 205F of the second piezoelectric actuator 205. The common lower electrode 207d can be used as a lower electrode common to the upper electrode pads 207a to 207c.

In a similar manner, the electrode set 208 can include an upper electrode pad 208a, a first upper electrode pad 208b, a second upper electrode pad 208c, and a common lower electrode 208d. The upper electrode pad 208a can be configured to apply a drive voltage to the first piezoelectric actuator 204. The first upper electrode pad 208b can be configured to apply a drive voltage to the odd-numbered piezoelectric cantilevers 206A, 206C, and 206E of the second piezoelectric actuator 206. The second upper electrode pad 208c can be configured to apply a drive voltage to the even-numbered piezoelectric cantilevers 206B, 206D, and 206F of the second piezoelectric actuator 206. The common lower electrode 208d can be used as a lower electrode common to the upper electrode pads 208a to 208c.

In this reference example, the first piezoelectric actuator 203 can be applied with a first AC voltage as a drive voltage, while the first piezoelectric actuator 204 can be applied with a second AC voltage as a drive voltage, where the first AC voltage and the second AC voltage can be different from each other in phase, such as a sinusoidal wave with an opposite phase or shifted phase. In this case, an AC voltage with a frequency close to a mechanical resonance frequency (first resonance point) of the mirror part 202 including the torsion bars 211a and 211b can be applied to resonantly drive the first piezoelectric actuators 203 and 204. This can cause the mirror part 202 to be reciprocately swung about the first axis X1 with respect to the movable frame 212, so that the laser light rays from the excitation light source 12 and incident on the mirror part 202 can scan in a first direction (for example, in the horizontal direction).

A third AC voltage can be applied to each of the second piezoelectric actuators 205 and 206 as a drive voltage. In this case, an AC voltage with a frequency equal to or lower than a predetermined value that is smaller than a mechanical resonance frequency (first resonance point) of the movable frame 212 including the mirror part 202, the torsion bars 211a and 211b, and the first piezoelectric actuators 203 and 204 can be applied in order to nonresonantly drive the second piezoelectric actuators 205 and 206. This can cause the mirror part 202 to be reciprocately swung about the second axis X2 with respect to the base 215, so that the laser light rays as excitation light rays from the excitation light source 12 and incident on the mirror part 202 can scan in a second direction (for example, in the vertical direction).

The optical deflector 201 utilizing a 2-D optical scanner (fast resonant and slow static combination) can be arranged so that the first axis X1 is contained in a vertical plane and the second axis X2 is contained in a horizontal plane. With this arrangement, a predetermined light distribution pattern (two-dimensional image corresponding to the required predetermined light distribution pattern) being wide in the horizontal direction and narrow in the vertical direction for use in a vehicular headlamp can be easily formed (drawn). The reason therefor will be discussed next.

Figure 7A:
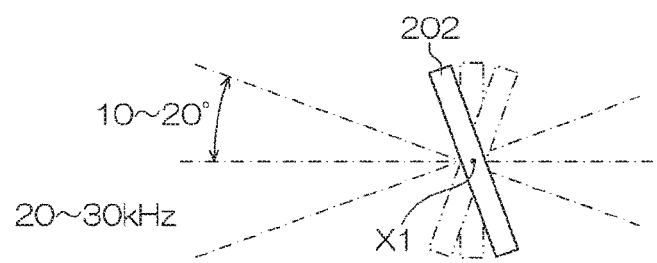
FIG. 7A is a diagram illustrating the maximum swing angle of a mirror part 202 around a first axis X1.
Figure 7B:
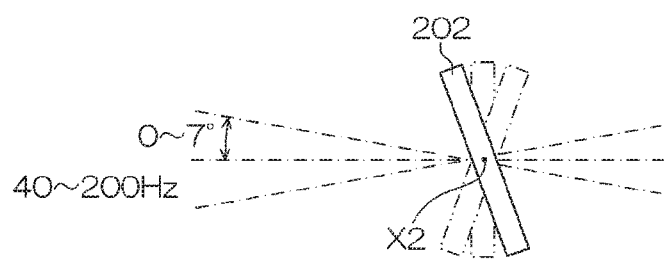
FIG. 7B is a diagram illustrating the maximum swing angle of the mirror part 202 around a second axis X2.

Specifically, the optical deflector 201 utilizing a 2-D optical scanner (fast resonant and slow static combination) can be configured such that the maximum swing angle of the mirror part 202 about the first axis X1 is larger than the maximum swing angle of the mirror part 202 about the second axis X2. For example, since the reciprocal swing movement of the mirror part 202 about the first axis X1 is caused due to the resonance driving, the maximum swing angle of the mirror part 202 about the first axis X1 ranges from 10 degrees to 20 degrees as illustrated in FIG. 7A. On the contrary, since the reciprocal swing movement of the mirror part 202 about the second axis X2 is caused due to the nonresonance driving, the maximum swing angle of the mirror part 202 about the second axis X2 becomes about 7 degrees as illustrated in FIG. 7B. As a result, the above-described arrangement of the optical deflector 201 utilizing a 2-D optical scanner (fast resonant and slow static combination) can easily form (draw) a predetermined light distribution pattern (two-dimensional image corresponding to the required predetermined light distribution pattern) being wide in the horizontal direction and narrow in the vertical direction for use in a vehicular headlight.

As described above, by driving the respective piezoelectric actuators 203 to 206, the laser light rays from the excitation light source 12 as the excitation light rays can scan in a two dimensional manner (for example, in the horizontal and vertical directions).

As illustrated in FIG. 4, the optical deflector 201 can include an H sensor 220 and a V sensor 222. The H sensor 220 can be disposed at the tip end of the torsion bar 211a on the mirror part 202 side. The V sensor 222 can be disposed to the base end sides of the second piezoelectric actuators 205 and 206, for example, at the piezoelectric cantilevers 205F and 206F.

The H sensor 220 can be formed from a piezoelectric element (PZT) similar to the piezoelectric cantilever included in the first piezoelectric actuators 203 and 204 and can be configured to generate a voltage in accordance with the bent deformation (amount of displacement) of the first piezoelectric actuators 203 and 204. The V sensor 222 can be formed from a piezoelectric element (PZT) similar to the piezoelectric cantilever included in the second piezoelectric actuators 205 and 206 and can be configured to generate a voltage in accordance with the bent deformation (amount of displacement) of the second piezoelectric actuators 205 and 206.

Figure 20:
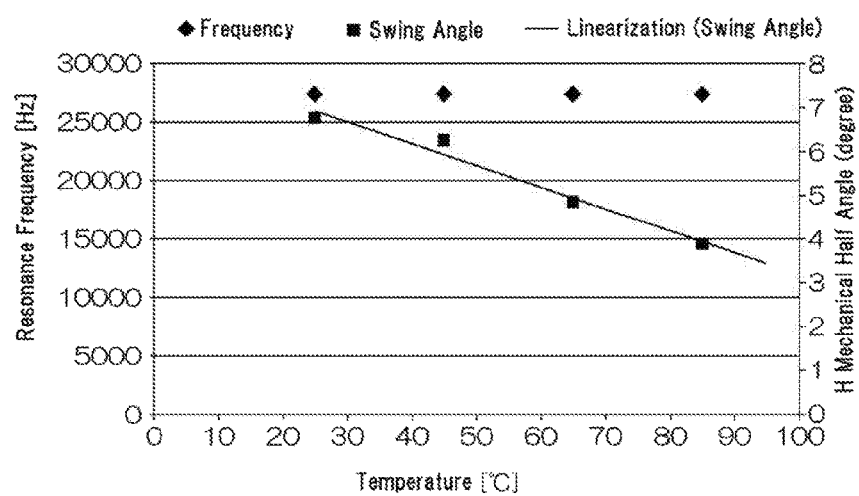
FIG. 20 is a graph showing the relationship among the temperature variation, the resonance frequency, and the mechanical swing angle (half angle) of a mirror part 202 about the first axis X1 as a center.

In the optical deflector 201, the mechanical swing angle (half angle) of the mirror part 202 about the first axis X1 is varied, as illustrated in FIG. 20, due to the change in natural vibration frequency of a material constituting the optical deflector 201 by temperature variation. This can be suppressed by the following method. Specifically, on the basis of the drive signal (the first AC voltage and the second AC voltage to be applied to the first piezoelectric actuators 203 and 204) and the sensor signal (output of the H sensor 220), the frequencies of the first AC voltage and the second AC voltage to be applied to the first piezoelectric actuators 203 and 204 (or alternatively, the first AC voltage and the second AC voltage themselves) can be feed-back controlled so that the mechanical swing angle (half angle) of the mirror part 202 about the first axis X1 becomes a target value. As a result, the fluctuation can be suppressed.

A description will next be given of the desired frequencies of the first AC voltage and the second AC voltage to be applied to the first piezoelectric actuators 203 and 204 and the desired frequency of the third AC voltage to be applied to the second piezoelectric actuators 205 and 206.

The inventor of the subject application has conducted experiments and examined the test results thereof to find out that the frequencies (hereinafter, referred to as a horizontal scanning frequency $f_H$) of the first AC voltage and the second AC voltage to be applied to the first piezoelectric actuators 203 and 204 in the optical deflector 201 utilizing a 2-D optical scanner (fast resonant and slow static combination) with the above configuration can be desirably about 4 to 30 kHz (sinusoidal wave), and more desirably 27 kHz±3 kHz (sinusoidal wave).

Furthermore, the inventor of the subject application has found out that the horizontal resolution (number of pixels) is desirably set to 300 (or more) in consideration of the high-beam light distribution pattern so that the turning ON/OFF (lighting or not lighting) can be controlled at an interval of 0.1 degrees (or less) within the angular range of −15 degrees (left) to +15 degrees (right) with respect to the vertical axis V.

The inventor of the subject application has further conducted experiments and examined the test results thereof to find out that the frequency (hereinafter, referred to as a vertical scanning frequency $f_V$) of the third AC voltage to be applied to the second piezoelectric actuators 205 and 206 in the optical deflector 201 utilizing a 2-D optical scanner (fast resonant and slow static combination) with the above configuration can be desirably 55 Hz or higher (sawtooth wave), more desirably 55 Hz to 120 Hz (sawtooth wave), still more desirably 55 Hz to 100 Hz (sawtooth wave), and particularly desirably 70 Hz±10 Hz (sawtooth wave).

Furthermore, the inventor of the subject application has found out that the frequency (the vertical scanning frequency $f_V$) of the third AC voltage to be applied to the second piezoelectric actuators 205 and 206 is set to desirably 50 Hz or higher (sawtooth wave), more desirably 50 Hz to 120 Hz (sawtooth wave), still more desirably 50 Hz to 100 Hz (sawtooth wave), and particularly desirably 70 Hz±10 Hz (sawtooth wave) in consideration of normal travelling speeds (for example, 0 km/h to 150 km/h). Since the frame rate depends on the vertical scanning frequency $f_V$, when the vertical scanning frequency $f_V$ is 70 Hz, the frame rate is 70 fps.

When the vertical scanning frequency $f_V$ is 55 Hz or higher, the predetermined light distribution pattern can be formed on the virtual vertical screen as an image (may be considered as a moving picture or movie) with a frame rate of 55 fps or more. Similarly, when the vertical scanning frequency $f_V$ is 55 Hz to 120 Hz, the predetermined light distribution pattern can be formed on the virtual vertical screen as an image (may be considered as a moving picture or movie) with a frame rate of 55 fps or more and 120 fps or less. In a similar manner, when the vertical scanning frequency $f_V$ is 55 Hz to 100 Hz, the predetermined light distribution pattern can be formed on the virtual vertical screen as an image (may be considered as a moving picture or movie) with a frame rate of 55 fps or more and 100 fps or less. Similarly, when the vertical scanning frequency $f_V$ is 70 Hz±10 Hz, the predetermined light distribution pattern can be formed on the virtual vertical screen as an image (may be considered as a moving picture or movie) with a frame rate of 70 fps±10 fps. The same correspondence as above can be applied to the cases when the vertical scanning frequency $f_V$ is 50 Hz or more, 50 Hz to 120 Hz, 50 Hz to 100 Hz, and 70 Hz±10 Hz.

The resolution (the number of vertical scanning lines) in the vertical direction can be determined by the following formula.

Resolution in the vertical direction (or the number of vertical scanning lines)=2×(Utility time coefficient of vertical scanning:$K_V$)×$f_H/f_V$.

On the basis of this formula, if the horizontal scanning frequency $f_H$=25 kHz, the vertical scanning frequency $f_V$=70 Hz, and the utility time coefficient Kv=0.9 to 0.8, then the number of vertical scanning lines is about 600 (lines)=2×25 kHz/70 Hz×(0.9 to 0.85).

The above-described desirable vertical scanning frequency $f_V$ has never been used in vehicle lighting fixtures such as vehicle headlamps, and the inventor of the present application has found it for the first time as a result of various experiments conducted by the inventor. Specifically, in the conventional art, in order to suppress the flickering in the general illumination field (other than the vehicle lighting fixtures such as an automobile headlamp), it is a technical common knowledge to use a frequency of 100 Hz or higher. Furthermore, in order to suppress the flickering in the technical field of vehicle lighting fixtures, it is a technical common knowledge to use a frequency of 220 Hz or higher. Therefore, the above-described desirable vertical scanning frequency $f_V$ has never been used in vehicle lighting fixtures such as vehicle headlamps.

Next, a description will now be given of why the technical common knowledge is to use a frequency of 100 Hz or higher in order to suppress the flickering in the general illumination field (other than the vehicle lighting fixtures such as an automobile headlamp).

For example, the Ordinance Concerning Technical Requirements for Electrical Appliances and Materials (Ordinance of the Ministry of International Trade and Industry No. 85 of 37th year of Showa) describes that "the light output should be no flickering felt by anyone," and "it is interpreted as to be no flickering when the light output has a repeated frequency of 100 Hz or higher without missing parts or has a repeated frequency of 500 Hz or higher." It should be noted that the Ordinance is not intended to vehicle lighting fixtures such as automobile headlamps.

Furthermore, the report in Nihon Keizai Shimbun (The Nikkei dated Aug. 26, 2010) also said that "the alternating current has a frequency of 50 Hz. The voltage having passed through a rectifier is repeatedly changed between ON and OFF at a frequency of 100 times per second. The fluctuation in voltage may affect the fluctuation in luminance of fluorescent lamps. An LED illumination has no afterglow time like the fluorescent lamps, but instantaneously changes in its luminance, whereby flickering is more noticeable," meaning that the flickering is more noticeable when the frequency is 100 Hz or higher.

In general, the blinking frequency of fluorescent lamps that cannot cause flickering is said to be 100 Hz to 120 Hz (50 Hz to 60 Hz in terms of the power source phase).

Next, a description will be given of why the technical common knowledge is to use a frequency of 220 Hz or higher (or a frame rate of 220 fps or more) in order to suppress the flickering in vehicle lighting fixtures such as an automobile headlamp.

In general, an HID (metal halide lamp) used for an automobile headlamp can be lit in a condition of applying a voltage with a frequency of 350 to 500 Hz (rectangular wave). This is because a frequency of 800 Hz or more may cause a noise while a lower frequency may deteriorate the light emission efficiency of HIDs. When a frequency of 150 Hz or lower is employed, the HID life may be lowered due to the adverse effect to heating wearing of electrodes. Furthermore, a frequency of 250 Hz or higher is said to be preferable.

The report of "Glare-free High Beam with Beam-scanning," ISAL 2013, pp. 340 to 347 says that the frequency for use in a vehicle lighting fixture such as an automobile headlamp is 220 Hz or higher, and the recommended frequency is 300 to 400 Hz or higher. Furthermore, the report "Flickering effects of vehicle exterior light systems and consequences," ISAL 2013, pp. 262 to 266 says that the frequency for use in a vehicle lighting fixture such as an automobile headlamp is approximately 400 Hz.

Therefore, it has never been known in the conventional art that the use of frequency of 55 Hz or higher (desirably 55 Hz to 120 Hz) as a vertical scanning frequency $f_V$ in a vehicle lighting fixture such as an automobile headlamp can suppress flickering.

A description will now be given of the experiments conducted by the inventor of the present application in order to study the above-described desirable vertical scanning frequency $f_V$.

Experiment

The inventor conducted experiments using a test system simulating a vehicle headlamp during driving to evaluate the degree of flickering sensed by test subjects.

Figure 8:
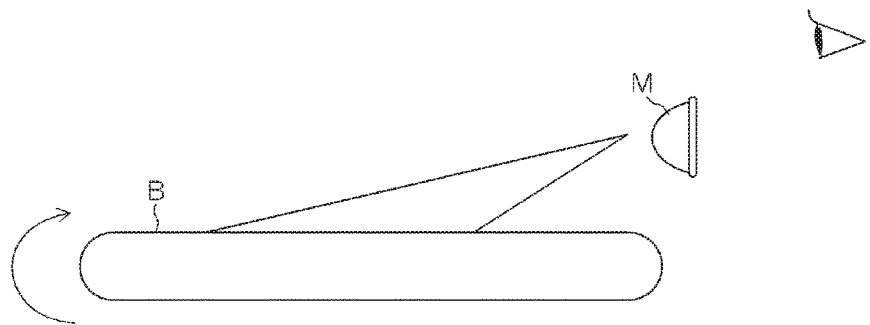
FIG. 8 is a schematic diagram of a test system.

FIG. 8 is a schematic diagram of a test system used.

As illustrated in FIG. 8, the test system can include a movable road model using a rotary belt B that can be varied in rotational speed and a lighting fixture model M similar to those used in a vehicle lighting fixture 10. The movable road model is made with a scale size of ⅕, and white lines and the like simulating an actual road surface are drawn on the surface of the rotary belt B. The lighting fixture model M can change the output (scanning illuminance) of an excitation light source similar to the excitation light source 12.

First, experiments were performed to confirm whether the flickering sensed by a test subject is different between a case where the lighting fixture model M having an LED excitation light source is used for illuminating the surface of the rotary belt B and a case where the lighting fixture model M having an LD excitation light source is used for illuminating the surface of the rotary belt B. As a result, it has been confirmed that if the vertical scanning frequency $f_V$ is the same, the degree of flickering sensed by test subjects is not different between the case where the lighting fixture model M having the LED excitation light source is used for illuminating the surface of the rotary belt B and the case where the lighting fixture model M having the LD excitation light source is used for illuminating the surface of the rotary belt B.

Figure 9:
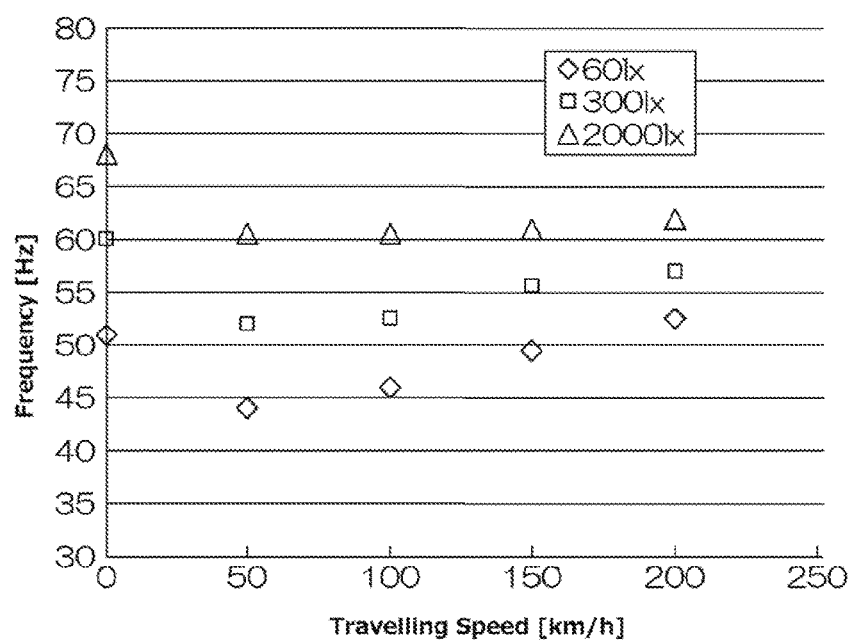
FIG. 9 is a graph obtained by plotting test results (measurement results)

Next, the vertical scanning frequency $f_V$ was measured at the time when a test subject did not sense the flickering while the rotary belt B was being rotated at different rotational speed corresponding to each of actual travelling speeds, 0 km/h, 50 km/h, 100 km/h, 150 km/h, and 200 km/h. In particular, the test experiment was performed in such a manner that the test subject changed the vertical scanning frequency $f_V$ by dial operation and stopped the dial operation when he/she did not sense the flickering. The vertical scanning frequency measured at that time was regarded as the vertical scanning frequency $f_V$. The measurement was performed at some levels of illuminance. They are: illuminance of 60 lx being the comparable level of road illumination in front of a vehicle body 30 to 40 m away from the vehicle body (at an area which a driver watches during driving); illuminance of 300 lx being the comparable level of road illumination in front of the vehicle body approximately 10 m away from the vehicle body (at an area just in front of the vehicle body); and illuminance of 2000 lx being the comparable level of reflection light from a preceding vehicle or a guard rail close to the vehicle body. FIG. 9 is a graph obtained by plotting test results (measurement results), showing the relationship between the travelling speed and the flickering. The vertical axis represents the vertical scanning frequency $f_V$ and the horizontal axis represents the travelling speed (per hour).

With reference to FIG. 9, the following facts can be found.

First, when the road illuminance is 60 lx and the travelling speed is 0 km/h to 200 km/h, the vertical scanning frequency $f_V$ at which a person does not sense flickering is 55 kHz or higher. In consideration of the road illuminance of 60 lx at an area which a driver watches during driving, it is desirable to set the vertical scanning frequency $f_V$ at 55 kHz or higher in order to suppress the flickering occurring in a vehicle lighting fixture such as an automobile headlamp.

Second, when the road illuminance is 60 lx and the travelling speed is 0 km/h to 150 km/h, the vertical scanning frequency $f_V$ at which a person does not sense flickering is 50 kHz or higher. In consideration of the road illuminance of 60 lx at an area which a driver watches during driving, it is desirable to set the vertical scanning frequency $f_V$ at 50 kHz or higher in order to suppress the flickering occurring in a vehicle lighting fixture such as an automobile headlamp.

Third, when the travelling speed is increased, the vertical scanning frequency $f_V$ at which a person does not sense flickering tends to increase. Taking it into consideration, it is desirable to make the vertical scanning frequency $f_V$ variable in order to suppress the occurrence of flickering in a vehicle lighting fixture such as an automobile headlamp. For example, it is desirable to increase the vertical scanning frequency $f_V$ as the travelling speed is increased.

Fourth, when the illuminance is increased, the vertical scanning frequency $f_V$ at which a person does not sense flickering tends to increase. Taking it into consideration, it is desirable to make the vertical scanning frequency $f_V$ variable in order to suppress the occurrence of flickering in a vehicle lighting fixture such as an automobile headlamp. For example, it is desirable to increase the vertical scanning frequency $f_V$ as the illuminance is increased.

Fifth, the vertical scanning frequency $f_V$ at which a person does not sense flickering is higher at the time of stopping (0 km/h) than at the time of travelling (50 km/h to 150 km/h). Taking it into consideration, it is desirable to make the vertical scanning frequency $f_V$ variable in order to suppress the occurrence of flickering in a vehicle lighting fixture such as an automobile headlamp. For example, it is desirable to make the relationship between the vertical scanning frequency $f_V 1$ during stopped and the vertical scanning frequency $f_V 2$ during travelling $f_V 1 > f_V 2$.

Sixth, the vertical scanning frequency $f_V$ at which a person does not sense flickering is not higher than 70 kHz at illuminance of 60 lx, 300 lx, or 2000 lx and at the time of travelling (0 km/h to 200 km/h). Taking it into consideration, it is desirable to set the vertical scanning frequency $f_V$ to 70 kHz or higher or 70 Hz±10 Hz in order to suppress the occurrence of flickering in a vehicle lighting fixture such as an automobile headlamp.

Furthermore, the inventor of the present application has found that the frequency (the vertical scanning frequency $f_V$) of the third AC voltage to be applied to the second piezoelectric actuators 205 and 206 is set to desirably 120 Hz or lower (sawtooth wave), and more desirably 100 Hz or lower (sawtooth wave), when taking the mechanical resonance point (hereinafter referred to as V-side resonance point) of the movable frame 212 including the mirror part 202, the torsion bars 211*a* and 211*b*, and the first piezoelectric actuators 203 and 204 into consideration. The reason is as follows.

Figure 10:
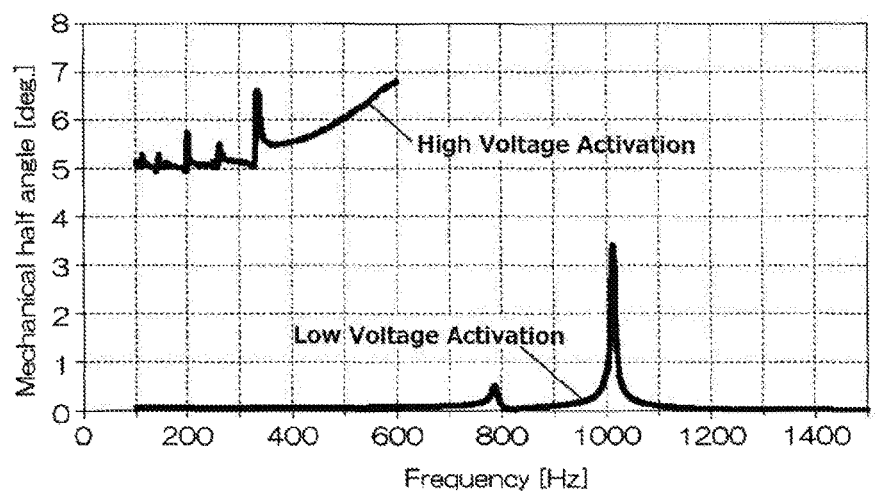
FIG. 10 is a graph showing the relationship between the swing angle and frequency of the mirror part 202.

FIG. 10 is a graph showing the relationship between the swing angle and frequency of the mirror part 202, and the vertical axis represents the swing angle and the horizontal axis represents the frequency of the applied voltage (for example, sinusoidal wave or triangle wave).

For example, when a voltage of about 2 V is applied to the second piezoelectric actuators 205 and 206 (low voltage activation), as illustrated in FIG. 10, the V-side resonance point exists near 1000 Hz and 800 Hz. On the other hand, when a high voltage of about 45 V is applied to the second piezoelectric actuators 205 and 206 (high voltage activation), the V-side resonance point exists near 350 Hz and 200 Hz at the maximum swing angle. In order to achieve the stable angular control while periodically vibrating (swinging), it is necessary to set the vertical scanning frequency $f_V$ at points other than the V-side resonance point. In view of this, the frequency of the third AC voltage to be applied to the second piezoelectric actuators 205 and 206 (the vertical scanning frequency $f_V$) is desirably 120 Hz or lower (sawtooth wave), and more desirably 100 Hz or lower (sawtooth wave). Further, when the frequency of the third AC voltage to be applied to the second piezoelectric actuators 205 and 206 (the vertical scanning frequency $f_V$) exceeds 120 Hz, the reliability, durability, life time, etc. of the optical deflector 201 may deteriorate. Also in terms of this point, the frequency of the third AC voltage to be applied to the second piezoelectric actuators 205 and 206 (the vertical scanning frequency $f_V$) is desirably 120 Hz or lower (sawtooth wave), and more desirably 100 Hz or lower (sawtooth wave).

The above desirable vertical scanning frequencies $f_V$ have been derived for the first time by the inventor on the basis of the aforementioned findings.

Figure 11:
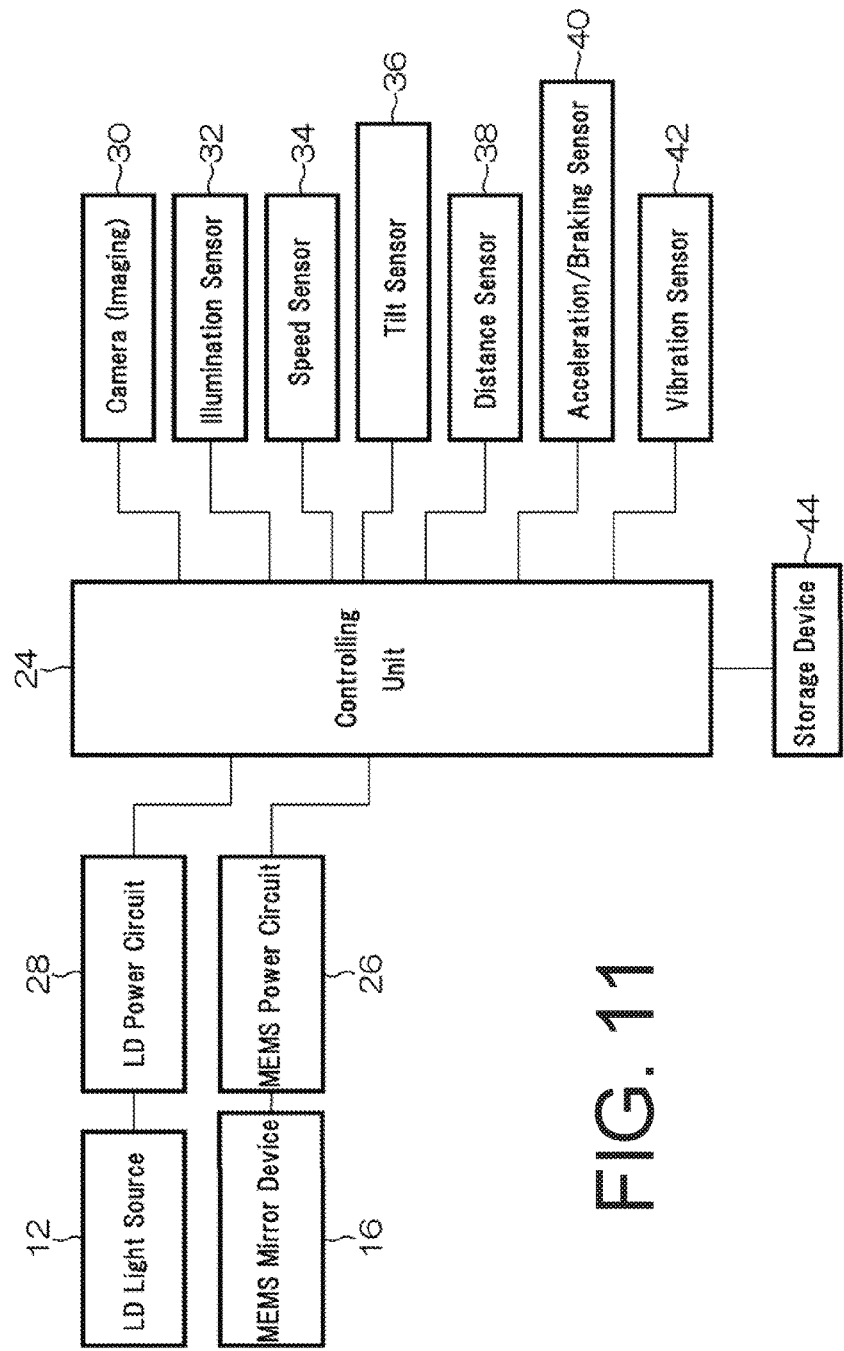
FIG. 11 is a block diagram illustrating an example of a configuration of a controlling system for controlling an excitation light source 12 and the optical deflector 201.

A description will next be given of the configuration example of a controlling system configured to control the excitation light source 12 and the optical deflector 201, which is illustrated in FIG. 11.

As illustrated in FIG. 11, the controlling system can be configured to include a controlling unit 24, and a MEMS power circuit 26, an LD power circuit 28, an imaging device 30, an illuminance sensor 32, a speed sensor 34, a tilt sensor 36, a distance sensor 38, an acceleration/braking sensor 40, a vibration sensor 42, a storage device 44, etc., which are electrically connected to the controlling unit 24.

The MEMS power circuit 26 can function as a piezoelectric actuator controlling unit (or mirror part controlling unit) in accordance with the control by the controlling unit 24. The MEMS power circuit 26 can be configured to apply the first and second AC voltages (for example, sinusoidal wave of 25 MHz) to the first piezoelectric actuators 203 and 204 to resonantly drive the first piezoelectric actuators 203 and 204, so that the mirror part 202 can be reciprocally swung about the first axis X1. The MEMS power circuit 26 can be further configured to apply the third AC voltage (for example, sawtooth wave of 55 Hz) to the second piezoelectric actuators 205 and 206 to none-resonantly drive the second piezoelectric actuators 205 and 206, so that the mirror part 202 can be reciprocally swung about the second axis X2.

In FIG. 12, the graph at the middle represents the state where the first and second AC voltages (for example, sinusoidal wave of 25 MHz) are applied to the first piezoelectric actuators 203 and 204, while the graph at the bottom represents the state where the third AC voltage (for example, sawtooth wave of 55 Hz) is applied to the second piezoelectric actuators 205 and 206. Also, in FIG. 12, the graph at the top represents the state where the excitation light source 12 emitting laser light rays is modulated at the modulation frequency $f_L$ (25 MHz) in synchronization with the reciprocating swing movement of the mirror part 202. Note that the shaded areas in FIG. 12 show that the excitation light source 12 is not lit.

Figure 13A:
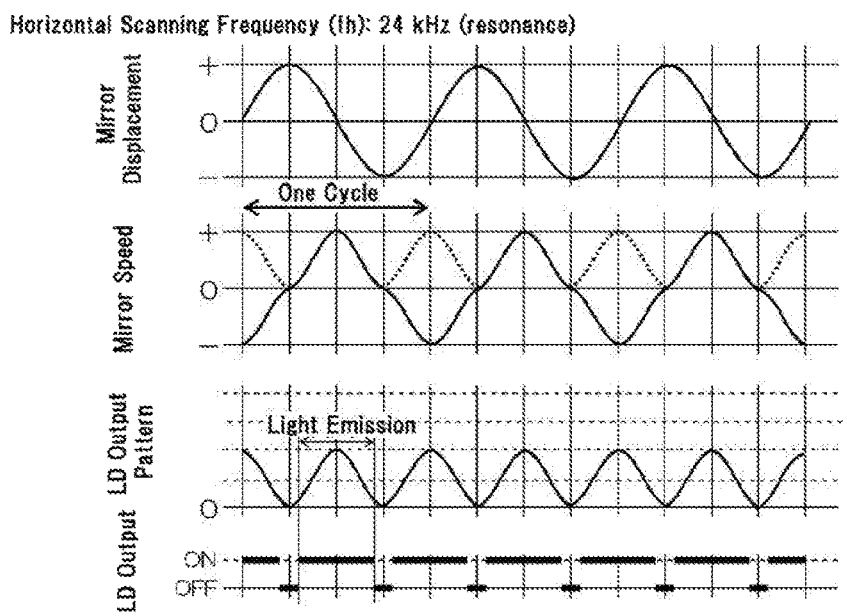
FIG. 13A includes graphs showing details of the first and second alternating voltages (for example, sinusoidal wave of 24 kHz) to be applied to the first piezoelectric actuators 203 and 204, an output pattern of the excitation light source 12 (laser light), etc., and FIG. 13B includes graphs showing details of the third alternating voltage (for example, sawtooth wave of 60 Hz) to be applied to the second piezoelectric actuators 205 and 206, an output pattern of the excitation light source 12 (laser light), etc.
Figure 13B:
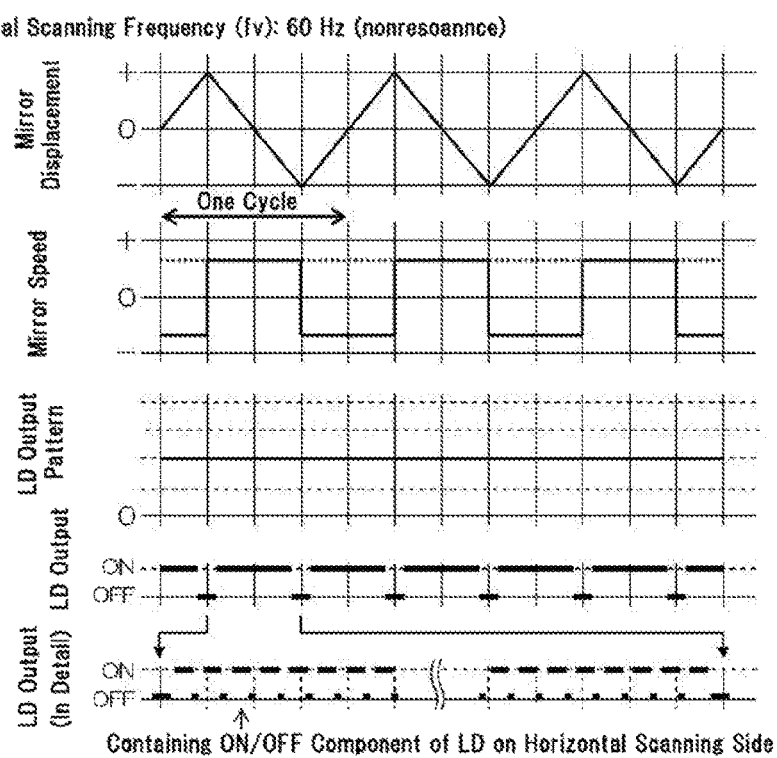

FIG. 13A includes graphs showing details of the first and second AC voltages (for example, sinusoidal wave of 24 kHz) to be applied to the first piezoelectric actuators 203 and 204, an output pattern of the excitation light source 12 (laser light), etc., and FIG. 13B includes graphs showing details of the third AC voltage (for example, sawtooth wave of 60 Hz) to be applied to the second piezoelectric actuators 205 and 206, an output pattern of the excitation light source 12 (laser light), etc.

The LD power circuit 28 can function as a modulation unit configured to modulate the excitation light source 12 (laser light rays) in synchronization with the reciprocating swing movement of the mirror part 202 in accordance with the control by the controlling unit 24.

The modulation frequency (modulation rate) of the excitation light source 12 (laser light rays) can be determined by the following formula.

Modulation Frequency $f_L$=(number of pixels)(frame rate:$f_V$)/(ratio of blanking time:$Br$).

On the basis of this formula, if the number of pixels is 300×600, $f_V$=70, and Br=0.5, then the modulation frequency $f_L$ is approximately 25 MHz=300×600×70/0.5. If the modulation frequency $f_L$ is approximately 25 MHz, the output of the excitation light source 12 can be controlled to turn ON/OFF the light source or emit light rays with various intensities in plural stepped degrees per $\frac{1}{25}$ MHz seconds (for example, zero is minimum and a plurality of stepwisely increased intensities).

The LD power circuit 28 can modulate the excitation light source 12 (laser light rays) on the basis of a predetermined light distribution pattern (digital data) stored in the storage device 44 so that a two-dimensional image corresponding to the predetermined light distribution pattern is drawn on the wavelength converting member 18 by means of laser light rays as excitation light with which the optical deflector 201 two-dimensionally scans (in the horizontal and vertical directions).

Examples of the predetermined light distribution pattern (digital data) may include a high-beam light distribution pattern (digital data), a low-beam distribution pattern (digital data), a highway driving light distribution pattern (digital data), and a town-area driving light distribution pattern (digital data). The predetermined light distribution patterns (digital data) can include the outer shapes of respective light distribution patterns, light intensity distributions (illuminance distribution), and the like. As a result, the two-dimensional image drawn on the wavelength converting member 18 by means of laser light rays as excitation light with which the optical deflector 201 two-dimensionally scans (in the horizontal and vertical directions) can have the outer shape corresponding to the light distribution pattern (for example, high-beam light distribution pattern) and the light intensity distribution (for example, the light intensity distribution with a maximum value at its center required for such a high-beam light distribution pattern). Note that the switching between various predetermined light distribution patterns (digital data) can be performed by operating a selector switch to be provided within a vehicle interior.

FIGS. 14A, 14B, and 14C illustrate examples of scanning patterns of laser light (spot-shaped laser light) with which the optical deflector 201 two-dimensionally scans (in the horizontal direction and the vertical direction).

Examples of the scanning patterns in the horizontal direction of laser light (spot-shaped laser light) scanned by the optical deflector 201 in a two-dimensional manner (in the horizontal direction and the vertical direction) may include the pattern with bidirectional scanning (reciprocating scanning) as illustrated in FIG. 14A and the pattern with one-way scanning (forward scanning or return scanning only) as illustrated in FIG. 14B.

Furthermore, examples of the scanning patterns in the vertical direction of laser light (spot-shaped laser light) scanned by the optical deflector 201 in a two-dimensional manner (in the horizontal direction and the vertical direction) may include the pattern densely scanned one line by one line, and the pattern scanned every other line similar to the interlace scheme as illustrated in FIG. 14C.

Figure 15A:
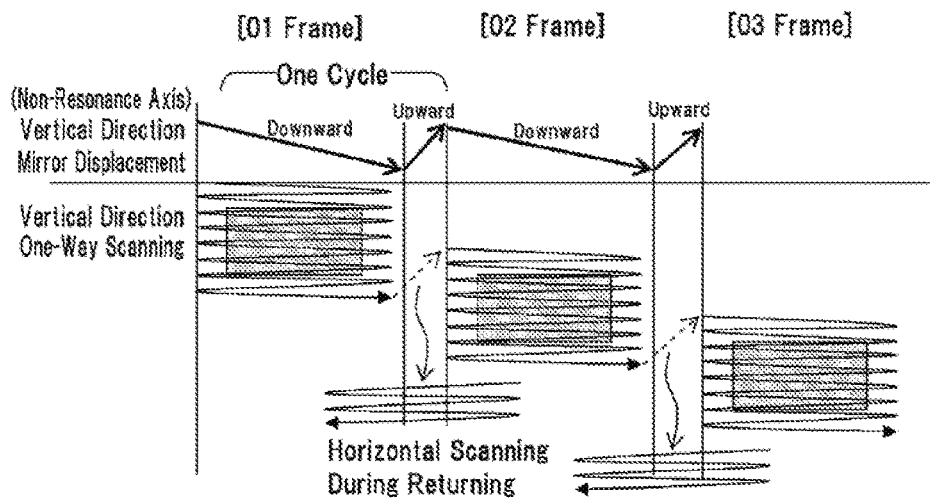
FIGS. 15A and 15B illustrate examples of scanning patterns of laser light (spot-shaped laser light) with which the optical deflector 201 can two-dimensionally scan (in the horizontal direction and the vertical direction)
Figure 15B:
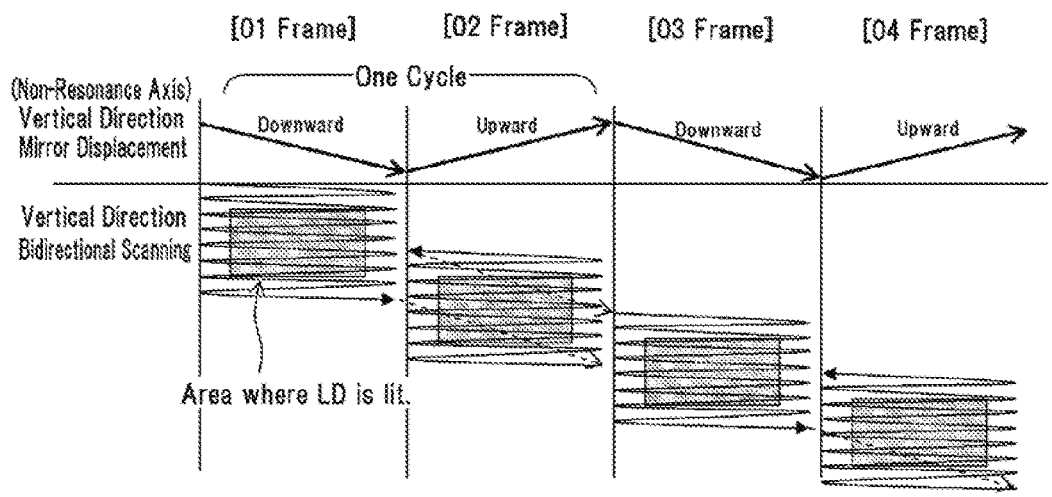

Furthermore, examples of the scanning patterns in the vertical direction of laser light (spot-shaped laser light) scanned by the optical deflector 201 in a two-dimensional manner (in the horizontal direction and the vertical direction) may include the pattern in which the optical deflector scans from the upper end to the lower end repeatedly, as illustrated in FIG. 15A, and the pattern in which the optical deflector scans from the upper end to the lower end and then from the lower end to the upper end repeatedly, as illustrated in FIG. 15B.

Incidentally, when the scanning reaches the left, right, upper, or lower end of the wavelength converting member 18 (screen), the scanning light may be returned to the original starting point or another designated point. This time period is called as blanking, during which the excitation light source 12 is not lit.

A description will next be given of other examples of control by the controlling system illustrated in FIG. 11.

The controlling system illustrated in FIG. 11 can perform various types of control other than the above-described exemplary control. For example, the controlling system can achieve a variable light-distribution vehicle headlamp (ADB: Adaptive Driving Beam). For example, the controlling unit 28 can determine whether an object which is prohibited from being irradiated with light (such as pedestrians and oncoming vehicles) exists within a predetermined light distribution pattern formed on a virtual vertical screen on the basis of detection results of the imaging device 30 functioning as a detector for detecting an object present in front of its vehicle body. If it is determined that the object exists within the pattern, the controlling unit 28 can control the excitation light source 12 in such a manner that the output of the excitation light source 12 is stopped or lowered during the time when an area on the wavelength converting member 18 corresponding to an area of the light distribution pattern where the object exists is being scanned with the laser light rays as the excitation light.

Furthermore, on the basis of the finding by the inventor of the present application, i.e., on the basis of the fact where when the travelling speed is increased, the vertical scanning frequency $f_V$ at which a person does not sense flickering tends to increase, the driving frequency (vertical scanning frequency $f_V$) for nonresonantly driving the second piezoelectric actuators 205 and 206 can be changed on the basis of the travelling speed as a result of detection by the speed sensor 34 provided to the vehicle body. For example, it is possible to increase the vertical scanning frequency $f_V$ as the traveling speed increases. When doing so, the correspondence between the vertical scanning frequencies $f_V$ and the traveling speeds (or ranges of traveling speed) is stored in the storage device 44 in advance (meaning that the relationship of the increased vertical scanning frequency $f_V$ corresponding to the increased travelling speed or range is confirmed in advance). Then, the vertical scanning frequency $f_V$ is read out from the storage device 44 on the basis of the detected vehicle traveling speed detected by the speed sensor 34. After that, the MEMS power circuit 26 can apply the third AC voltage (with the read-out vertical scanning frequency) to the second piezoelectric actuators 205 and 206 to thereby nonresonantly drive the second piezoelectric actuators 205 and 206.

Furthermore, on the basis of the finding by the inventor of the present application, i.e. on the basis of the fact where the vertical scanning frequency $f_V$ at which a person does not sense flickering is higher at the time of stopping (0 km/h) than at the time of travelling (50 km/h to 150 km/h), the vertical scanning frequency $f_V$ at the time of stopping (0 km/h) can be increased as compared with that at the time of travelling (50 km/h to 150 km/h). This can be achieved by the following method. That is, for example, the vertical scanning frequency $f_V 1$ at the time of stopping and the vertical scanning frequency $f_V 2$ at the time of traveling are stored in the storage device 44 in advance ($f_V 1 > f_V 2$), and it is determined whether the vehicle body is stopped or not on the basis of the detection results from the speed sensor 34. When it is determined that the vehicle body is traveling, the vertical scanning frequency $f_V 2$ at the time of traveling is read out from the storage device 44. After that, the MEMS power circuit 26 can apply the third AC voltage (with the read-out vertical scanning frequency $f_V 2$ at the time of traveling) to the second piezoelectric actuators 205 and 206 to thereby nonresonantly drive the second piezoelectric actuators 205 and 206. On the other hand, when it is determined that the vehicle body is stopped, the vertical scanning frequency $f_V 1$ at the time of stopping is read out from the storage device 44. After that, the MEMS power circuit 26 can apply the third AC voltage (with the read-out vertical scanning frequency $f_V 1$ at the time of stopping) to the second piezoelectric actuators 205 and 206 to thereby nonresonantly drive the second piezoelectric actuators 205 and 206.

Furthermore, on the basis of the finding by the inventor of the present application, i.e. on the basis of the fact where when the illuminance is increased, the vertical scanning frequency $f_V$ at which a person does not sense flickering tends to increase, the driving frequency (vertical scanning frequency $f_V$) for nonresonantly driving the second piezoelectric actuators 205 and 206 can be changed on the basis of the illuminance detected by the illumination sensor 32 provided to the vehicle body (for example, the illuminance sensed by a driver). For example, it is possible to increase the vertical scanning frequency $f_V$ as the illuminance increases. When doing so, the correspondence between the vertical scanning frequencies $f_V$ and the illuminances (or ranges of illuminance) is stored in the storage device 44 in advance (meaning that the relationship of the increased vertical scanning frequency $f_V$ corresponding to the increased illuminance or range is confirmed in advance). Then, the vertical scanning frequency $f_V$ is read out from the storage device 44 on the basis of the detected illuminance value detected by the illuminance sensor 32. After that, the MEMS power circuit 26 can apply the third AC voltage (with the read-out vertical scanning frequency $f_V$) to the second piezoelectric actuators 205 and 206 to thereby nonresonantly drive the second piezoelectric actuators 205 and 206.

In the same manner, the driving frequency (vertical scanning frequency $f_V$) for nonresonantly driving the second piezoelectric actuators 205 and 206 can be changed on the basis of the distance between the vehicle body and an object to be irradiated with light detected by the distance sensor 38 provided to the vehicle body.

In the same manner, the driving frequency (vertical scanning frequency $f_V$) for nonresonantly driving the second piezoelectric actuators 205 and 206 can be changed on the basis of the detection results by the vibration sensor 42 provided to the vehicle body.

In the same manner, the driving frequency (vertical scanning frequency $f_V$) for nonresonantly driving the second piezoelectric actuators 205 and 206 can be changed according to a predetermined light distribution pattern. For example, the driving frequency (vertical scanning frequency $f_V$) for nonresonantly driving the second piezoelectric actuators 205 and 206 can be changed between the highway driving light distribution pattern and the town-area driving light distribution pattern.

By making the vertical scanning frequency $f_V$ variable as described above, the optical deflector 201 can be improved in terms of the reliability, durability, life time, etc. when compared with the case where the driving frequency for nonresonantly driving the second piezoelectric actuators 205 and 206 is made constant.

In place of the optical deflector 201 of the one-dimensional nonresonance/one-dimensional resonance type (2-D optical scanner (fast resonant and slow static combination)) with the above-described configuration, a two-dimensional nonresonance type optical deflector 161 can be utilized.

<Two-Dimensional Nonresonance Type>

Figure 16:
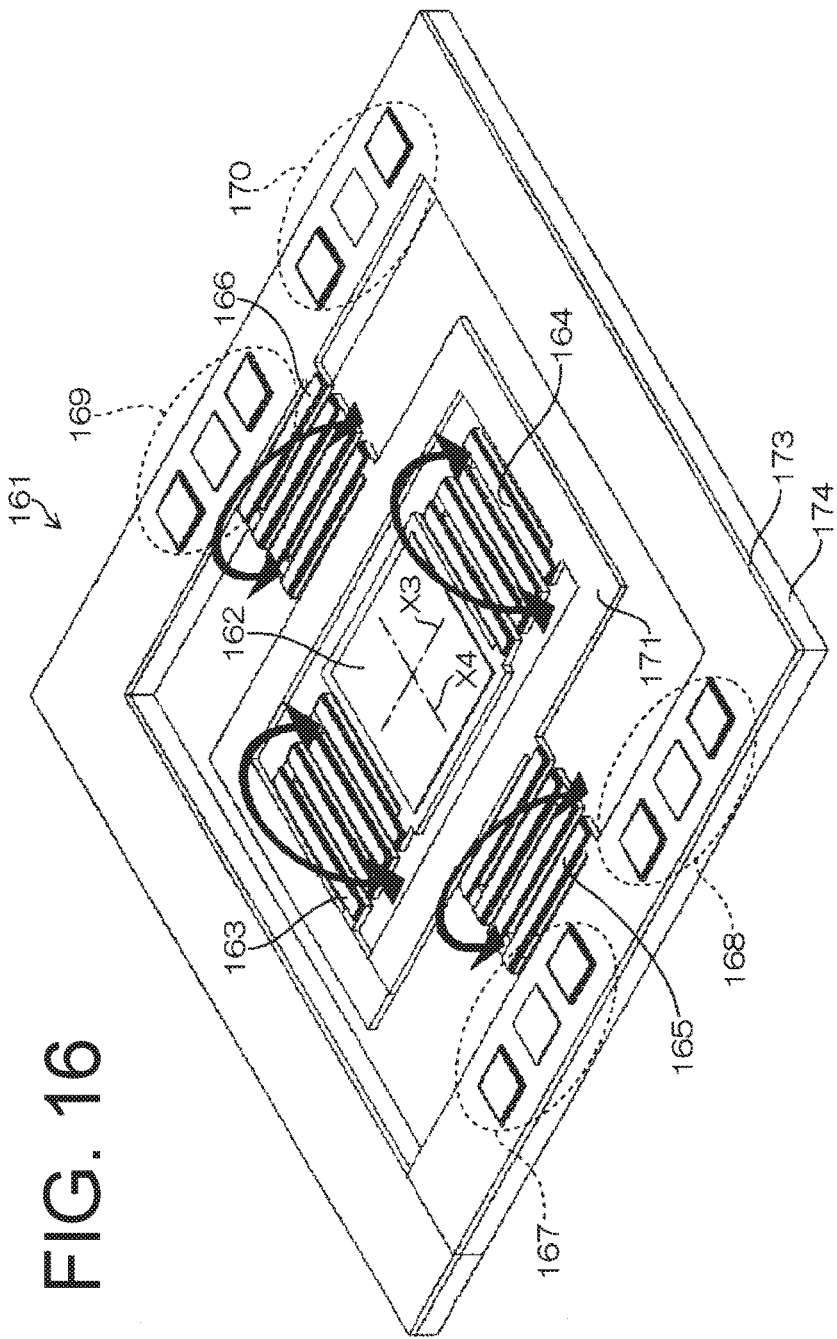
FIG. 16 is a perspective view of an optical deflector 161 of a two-dimensional nonresonance type.

FIG. 16 is a perspective view of an optical deflector 161 of a two-dimensional nonresonance type.

As illustrated in FIG. 16, the optical deflector 161 of the two-dimensional nonresonance type can be configured to include a mirror part 162 (referred to as a MEMS mirror), piezoelectric actuators 163 to 166 configured to drive the mirror part 162, a movable frame 171 configured to support the piezoelectric actuators 163 to 166, and a base 174.

The configuration and action of the piezoelectric actuators 163 to 166 can be the same as those of the second piezoelectric actuators 205 and 206 of the optical deflector 201 of the one-dimensional nonresonance/one-dimensional resonance type.

In this reference example, each of first piezoelectric actuators 163 and 164 out of the piezoelectric actuators 163 to 166 can be applied with a first AC voltage as its driving voltage. At this time, the applied voltage can be an alternating voltage with a frequency equal to or lower than a predetermined value smaller than the mechanical resonance frequency (first resonance point) of the mirror part 162 to thereby nonresonantly drive the first piezoelectric actuators 163 and 164. This can cause the mirror part 162 to be reciprocately swung about the third axis X3 with respect to the movable frame 171, so that the excitation light rays from the excitation light source 12 and incident on the mirror part 162 can scan in a first direction (for example, in the horizontal direction).

Furthermore, a second AC voltage can be applied to each of the second piezoelectric actuators 165 and 166 as a drive voltage. At this time, the applied voltage can be an alternating voltage with a frequency equal to or lower than a predetermined value smaller than the mechanical resonance frequency (first resonance point) of the movable frame 171 including the mirror part 162 and the first piezoelectric actuators 165 and 166 to thereby nonresonantly drive the movable frame 171. This can cause the mirror part 162 to be reciprocately swung about the fourth axis X4 with respect to the base 174, so that the excitation light rays from the excitation light source 12 and incident on the mirror part 162 can scan in a second direction (for example, in the vertical direction).

Figure 17A:
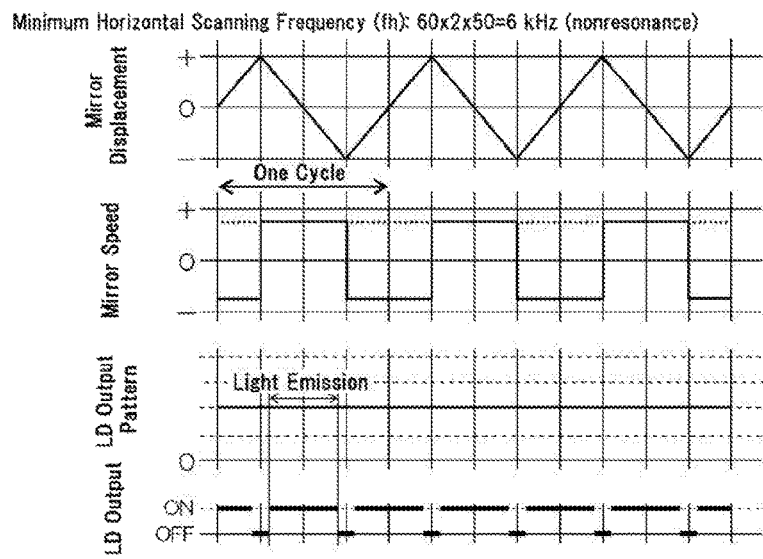
FIG. 17A includes graphs showing details of the first alternating voltage (for example, sawtooth wave of 6 kHz) to be applied to first piezoelectric actuators 163 and 164, an output pattern of the excitation light source 12 (laser light), etc., and FIG. 17B includes graphs showing details of the third alternating voltage (for example, sawtooth wave of 60 Hz) to be applied to second piezoelectric actuators 165 and 166, an output pattern of the excitation light source 12 (laser light), etc.
Figure 17B:
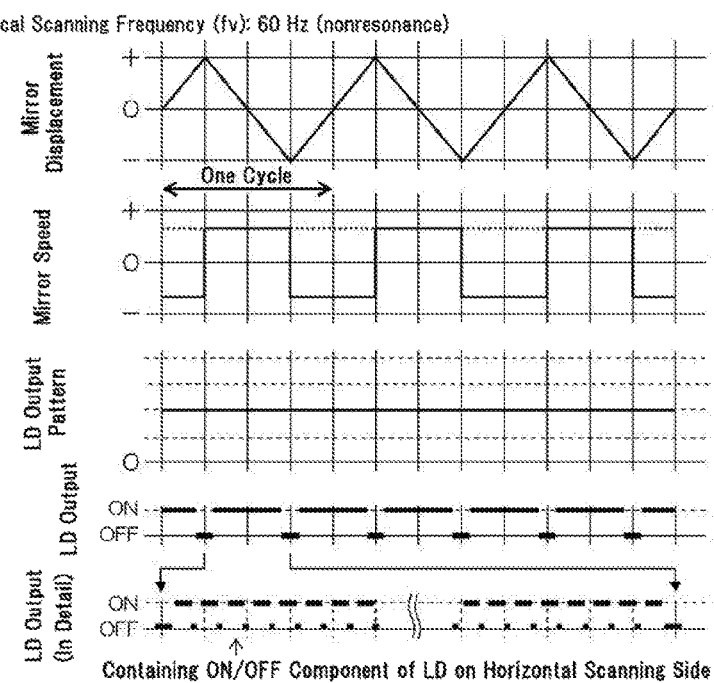

FIG. 17A includes graphs showing details of the first AC voltage (for example, sawtooth wave of 6 kHz) to be applied to the first piezoelectric actuators 163 and 164, an output pattern of the excitation light source 12 (laser light), etc., and FIG. 17B includes graphs showing details of the third alternating voltage (for example, sawtooth wave of 60 Hz) to be applied to the second piezoelectric actuators 165 and 166, an output pattern of the excitation light source 12 (laser light), etc.

The respective piezoelectric actuators 163 to 166 can be driven, so that the laser light rays as the excitation light rays from the excitation light source 12 can scan two-dimensionally (in the horizontal and vertical directions).

In place of the optical deflector 201 of the one-dimensional nonresonance/one-dimensional resonance type (2-D optical scanner (fast resonant and slow static combination)) with the above-described configuration, a two-dimensional resonance type optical deflector 201A can be utilized.

<Two-Dimensional Resonance Type>

Figure 18:
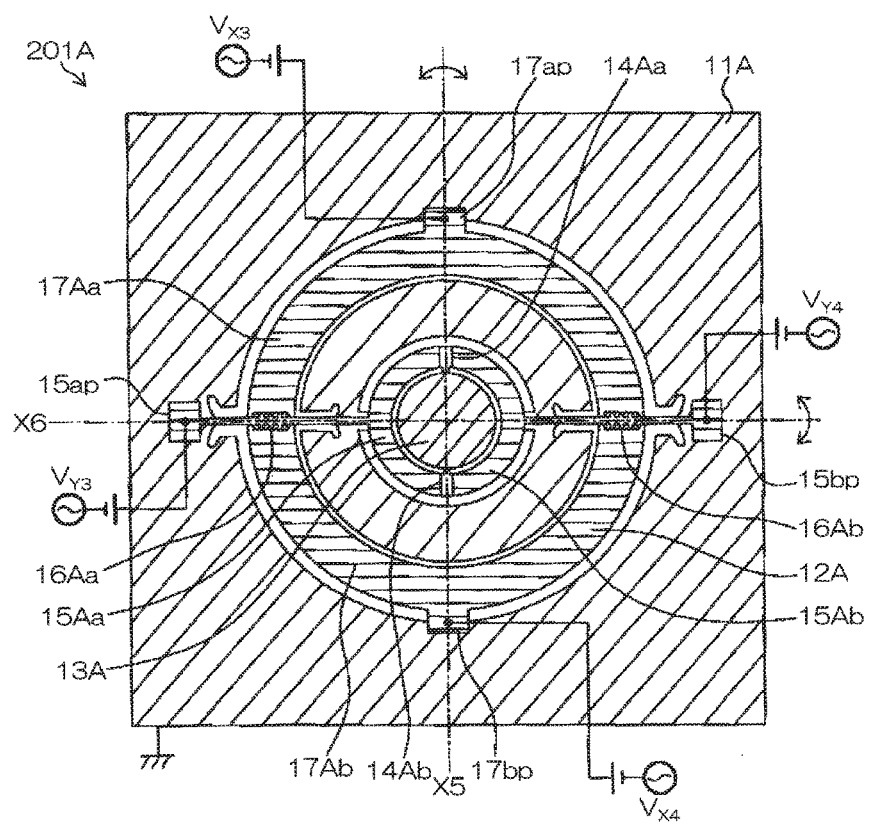
FIG. 18 is a plan view illustrating an optical deflector 201A of a two-dimensional resonance type.

FIG. 18 is a perspective view of an optical deflector 201A of a two-dimensional resonance type.

As illustrated in FIG. 18, the optical deflector 201A of the two-dimensional resonance type can be configured to include a mirror part 13A (referred to as a MEMS mirror), first piezoelectric actuators 15Aa and 15Ab configured to drive the mirror part 13A via torsion bars 14Aa and 14Ab, a movable frame 12A configured to support the first piezoelectric actuators 15Aa and 15Ab, second piezoelectric actuators 17Aa and 17Ab configured to drive the movable frame 12A, and a base 11A configured to support the second piezoelectric actuators 17Aa and 17Ab.

The configuration and action of the piezoelectric actuators 15Aa, 15Ab, 17Aa, and 17Ab can be the same as those of the first piezoelectric actuators 203 and 204 of the optical deflector 201 of the one-dimensional nonresonance/one-dimensional resonance type.

In this reference example, the first piezoelectric actuator 15Aa can be applied with a first AC voltage as its driving voltage while the other first piezoelectric actuator 15Ab can be applied with a second AC voltage as its driving voltage. Here, the first AC voltage and the second AC voltage can be different from each other in phase, such as a sinusoidal wave with an opposite phase or shifted phase. In this case, an AC voltage with a frequency close to a mechanical resonance frequency (first resonance point) of the mirror part 13A including the torsion bars 14Aa and 14Ab can be applied to resonantly drive the first piezoelectric actuators 15Aa and 15Ab. This can cause the mirror part 13A to be reciprocately swung about the fifth axis X5 with respect to the movable frame 12A, so that the laser light rays as excitation light rays from the excitation light source 12 and incident on the mirror part 13A can scan in a first direction (for example, in the horizontal direction).

A third AC voltage can be applied to the second piezoelectric actuator 17Aa as a drive voltage while a fourth AC voltage can be applied to the other second piezoelectric actuator 17Ab as a drive voltage. Here, the third AC voltage and the fourth AC voltage can be different from each other in phase, such as a sinusoidal wave with an opposite phase or shifted phase. In this case, an AC voltage with a frequency near the mechanical resonance frequency (first resonance point) of the movable frame 12A including the mirror part 13A and the first piezoelectric actuators 15Aa and 15Ab can be applied to resonantly drive the first piezoelectric actuators 17Aa and 17Ab. This can cause the mirror part 13A to be reciprocately swung about the sixth axis X6 with respect to the base 11A, so that the laser light rays as excitation light rays from the excitation light source 12 and incident on the mirror part 13A can scan in a second direction (for example, in the vertical direction).

Figure 19A:
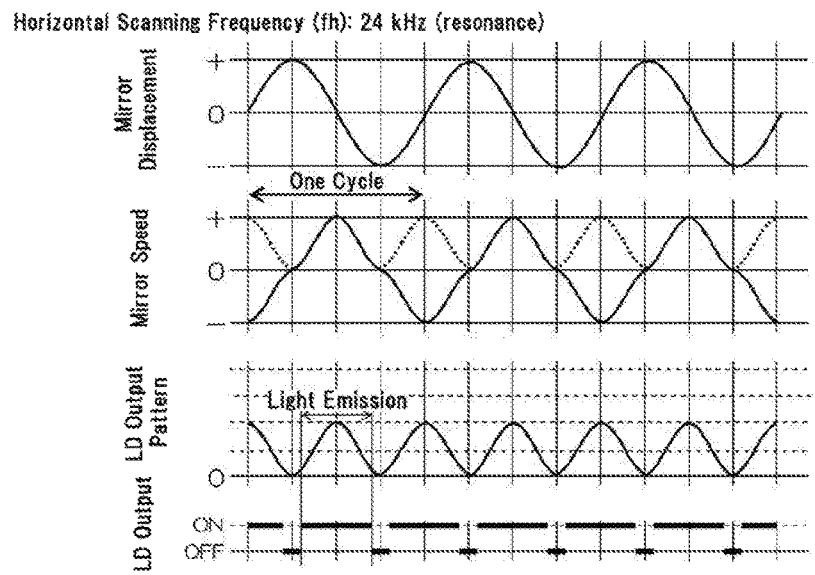
FIG. 19A includes graphs showing details of the first alternating voltage (for example, sinusoidal wave of 24 kHz) to be applied to first piezoelectric actuators 15Aa and 15Ab, an output pattern of the excitation light source 12 (laser light), etc., and FIG. 19B includes graphs showing details of the third alternating voltage (for example, sinusoidal wave of 12 Hz) to be applied to second piezoelectric actuators 17Aa and 17Ab, an output pattern of the excitation light source 12 (laser light), etc.
Figure 19B:
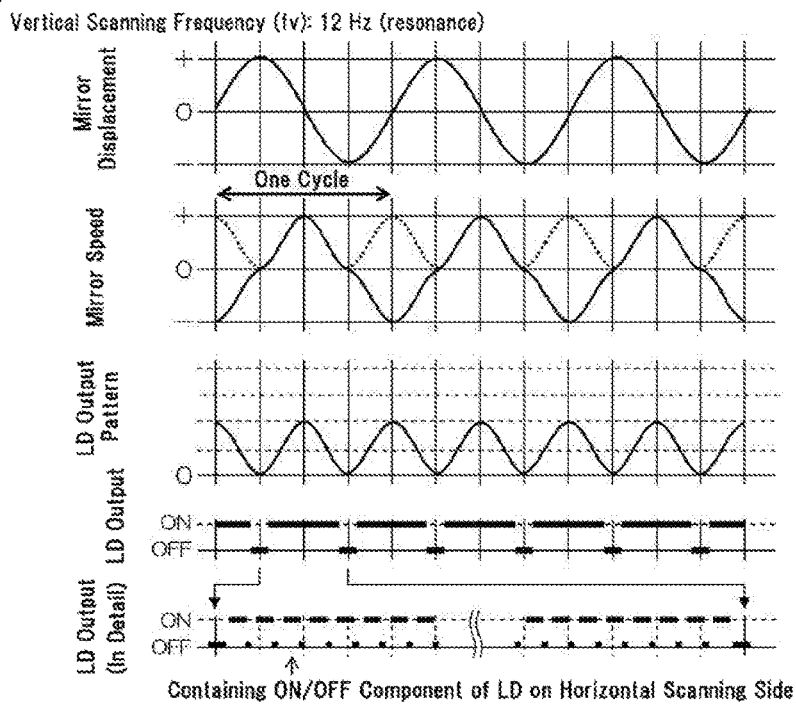

FIG. 19A includes graphs showing details of the first AC voltage (for example, sinusoidal wave of 24 kHz) to be applied to the first piezoelectric actuators 15Aa and 15Ab, an output pattern of the excitation light source 12 (laser light), etc., and FIG. 19B includes graphs showing details of the third AC voltage (for example, sinusoidal wave of 12 Hz) to be applied to the second piezoelectric actuators 17Aa and 17Ab, an output pattern of the excitation light source 12 (laser light), etc.

The respective piezoelectric actuators 15Aa, 15Ab, 17Aa, and 17Ab can be driven, so that the laser light rays as the excitation light rays from the excitation light source 12 can scan two-dimensionally (in the horizontal and vertical directions).

As described above, according to this reference example, even when frequencies remarkably lower than 220 Hz that is conventionally considered to cause the flickering to occur in vehicle lighting fixtures such as an automobile headlamp are utilized or frame rates remarkably lower than 220 fps, i.e., "55 fps or more," "55 fps to 120 fps," "55 fps to 100 fps," or "70 fps±10 fps" are utilized, the occurrence of flickering can be suppressed.

Furthermore, according to this reference example, frequencies remarkably lower than 220 Hz are utilized (or frame rates remarkably lower than 220 fps), i.e., "55 fps or more," "55 fps to 120 fps," "55 fps to 100 fps," or "70 fps±10 fps" are utilized, and thus it is possible to improve the reliability, durability, and life time of the optical deflector 201 when compared with the case where the frequency of 220 Hz or higher or frame rates of 220 fps or more are used.

Furthermore, according to this reference example, the drive frequency used for nonresonantly driving the second piezoelectric actuators 205 and 206 can be made variable, and therefore, the reliability, durability, and life time of the optical deflector 201 can be improved when compared with the case where the drive frequency used for nonresonantly driving the second piezoelectric actuators 205 and 206 are constant.

A description will now be given of a vehicle lighting unit using three optical deflectors 201 of one-dimensional nonresonance/one-dimensional resonance type (2-D optical scanner (fast resonant and slow static combination)) with reference to the associated drawings as another reference example. It is appreciated that the aforementioned various types of optical deflectors discussed in the above reference examples can be used in place of the one-dimensional nonresonance/one-dimensional resonance type optical deflector 201.

Figure 21:
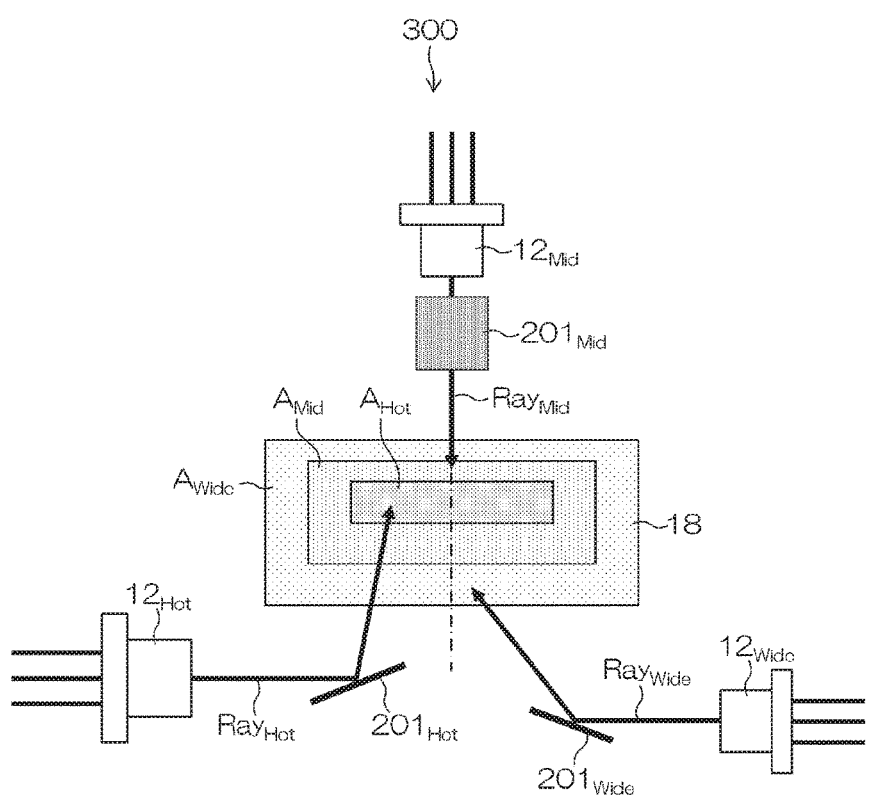
FIG. 21 is a schematic diagram illustrating a vehicle lighting fixture 300 according to a reference example.
Figure 22:
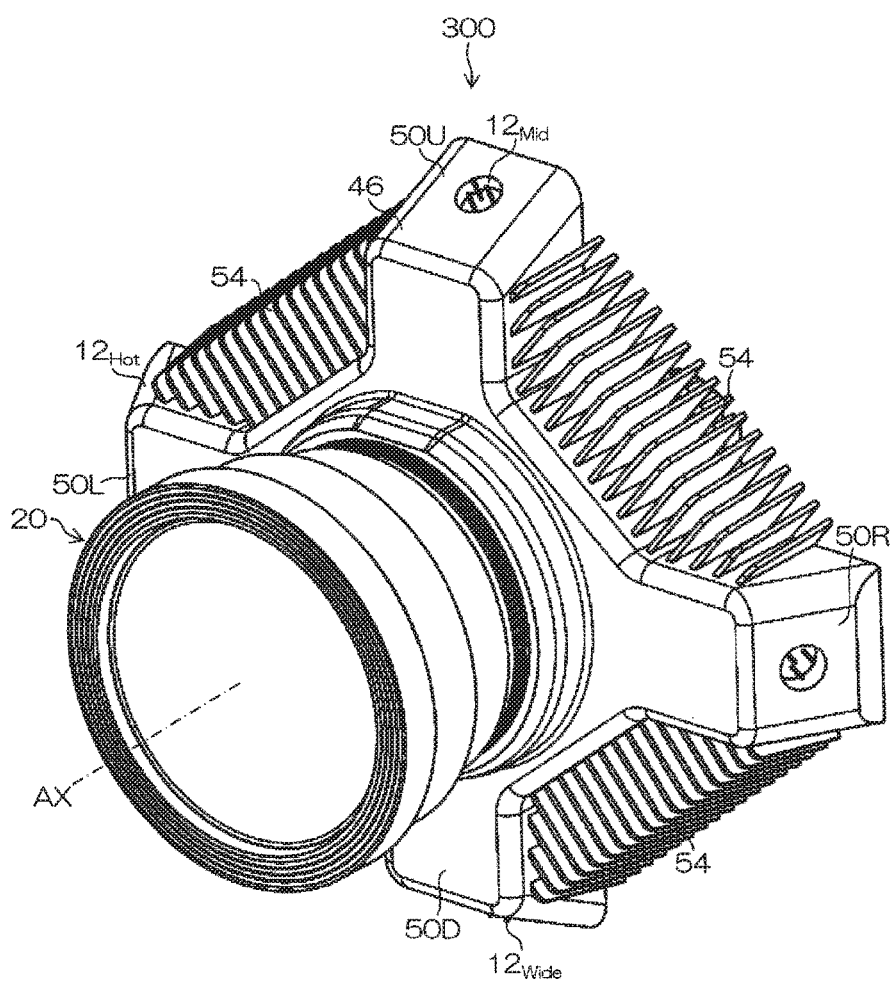
FIG. 22 is a perspective view illustrating the vehicle lighting fixture 300.
Figure 23:
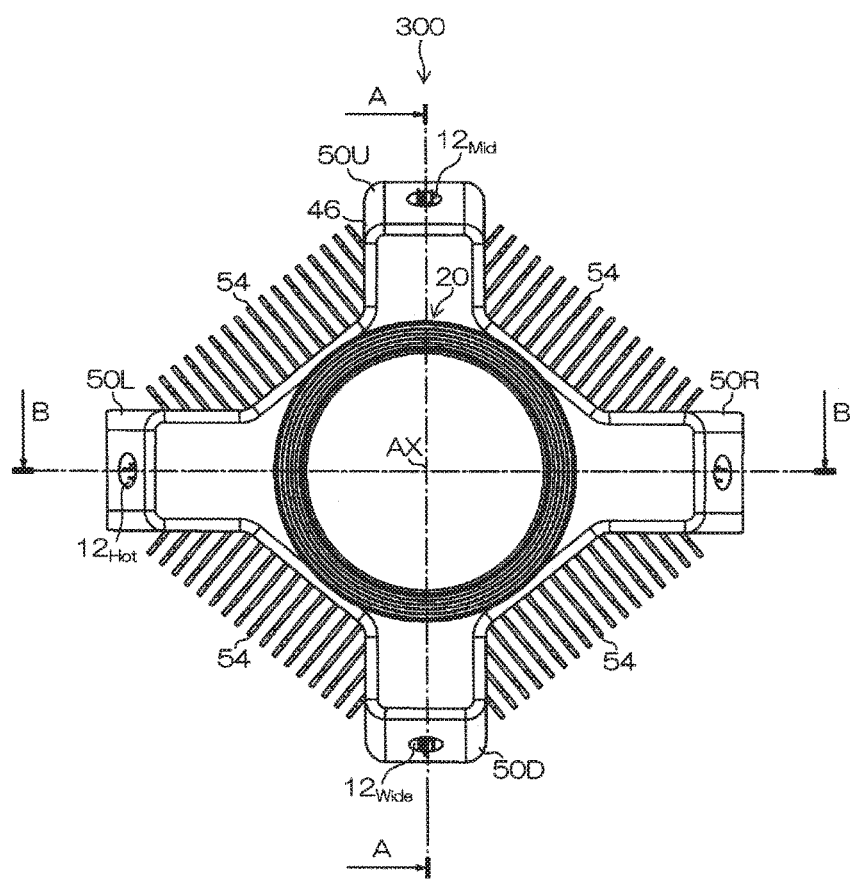
FIG. 23 is a front view illustrating the vehicle lighting fixture 300.
Figure 24:
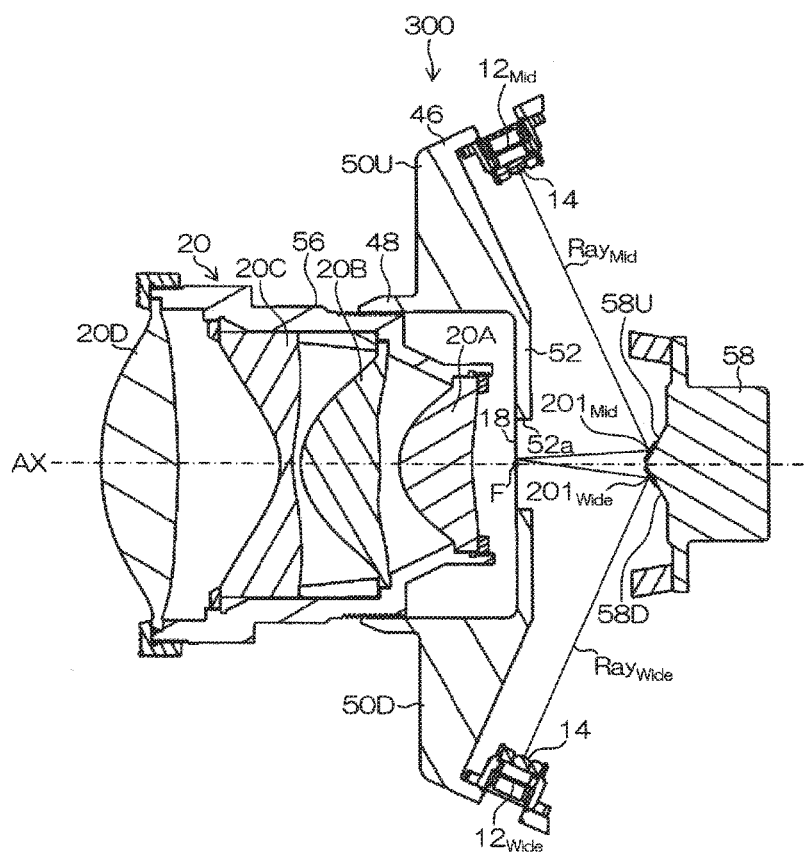
FIG. 24 is a cross-sectional view of the vehicle lighting fixture 300 of FIG. 23 taken along line A-A.
Figure 25:
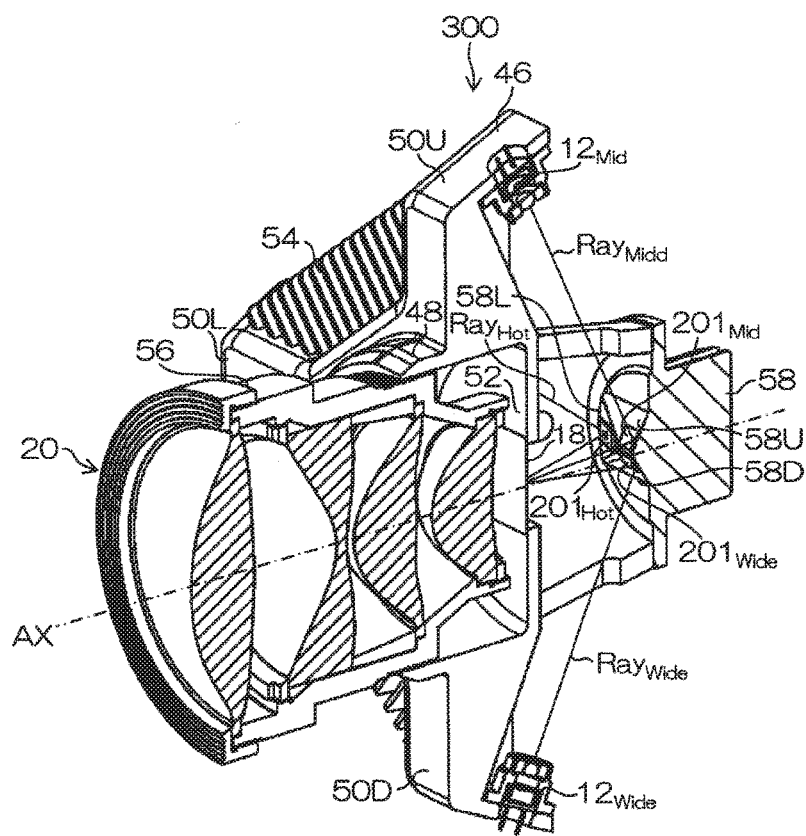
FIG. 25 is a perspective view including the cross-sectional view of FIG. 24 illustrating the vehicle lighting fixture 300 of FIG. 23 taken along line A-A.

FIG. 21 is a schematic diagram illustrating a vehicle lighting fixture 300 according to another reference example that can be employed in the presently disclosed subject matter. FIG. 22 is a perspective view illustrating the vehicle lighting fixture 300. FIG. 23 is a front view illustrating the vehicle lighting fixture 300. FIG. 24 is a cross-sectional view of the vehicle lighting fixture 300 of FIG. 23 taken along line A-A. FIG. 25 is a perspective view including the cross-sectional view of FIG. 24 illustrating the vehicle lighting fixture 300 of FIG. 23 taken along line A-A. FIG. 26 is a diagram illustrating a predetermined light distribution pattern P formed on a virtual vertical screen provided in front of a vehicle body (assumed to be disposed in front of a vehicle body approximately 25 m away from the vehicle front face) by the vehicle lighting fixture 300 of this reference example.

As illustrated in FIG. 26, the vehicle lighting fixture 300 of this reference example can be configured to form a predetermined light distribution pattern P (for example, high-beam light distribution pattern) excellent in far-distance visibility and having a better sense of light distribution. The predetermined light distribution pattern P can be configured such that the light intensity ($P_{Hot}$) at its center is relatively high and the light intensity is gradually lowered from the center to the periphery ($P_{Hot} \rightarrow P_{Mid} \rightarrow P_{Wide}$).

Next, the vehicle lighting fixture 300 of this reference example can be configured to form a predetermined light distribution pattern P will be compared with the vehicle lighting fixture 10 of the previously described reference examples. In the previously described reference example as illustrated in FIG. 2, the vehicle lighting fixture 10 can include the single excitation light source 12 and the single optical deflector 201. In this reference example as illustrated in FIG. 21, the vehicle lighting fixture 300 can include three excitation light sources (wide-zone excitation light source $12_{Wide}$, middle-zone excitation light source $12_{Mid}$, and hot-zone excitation light source $12_{Hot}$), and three optical deflectors (wide-zone optical deflector $201_{Wide}$, middle-zone optical deflector $201_{Mid}$, and hot-zone optical deflector $201_{Hot}$). In this point, this reference example is different from the previously described reference example.

The configuration of the vehicle lighting fixture 300 of this reference example can have the same configuration as that of the vehicle lighting fixture 10 of the previously described reference example except for the above different point. Hereinbelow, a description will be given of the different point of this reference example from the previously described reference example, and the same or similar components of this reference example as those of the previously described reference example will be denoted by the same reference numerals and a description thereof will be omitted as appropriate.

In the specification, the term "hot-zone" member/part means a member/part for use in forming a hot-zone partial light distribution pattern (with highest intensity), the term "middle-zone" member/part means a member/part for use in forming a middle-zone partial light distribution pattern (having a wider area and formed by light diffused more than the hot-zone partial light distribution pattern), and the term "wide-zone" member/part means a member/part for use in forming a wide-zone partial light distribution pattern (having a more wider area and formed by light diffused more than the middle-zone partial light distribution pattern), unless otherwise specified.

The vehicle lighting fixture 300 can be configured, as illustrated in FIGS. 21 to 25, as a vehicle headlamp. The vehicle lighting fixture 300 can include three excitation light sources $12_{Wide}$, $12_{Mid}$, and $12_{Hot}$, three optical deflectors $201_{Wide}$, $201_{Mid}$, and $201_{Hot}$ each including a mirror part 202, a wavelength converting member 18, a projection lens assembly 20, etc. The three optical deflectors $201_{Wide}$, $201_{Mid}$, and $201_{Hot}$ can be provided corresponding to the three excitation light sources $12_{Wide}$, $12_{Mid}$, and $12_{Hot}$. The wavelength converting member 18 can include three scanning areas $A_{Wide}$, $A_{Mid}$, and $A_{Hot}$ (see FIG. 21) provided corresponding to the three optical deflectors $201_{Wide}$, $201_{Mid}$, and $201_{Hot}$. Partial light intensity distributions can be formed within the respective scanning areas $A_{Wide}$, $A_{Mid}$, and $A_{Hot}$, and can be projected through the projection lens assembly 20 serving as an optical system for forming the predetermined light distribution pattern P. Note that the number of the excitation light sources 12, the optical deflectors 201, and the scanning areas A is not limited to three, and may be two or four or more.

As illustrated in FIG. 24, the projection lens assembly 20, the wavelength converting member 18, and the optical deflectors $201_{Wide}$, $201_{Mid}$, and $201_{Hot}$ can be disposed in this order along a reference axis AX (or referred to as an optical axis) extending in the front-rear direction of a vehicle body.

The vehicle lighting fixture 300 can further include a laser holder 46. The laser holder 46 can hold the excitation light sources $12_{Wide}$, $12_{Mid}$, and $12_{Hot}$ with a posture tilted in such a manner that excitation light rays $Ray_{Wide}$, $Ray_{Mid}$, and $Ray_{Hot}$ are directed rearward and toward the reference axis AX while the excitation light sources $12_{Wide}$, $12_{Mid}$, and $12_{Hot}$ surround the reference axis AX.

Specifically, the excitation light sources $12_{Wide}$, $12_{Mid}$, and $12_{Hot}$ can be disposed by being fixed to the laser holder 46 in the following manner.

As illustrated in FIG. 23, the laser holder 46 can be configured to include a tubular part 48 extending in the reference axis AX, and extension parts 50U, 50D, 50L, and 50R each radially extending from the outer peripheral face at its upper, lower, left, or right part in an upper, lower, left, or right direction substantially perpendicular to the reference axis AX. Specifically, the respective extension parts 50U, 50D, 50L, and 50R can be inclined rearward at the tip ends thereof, as illustrated in FIG. 24. Between the adjacent extension parts 50U, 50D, SOL, and 50R, there can be formed a heat dissipation part 54 (heat dissipation fin), as illustrated in FIG. 23.

As illustrated in FIG. 24, the wide-zone excitation light source $12_{Wide}$ can be fixed to the tip end of the extension part 50D with a posture tilted so that the excitation light rays $Ray_{Wide}$ are directed in a rearward and obliquely upward direction. Similarly, the middle-zone excitation light source $12_{Mid}$ can be fixed to the tip end of the extension part 50U with a posture tilted so that the excitation light rays $Ray_{Mid}$ are directed in a rearward and obliquely downward direction. Similarly, the hot-zone excitation light source $12_{Hot}$ can be fixed to the tip end of the extension part SOL with a posture tilted so that the excitation light rays $Ray_{Hot}$ are directed in a rearward and obliquely rightward direction when viewed from its front side.

The vehicle lighting fixture 300 can further include the lens holder 56 to which the projection lens assembly 20 (lenses 20A to 20D) is fixed. The lens holder 56 can be screwed at its rear end to the opening of the tubular part 48 so as to be fixed to the tubular part 48.

A condenser lens 14 can be disposed in front of each of the excitation light sources $12_{Wide}$, $12_{Mid}$, and $12_{Hot}$. The excitation light rays $Ray_{Wide}$, $Ray_{Mid}$, and $Ray_{Hot}$ can be output from the excitation light sources $12_{Wide}$, $12_{Mid}$, and $12_{Hot}$ and condensed by the respective condenser lenses 14 (for example, collimated) to be incident on the respective mirror parts 202 of the optical deflectors $201_{Wide}$, $201_{Mid}$, and $201_{Hot}$.

As illustrated in FIG. 25, the optical deflectors $201_{Wide}$, $201_{Mid}$, and $201_{Hot}$ with the above-described configuration can be disposed to surround the reference axis AX and be closer to the reference axis AX than the excitation light sources $12_{Wide}$, $12_{Mid}$, and $12_{Hot}$ so that the excitation light rays output from the excitation light sources $12_{Wide}$, $12_{Mid}$, and $12_{Hot}$ can be incident on the corresponding mirror parts 202 of the optical deflectors $201_{Wide}$, $201_{Mid}$, and $201_{Hot}$ and reflected by the same to be directed to the corresponding scanning areas $A_{Wide}$, $A_{Mid}$, and $A_{Hot}$, respectively.

Specifically, the optical deflectors $201_{Wide}$, $201_{Mid}$, and $201_{Hot}$ can be secured to an optical deflector holder 58 as follows.

The optical deflector holder 58 can have a square pyramid shape projected forward, and its front face can be composed of an upper face 58U, a lower face 58D, a left face 58L, and a right face 58R (not shown in the drawings), as illustrated in FIG. 25.

The wide-zone optical deflector $201_{Wide}$ (corresponding to the first optical deflector in the presently disclosed subject matter) can be secured to the lower face 58D of the square pyramid face while being tilted so that the mirror part 202 thereof is positioned in an optical path of the excitation light rays $Ray_{Wide}$ output from the wide-zone excitation light source $12_{Wide}$. Similarly thereto, the middle-zone optical deflector $201_{Mid}$ (corresponding to the second optical deflector in the presently disclosed subject matter) can be secured to the upper face 58U of the square pyramid face while being tilted so that the mirror part 202 thereof is positioned in an optical path of the excitation light rays $Ray_{Mid}$ output from the middle-zone excitation light source $12_{Mid}$. Similarly thereto, the hot-zone optical deflector $201_{Hot}$ (corresponding to the third optical deflector in the presently disclosed subject matter) can be secured to the left face 58L (when viewed from front) of the square pyramid face while being tilted so that the mirror part 202 thereof is positioned in an optical path of the excitation light rays $Ray_{Hot}$ output from the hot-zone excitation light source $12_{Hot}$.

The optical deflectors $201_{Wide}$, $201_{Mid}$, and $201_{Hot}$ each can be arranged so that the first axis X1 is contained in a vertical plane and the second axis X2 is contained in a horizontal plane. As a result, the above-described arrangement of the optical deflectors $201_{Wide}$, $201_{Mid}$, and $201_{Hot}$ can easily form (draw) a predetermined light distribution pattern (two-dimensional image corresponding to the required predetermined light distribution pattern) being wide in the horizontal direction and narrow in the vertical direction required for a vehicular headlight.

The wide-zone optical deflector $201_{Wide}$ can draw a first two-dimensional image on the wide-zone scanning area $A_{Wide}$ (corresponding to the first scanning area in the presently disclosed subject matter) with the excitation light rays $Ray_{Wide}$ two-dimensionally scanning in the horizontal and vertical directions by the mirror part 202 thereof, to thereby form a first light intensity distribution on the wide-zone scanning area $A_{Wide}$.

The middle-zone optical deflector $201_{Mid}$ can draw a second two-dimensional image on the middle-zone scanning area $A_{Mid}$ (corresponding to the second scanning area in the presently disclosed subject matter) with the excitation light rays $Ray_{Mid}$ two-dimensionally scanning in the horizontal and vertical directions by the mirror part 202 thereof in such a manner that the second two-dimensional image overlaps the first two-dimensional image in part, to thereby form a second light intensity distribution on the middle-zone scanning area $A_{Mid}$ with a higher light intensity than that of the first light intensity distribution.

As illustrated in FIG. 21, the middle-zone scanning area $A_{Mid}$ can be smaller than the wide-zone scanning area $A_{Wide}$ in size and overlap part of the wide-zone scanning area $A_{Wide}$. As a result of the overlapping, the overlapped middle-zone scanning area $A_{Mid}$ can have the relatively higher light intensity distribution.

The hot-zone optical deflector $201_{Hot}$ can draw a third two-dimensional image on the hot-zone scanning area $A_{Hot}$ (corresponding to the third scanning area in the presently disclosed subject matter) with the excitation light rays Ray$_{Hot}$ two-dimensionally scanning in the horizontal and vertical directions by the mirror part 202 thereof in such a manner that the third two-dimensional image overlaps the first and second two-dimensional images in part, to thereby form a third light intensity distribution on the hot-zone scanning area A$_{Hot}$ with a higher light intensity than that of the second light intensity distribution.

As illustrated in FIG. 21, the hot-zone scanning area A$_{Hot}$ can be smaller than the middle-zone scanning area A$_{Mid}$ in size and overlap part of the middle-zone scanning area A$_{Mid}$. As a result of the overlapping, the overlapped hot-zone scanning area A$_{Hot}$ can have the relatively higher light intensity distribution.

The shape of each of the illustrated scanning areas A$_{Wide}$, A$_{Mid}$, and A$_{Hot}$ in FIG. 21 is a rectangular outer shape, but the outer shape thereof may be a circle, an oval, or other shapes.

FIGS. 27A, 27B, and 27C are a front view, a top plan view, and a side view of the wavelength converting member 18, respectively.

The illustrated wavelength converting member 18 can be configured to be a rectangular plate with a horizontal length of 18 mm and a vertical length of 9 mm. The wavelength converting member 18 can also be referred to as a phosphor panel.

As illustrated in FIGS. 24 and 25, the vehicle lighting fixture 300 can include a phosphor holder 52 which can close the rear end opening of the tubular part 48. The wavelength converting member 18 can be secured to the phosphor holder 52. Specifically, the phosphor holder 52 can have an opening 52a formed therein and the wavelength converting member 18 can be secured to the periphery of the opening 52a of the phosphor holder 52 at its outer periphery of the rear surface 18a thereof. The wavelength converting member 18 covers the opening 52a.

Figure 30A:
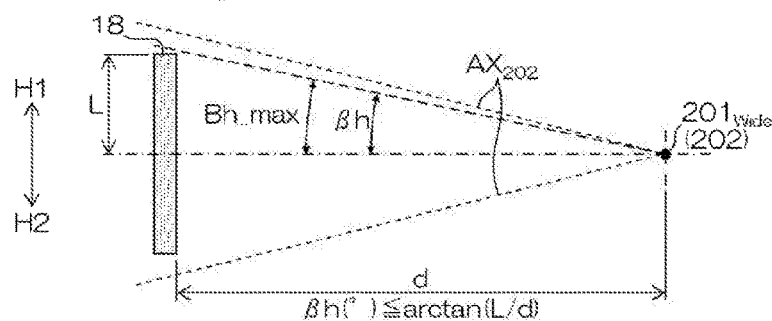
FIG. 30A is a diagram for illustrating the "L" and "βh_max" illustrated in (a) of FIG. 29.
Figure 30B:
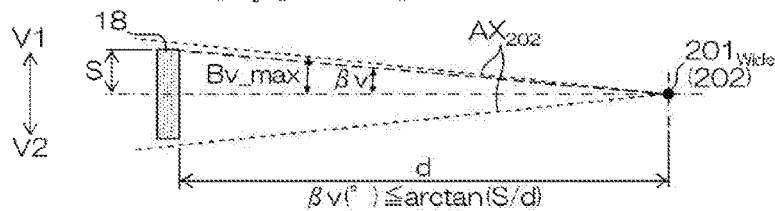
FIG. 30B is a diagram for illustrating the "S," "βv_max," and L illustrated in (b) of FIG. 29.

The wavelength converting member 18 can be disposed to be confined between the center line AX$_{202}$ of the mirror part 202 of the wide-zone optical deflector 201$_{Wide}$ at the maximum deflection angle βh_max (see FIG. 30A) and the center line AX$_{202}$ of the mirror part 202 of the wide-zone optical deflector 201$_{Wide}$ at the maximum deflection angle βv_max (see FIG. 30B). Specifically, the wavelength converting member 18 should be disposed to satisfy the following two formulas 1 and 2:

tan(βh_max)≥L/d  (Formula 1), and tan(βv_max)≥S/d  (Formula 2), wherein L is ½ of a horizontal length of the wavelength converting member 18, S is ½ of a vertical length of the wavelength converting member 18, and d is the distance from the wavelength converting member 18 to the optical deflector 201 (mirror part 202).

A description will next be given of how to adjust the sizes (horizontal length and vertical length) of the scanning areas A$_{Wide}$, A$_{Mid}$, and A$_{Hot}$.

The sizes (horizontal length and vertical length) of the scanning areas A$_{Wide}$, A$_{Mid}$, and A$_{Hot}$ can be adjusted by changing the swinging ranges of the mirror parts 202 of the optical deflectors 201$_{Wide}$, 201$_{Mid}$, and 201$_{Hot}$ about the first axis X1 and the swinging ranges of the mirror parts 202 of the optical deflectors 201$_{Wide}$, 201$_{Mid}$, and 201$_{Hot}$ about the second axis X2. This can be done by changing the first and second AC voltages to be applied to the first piezoelectric actuators 203 and 204 and the third AC voltage to be applied to the second piezoelectric actuators 205 and 206 when the distances between each of the optical deflectors 201$_{Wide}$, 201$_{Mid}$, and 201$_{Hot}$ (the center of the mirror part 202) and the wavelength converting member 18 are the same (or substantially the same) as each other. (See FIGS. 23 and 24.) The reasons therefor are as follows.

Figure 28A:
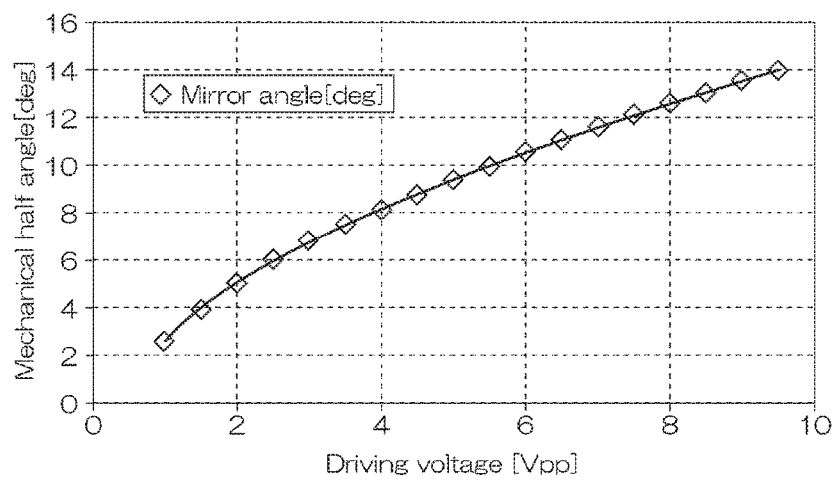
FIG. 28A is a graph showing the relationship between a mechanical swing angle (half angle) of the mirror part 202 about the first axis X1 and the drive voltage to be applied to the first piezoelectric actuators 203 and 204.
Figure 28B:
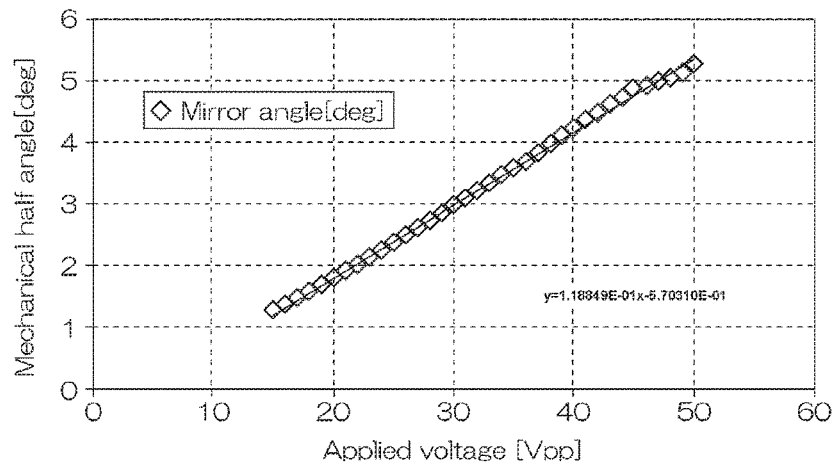
FIG. 28B is a graph showing the relationship between a mechanical swing angle (half angle) of the mirror part 202 about the second axis X2 and the drive voltage to be applied to the second piezoelectric actuators 205 and 206.

Specifically, as illustrated in FIG. 28A, in the optical deflectors 201$_{Wide}$, 201$_{Mid}$, and 201$_{Hot}$, the mechanical swing angle (half angle, see the vertical axis) of the mirror part 202 about the first axis X1 is increased as the drive voltage (see the horizontal axis) to be applied to the first piezoelectric actuators 203 and 204 is increased. Furthermore, as illustrated in FIG. 28B, the mechanical swing angle (half angle, see the vertical axis) of the mirror part 202 about the second axis X2 is also increased as the drive voltage (see the horizontal axis) to be applied to the second piezoelectric actuators 205 and 206 is increased.

Thus, when the distances between each of the optical deflectors 201$_{Wide}$, 201$_{Mid}$, and 201$_{Hot}$ (the center of the mirror part 202 thereof) and the wavelength converting member 18 are the same (or substantially the same) as each other (see FIGS. 24 and 25), the sizes (horizontal length and vertical length) of the scanning areas A$_{Wide}$, A$_{Mid}$, and A$_{Hot}$ can be adjusted by changing the first and second AC voltages to be applied to the first piezoelectric actuators 203 and 204 and the third AC voltage to be applied to the second piezoelectric actuators 205 and 206, and thereby changing the swinging ranges of the mirror parts 202 of the respective optical deflectors 201$_{Wide}$, 201$_{Mid}$, and 201$_{Hot}$ about the first axis X1 and the swinging ranges of the mirror parts 202 of the respective optical deflectors 201$_{Wide}$, 201$_{Mid}$, and 201$_{Hot}$ about the second axis X2.

Next, a description will be given of a concrete adjustment example. In the following description, it is assumed that the distances between each of the optical deflectors 201$_{Wide}$, 201$_{Mid}$, and 201$_{Hot}$ (the center of the mirror part 202 thereof) and the wavelength converting member 18 are the same (or substantially the same) as each other and d=24.0 mm as illustrated in FIGS. 30A and 30B and the focal distance of the projection lens assembly 20 is 32 mm.

As shown in the row "WIDE" of the table of (a) of FIG. 29, when 5.41 V$_{pp}$ as a drive voltage is applied to the first piezoelectric actuators 203 and 204 of the wide-zone optical deflector 201$_{Wide}$, the mechanical swing angle (half angle: γh_max) about the first axis X1 and the maximum deflection angle (half angle: βh_max) are ±9.8 degrees and ±19.7 degrees, respectively. In this case, the size (horizontal length) of the wide-zone scanning area A$_{Wide}$ is adjusted to be ±8.57 mm.

The "L" and "μh_max" described in (a) of FIG. 29 represent the distance and the angle shown in FIG. 30A. The "mirror mechanical half angle" (also referred to as "mechanical half angle") described in (a) of FIG. 29 means the angle at which the mirror part 202 actually moves, and represents an angle of the mirror part 202 with respect to the normal direction with the sign "+" or "−." The "mirror deflection angle" (also referred to as "optical half angle") described in (a) of FIG. 29 means the angle formed between the excitation light (light rays) reflected by the mirror part 202 and the normal direction of the mirror part 202, and also represents an angle of the mirror part 202 with respect to the normal direction with the sign "+" or "−." According to the Fresnel's law, the optical half angle is twice the mechanical half angle.

As shown in the row "WIDE" of the table of (b) of FIG. 29, when 41.2 V$_{pp}$ as a drive voltage is applied to the second piezoelectric actuators 205 and 206 of the wide-zone optical deflector 201$_{Wide}$, the mechanical swing angle (half angle: γv_max) about the first axis X1 and the maximum deflection angle (half angle: βv_max) are ±4.3 degrees and ±8.6 degrees, respectively. In this case, the size (vertical length) of the wide-zone scanning area $A_{Wide}$ is adjusted to be ±3.65 mm.

The "S" and "βv_max" described in (b) of FIG. 29 represent the distance and the angle shown in FIG. 30B, respectively.

As described above, 5.41 $V_{pp}$ as a drive voltage (the first and second AC voltages) is applied to the first piezoelectric actuators 203 and 204 of the wide-zone optical deflector $201_{Wide}$, and 41.2 $V_{pp}$ as a drive voltage (the third AC voltage) is applied to the second piezoelectric actuators 205 and 206 of the wide-zone optical deflector $201_{Wide}$, thereby changing the swinging range of the mirror part 202 of the wide-zone optical deflector $201_{Wide}$ about the first axis X1 and the swinging range of the mirror part 202 of the wide-zone optical deflector $201_{Wide}$ about the second axis X2. In this manner, the size (horizontal length) of the wide-zone scanning area $A_{Wide}$ can be adjusted to be ±8.57 mm and the size (vertical length) of the wide-zone scanning area $A_{Wide}$ can be adjusted to be ±3.65 mm to form a rectangular shape with the horizontal length of ±8.57 mm and the vertical length of ±3.65 mm.

The light intensity distribution formed in the wide-zone scanning area $A_{Wide}$ with the above-described dimensions can be projected forward through the projection lens assembly 20 to thereby form the wide-zone light distribution pattern $P_{Wide}$ with a rectangle of the width of ±15 degrees in the horizontal direction and the width of ±6.5 degrees in the vertical direction on the virtual vertical screen (see FIG. 26).

As shown in the row "MID" of the table of (a) of FIG. 29, when 2.31 $V_{pp}$ as a drive voltage is applied to the first piezoelectric actuators 203 and 204 of the middle-zone optical deflector $201_{Mid}$, the mechanical swing angle (half angle: γh_max) about the first axis X1 and the maximum deflection angle (half angle: βh_max) are ±5.3 degrees and ±11.3 degrees, respectively. In this case, the size (horizontal length) of the middle-zone scanning area $A_{Mid}$ is adjusted to be ±4.78 mm.

As shown in the row "MID" of the table of (b) of FIG. 29, when 24.4 $V_{pp}$ as a drive voltage is applied to the second piezoelectric actuators 205 and 206 of the middle-zone optical deflector $201_{Mid}$, the mechanical swing angle (half angle: γv_max) about the first axis X1 and the maximum deflection angle (half angle: βv_max) are ±2.3 degrees and ±4.7 degrees, respectively. In this case, the size (vertical length) of the middle-zone scanning area $A_{Mid}$ is adjusted to be ±1.96 mm.

As described above, 2.31 $V_{pp}$ as a drive voltage (the first and second AC voltages) is applied to the first piezoelectric actuators 203 and 204 of the middle-zone optical deflector $201_{Mid}$, and 24.4 $V_{pp}$ as a drive voltage (the third AC voltage) is applied to the second piezoelectric actuators 205 and 206 of the middle-zone optical deflector $201_{Mid}$, thereby changing the swinging range of the mirror part 202 of the middle-zone optical deflector $201_{Mid}$ about the first axis X1 and the swinging range of the mirror part 202 of the middle-zone optical deflector $201_{Mid}$ about the second axis X2. In this manner, the size (horizontal length) of the middle-zone scanning area $A_{Mid}$ can be adjusted to be ±4.78 mm and the size (vertical length) of the middle-zone scanning area $A_{Mid}$ can be adjusted to be ±1.96 mm to form a rectangular shape with the horizontal length of ±4.78 mm and the vertical length of ±1.96 mm.

The light intensity distribution formed in the middle-zone scanning area $A_{Mid}$ with the above-described dimensions can be projected forward through the projection lens assembly 20 to thereby form the middle-zone light distribution pattern $P_{Mid}$ (see FIG. 26) with a rectangle of the width of ±8.5 degrees in the horizontal direction and the width of ±3.5 degrees in the vertical direction on the virtual vertical screen.

As shown in the row "HOT" of the table of (a) of FIG. 29, when 0.93 $V_{pp}$ as a drive voltage is applied to the first piezoelectric actuators 203 and 204 of the hot-zone optical deflector $201_{Hot}$, the mechanical swing angle (half angle: γh_max) about the first axis X1 and the maximum deflection angle (half angle: βh_max) are ±2.3 degrees and ±4.7 degrees, respectively. In this case, the size (horizontal length) of the hot-zone scanning area $A_{Hot}$ is adjusted to be ±1.96 mm.

As shown in the row "HOT" of the table of (b) of FIG. 29, when 13.3 $V_{pp}$ as a drive voltage is applied to the second piezoelectric actuators 205 and 206 of the hot-zone optical deflector $201_{Hot}$, the mechanical swing angle (half angle: γv_max) about the first axis X1 and the maximum deflection angle (half angle: βv_max) are ±1.0 degrees and ±2.0 degrees, respectively. In this case, the size (vertical length) of the hot-zone scanning area $A_{Hot}$ is adjusted to be ±0.84 mm.

As described above, 0.93 $V_{pp}$ as a drive voltage (the first and second AC voltages) is applied to the first piezoelectric actuators 203 and 204 of the hot-zone optical deflector $201_{Hot}$, and 13.3 $V_{pp}$ as a drive voltage (the third AC voltage) is applied to the second piezoelectric actuators 205 and 206 of the hot-zone optical deflector $201_{Hot}$, thereby changing the swinging range of the mirror part 202 of the hot-zone optical deflector $201_{Hot}$ about the first axis X1 and the swinging range of the mirror part 202 of the hot-zone optical deflector $201_{Hot}$ about the second axis X2. In this manner, the size (horizontal length) of the hot-zone scanning area $A_{Hot}$ can be adjusted to be ±1.96 mm and the size (vertical length) of the hot-zone scanning area $A_{Hot}$ can be adjusted to be ±0.84 mm to form a rectangular shape with the horizontal length of ±1.96 mm and the vertical length of ±0.84 mm.

The light intensity distribution formed in the hot-zone scanning area $A_{Hot}$ with the above-described dimensions can be projected forward through the projection lens assembly 20 to thereby form the hot-zone light distribution pattern $P_{Hot}$ with a rectangle of the width of ±3.5 degrees in the horizontal direction and the width of ±1.5 degrees in the vertical direction on the virtual vertical screen (see FIG. 26).

Thus, when the distances between each of the optical deflectors $201_{Wide}$, $201_{Mid}$, and $201_{Hot}$ (the center of the mirror part 202) and the wavelength converting member 18 are the same (or substantially the same) as each other (see FIGS. 24 and 25), the sizes (horizontal length and vertical length) of the scanning areas $A_{Wide}$, $A_{Mid}$, and $A_{Hot}$ can be adjusted by changing the first and second AC voltages to be applied to the first piezoelectric actuators 203 and 204 and the third AC voltage to be applied to the second piezoelectric actuators 205 and 206, and thereby changing the swinging ranges of the mirror parts 202 of the optical deflectors $201_{Wide}$, $201_{Mid}$, and $201_{Hot}$ about the first axis X1 and the swinging ranges of the mirror parts 202 of the optical deflectors $201_{Wide}$, $201_{Mid}$, and $201_{Hot}$ about the second axis X2.

Next, a description will be given of another vehicle lighting fixture using three optical deflectors 201 of one-dimensional nonresonance/one-dimensional resonance type (2-D optical scanner (fast resonant and slow static combination)) as further another reference example that can be employed in the presently disclosed subject matter. Note that the type of the optical deflector 201 is not limited to this, but any of the previously described various optical deflectors as exemplified in the previously described reference example may be adopted.

Figure 32:
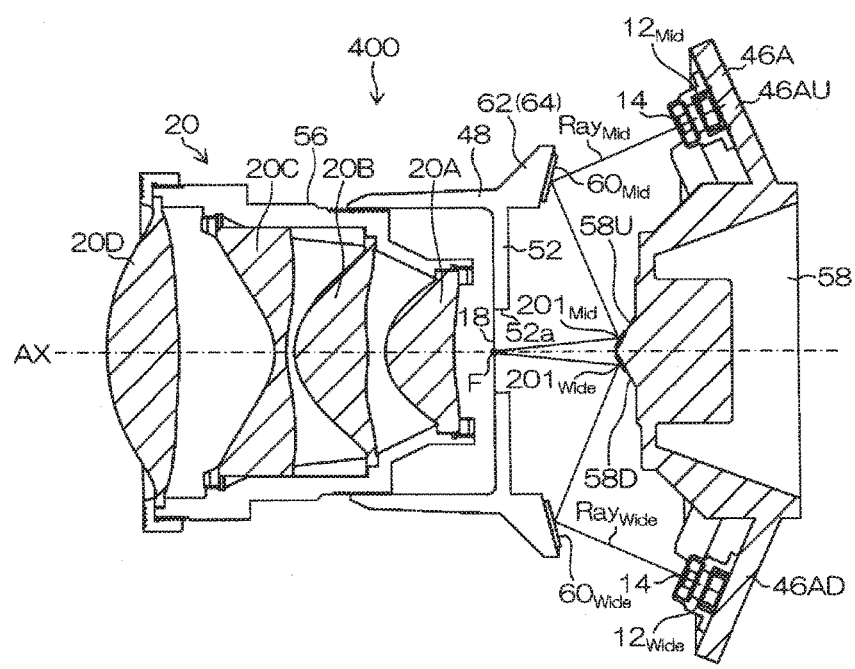
FIG. 32 is a vertical cross-sectional view of a vehicle lighting fixture 400 according to a reference example.
Figure 33:
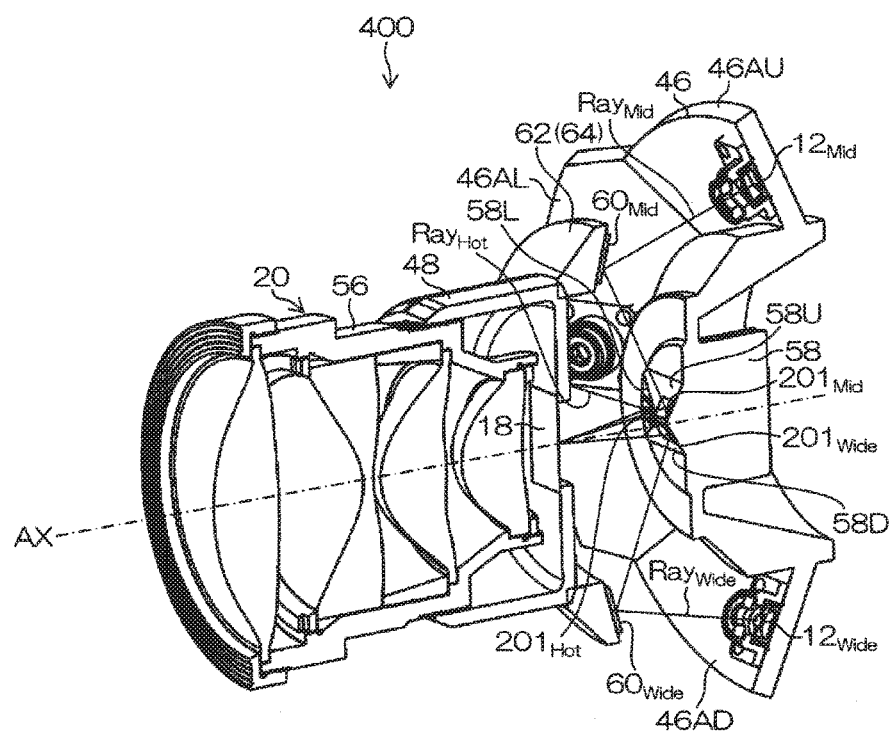
FIG. 33 is a perspective view including the cross-sectional view of the vehicle lighting fixture 400 of FIG. 32.

FIG. 32 is a vertical cross-sectional view of a vehicle lighting fixture 400 according to this reference example, and FIG. 33 is a perspective view including a cross section of the vehicle lighting fixture 400 of FIG. 32.

The vehicle lighting fixture 400 of this reference example can be configured to form a predetermined light distribution pattern P (for example, high-beam light distribution pattern), as illustrated in FIG. 26, which is excellent in far-distance visibility and has a better sense of light distribution and be configured such that the light intensity in part, for example, at the center ($P_{Hot}$), is relatively high and the light intensity is gradually lowered from that part, or the center, to the periphery ($P_{Hot} \rightarrow P_{Mid} \rightarrow P_{Wide}$).

Next, the vehicle lighting fixture 400 of this reference example will be compared with the vehicle lighting fixture 300 of the previously described reference example. In the previously described reference example, as illustrated in FIGS. 24 and 25, the vehicle lighting fixture 300 can be configured such that the laser light rays as the excitation light rays emitted from the respective excitation light sources $12_{Wide}$, $12_{Mid}$, and $12_{Hot}$ can be directly incident on the corresponding optical deflectors $201_{Wide}$, $201_{Mid}$, and $201_{Hot}$, respectively. The vehicle lighting fixture 400 of this reference example is different from the previously described reference example in that, as illustrated in FIGS. 34 and 35, once the laser light rays as the excitation light rays emitted from the respective excitation light sources $12_{Wide}$, $12_{Mid}$, and $12_{Hot}$ can be reflected by corresponding reflecting surfaces $60_{Wide}$, $60_{Mid}$, and $60_{Hot}$, respectively and then incident on the corresponding optical deflectors $201_{Wide}$, $201_{Mid}$, and $201_{Hot}$, respectively.

The configuration of the vehicle lighting fixture 400 of this reference example can have the same configuration as that of the vehicle lighting fixture 300 of the previously described reference example except for the above different point. Hereinbelow, a description will be given of the different point of this reference example from the previously described reference example, and the same or similar components of this reference example as those in the previously described reference example will be denoted by the same reference numerals and a description thereof will be omitted as appropriate.

Figure 34:
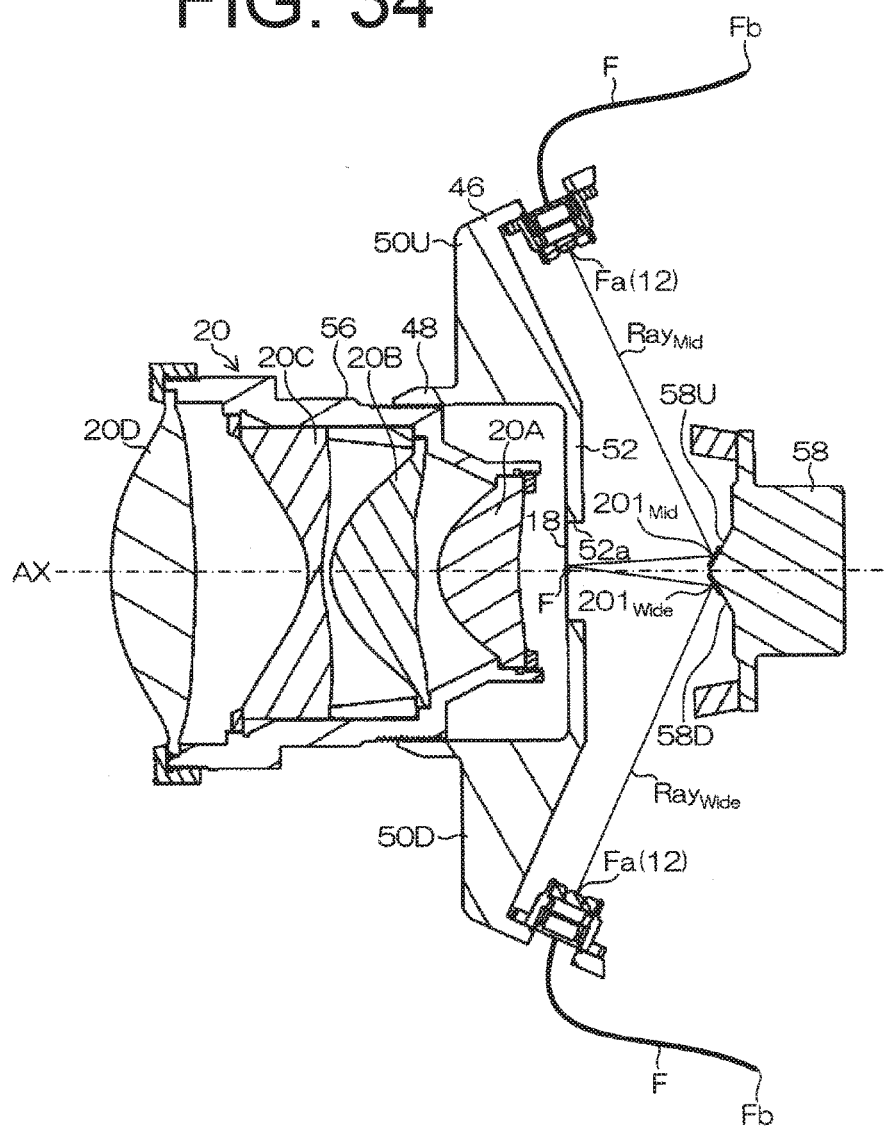
FIG. 34 is a vertical cross-sectional view of another modified example of the vehicle lighting fixture 300.
Figure 35:
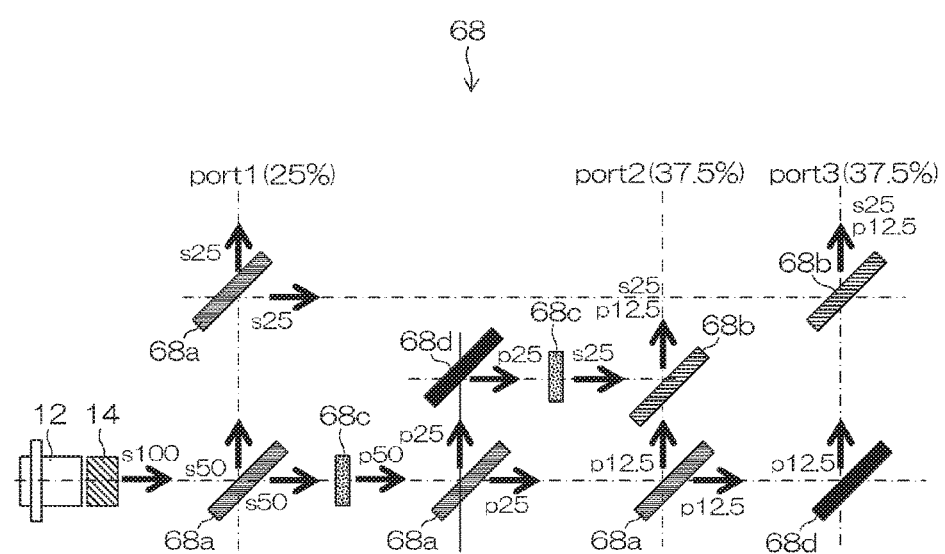
FIG. 35 is a diagram illustrating an example of an internal configuration of an optical distributor 68.

The vehicle lighting fixture 400 can be configured, as illustrated in FIGS. 34 and 35, as a vehicle headlamp. The vehicle lighting fixture 400 can include three excitation light sources $12_{Wide}$, $12_{Mid}$, and $12_{Hot}$; three reflecting surfaces $60_{Wide}$, $60_{Mid}$, and $60_{Hot}$ provided corresponding to the three excitation light sources $12_{Wide}$, $12_{Mid}$, and $12_{Hot}$; three optical deflectors $201_{Wide}$, $201_{Mid}$, and $201_{Hot}$ each including a mirror part 202; a wavelength converting member 18; a projection lens assembly 20; etc. The three optical deflectors $201_{Wide}$, $201_{Mid}$, and $201_{Hot}$ can be provided corresponding to the three reflecting surfaces $60_{Wide}$, $60_{Mid}$, and $60_{Hot}$. The wavelength converting member 18 can include three scanning areas $A_{Wide}$, $A_{Mid}$, and $A_{Hot}$ (see FIG. 21) provided corresponding to the three optical deflectors $201_{Wide}$, $201_{Mid}$, and $201_{Hot}$. Partial light intensity distributions can be formed within the respective scanning areas $A_{Wide}$, $A_{Mid}$, and $A_{Hot}$, and can be projected through the projection lens assembly 20 serving as an optical system to thereby form the predetermined light distribution pattern P. Note that the respective numbers of the excitation light sources 12, the reflecting surfaces 60, the optical deflectors 201, and the scanning areas A are not limited to three, and may be two or four or more.

As illustrated in FIG. 32, the projection lens assembly 20, the wavelength converting member 18, and the optical deflectors $201_{Wide}$, $201_{Mid}$, and $201_{Hot}$ can be disposed in this order along a reference axis AX (or referred to as an optical axis) extending in the front-rear direction of a vehicle body.

The vehicle lighting fixture 400 can further include a laser holder 46A. The excitation light sources $12_{Wide}$, $12_{Mid}$, and $12_{Hot}$ can be disposed to surround the reference axis AX and fixed to the laser holder 46A with a posture tilted in such a manner that excitation light rays $Ray_{Wide}$, $Ray_{Mid}$, and $Ray_{Hot}$ are directed forward and toward the reference axis AX.

Specifically, the excitation light sources $12_{Wide}$, $12_{Mid}$, and $12_{Hot}$ can be disposed by being fixed to the laser holder 46A in the following manner.

As illustrated in FIG. 32, the laser holder 46A can be configured to include extension parts 46AU, 46AD, 46AL, and 46AR (not illustrated) each extending from the outer peripheral face of an optical deflector holder 58 at its upper, lower, left, or right part in a forward and obliquely upward direction, a forward and obliquely downward direction, a forward and obliquely leftward direction, or a forward and obliquely rightward direction.

As illustrated in FIG. 32, the wide-zone excitation light source $12_{Wide}$ can be fixed to the front face of the extension part 46AD with a posture tilted so that the excitation light rays $Ray_{Wide}$ is directed in the forward and obliquely upward direction. Similarly, the middle-zone excitation light source $12_{Mid}$ can be fixed to the front face of the extension part 46AU with a posture tilted so that the excitation light rays $Ray_{Mid}$ is directed in the forward and obliquely downward direction. Similarly, the hot-zone excitation light source $12_{Hot}$ can be fixed to the front face of the extension part 46AL with a posture tilted so that the excitation light rays $Ray_{Mid}$ is directed in the forward and obliquely leftward direction.

The vehicle lighting fixture 400 can further include a lens holder 56 to which the projection lens assembly 20 (lenses 20A to 20D) is fixed. The lens holder 56 can be screwed at its rear end to the opening of a tubular part 48 so as to be fixed to the tubular part 48.

A condenser lens 14 can be disposed in front of each of the excitation light sources $12_{Wide}$, $12_{Mid}$, and $12_{Hot}$. The excitation light rays $Ray_{Wide}$, $Ray_{Mid}$, and $Ray_{Hot}$ can be emitted from the respective excitation light sources $12_{Wide}$, $12_{Mid}$, and $12_{Hot}$ and condensed by the respective condenser lenses 14 (for example, collimated) to be incident on and reflected by the respective reflecting surfaces $60_{Wide}$, $60_{Mid}$, and $60_{Hot}$, and then be incident on the respective mirror parts 202 of the optical deflectors $201_{Wide}$, $201_{Mid}$, and $201_{Hot}$.

As illustrated in FIG. 32, the reflecting surfaces $60_{Wide}$, $60_{Mid}$, and $60_{Hot}$ can be disposed to surround the reference axis AX and be closer to the reference axis AX than the excitation light sources $12_{Wide}$, $12_{Mid}$, and $12_{Hot}$. The reflecting surfaces $60_{Wide}$, $60_{Mid}$, and $60_{Hot}$ can be fixed to a reflector holder 62 such that each posture is tilted to be closer to the reference axis AX and also the excitation light rays output from the excitation light sources $12_{Wide}$, $12_{Mid}$, and $12_{Hot}$ can be incident on the corresponding reflecting surfaces $60_{Wide}$, $60_{Mid}$, and $60_{Hot}$, and reflected by the same to be directed rearward and closer to the reference axis AX.

Specifically, the reflecting surfaces $60_{Wide}$, $60_{Mid}$, and $60_{Hot}$ can be secured to the reflector holder 62 as follows.

The reflector holder 62 can include a ring-shaped extension 64 extending from the rear end of the tubular part 48, which extends in the reference axis AX direction, toward the rear and outer side. The ring-shaped extension 64 can have a rear surface tilted so that an inner rim thereof closer to the reference axis AX is positioned more forward than an outer rim thereof, as can be seen from FIG. 32.

The wide-zone reflecting surface $60_{Wide}$ can be secured to a lower portion of the rear surface of the ring-shaped extension 64 with a tilted posture such that the excitation light rays $Ray_{Wide}$ can be reflected thereby to be directed in a rearward and obliquely upward direction. Similarly, the middle-zone reflecting surface $60_{Mid}$ can be secured to an upper portion of the rear surface of the ring-shaped extension 64 with a tilted posture such that the excitation light rays $Ray_{Mid}$ can be reflected thereby to be directed in a rearward and obliquely downward direction. Similarly, the hot-zone reflecting surface $60_{Hot}$ (not illustrated) can be secured to a left portion of the rear surface of the ring-shaped extension 64 with a tilted posture such that the excitation light rays $Ray_{Hot}$ can be reflected thereby to be directed in a rearward and obliquely rightward direction (when viewed from its front side).

As illustrated in FIG. 33, the optical deflectors $201_{Wide}$, $201_{Mid}$, and $201_{Hot}$ with the above-described configuration can be disposed to surround the reference axis AX and be closer to the reference axis AX than the reflecting surfaces $60_{Wide}$, $60_{Mid}$, and $60_{Hot}$ so that the excitation light rays as reflected light rays from the corresponding reflecting surfaces $60_{Wide}$, $60_{Mid}$, and $60_{Hot}$ can be incident on the corresponding mirror parts 202 of the optical deflectors $201_{Wide}$, $201_{Mid}$, and $201_{Hot}$ and reflected by the same to be directed to the corresponding scanning areas $A_{Wide}$, $A_{Mid}$, and $A_{Hot}$, respectively.

Specifically, the optical deflectors $201_{Wide}$, $201_{Mid}$, and $201_{Hot}$ can be secured to the optical deflector holder 58 in the same manner as in the previously disclosed reference example.

The wide-zone optical deflector $201_{Wide}$ (corresponding to the first optical deflector in the presently disclosed subject matter) can be secured to the lower face 58D of the square pyramid face while being tilted so that the mirror part 202 thereof is positioned in an optical path of the excitation light rays $Ray_{Wide}$ reflected from the wide-zone reflecting surface $60_{Wide}$. Similarly thereto, the middle-zone optical deflector $201_{Mid}$ (corresponding to the second optical deflector in the presently disclosed subject matter) can be secured to the upper face 58U of the square pyramid face while being tilted so that the mirror part 202 thereof is positioned in an optical path of the excitation light rays $Ray_{Mid}$ reflected from the middle-zone reflecting surface $60_{Mid}$. Similarly thereto, the hot-zone optical deflector $201_{Hot}$ (corresponding to the third optical deflector in the presently disclosed subject matter) can be secured to the left face 58L (when viewed from its front side) of the square pyramid face while being tilted so that the mirror part 202 thereof is positioned in an optical path of the excitation light rays $Ray_{Hot}$ reflected from the hot-zone reflecting surface $60_{Hot}$.

The optical deflectors $201_{Wide}$, $201_{Mid}$, and $201_{Hot}$ each can be arranged so that the first axis X1 is contained in a vertical plane and the second axis X2 is contained in a horizontal plane. As a result, the above-described arrangement of the optical deflectors $201_{Wide}$, $201_{Mid}$, and $201_{Hot}$ can easily form (draw) a predetermined light distribution pattern (two-dimensional image corresponding to the required predetermined light distribution pattern) being wide in the horizontal direction and narrow in the vertical direction required for a vehicular headlight.

The wide-zone optical deflector $201_{Wide}$ can draw a first two-dimensional image on the wide-zone scanning area $A_{Wide}$ (corresponding to the first scanning area in the presently disclosed subject matter) with the excitation light rays $Ray_{Wide}$ two-dimensionally scanning in the horizontal and vertical directions by the mirror part 202 thereof, to thereby form a first light intensity distribution on the wide-zone scanning area $A_{Wide}$.

The middle-zone optical deflector $201_{Mid}$ can draw a second two-dimensional image on the middle-zone scanning area $A_{Mid}$ (corresponding to the second scanning area in the presently disclosed subject matter) with the excitation light rays $Ray_{Mid}$ two-dimensionally scanning in the horizontal and vertical directions by the mirror part 202 thereof in such a manner that the second two-dimensional image overlaps the first two-dimensional image in part, to thereby form a second light intensity distribution on the middle-zone scanning area $A_{Mid}$ with a higher light intensity than that of the first light intensity distribution.

As illustrated in FIG. 21, the middle-zone scanning area $A_{Mid}$ can be smaller than the wide-zone scanning area $A_{Wide}$ in size and overlap part of the wide-zone scanning area $A_{Wide}$. As a result of the overlapping, the overlapped middle-zone scanning area $A_{Mid}$ can have the relatively higher light intensity distribution.

The hot-zone optical deflector $201_{Hot}$ can draw a third two-dimensional image on the hot-zone scanning area $A_{Hot}$ (corresponding to the third scanning area in the presently disclosed subject matter) with the excitation light rays $Ray_{Hot}$ two-dimensionally scanning in the horizontal and vertical directions by the mirror part 202 thereof in such a manner that the third two-dimensional image overlaps the first and second two-dimensional images in part, to thereby form a third light intensity distribution on the hot-zone scanning area $A_{Hot}$ with a higher light intensity than that of the second light intensity distribution.

As illustrated in FIG. 21, the hot-zone scanning area $A_{Hot}$ can be smaller than the middle-zone scanning area $A_{Mid}$ in size and overlap part of the middle-zone scanning area $A_{Mid}$. As a result of the overlapping, the overlapped hot-zone scanning area $A_{Hot}$ can have the relatively higher light intensity distribution.

The shape of each of the scanning areas $A_{Wide}$, $A_{Mid}$, and $A_{Hot}$ illustrated in FIG. 21 is a rectangular outer shape, but the outer shape thereof may be a circle, an oval, or other shapes.

The vehicle lighting fixture 400 can include a phosphor holder 52 to which the wavelength converting member 18 can be secured as in the previously disclosed reference example.

In this reference example, the sizes (horizontal length and vertical length) of the scanning areas $A_{Wide}$, $A_{Mid}$, and $A_{Hot}$ can be adjusted by the same technique as in the previously disclosed reference example.

With the vehicle lighting fixture having the above-described configuration in this reference example, which utilizes a plurality of optical deflectors configured to scan with excitation light in a two-dimensional manner, it is possible to miniaturize its size and reduce the parts number, which has been a cause for cost increase, as in the previously disclosed reference example.

With the vehicle lighting fixture having the above-described configuration in this reference example, which utilizes a plurality of optical deflectors configured to scan with excitation light in a two-dimensional manner, as illustrated in FIG. 26, a predetermined light distribution pattern P (for example, high-beam light distribution pattern) excellent in far-distance visibility and having a better sense of light distribution can be formed. The predetermined light distribution pattern P of FIG. 26 can be configured such that the light intensity in part, for example, at the center ($P_{Hot}$), is relatively high and the light intensity is gradually lowered from that part, or the center, to the periphery ($P_{Hot} \rightarrow P_{Mid} \rightarrow P_{Wide}$).

According to this reference example, when compared with the above-described vehicle lighting fixture 300 (lighting unit), although the efficiency may be slightly lowered due to the additional reflection, the vehicle lighting fixture 400 can be miniaturized in the up-down and left-right directions (vertical and horizontal direction).

A description will now be given of a modified example.

The above-described reference examples have dealt with the cases where the semiconductor light emitting elements that can emit excitation light rays are used as the excitation light sources 12 ($12_{Wide}$, $12_{Mid}$, and $12_{Hot}$), but the presently disclosed subject matter is not limited thereto.

Figure 31:
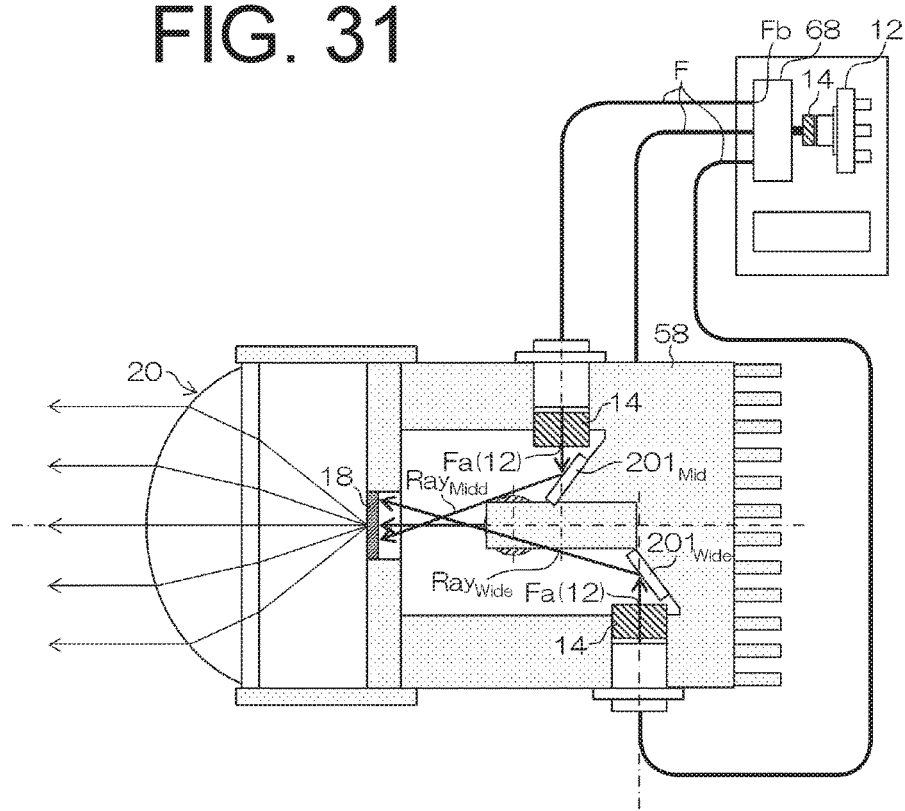
FIG. 31 is a diagram for illustrating an example in which the distances between each of the optical deflectors $201_{Wide}$, $201_{Mid}$, and $201_{Hot}$ (in particular, the center of the mirror part 202 thereof) and the wavelength converting member 18 are changed.

For example, as the excitation light sources 12 ($12_{Wide}$, $12_{Mid}$, and $12_{Hot}$), output end faces Fa of optical fibers F that can output excitation light rays from a single excitation light source or a plurality of respective excitation light sources may be used as illustrated in FIGS. 31 and 36.

In particular, when the output end faces Fa of optical fibers F guiding and outputting excitation light are used as the respective excitation light sources 12 ($12_{Hot}$, $12_{Mid}$, and $12_{Wide}$), the excitation light source, such as a semiconductor light emitting element, can be disposed at a position away from the main body of the vehicle lighting fixture 10. This configuration can make it possible to further miniaturize the vehicle lighting fixture main body and reduce its weight.

FIG. 34 shows an example in which three optical fibers F are combined with not-illustrated three excitation light sources disposed outside of the main body of the vehicle lighting fixture. Here, the optical fiber F can be configured to include a core having an input end face Fb for receiving excitation laser light and an output end face Fa for outputting the excitation laser light, and a clad configured to surround the core. Note that FIG. 34 does not show the hot-zone optical fiber F due to the cross-sectional view.

FIG. 31 shows an example in which the vehicle lighting fixture can include a single excitation light source 12 and an optical distributor 68 that can divide excitation laser light rays from the excitation light source 12 into a plurality of (for example, three) bundles of laser light rays to distribute the plurality of bundles of light rays. The vehicle lighting fixture can further include optical fibers F the number of which corresponds to the number of division of laser light rays. The optical fiber F can be configured to have a core with an input end face Fb and an output end face Fa and a clad surrounding the core. The distributed bundles of the light rays can be incident on the respective input end faces Fb, guided through the respective cores of the optical fibers F and output through the respective output end faces Fa for use in formation of the light intensity distributions.

FIG. 35 shows an example of an internal structure of the optical distributor 68. The optical distributor 68 can be configured to include a plurality of non-polarizing beam splitters 68a, polarizing beam splitters 68b, ½λ plates 68c, and mirrors 68d, which are arranged in the manner described in FIG. 35. With the optical distributor 68 having this configuration, excitation laser light rays emitted from the excitation light source 12 and condensed by the condenser lens 14 can be distributed to the ratios of 25%, 37.5%, and 37.5%, for example.

A description will now be given of a technique for forming a high-beam light distribution pattern P (see FIG. 36D) as a further reference example. Here, the high-beam light distribution pattern $P_{Hi}$ can be formed by overlaying a plurality of irradiation patterns $P_{Hot}$, $P_{Mid}$, and $P_{Wide}$ forming respective non-irradiation regions C1, C2, and C3 illustrated in FIGS. 36A to 36C.

Hereinafter, a description will be given of an example in which the high-beam light distribution pattern $P_{Hi}$ (see FIG. 36D) is formed by the vehicle lighting fixture 300 as illustrated in FIGS. 21 to 25. It should be appreciated that the vehicle lighting fixture may be any of those described in the above-described reference examples or may be a combination of a plurality of lighting units for forming the respective irradiation patterns $P_{Hot}$, $P_{Mid}$, and $P_{Wide}$. The number of the irradiation patterns (irradiation patterns $P_{Hot}$, $P_{Mid}$, and $P_{Wide}$) for forming the high-beam light distribution pattern $P_{Hi}$ is not limited to three, but may be two or four or more.

The vehicle lighting fixture 300 can be configured to include an irradiation-prohibitive object detection unit for detecting an object to which irradiation is prohibited such as a pedestrian and an oncoming vehicle present in front of a vehicle body in which the vehicle lighting fixture 300 is installed. The irradiation-prohibitive object detection unit may be configured to include an imaging device and the like, such as a camera 30 shown in FIG. 11.

Figure 36A:
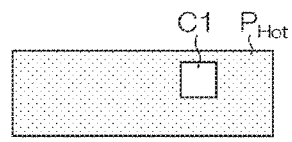
FIG. 36A is a diagram illustrating an example of an irradiation pattern $P_{Hot}$ for forming an unirradiation region C1.
Figure 36B:
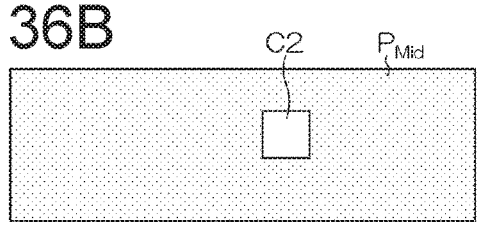
FIG. 36B is a diagram illustrating an example of an irradiation pattern $P_{Mid}$ for forming an unirradiation region C2.
Figure 36C:
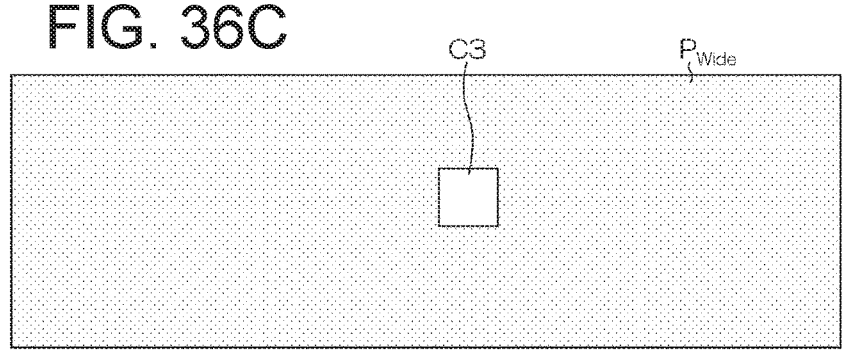
FIG. 36C is a diagram illustrating an example of an irradiation pattern $P_{Wide}$ for forming an unirradiation region C3.

FIG. 36A shows an example of an irradiation pattern $P_{Hot}$ in which the non-irradiation region C1 is formed, FIG. 36B shows an example of an irradiation pattern $P_{Mid}$ in which the non-irradiation region C2 is formed, and FIG. 36C shows an example of an irradiation pattern $P_{Wide}$ in which the non-irradiation region C3 is formed.

Figure 36D:
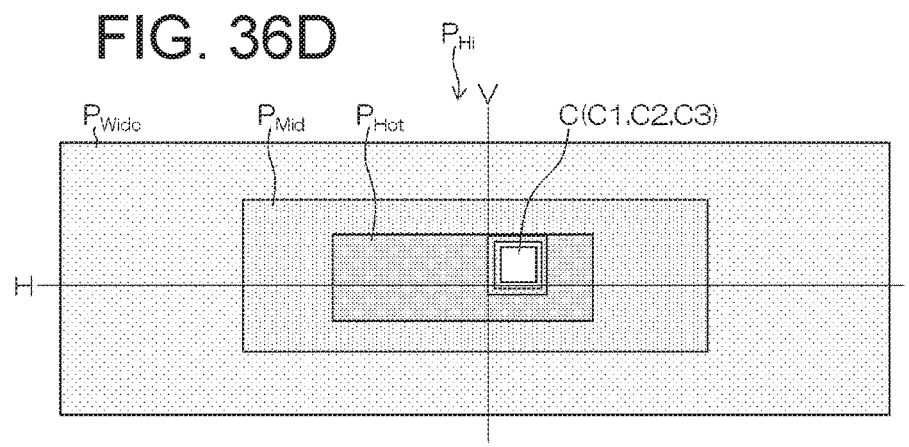
FIG. 36D is a diagram illustrating an example of a high-beam light distribution pattern $P_{Hi}$ configured by overlaying a plurality of irradiation patterns $P_{Hot}$, $P_{Mid}$, and $P_{Wide}$.

As shown in FIG. 36D, the plurality of irradiation patterns $P_{Hot}$, $P_{Mid}$, and $P_{Wide}$ can be overlaid on one another so as to overlay the non-irradiation regions C1, C2, and C3 thereby forming a non-irradiation region C.

Figure 37:
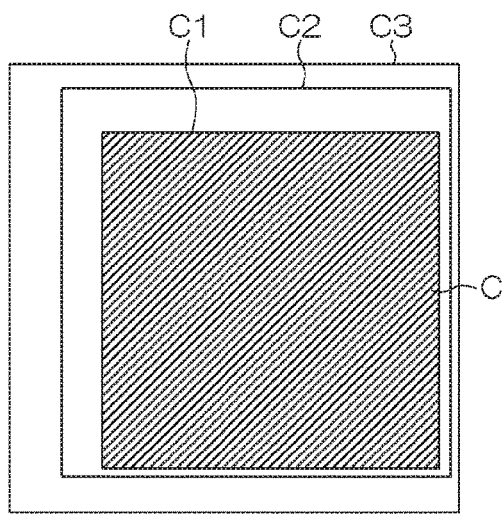
FIG. 37 is a diagram illustrating a state in which the unirradiation regions C1, C2, and C3 are shifted from each other.

The non-irradiation regions C1, C2, and C3 each can have a different size, as illustrated in FIGS. 36A to 36D. By this difference, even when the non-irradiation regions C1, C2, and C3 formed by the respective irradiation patterns $P_{Hot}$, $P_{Mid}$, and $P_{Wide}$ are displaced from one another due to controlling error in the respective optical deflectors $201_{Hot}$, $201_{Mid}$, and $201_{Wide}$, displacement of the optical axes, etc. as shown in FIG. 37, the area of the resulting non-irradiation region C (see the hatched region in FIG. 37) can be prevented from decreasing. As a result, any glare light to the irradiation-prohibitive object can be prevented from being generated. This is because the sizes of the non-irradiation regions C1, C2, and C3 formed in the respective irradiation patterns $P_{Hot}$, $P_{Mid}$, and $P_{Wide}$ are not the same but are different from one another.

The non-irradiation regions C1, C2, and C3 (or the non-irradiation region C as a result of the combination) can be formed in respective regions of the plurality of irradiation patterns $P_{Hot}$, $P_{Mid}$, and $P_{Wide}$ corresponding to the position where the irradiation-prohibitive object has been detected by the irradiation-prohibitive object detection unit. Specifically, the non-irradiation regions C1, C2, and C3 (or the non-irradiation region C) can be formed in a different region corresponding to the position where the irradiation-prohibitive object is detected. As a result, any glare light toward the irradiation-prohibitive object such as a pedestrian, an oncoming vehicle, etc. can be prevented from being generated.

The plurality of irradiation patterns $P_{Hot}$, $P_{Mid}$, and $P_{Wide}$ can have respective different sizes, and can have a higher light intensity as the size thereof is smaller. Due to this configuration, the vehicle lighting fixture 300 can form a high-beam light distribution pattern $P_{Hi}$ (see FIG. 36D) excellent in far-distance visibility and having a better sense of light distribution. The predetermined light distribution pattern $P_{Hi}$ can be configured such that the light intensity ($P_{Hot}$) at its center is relatively high and the light intensity is gradually lowered from the center to the periphery ($P_{Hot} \rightarrow P_{Mid} \rightarrow P_{Wide}$).

The non-irradiation regions C1, C2, and C3 can have a smaller size as the irradiation pattern including the non-irradiation region is smaller. Therefore, the relation in size of the non-irradiation region C1<the non-irradiation region C2<the non-irradiation region C3 may hold. Therefore, the smallest non-irradiation region C1 can be formed in the smallest irradiation pattern $P_{Hot}$ (with the maximum light intensity). This means that the irradiation pattern $P_{Hot}$ can allow a wider region to be irradiated with light more brighter when compared with the case where a smallest non-irradiation region C1 is formed in the irradiation patterns $P_{Mid}$ and $P_{Wide}$ other than the smallest irradiation pattern $P_{Hot}$. Furthermore, since the smallest non-irradiation region C1 is formed in the smallest irradiation pattern $P_{Hot}$ with the maximum light intensity, the bright/dark ratio near the contour of the non-irradiation region C can become relatively high (see FIG. 37) when compared with the case where a smallest non-irradiation region C1 is formed in the irradiation patterns $P_{Mid}$ and $P_{Wide}$ other than the smallest irradiation pattern $P_{Hot}$. As a result, the non-irradiation region C can have sharp and clear contour. It should be appreciated that the non-irradiation regions C1, C2, and C3 may have respective different sizes and the relation in size of the non-irradiation region C1<the non-irradiation region C2<the non-irradiation region C3 is not limitative. In order to blur the contour of the non-irradiation region C, the relation in size of the non-irradiation regions C1, C2, and C3 can be set as appropriate instead of the relationship described above.

The non-irradiation regions C1, C2, and C3 formed in the respective irradiation patterns $P_{Hot}$, $P_{Mid}$, and $P_{Wide}$ can have a similarity shape. Even when the non-irradiation regions C1, C2, and C3 formed by the respective irradiation patterns $P_{Hot}$, $P_{Mid}$, and $P_{Wide}$ are displaced from one another, the area of the resulting non-irradiation region C (see the hatched region in FIG. 37) can be prevented from decreasing. As a result, any glare light to the irradiation-prohibitive object can be prevented from being generated. It should be appreciated that the non-irradiation regions C1, C2, and C3 may have a shape other than a similarity shape as long as their sizes are different from each other. Furthermore, the shape thereof is not limited to a rectangular shape as shown in FIGS. 36A to 36D, but may be a circular shape, an oval shape, or other outer shapes.

The high-beam light distribution pattern $P_{Hi}$ shown in FIG. 36D can be formed on a virtual vertical screen by projecting the light intensity distributions, which are formed by the respective scanning areas $A_{Hot}$, $A_{Mid}$, and $A_{Wide}$, by the projection lens assembly 20.

The light intensity distributions can be formed in the respective scanning areas $A_{Hot}$, $A_{Mid}$, and $A_{Wide}$ by the following procedures.

The wide-zone optical deflector $201_{Wide}$ can draw a first two-dimensional image on the wide-zone scanning area $A_{Wide}$ (see FIG. 21) (two-dimensional image corresponding to the irradiation pattern $P_{Wide}$ shown in FIG. 36C) with the excitation light rays $Ray_{Wide}$ two-dimensionally scanning in the horizontal and vertical directions by the mirror part 202 thereof, to thereby form a first light intensity distribution on the wide-zone scanning area $A_{Wide}$ (the light intensity distribution corresponding to the irradiation pattern $P_{Wide}$ shown in FIG. 36C).

The middle-zone optical deflector $201_{Mid}$ can draw a second two-dimensional image on the middle-zone scanning area $A_{Mid}$ (see FIG. 21) (two-dimensional image corresponding to the irradiation pattern $P_{Mid}$ shown in FIG. 36B) with the excitation light rays $Ray_{Mid}$ two-dimensionally scanning in the horizontal and vertical directions by the mirror part 202 thereof in such a manner that the second two-dimensional image overlaps the first two-dimensional image in part, to thereby form a second light intensity distribution on the middle-zone scanning area $A_{Mid}$ (the light intensity distribution corresponding to the irradiation pattern $P_{Mid}$ shown in FIG. 36B). Here, the light intensity of the second light intensity distribution is higher than that of the first light intensity distribution.

The hot-zone optical deflector $201_{Hot}$ can draw a third two-dimensional image on the hot-zone scanning area $A_{Hot}$ (see FIG. 21) (two-dimensional image corresponding to the irradiation pattern $P_{Hot}$ shown in FIG. 36A) with the excitation light rays $Ray_{Hot}$ two-dimensionally scanning in the horizontal and vertical directions by the mirror part 202 thereof in such a manner that the third two-dimensional image overlaps the first and second two-dimensional images in part, to thereby form a third light intensity distribution on the hot-zone scanning area $A_{Hot}$ (the light intensity distribution corresponding to the irradiation pattern $P_{Hot}$ shown in FIG. 36A). Here, the light intensity of the third light intensity distribution is higher than that of the second light intensity distribution.

It should be appreciated that the first to third light intensity distributions can be formed in the respective scanning areas $A_{Wide}$, $A_{Mid}$, and $A_{Hot}$ so as to include the non-irradiation region corresponding to the non-irradiation regions C1, C2, and C3 by overlaying the non-irradiation regions C1, C2, and C3 to form the non-irradiation region.

As described above, the light intensity distributions formed in the respective scanning areas $A_{Wide}$, $A_{Mid}$, and $A_{Hot}$ can be projected forward by the projection lens assembly 20, to thereby form the high-beam light distribution pattern $P_{Hi}$ on a virtual vertical screen as shown in FIG. 36D.

As described above, this reference example can provide a vehicle lighting fixture configured to form a predetermined light distribution pattern (for example, a high-beam light distribution pattern) by overlaying a plurality of irradiation patterns $P_{Hot}$, $P_{Mid}$, and $P_{Wide}$ including the respective non-irradiation regions C1, C2, and C3. Thus, even when the non-irradiation regions C1, C2, and C3 formed in the respective irradiation patterns $P_{Hot}$, $P_{Mid}$, and $P_{Wide}$ are displaced from one another (as shown in FIG. 37), the area of the resulting non-irradiation region C (the shaded region in FIG. 37) can be prevented from decreasing, and as a result, any glare light toward irradiation-prohibitive objects can be prevented from occurring.

This can be achieved by designing the non-irradiation regions C1, C2, and C3 to have respective different sizes to be formed in the respective irradiation patterns $P_{Hot}$, $P_{Mid}$, and $P_{Wide}$.

Figure 38A:
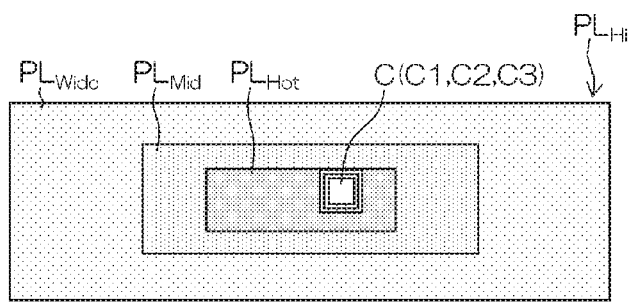
FIG. 38A is a diagram illustrating an example of a high-beam light distribution pattern $PL_{Hi}$ formed by a vehicle lighting fixture 300L disposed on the left side of a vehicle body front portion (on the left side of a vehicle body)
Figure 38B:
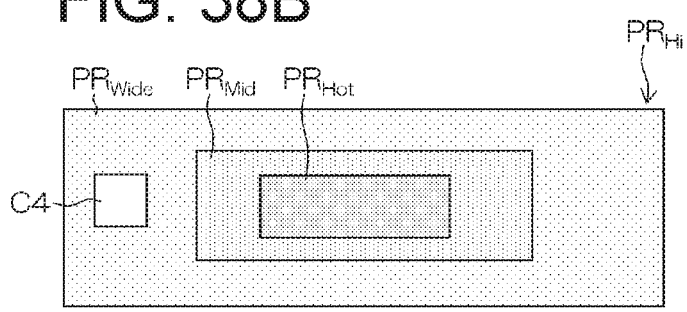
FIG. 38B is a diagram illustrating an example of a high-beam light distribution pattern $PR_{Hi}$ formed by a vehicle lighting fixture 300R disposed on the right side of the vehicle body front portion (on the front side of the vehicle body)

It should be appreciated that two vehicle lighting fixtures 300 can be used to form a single high-beam light distribution pattern $P_{Hi}$ (illustrated in FIG. 38C) by overlaying two high-beam light distribution patterns $PL_{Hi}$ and $PR_{Hi}$ as shown in FIGS. 38A and 38B.

FIG. 38A shows an example of the high-beam light distribution pattern $PL_{Hi}$ formed by a vehicle lighting fixture 300L disposed on the left side of a vehicle body front portion (on the left side of a vehicle body), and FIG. 38B shows an example of the high-beam light distribution pattern $PR_{Hi}$ formed by a vehicle lighting fixture 300R disposed on the right side of the vehicle body front portion (on the front side of the vehicle body). It should be appreciated that the high-beam light distribution patterns $PL_{Hi}$ and $PR_{Hi}$ are not limited to those formed by overlaying a plurality of irradiation patterns (irradiation patterns $PL_{Hot}$, $PL_{Mid}$, and $PL_{Wide}$ and irradiation patterns $PR_{Hot}$, $PR_{Mid}$, and $PR_{Wide}$), but may be formed by a single irradiation pattern or by a combination of two or four or more irradiation patterns overlaid with one another.

Figure 38C:
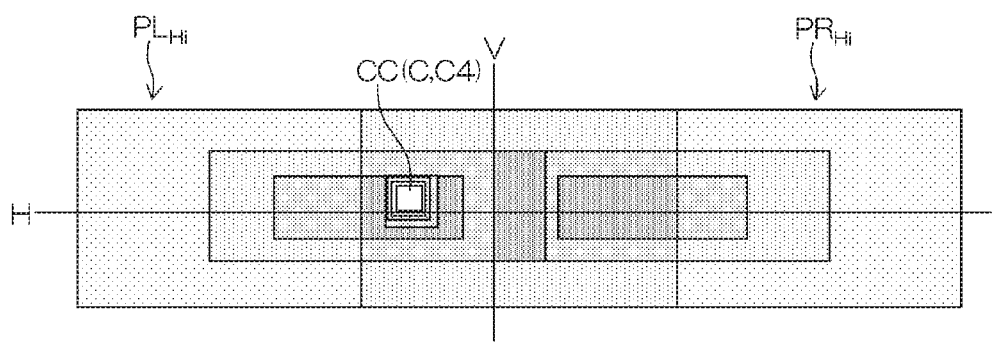
FIG. 38C is a diagram illustrating an example of a high-beam light distribution pattern $P_{Hi}$ configured by overlaying the two irradiation patterns $PL_{Hi}$ and $PR_{Hi}$.

The high-beam light distribution patterns $PL_{Hi}$ and $PR_{Hi}$ as illustrated in FIG. 38C, can be overlaid on each other so that the non-irradiation region C (non-irradiation regions C1, C2, and C3) and non-irradiation region C4 are overlaid on each other to form a non-irradiation region CC.

The non-irradiation region C (non-irradiation regions C1, C2, and C3) and non-irradiation region C4 can have respectively different sizes as illustrated in FIGS. 38A to 38C. For example, the relationship of the non-irradiation region C1<the non-irradiation region C2<the non-irradiation region C3<the non-irradiation region C4 may hold. Therefore, the smallest non-irradiation region C1 can be formed in the smallest irradiation pattern $P_{Hot}$ (with the maximum light intensity). This means that the irradiation pattern $P_{Hot}$ can allow a wider region to be irradiated with light more brighter when compared with the case where a smallest non-irradiation region C1 is formed in the irradiation patterns $P_{Mid}$ and $P_{Wide}$ other than the smallest irradiation pattern $P_{Hot}$. Furthermore, since the smallest non-irradiation region C1 is formed in the smallest irradiation pattern $P_{Hot}$ with the maximum light intensity, the bright/dark ratio near the contour of the non-irradiation region CC can become relatively high when compared with the case where a smallest non-irradiation region C1 is formed in the irradiation patterns $P_{Mid}$ and $P_{Wide}$ other than the smallest irradiation pattern $P_{Hot}$. As a result, the non-irradiation region CC can have sharp and clear contour. It should be appreciated that the non-irradiation regions C1, C2, C3, and C4 may have respective different sizes and the relation in size of the non-irradiation region C1<the non-irradiation region C2<the non-irradiation region C3<the non-irradiation region C4 is not limitative. In order to blur the contour of the non-irradiation region CC, the relation in size of the non-irradiation regions C1, C2, C3, and C4 can be controlled as appropriate in place of the relationship described above.

Next, a description will now be given of a case where, when at least one of excitation light sources (for example, wide-zone, middle-zone, and hot-zone excitation light sources $12_{Wide}$, $12_{Mid}$, and $12_{Hot}$) and optical deflectors (for example, wide-zone, middle-zone, and hot-zone optical deflectors $201_{Wide}$, $201_{Mid}$, and $201_{Hot}$) is failed, the luminance distribution assigned to the failed optical deflector or the optical deflector corresponding to the failed excitation light source before the detection of such a failure can be compensated with.

Figure 39:
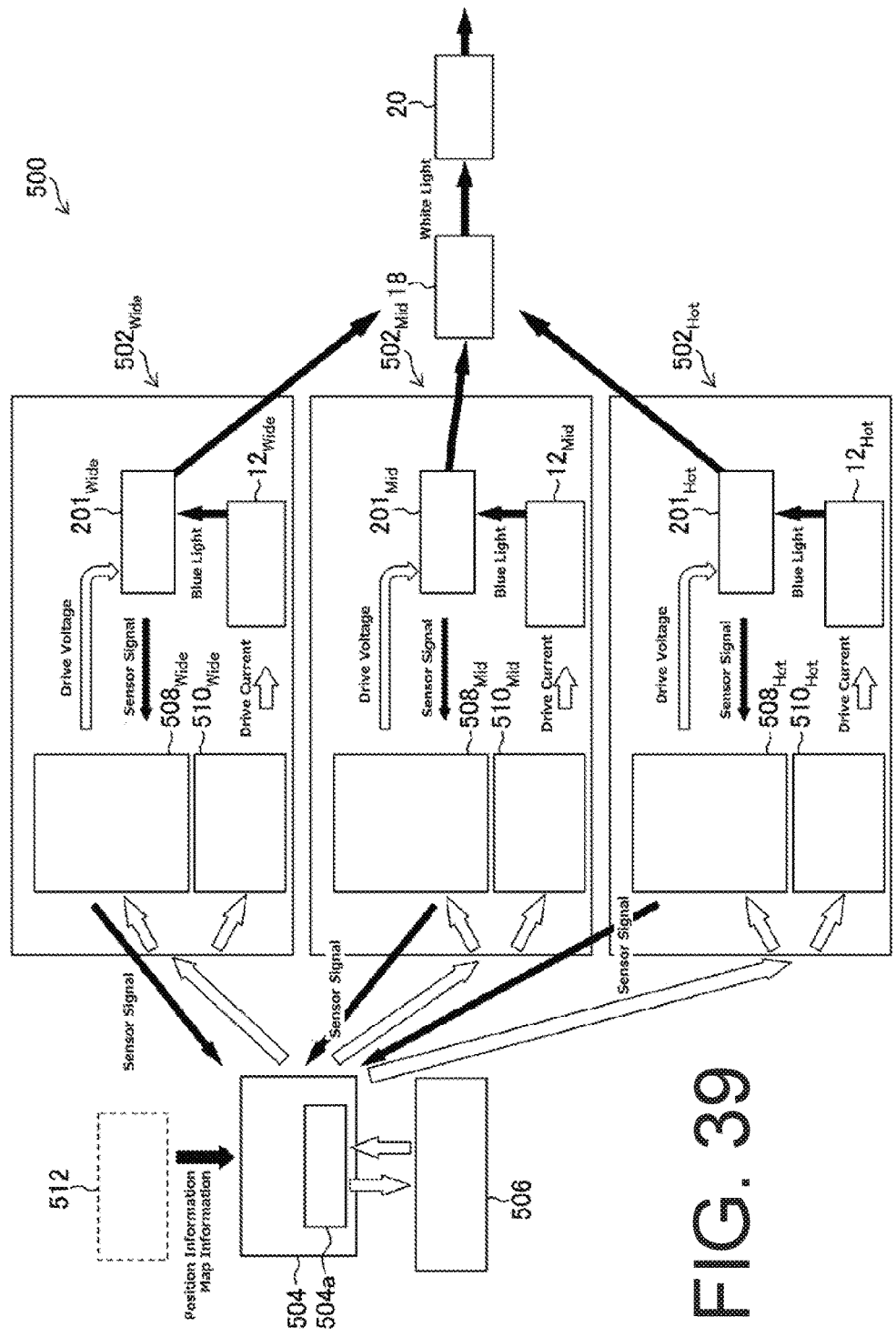
FIG. 39 is a schematic diagram illustrating a configuration of a vehicle lighting fixture 500 of a reference example.

FIG. 39 is a schematic diagram illustrating a configuration of a vehicle lighting fixture 500 of this reference example.

As illustrated in FIG. 39, the vehicle lighting fixture 500 can have the same configuration as that of the vehicle lighting fixture 300 or 400 of the previously described reference examples. The vehicle lighting fixture 500 can include a wide-zone optical unit $502_{Wide}$, a middle-zone optical unit $502_{Mid}$, a hot-zone optical unit $502_{Hot}$, an imaging engine CPU 504, a storage device 506, a wavelength converting member 18 (for example, phosphor plate), a projection lens assembly 20, etc.

Hereinbelow, a description will be given of the different point of this reference example from the previously described reference example (vehicle lighting fixture 300 or 400), and the same or similar components of this reference example as those in the previously described reference example will be denoted by the same reference numerals and a description thereof will be omitted as appropriate.

The wide-zone optical unit $502_{Wide}$ can include a wide-zone excitation light source $12_{Wide}$, a wide-zone optical deflector $201_{Wide}$, a wide-zone driver/controller $508_{Wide}$ for driving the wide-zone optical deflector and outputting a synchronous signal and the like for control, and a wide-zone current-strengthened laser driver $510_{Wide}$. Similarly, the middle-zone optical unit $502_{Mid}$ can include a middle-zone excitation light source $12_{Mid}$, a middle-zone optical deflector $201_{Mid}$, a middle-zone driver/controller $508_{Mid}$ for driving the middle-zone optical deflector and outputting a synchronous signal and the like for control, and a middle-zone current-strengthened laser driver $510_{Mid}$. Furthermore, similarly, the hot-zone optical unit $502_{Hot}$ can include a hot-zone excitation light source $12_{Hot}$, a hot-zone optical deflector $201_{Hot}$, a hot-zone driver/controller $508_{Hot}$ for driving the hot-zone optical deflector and outputting a synchronous signal and the like for control, and a hot-zone current-strengthened laser driver $510_{Hot}$.

The storage device 506 can store various pieces of information, including basic light distribution data, divided light distribution data (wide-zone divided light distribution data, middle-zone divided light distribution data, and hot-zone divided light distribution data), voltage-swing angle characteristics (for example, those illustrated in FIGS. 28A and 28B), current-brightness characteristics, etc.

Figure 45:
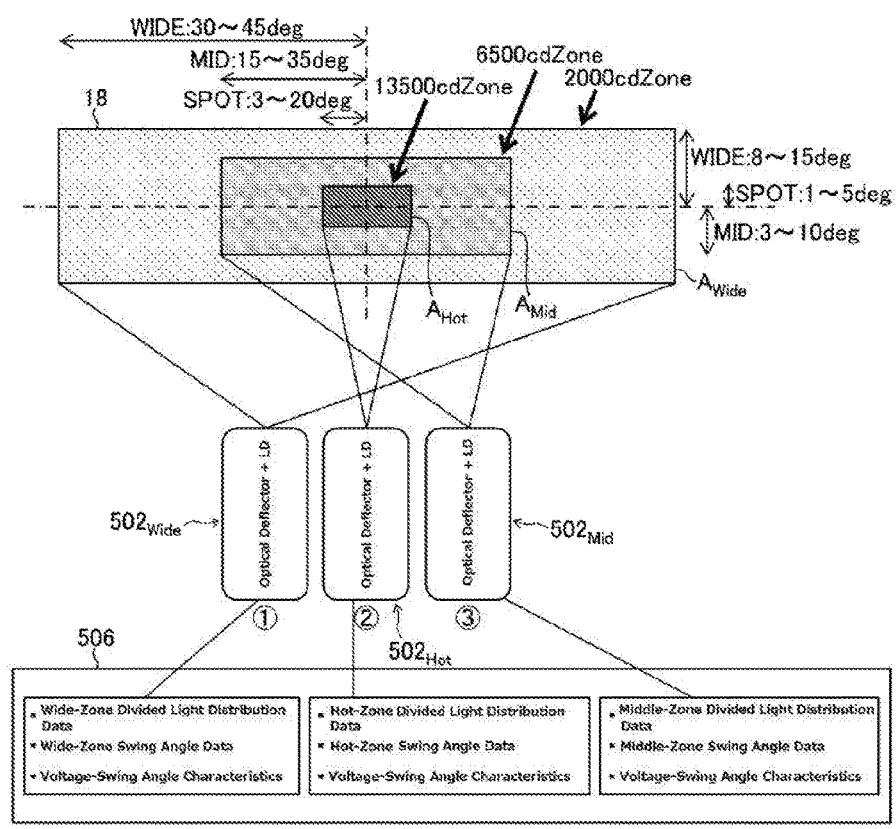
FIG. 45 is a diagram illustrating the relationship between each of data (swing angle data, etc.) and each of the optical units $502_{Wide}$, $502_{Mid}$, and $502_{Hot}$ (each of the optical deflectors $201_{Wide}$, $201_{Mid}$, and $201_{Hot}$.

As illustrated in FIG. 45, these pieces of data can be stored in the storage device 506 in association with the respective optical units $502_{Wide}$, $502_{Mid}$, and $502_{Hot}$ (or the respective optical deflectors $201_{Wide}$, $201_{Mid}$, and $201_{Hot}$).

Figure 40:
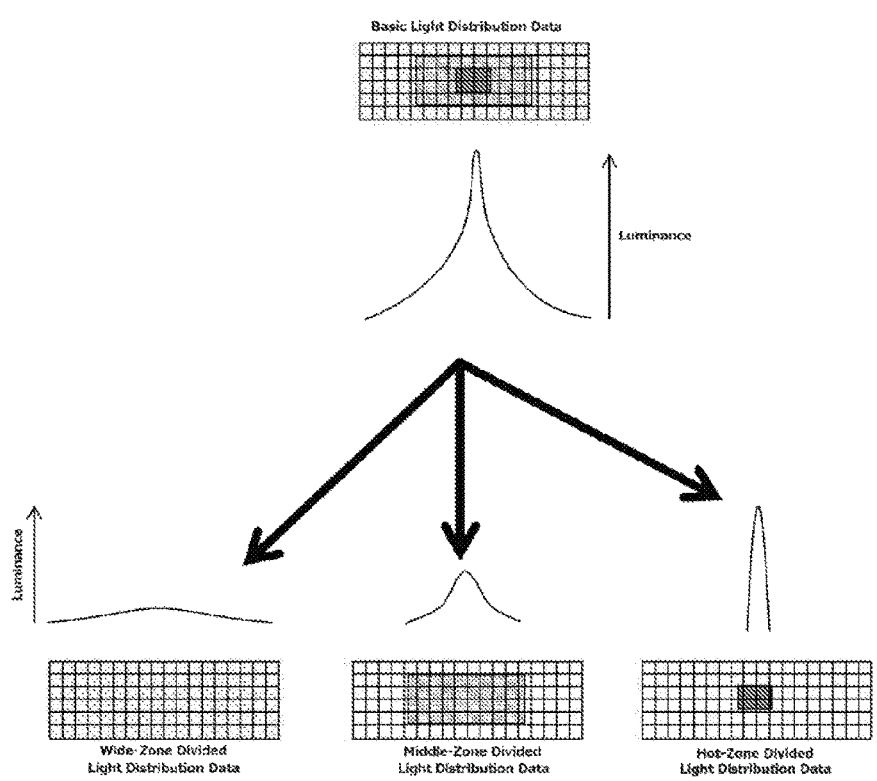
FIG. 40 is a schematic diagram illustrating a process of dividing optimum light distribution when a mode is transferred to a normal driving mode.

Here, the basic light distribution data can be referred to as a basic luminance distribution or a basic light distribution, and can be represented by a luminance image formed by a plurality of pixels with a plurality of luminance values in a plurality of bits. For example, such a luminance image can be formed by 640 pixels by 360 pixels as schematically illustrated in FIG. 40. Furthermore, the basic light distribution data can include various patterns for various driving situations, like a highway basic light distribution pattern, a mountain-road basic light distribution pattern, an urban-road basic light distribution pattern, a right-hand traffic basic light distribution pattern, and a left-hand traffic basic light distribution pattern. Therefore, the various pieces of data can be stored in advance in the storage device 506 in association with the information for identifying the various driving situations. Note that the basic light distribution data can be generated by a predefined mathematical means.

Furthermore, the divided light distribution data can be referred to as a divided luminance distribution or a divided light distribution, and can be represented by a luminance image (for example, those illustrated in FIG. 40) formed by a plurality of pixels with a plurality of luminance values in a plurality of bits. For example, such divided light distribution data can be generated by a process of dividing optimum light distribution to be described later. Furthermore, the divided light distribution data can include various patterns for various driving situations, like a highway divided light distribution pattern, a mountain-road divided light distribution pattern, an urban-road divided light distribution pattern, a right-hand traffic divided light distribution pattern, and a left-hand traffic divided light distribution pattern. Therefore, the various pieces of data can be stored in advance in the storage device 506 in association with the information for identifying the various driving situations.

As illustrated in FIG. 45, the swing angle data can include swing angle data for wide-zone divided light distribution data (for example, 45 degrees in the horizontal direction and 15 degrees in the vertical direction), swing angle data for middle-zone divided light distribution data (for example, 35 degrees in the horizontal direction and 10 degrees in the vertical direction), and swing angle data for hot-zone divided light distribution data (for example, 20 degrees in the horizontal direction and 5 degrees in the vertical direction). The swing angle data can be generated by the process of dividing optimum light distribution to be described later. The various pieces of swing angle data can be prepared for respective pieces of divided light distribution data and stored in advance in the storage device 506 in association with the respective pieces of divided light distribution data.

The voltage-swing angle characteristics can be prepared for the respective optical deflectors. The current-brightness characteristics can be prepared for the respective excitation light sources.

The imaging engine CPU 504 can control the three excitation light sources $12_{Wide}$, $12_{Mid}$, and $12_{Hot}$, and the three optical deflectors $201_{Wide}$, $201_{Mid}$, and $201_{Hot}$ so that the luminance distributions formed in the respective three scanning areas $A_{Wide}$, $A_{Mid}$, and $A_{Hot}$ (see FIG. 45) are coincident with respective target luminance distributions, for example, a first target luminance distribution or a second target luminance distribution to be described later.

The imaging engine CPU 504 can output a drive signal(s) to the respective driver/controller $508_{Wide}$, $508_{Mid}$, and $508_{Hot}$ on the basis of the respective pieces of divided light distribution data (and respective pieces of swing angle data and voltage-swing angle characteristics) so as to control them. This control can be performed to apply respective drive voltages to the respective optical deflectors $201_{Wide}$, $201_{Mid}$, and $201_{Hot}$ so that the vertical width and the horizontal width of the luminance distribution formed in each of the scanning areas $A_{Wide}$, $A_{Mid}$, and $A_{Hot}$ become those of luminance distribution (light intensity distribution) represented by the divided light distribution data.

Furthermore, the imaging engine CPU 504 can output a drive signal(s) to the respective current-strengthened laser driver $510_{Wide}$, $510_{Mid}$, and $510_{Hot}$ on the basis of the respective pieces of divided light distribution data (and respective pieces of current-brightness characteristics) so as to control them. This control can be performed to apply respective drive currents to the respective excitation light sources $12_{Wide}$, $12_{Mid}$, and $12_{Hot}$ so that the luminance distribution formed in each of the scanning areas $A_{Wide}$, $A_{Mid}$, and $A_{Hot}$ becomes the luminance distribution (light intensity distribution) represented by the divided light distribution data.

Then, the respective driver/controllers $508_{Wide}$, $508_{Mid}$, and $508_{Hot}$ can apply the drive voltages to the respective optical deflectors $201_{Wide}$, $201_{Mid}$, and $201_{Hot}$ according to the control (drive signal) by the imaging engine CPU 504, with the drive voltages having been adjusted such that the vertical width and the horizontal width of the luminance distribution formed in each of the scanning areas $A_{Wide}$, $A_{Mid}$, and $A_{Hot}$ become those of luminance distribution represented by the divided light distribution data. Here, the drive voltage can be a drive voltage for resonantly driving the optical deflector and/or a drive voltage for nonresonantly driving the optical deflector, for example, those illustrated in FIG. 12.

Furthermore, the respective current-strengthened laser drivers $510_{Wide}$, $510_{Mid}$, and $510_{Hot}$ can apply the drive currents to the respective excitation light sources $12_{Wide}$, $12_{Mid}$, and $12_{Hot}$ according to the control (drive signal) by the imaging engine CPU 504, with the drive currents having been adjusted such that the luminance distribution formed in each of the scanning areas $A_{Wide}$, $A_{Mid}$, and $A_{Hot}$ becomes the luminance distribution represented by the divided light distribution data. Here, the drive current can be that illustrated in FIG. 12.

As described above, the imaging engine CPU 504 can function as a control unit for controlling the three excitation light sources $12_{Wide}$, $12_{Mid}$, and $12_{Hot}$, and the three optical deflectors $201_{Wide}$, $201_{Mid}$, and $201_{Hot}$ so that the luminance distributions (wide-zone, middle-zone, and hot-zone divided luminance distributions) assigned to the three optical deflectors $201_{Wide}$, $201_{Mid}$, and $201_{Hot}$ can be formed in the wavelength converting member 18. Note that the imaging engine CPU 504 can be configured to execute a predetermined program to achieve the function of the control unit.

Figure 41:
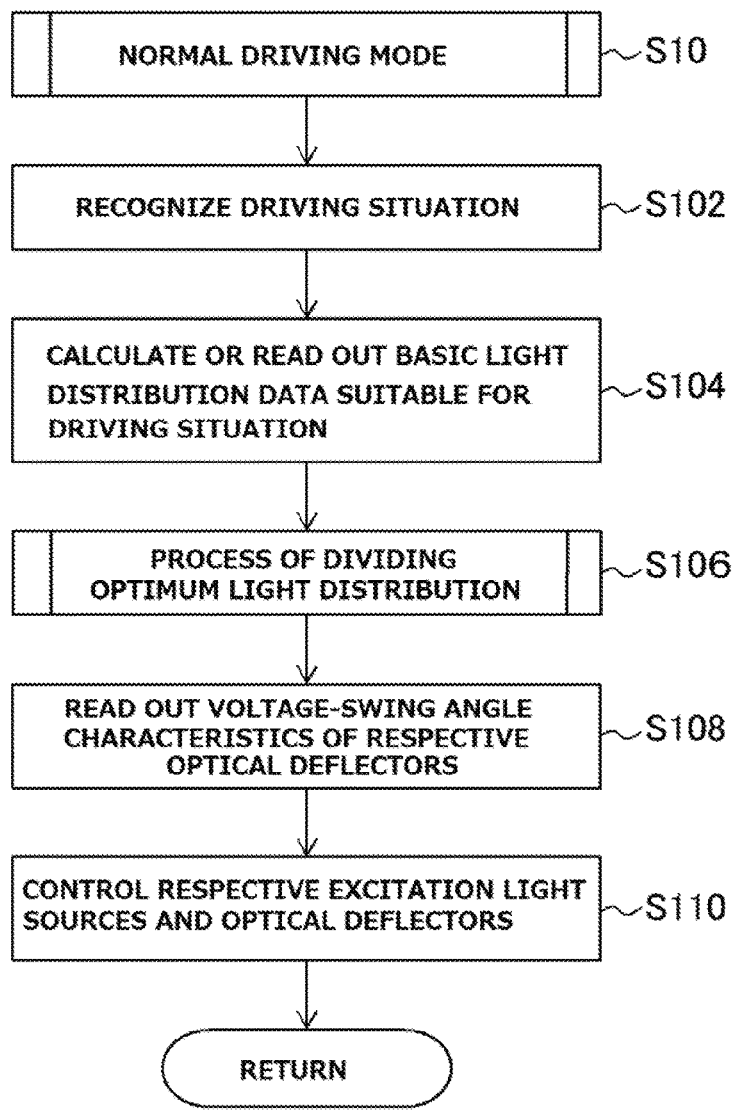
FIG. 41 is a flow chart illustrating an operation example when a mode is transferred to a normal driving mode.

FIG. 41 is a flow chart illustrating an operation example when a mode is transferred to a normal driving mode.

As illustrated in FIG. 41, when the mode is transferred to a normal driving mode, a recognition processing of the driving situation is first performed (Step S102).

In this case, a plurality of sensors can be attached to a vehicle body in which the vehicle lighting fixture 500 is installed. According to at least one signal from the plurality of sensors, the driving situation at that time can be recognized. For example, on the basis of a signal (signal indicative of own vehicle position information, map information, etc.) from a car navigation system 512 (see FIG. 39), it is recognized as to which predetermined driving situation (highway driving, mountain-road driving, urban-road driving, right-hand traffic driving, left-hand traffic driving, etc.) the driving situation is.

Next, the basic light distribution data suitable for and corresponding to the recognized driving situation is calculated or read out from the storage device 506 (Step S104).

Figure 42:
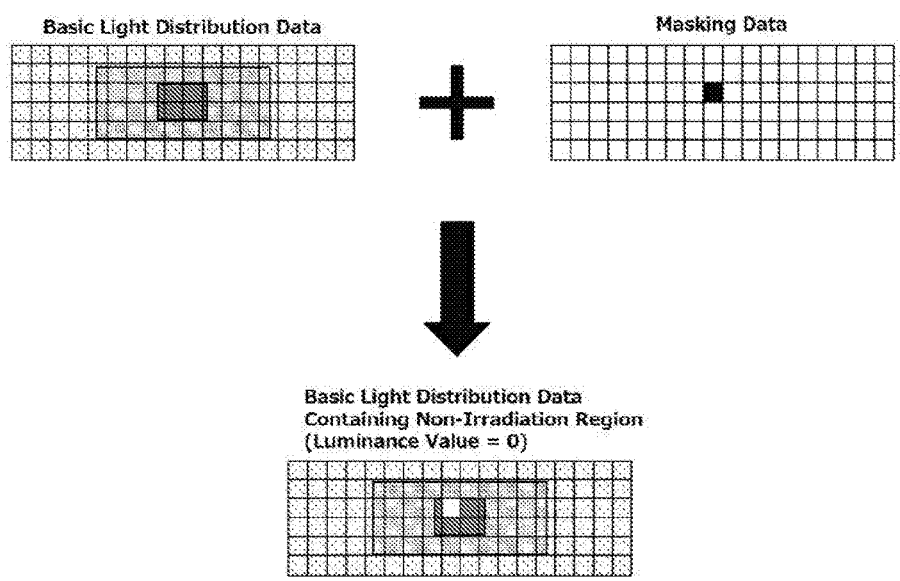
FIG. 42 is a diagram illustrating an example of generating a basic light distribution pattern using basic light distribution data and mask data for forming a non-irradiation region.

If an imaging device (not illustrated) such as a CCD electrically connected to the imaging engine CPU 504 captures an image containing an irradiation-prohibitive object such as a preceding vehicle, an oncoming vehicle, and a pedestrian, then a basic distribution pattern including a non-irradiation region where the luminance value is zero (0) is generated. In this case the non-irradiation region corresponds to the region where the irradiation-prohibitive object is present. For example, as illustrated in FIG. 42, this basic light distribution including a non-irradiation region where the luminance value is zero (0) can be obtained by performing a predetermined calculation using basic light distribution data and masking data.

Next, the process of dividing optimum light distribution is performed (Step S106).

Figure 43:
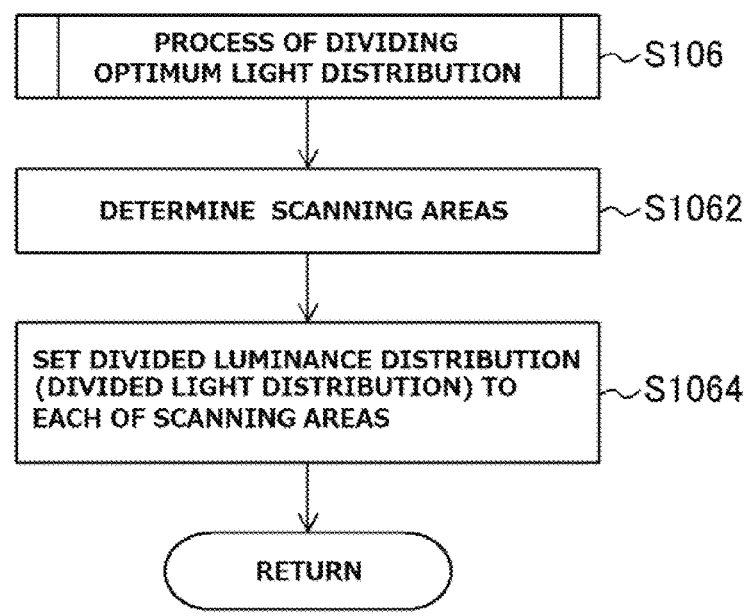
FIG. 43 is a flow chart illustrating the process of dividing optimum light distribution.

FIG. 40 is a schematic diagram illustrating a process of dividing optimum light distribution when a mode is transferred to a normal driving mode, and FIG. 43 is a flow chart illustrating the process of dividing optimum light distribution.

As illustrated in FIG. 40, the process of dividing optimum light distribution when a mode is transferred to a normal driving mode (step S106) is a process of generating divided light distribution data (wide-zone divided light distribution data, middle-zone divided light distribution data, and hot-zone divided light distribution data) and swing angle data (wide-zone swing angle data, middle-zone swing angle data, and hot-zone swing angle data) assigned to the respective optical deflectors $201_{Wide}$, $201_{Mid}$, and $201_{Hot}$.

Figure 44A:
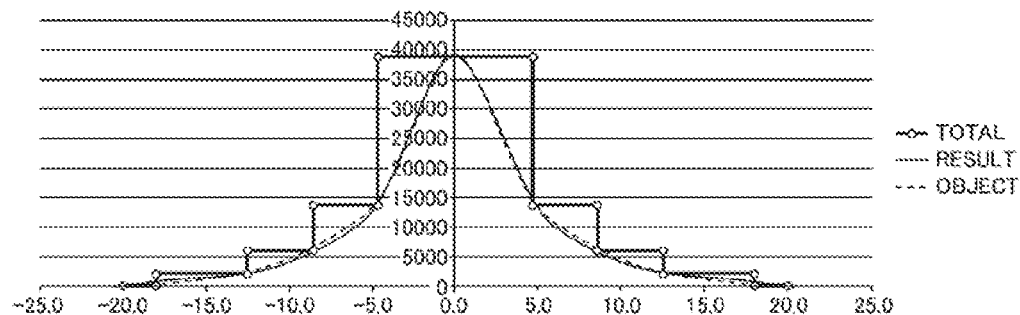
FIG. 44A includes graphs illustrating a first objective luminance distribution as an object and the like, FIG. 44B includes graphs illustrating scanning areas assigned to respective optical units $502_{Wide}$, $502_{Mid}$, and $502_{Hot}$ (respective combinations of one of excitation light sources $12_{Wide}$, $12_{Mid}$, and $12_{Hot}$ and corresponding one of optical deflectors $201_{Wide}$, $201_{Mid}$, and $201_{Hot}$), and FIG. 44C includes graphs illustrating divided light distribution patterns distributed (set) to the respective scanning areas (including wide-zone divided light distribution data, middle-zone divided light distribution data, and hot-zone divided light distribution data)
Figure 44B:
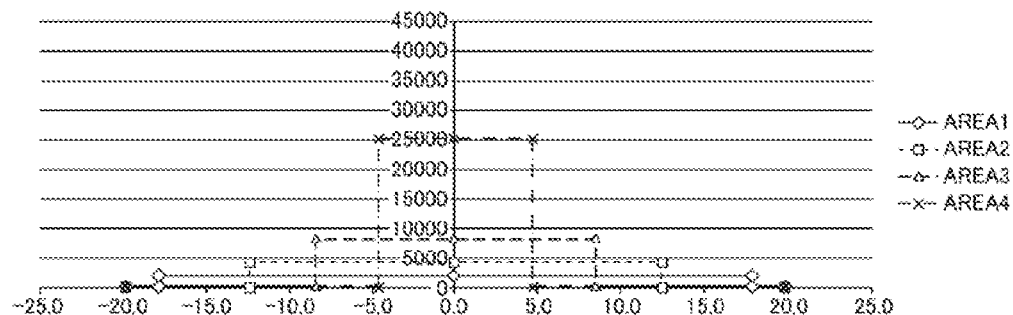
Figure 44C:
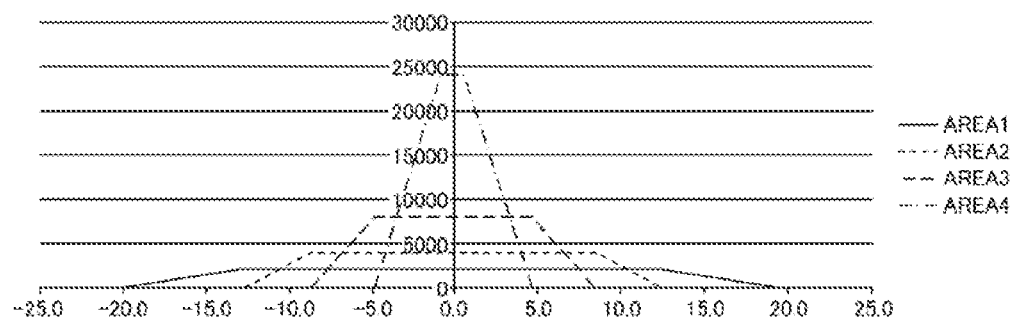

FIG. 44A includes graphs illustrating a first objective luminance distribution as an object and the like, FIG. 44B includes graphs illustrating scanning areas assigned to the respective optical deflectors $201_{Wide}$, $201_{Mid}$, and $201_{Hot}$, and FIG. 44C includes graphs illustrating divided light distribution data distributed (set) to the respective scanning areas (including wide-zone divided light distribution data, middle-zone divided light distribution data, and hot-zone divided light distribution data). In FIGS. 44A to 44C, the vertical axis represents the light intensity (or luminance) and the horizontal axis represents the angle.

First, the process of dividing optimum light distribution when a mode is transferred to a normal driving mode (step S106) determines the maximum light intensity and the scanning areas (the scanning areas $A_{Wide}$, $A_{Mid}$, and $A_{Hot}$, i.e. swing angle data) assigned to the respective optical deflectors $201_{Wide}$, $201_{Mid}$, and $201_{Hot}$ (see FIG. 44B).

The maximum light intensity means the maximum light intensity at each of the scanning areas assigned to the respective optical deflectors $201_{Wide}$, $201_{Mid}$, and $201_{Hot}$, and examples thereof may include approx. 2,500 cd, approx. 4,500 cd, approx. 8,000 cd, and approx. 25,000 cd (four points on the vertical axis in FIG. 44B). The data of the maximum light intensity can be stored in advance in the storage device 506 in association with the basic light distribution data, and also can be read out therefrom together with the basic light distribution data in step S104. Of course, the maximum light intensity can be generated by predefined calculation on the basis of the basic light distribution data etc.

The scanning areas (swing angle data) assigned to the respective optical deflectors $201_{Wide}$, $201_{Mid}$, and $201_{Hot}$ can be determined by the angles (angular ranges) between intersections of the horizontal line passing through the determined maximum light intensity and the graph showing the OBJECT in FIG. 44A.

For example, the scanning area (or the hot-zone swing angle data) assigned to the optical deflector $201_{Hot}$ can be determined by the angles (angular range of ±5.0° between intersections of the horizontal line passing through the determined maximum light intensity (approximately 25,000 cd) and the graph (the first target luminance distribution) showing the OBJECT in FIG. 44A.

The respective scanning areas in FIG. 44B are summed up to show the graph TOTAL in FIG. 44A. Incidentally, FIG. 44B includes four maximum light intensities and four scanning areas AREA1 to AREA4, but in the reference examples and the like utilizing three optical deflectors $201_{Wide}$, $201_{Mid}$, and $201_{Hot}$, three maximum light intensities and three scanning areas are determined in response to three optical deflectors $201_{Wide}$, $201_{Mid}$, and $201_{Hot}$.

Next, an optimization process is performed. Specifically, the process can include optimization of the determined scanning areas assigned to the respective optical deflectors $201_{Wide}$, $201_{Mid}$, and $201_{Hot}$ to contain the graph of OBJECT (first target luminance distribution) in FIG. 44A. This may be done by iterative calculation or sequential optimization calculation. Note that the respective scanning areas (swing angle data) assigned to the respective optical deflectors $201_{Wide}$, $201_{Mid}$, and $201_{Hot}$ may be stored in the storage device 506 in advance to be read out together with the basic light distribution data in step S104.

Next, the basic light distribution data calculated or read-out in step S104 can be divided into the three wide-zone divided light distribution data, middle-zone divided light distribution data, and hot-zone divided light distribution data as illustrated in FIG. 40, and distributed (set) to the respective scanning areas. At that time, the basic light distribution data calculated or read-out in step S104 can be divided into three and distributed (set) to the respective scanning areas so that the data by summing up the divided respective pieces of the light distribution data can be coincident with or nearly equal to the first target luminance distribution (being the basic light distribution data calculated or read-out in step S104 or also referred to as the first target light distribution) as illustrated in FIG. 44C.

Specifically, first, a divided light distribution 1 (for example, wide-zone divided light distribution data, see the graph of AREA1 in FIG. 44C) can be determined so that it is coincident with or nearly equal to the graph (first target luminance distribution) showing the OBJECT in FIG. 44A in the scanning area 1 in FIG. 44B (the area of AREA1 in FIG. 44B).

Next, a divided light distribution 2 (for example, middle-zone divided light distribution data, see the graph of AREA2 in FIG. 44C) can be determined so that it is coincident with or nearly equal to the graph (first target luminance distribution or that obtained by subtracting the divided light distribution 1 from the first target luminance distribution) showing the OBJECT in FIG. 44A in the scanning area 2 in FIG. 44B (the area of AREA2 in FIG. 44B).

Furthermore, a divided light distribution 3 (for example, middle-zone divided light distribution data, see the graph of AREA3 in FIG. 44C) can be determined so that it is coincident with or nearly equal to the graph (first target luminance distribution or that obtained by subtracting the divided light distributions 1 and 2 from the first target luminance distribution) showing the OBJECT in FIG. 44A in the scanning area 3 in FIG. 44B (the area of AREA3 in FIG. 44B).

Furthermore, a divided light distribution 4 (for example, hot-zone divided light distribution data, see the graph of AREA4 in FIG. 44C) can be determined by subtracting the divided light distributions 1, 2, and 3 from the basic light distribution (basic light distribution data).

In this manner, the divided light distributions (divided luminance distributions or wide-zone divided light distribution data, middle-zone divided light distribution data, and hot-zone divided light distribution data) and swing angle data (wide-zone swing angle data, middle-zone swing angle data, and hot-zone swing angle data) assigned to the respective optical deflectors $201_{Wide}$, $201_{Mid}$, and $201_{Hot}$ can be generated.

The first target luminance distribution can be configured to have the maximum luminance at or near its center and gradually decreased luminance toward both sides (vertically and horizontally) as in the graph of OBJECT in FIG. 44A. The first target luminance distribution may be configured to have the maximum luminance at a position shifted from its center and gradually decreased luminance toward both sides (vertically and horizontally).

Incidentally, FIG. 44C includes four scanning areas AREA1 to AREA4 divided by four and distributed (set), but in the reference examples and the like utilizing three optical deflectors $201_{Wide}$, $201_{Mid}$, and $201_{Hot}$, three scanning areas are distributed (set) in response to three optical deflectors $201_{Wide}$, $201_{Mid}$, and $201_{Hot}$. Accordingly, the respective pieces of divided light distribution date distributed in this manner may be summed up to become the graph of RESULT in FIG. 44A.

Furthermore, in place of the above-described process of dividing optimum light distribution (step S106), the divided light distribution data (wide-zone divided light distribution data, middle-zone divided light distribution data, and hot-zone divided light distribution data) and swing angle data (wide-zone swing angle data, middle-zone swing angle data, and hot-zone swing angle data) in association therewith that are suitable for and correspond to a driving situation identified in step S102 can be read out from the storage device 506. In this case, the process of step S104 can be omitted.

Next, the voltage-swing angle characteristics of the respective optical deflectors $201_{Wide}$, $201_{Mid}$, and $201_{Hot}$ can be read out from the storage device 506. If the voltage-swing angle characteristics of the respective optical deflectors $201_{Wide}$, $20_{Mid}$, and $201_{Hot}$ temporarily vary, the voltage-swing angle characteristics of the respective optical deflectors $201_{Wide}$, $201_{Mid}$, and $201_{Hot}$ may be appropriately updated.

Next, the imaging engine CPU 504 can control the three excitation light sources $12_{Wide}$, $12_{Mid}$, and $12_{Hot}$ and the three optical deflectors $201_{Wide}$, $201_{Mid}$, and $201_{Hot}$ so that the luminance distributions formed in the respective scanning areas $A_{Wide}$, $A_{Mid}$, and $A_{Hot}$ (see FIG. 45) are coincident with the first target luminance distribution (step S110).

The imaging engine CPU 504 can output a drive signal(s) to the respective driver/controllers $508_{Wide}$, $508_{Mid}$, and $508_{Hot}$ on the basis of the respective pieces of divided light distribution data (and respective pieces of swing angle data and voltage-swing angle characteristics) so as to control them. This control can be performed to apply respective drive voltages to the respective optical deflectors $201_{Wide}$, $201_{Mid}$, and $201_{Hot}$ so that the vertical width and the horizontal width of the luminance distribution formed in each of the scanning areas $A_{Wide}$, $A_{Mid}$, and $A_{Hot}$ become those of luminance distribution (light intensity distribution) represented by the divided light distribution data.

At the same time, the imaging engine CPU 504 can output a drive signal(s) to the respective current-strengthened laser drivers $510_{Wide}$, $510_{Mid}$, and $510_{Hot}$ on the basis of the respective pieces of divided light distribution data (and respective pieces of current-brightness characteristics) so as to control them. This control can be performed to apply respective drive currents to the respective excitation light sources $12_{Wide}$, $12_{Mid}$, and $12_{Hot}$ so that the luminance distribution formed in each of the scanning areas $A_{Wide}$, $A_{Mid}$, and $A_{Hot}$ becomes the luminance distribution (light intensity distribution) represented by the divided light distribution data.

Then, the respective driver/controllers $508_{Wide}$, $508_{Mid}$, and $508_{Hot}$ can apply the drive voltages to the respective optical deflectors $201_{Wide}$, $201_{Mid}$, and $201_{Hot}$ according to the control (drive signal) by the imaging engine CPU 504, with the drive voltages having been adjusted such that the vertical width and the horizontal width of the luminance distribution formed in each of the scanning areas $A_{Wide}$, $A_{Mid}$, and $A_{Hot}$ become those of luminance distribution represented by the divided light distribution data. Here, the drive voltage can be a drive voltage for resonantly driving the optical deflector and/or a drive voltage for nonresonantly driving the optical deflector, for example, those illustrated in FIG. 12.

In synchronization with this, the respective current-strengthened laser drivers $510_{Wide}$, $510_{Mid}$, and $510_{Hot}$ can apply the drive currents to the respective excitation light sources $12_{Wide}$, $12_{Mid}$, and $12_{Hot}$ according to the control (drive signal) by the imaging engine CPU 504, with the drive currents having been adjusted such that the luminance distribution formed in each of the scanning areas $A_{Wide}$, $A_{Mid}$, and $A_{Hot}$ becomes the luminance distribution represented by the divided light distribution data. Here, the drive current can be one illustrated in FIG. 12.

As described above, when the process of dividing optimum light distribution when a mode is transferred to a normal driving mode (S106) is performed, the three excitation light sources $12_{Wide}$, $12_{Mid}$, and $12_{Hot}$ and the three optical deflectors $201_{Wide}$, $201_{Mid}$, and $201_{Hot}$ can be controlled by the imaging engine CPU 504 to form the luminance distribution (wide-zone divided luminance distribution, middle-zone divided luminance distribution, and hot-zone divided luminance distribution) configured to be coincident with the first target luminance distribution or the luminance distributions assigned to the three excitation light sources $12_{Wide}$, $12_{Mid}$, and $12_{Hot}$.

Accordingly, since the three excitation light sources $12_{Wide}$, $12_{Mid}$, and $12_{Hot}$ and the three optical deflectors $201_{Wide}$, $201_{Mid}$, and $201_{Hot}$ can be controlled in synchronization with one another, the three optical deflectors $201_{Wide}$, $201_{Mid}$, and $201_{Hot}$ can draw two-dimensional images on the three scanning areas $A_{Wide}$, $A_{Mid}$, and $A_{Hot}$ by the excitation light rays two-dimensionally scanning in the horizontal and vertical directions by the mirror parts 202 of the respective optical deflectors $201_{Wide}$, $201_{Mid}$, and $201_{Hot}$. As a result, the luminance distributions coincident with or substantially coincident with the first target luminance distribution can be formed on the wavelength converting member 18.

The luminance distributions formed on the wavelength converting member 18 can be projected forward by the projection lens assembly 20 to form a predetermined light distribution pattern corresponding to the luminance distributions on a virtual vertical screen.

Next, a description will be given of a process of changing luminance distributions assigned to a plurality of optical deflectors (for example, three optical deflectors $201_{(1)}$, $201_{(2)}$, and $201_{(3)}$) as a reference example.

Figure 46:
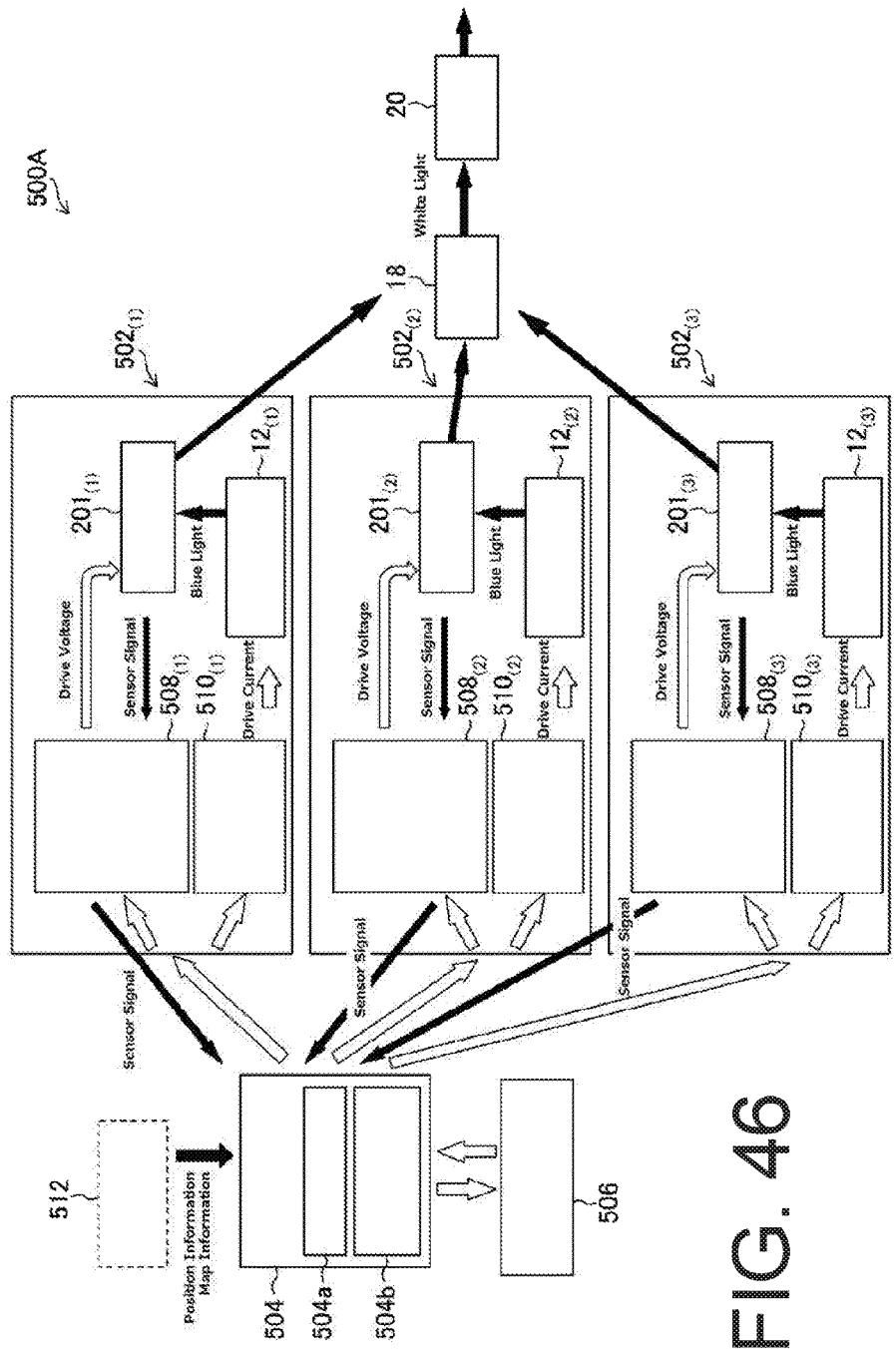
FIG. 46 is a schematic diagram illustrating a configuration of a vehicle lighting fixture 500A of a reference example.

FIG. 46 is a schematic diagram illustrating a configuration of a vehicle lighting fixture 500A of this reference example.

As illustrated in FIG. 46, the vehicle lighting fixture 500A of this reference example can include the same or similar configuration as that of the vehicle lighting fixture 500 of FIG. 39 and further include an assigned scanning area register 504b built in the imaging engine CPU 504.

Hereinafter, a description will be given of a different point of this reference example from the vehicle lighting fixture 500 of FIG. 39, and the same or similar components as those in the vehicle lighting fixture 500 of FIG. 39 are denoted by the same reference numerals and descriptions thereof are omitted.

As illustrated in FIG. 46, the vehicle lighting fixture 500A of this reference example can include three optical units $502_{(1)}$, $502_{(2)}$, and $502_{(3)}$, the imaging engine CPU 504, the storage device 506, the wavelength converting member 18 (for example, phosphor plate), the projection lens assembly 20, etc.

The first optical unit $502_{(1)}$ can include a first excitation light source $12_{(1)}$, a first optical deflector $201_{(1)}$, a first driver/controller $508_{(1)}$ for driving the first optical deflector and outputting a synchronous signal and the like for control, and a first current-strengthened laser driver $510_{(1)}$. Similarly, the second optical unit $502_{(2)}$ can include a second excitation light source $12_{(2)}$, a second optical deflector $201_{(2)}$, a second driver/controller $508_{(2)}$ for driving the second optical deflector and outputting a synchronous signal and the like for control, and a second current-strengthened laser driver $510_{(2)}$. Similarly, the third optical unit $502_{(3)}$ can include a third excitation light source $12_{(3)}$, a third optical deflector $201_{(3)}$, a third driver/controller $508_{(3)}$ for driving the third optical deflector and outputting a synchronous signal and the like for control, and a third current-strengthened laser driver $510_{(3)}$.

The imaging engine CPU 504 can execute a predefined program to function as a changing unit for changing the luminance distributions assigned to the respective three optical deflectors $201_{(1)}$, $201_{(2)}$, and $201_{(3)}$. The imaging engine CPU 504 can change the luminance distributions assigned to the respective optical deflectors $201_{(1)}$, $201_{(2)}$, and $201_{(3)}$ at a predetermined timing. For example, the timing may be a timing when a not-illustrated headlamp switch is turned off or a timing when the headlamp switch is turned on. For example, assume that the three optical deflectors $201_{(1)}$, $201_{(2)}$, and $201_{(3)}$ can form respectively different sized luminance distributions. In this case, the imaging engine CPU 504 can change the luminance distributions different in size from those assigned to the optical deflectors before the change. This can be achieved by, for example, storing a mode A (or data representing the mode A), a mode B (or data representing the mode B), or a mode C (or data representing the mode C) in the assigned scanning area register 504b built in the imaging engine CPU 504, as illustrated in FIGS. 47A to 47C.

Figure 47A:
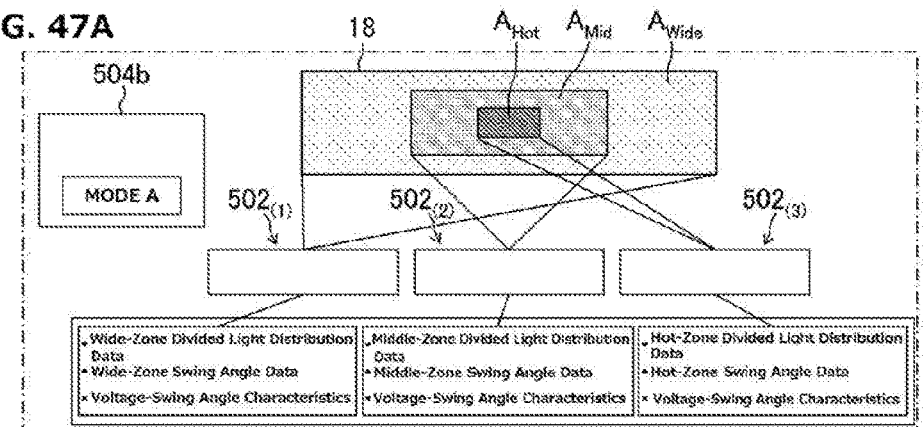
FIGS. 47A, 47B, and 47C are each a diagram illustrating luminance distributions (divided light distribution data) assigned to the respective optical units $502_{Wide}$, $502_{Mid}$, and $502_{Hot}$ (the optical deflectors $201_{Wide}$, $201_{Mid}$, and $201_{Hot}$)

The mode A (or data representing the mode A) can indicate that the luminance distribution and the swing angle data assigned to the first optical unit $502_{(1)}$ (the first optical deflector $201_{(1)}$) are a wide-zone luminance distribution (wide-zone divided light distribution data) and wide-zone swing angle data, that the luminance distribution and the swing angle data assigned to the second optical unit $502_{(2)}$ (the second optical deflector $201_{(2)}$) are a middle-zone luminance distribution (middle-zone divided light distribution data) and middle-zone swing angle data, and that the luminance distribution and the swing angle data assigned to the third optical unit $502_{(3)}$ (the third optical deflector $201_{(3)}$) are a hot-zone luminance distribution (hot-zone divided light distribution data) and hot-zone swing angle data, as illustrated in FIG. 47A.

Figure 47B:
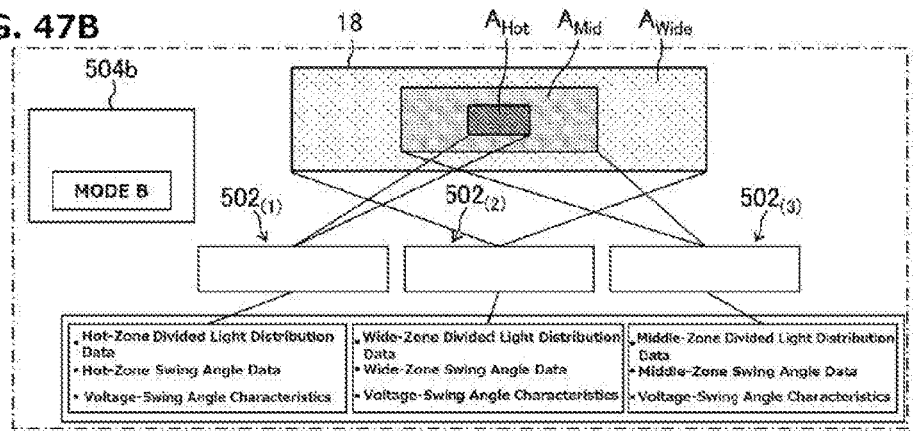

The mode B (or data representing the mode B) can indicate that the luminance distribution and the swing angle data assigned to the first optical unit $502_{(2)}$ (the first optical deflector $201_{(1)}$) are the hot-zone luminance distribution (hot-zone divided light distribution data) and the hot-zone swing angle data, that the luminance distribution and the swing angle data assigned to the second optical unit $502_{(2)}$ (the second optical deflector $201_{(2)}$) are the wide-zone luminance distribution (wide-zone divided light distribution data) and the wide-zone swing angle data, and that the luminance distribution and the swing angle data assigned to the third optical unit $502_{(3)}$ (the third optical deflector $201_{(3)}$) are the middle-zone luminance distribution (middle-zone divided light distribution data) and the middle-zone swing angle data, as illustrated in FIG. 47B.

Figure 47C:
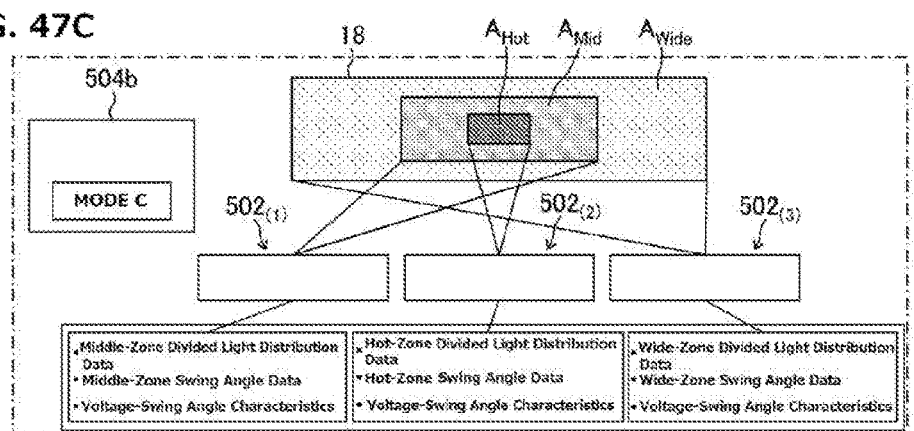

The mode C (or data representing the mode C) can indicate that the luminance distribution and the swing angle data assigned to the first optical unit $502_{(1)}$ (the first optical deflector $201_{(1)}$) are the middle-zone luminance distribution (middle-zone divided light distribution data) and the middle-zone swing angle data, that the luminance distribution and the swing angle data assigned to the second optical unit $502_{(2)}$ (the second optical deflector $201_{(2)}$) are the hot-zone luminance distribution (hot-zone divided light distribution data) and the hot-zone swing angle data, and that the luminance distribution and the swing angle data assigned to the third optical unit $502_{(3)}$ (the third optical deflector $201_{(3)}$) are the wide-zone luminance distribution (wide-zone divided light distribution data) and the wide-zone swing angle data, as illustrated in FIG. 47C.

Figure 48:
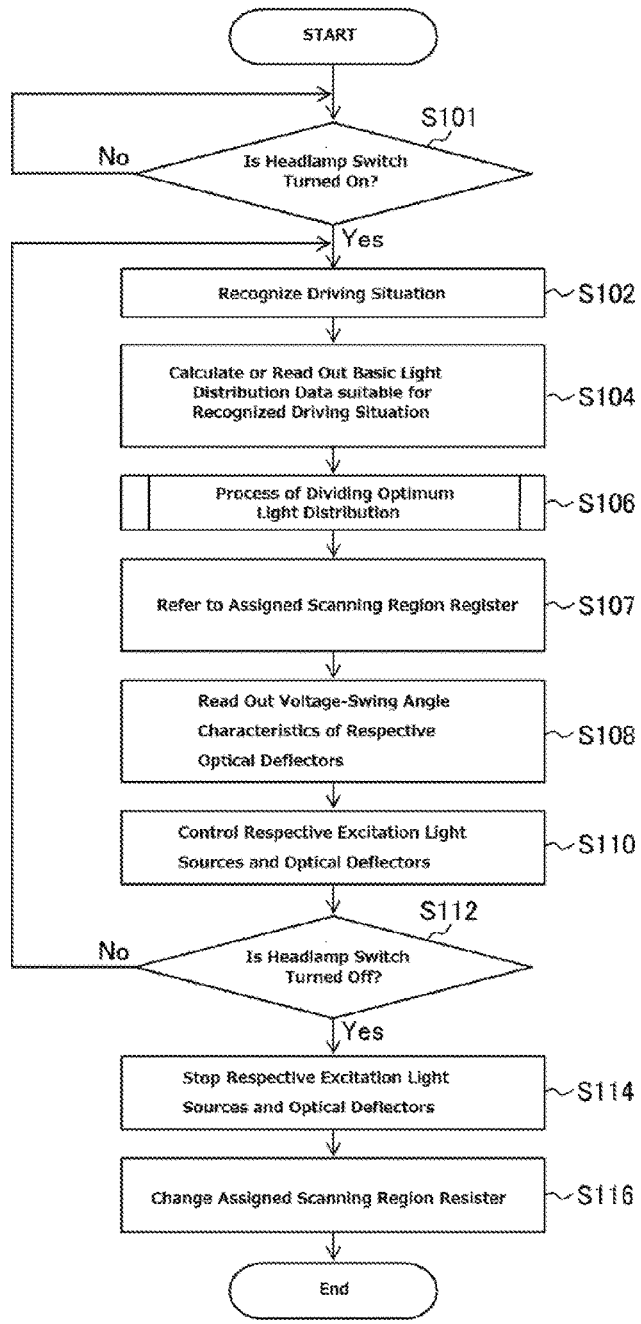
FIG. 48 is a flow chart illustrating an operation example of the vehicle lighting fixture 500A.

A description will now be given of an operation example of the vehicle lighting fixture 500A with the above-described configuration, with reference to FIG. 48. FIG. 48 is a flow chart showing the operation example of the vehicle lighting fixture 500A and that includes steps S101, S107, S112 to S116 in addition to the steps of the flow chart in FIG. 41.

The following processing can be achieved by the imaging engine CPU 504 that reads out a predefined program from the storage device 506 in a RAM (not illustrated) etc., and executes the program.

A description will be given of the operation example when the mode A (or data representing the mode A) has been previously stored in the assigned scanning area register 504b as a default value (see FIG. 47A). In the description, a different point of this reference example from the flow chart of FIG. 41 will be mainly described, and the same or similar steps as those in FIG. 41 are denoted by the same reference numerals and descriptions thereof will be appropriately omitted.

<Operation Example of Mode A>

As shown in FIG. 48, when a headlamp switch (not illustrated) is turned on (Yes in step S101), a recognition processing of the driving situation is first performed (Step S102).

Next, the basic light distribution data suitable for and corresponding to the recognized driving situation is calculated or read out from the storage device 506 (Step S104).

Next, the process of dividing optimum light distribution is performed (Step S106). This process can generate divided light distribution data (divided luminance distribution or wide-zone divided light distribution data, middle-zone divided light distribution data, and hot-zone divided light distribution data) and swing angle data (wide-zone swing angle data, middle-zone swing angle data, and hot-zone swing angle data) assigned to the respective optical deflectors $201_{(1)}$, $201_{(2)}$, and $201_{(3)}$.

Incidentally, in place of the process of dividing optimum light distribution (step S106), the divided light distribution data (wide-zone divided light distribution data, middle-zone divided light distribution data, and hot-zone divided light distribution data) and swing angle data (wide-zone swing angle data, middle-zone swing angle data, and hot-zone swing angle data) in association with the divided light distribution data suitable for and corresponding to the recognized driving situation in step S102 can be stored in advance in and be read out from the storage device 506. In this case, the process of step S104 can be omitted.

Next, the imaging engine CPU 504 refers to the assigned scanning region register 504b (the mode A stored in this register 504b) (step S107).

Next, the imaging engine CPU 504 reads out the voltage-swing angle characteristics of the respective optical deflectors $201_{(1)}$, $201_{(2)}$, and $201_{(3)}$ (step S108).

Then, the imaging engine CPU 504 can control the three excitation light sources $12_{(1)}$, $12_{(2)}$, and $12_{(3)}$ and the three optical deflectors $201_{(1)}$, $201_{(2)}$, and $201_{(3)}$ to form the luminance distributions (see FIG. 47A) assigned to the respective optical deflectors $201_{(1)}$, $201_{(2)}$, and $201_{(3)}$ indicated by the assigned scanning region register 504b (the mode A stored in this register 504b), which has been referred to in step S107. Specifically, the control can be performed to form the wide-zone luminance distribution assigned to the first optical deflector $201_{(1)}$, the middle-zone luminance distribution assigned to the second optical deflector $201_{(2)}$, and the hot-zone luminance distribution assigned to the third optical deflector $201_{(3)}$, on the wavelength converting member 18 (step S110).

The imaging engine CPU 504 can output a drive signal to the first driver/controller $508_{(1)}$ on the basis of the wide-zone divided light distribution data (and wide-zone swing angle data and voltage-swing angle characteristics) so as to control it. This control can be performed to apply a drive voltage to the first optical deflector $201_{(1)}$ so that the vertical width and the horizontal width of the luminance distribution formed in the wide-zone scanning area $A_{Wide}$ become those of luminance distribution (light intensity distribution) represented by the wide-zone divided light distribution data as illustrated in FIG. 47A.

Furthermore, the imaging engine CPU 504 can output a drive signal to the first current-strengthened laser driver $510_{(1)}$ on the basis of the wide-zone divided light distribution data (and current-brightness characteristics) so as to control it. This control can be performed to apply a drive current to the first excitation light source $12_{(1)}$ so that the luminance distribution formed in the wide-zone scanning area $A_{Wide}$ becomes the luminance distribution (light intensity distribution) represented by the wide-zone divided light distribution data.

Then, the first driver/controller $508_{(1)}$ can apply the drive voltage to the first optical deflector $201_{(1)}$ according to the control (drive signal) by the imaging engine CPU 504, with the drive voltage having been adjusted such that the vertical width and the horizontal width of the luminance distribution formed in the wide-zone scanning area $A_{Wide}$ become those of luminance distribution represented by the wide-zone divided light distribution data. Here, the drive voltage can be a drive voltage for resonantly driving the optical deflector and/or a drive voltage for nonresonantly driving the optical deflector, for example, those illustrated in FIG. 12.

Furthermore, in synchronization with this control, the first current-strengthened laser driver $510_{(1)}$ can apply the drive current to the first excitation light source $12_{(1)}$ according to the control (drive signal) by the imaging engine CPU 504, with the drive current having been adjusted such that the luminance distribution formed in the wide-zone scanning area $A_{Wide}$ becomes the luminance distribution represented by the wide-zone divided light distribution data. Here, the drive current can be one illustrated in FIG. 12.

Similarly, the imaging engine CPU 504 can output a drive signal to the second driver/controller $508_{(2)}$ on the basis of the middle-zone divided light distribution data (and middle-zone swing angle data and voltage-swing angle characteristics) so as to control it. This control can be performed to apply a drive voltage to the second optical deflector $201_{(2)}$ so that the vertical width and the horizontal width of the luminance distribution formed in the middle-zone scanning area $A_{Mid}$ become those of luminance distribution (light intensity distribution) represented by the middle-zone divided light distribution data as illustrated in FIG. 47A.

Furthermore, the imaging engine CPU 504 can output a drive signal to the second current-strengthened laser driver $510_{(2)}$ on the basis of the middle-zone divided light distribution data (and current-brightness characteristics) so as to control it. This control can be performed to apply a drive current to the second excitation light source $12_{(2)}$ so that the luminance distribution formed in the middle-zone scanning area $A_{Mid}$ becomes the luminance distribution (light intensity distribution) represented by the middle-zone divided light distribution data.

Then, the second driver/controller $508_{(2)}$ can apply the drive voltage to the second optical deflector $201_{(2)}$ according to the control (drive signal) by the imaging engine CPU 504, with the drive voltage having been adjusted such that the vertical width and the horizontal width of the luminance distribution formed in the middle-zone scanning area $A_{Mid}$ become those of luminance distribution represented by the middle-zone divided light distribution data. Here, the drive voltage can be a drive voltage for resonantly driving the optical deflector and/or a drive voltage for nonresonantly driving the optical deflector, for example, those illustrated in FIG. 12.

Furthermore, in synchronization with this control, the second current-strengthened laser driver $510_{(2)}$ can apply the drive current to the second excitation light source $12_{(2)}$ according to the control (drive signal) by the imaging engine CPU 504, with the drive current having been adjusted such that the luminance distribution formed in the middle-zone scanning area $A_{Mid}$ becomes the luminance distribution represented by the middle-zone divided light distribution data. Here, the drive current can be one illustrated in FIG. 12.

Similarly, the imaging engine CPU 504 can output a drive signal to the third driver/controller $508_{(3)}$ on the basis of the hot-zone divided light distribution data (and hot-zone swing angle data and voltage-swing angle characteristics) so as to control it. This control can be performed to apply a drive voltage to the third optical deflector $201_{(3)}$ so that the vertical width and the horizontal width of the luminance distribution formed in the hot-zone scanning area $A_{Hot}$ become those of luminance distribution (light intensity distribution) represented by the hot-zone divided light distribution data as illustrated in FIG. 47A.

Furthermore, the imaging engine CPU 504 can output a drive signal to the third current-strengthened laser driver $510_{(3)}$ on the basis of the hot-zone divided light distribution data (and current-brightness characteristics) so as to control it. This control can be performed to apply a drive current to the third excitation light source $12_{(3)}$ so that the luminance distribution formed in the hot-zone scanning area $A_{Hot}$ becomes the luminance distribution (light intensity distribution) represented by the hot-zone divided light distribution data.

Then, the third driver/controller $508_{(3)}$ can apply the drive voltage to the third optical deflector $201_{(3)}$ according to the control (drive signal) by the imaging engine CPU 504, with the drive voltage having been adjusted such that the vertical width and the horizontal width of the luminance distribution formed in the hot-zone scanning area $A_{Hot}$ become those of luminance distribution represented by the hot-zone divided light distribution data. Here, the drive voltage can be a drive voltage for resonantly driving the optical deflector and/or a drive voltage for nonresonantly driving the optical deflector, for example, those illustrated in FIG. 12.

Furthermore, in synchronization with this control, the third current-strengthened laser driver $510_{(3)}$ can apply the drive current to the third excitation light source $12_{(3)}$ according to the control (drive signal) by the imaging engine CPU 504, with the drive current having been adjusted such that the luminance distribution formed in the hot-zone scanning area $A_{Hot}$ becomes the luminance distribution represented by the hot-zone divided light distribution data. Here, the drive current can be one illustrated in FIG. 12.

As described above, the control unit, or the imaging engine CPU 504, can control the three excitation light sources $12_{(1)}$, $12_{(2)}$, and $12_{(3)}$ and the three optical deflectors $201_{(1)}$, $201_{(2)}$, and $201_{(3)}$ to form the luminance distributions (see FIG. 47A) assigned to the respective optical deflectors $201_{(1)}$, $201_{(2)}$, and $201_{(3)}$. Specifically, the control can be performed to form the wide-zone luminance distribution, the middle-zone luminance distribution, and the hot-zone luminance distribution on the wavelength converting member 18 so that the luminance distributions are coincident with the first target luminance distribution.

Accordingly, since the three excitation light sources $12_{(1)}$, $12_{(2)}$, and $12_{(3)}$ and the three optical deflectors $201_{(1)}$, $201_{(2)}$, and $201_{(3)}$ can be controlled in synchronization with one another, the three optical deflectors $201_{(1)}$, $201_{(2)}$, and $201_{(3)}$ can draw two-dimensional images on the three scanning areas $A_{Wide}$, $A_{Mid}$, and $A_{Hot}$ by the excitation light rays two-dimensionally scanning in the horizontal and vertical directions by the mirror parts 202 of the respective optical deflectors $201_{(1)}$, $201_{(2)}$, and $201_{(3)}$. As a result, the luminance distributions coincident with or substantially coincident with the first target luminance distribution can be formed on the wavelength converting member 18.

The luminance distributions formed on the wavelength converting member 18 can be projected forward by the projection lens assembly 20 to form a predetermined light distribution pattern corresponding to the luminance distributions on a virtual vertical screen.

The above-mentioned steps S102 to S110 are repeatedly performed until the headlamp switch (not illustrated) is turned off (No in step S112).

When the headlamp switch is turned off (Yes in step S112), the three excitation light sources $12_{(1)}$, $12_{(2)}$, and $12_{(3)}$ and the three optical deflectors $201_{(1)}$, $201_{(2)}$, and $201_{(3)}$ are stopped (step S114). In other words, the imaging engine CPU 504 can control to stop the driver/controllers $508_{(1)}$, $508_{(2)}$, and $508_{(3)}$ and the current-strengthened laser drivers $510_{(1)}$, $510_{(2)}$, and $510_{(3)}$.

Then, the content of the assigned scanning region register 504b is changed (step S116). Since the mode A (or data representing the mode A) has been stored in the assigned scanning region register 504b, the content (mode A) of the assigned scanning region register 504b is changed to the mode B (or data representing the mode B).

As described above, the imaging engine CPU 504 can change the mode A (or data representing the mode A) to the mode B (or data representing the mode B) in the assigned scanning region register 504b at the timing when the headlamp switch is turned off. Thus, the luminance distributions assigned to the respective optical deflectors $201_{(1)}$, $201_{(2)}$, and $201_{(3)}$ can be changed such that the respective optical deflectors $201_{(1)}$, $201_{(2)}$, and $201_{(3)}$ are assigned to luminance distributions different in size from those assigned to the respective optical deflectors $201_{(1)}$, $201_{(2)}$, and $201_{(3)}$ before the mode change. For example, the luminance distribution assigned to the first optical deflector $201_{(1)}$ is changed from the wide-zone divided luminance distribution to the hot-zone divided luminance distribution. Furthermore, the luminance distribution assigned to the second optical deflector $201_{(2)}$ is changed from the middle-zone divided luminance distribution to the wide-zone divided luminance distribution, and the luminance distribution assigned to the third optical deflector $201_{(3)}$ is changed from the hot-zone divided luminance distribution to the middle-zone divided luminance distribution.

In this manner, the operation in the mode A is terminated.

Next, a description will be given of the operation example when the mode B (or data representing the mode B) is stored in the assigned scanning area register 504b as a result of the aforementioned changing process (see FIG. 47B). In the description, a different point of this example from the above-described operation example of the mode A will be mainly described, and the same or similar steps as those in the above-described operation example of the mode A are denoted by the same reference numerals and descriptions thereof will be appropriately omitted.

<Operation Example of Mode B>

When the headlamp switch (not illustrated) is turned on (Yes in step S101), the process from S102 to S116 is performed.

Specifically, the imaging engine CPU 504 can control the three excitation light sources $12_{(1)}$, $12_{(2)}$, and $12_{(3)}$ and the three optical deflectors $201_{(1)}$, $201_{(2)}$, and $201_{(3)}$ to form the luminance distributions assigned to the respective optical deflectors $201_{(1)}$, $201_{(2)}$, and $201_{(3)}$ indicated by the assigned scanning region register 504b (the mode B stored in this register 504b) that has been referred to in step S107. Specifically, the control can be performed to form the hot-zone luminance distribution assigned to the first optical deflector $201_{(1)}$, the wide-zone luminance distribution assigned to the second optical deflector $201_{(2)}$, and the middle-zone luminance distribution assigned to the third optical deflector $201_{(3)}$, on the wavelength converting member 18.

The imaging engine CPU 504 can output a drive signal to the first driver/controller $508_{(1)}$ on the basis of the hot-zone divided light distribution data (and hot-zone swing angle data and voltage-swing angle characteristics) so as to control it. This control can be performed to apply a drive voltage to the first optical deflector $201_{(1)}$ so that the vertical width and the horizontal width of the luminance distribution formed in the hot-zone scanning area $A_{Hot}$ become those of luminance distribution (light intensity distribution) represented by the hot-zone divided light distribution data as illustrated in FIG. 47B.

Furthermore, the imaging engine CPU 504 can output a drive signal to the first current-strengthened laser driver $510_{(1)}$ on the basis of the hot-zone divided light distribution data (and current-brightness characteristics) so as to control it. This control can be performed to apply a drive current to the first excitation light source $12_{(1)}$ so that the luminance distribution formed in the hot-zone scanning area $A_{Hot}$ becomes the luminance distribution (light intensity distribution) represented by the hot-zone divided light distribution data.

Then, the first driver/controller $508_{(1)}$ can apply the drive voltage to the first optical deflector $201_{(1)}$ according to the control (drive signal) by the imaging engine CPU 504, with the drive voltage having been adjusted such that the vertical width and the horizontal width of the luminance distribution formed in the hot-zone scanning area $A_{Hot}$ become those of luminance distribution represented by the hot-zone divided light distribution data. Here, the drive voltage can be a drive voltage for resonantly driving the optical deflector and/or a drive voltage for nonresonantly driving the optical deflector, for example, those illustrated in FIG. 12.

Furthermore, in synchronization with this control, the first current-strengthened laser driver $510_{(1)}$ can apply the drive current to the first excitation light source $12_{(1)}$ according to the control (drive signal) by the imaging engine CPU 504, with the drive current having been adjusted such that the luminance distribution formed in the hot-zone scanning area $A_{Hot}$ becomes the luminance distribution represented by the hot-zone divided light distribution data. Here, the drive current can be one illustrated in FIG. 12.

Similarly, the imaging engine CPU 504 can output a drive signal to the second driver/controller 508$_{(2)}$ on the basis of the wide-zone divided light distribution data (and wide-zone swing angle data and voltage-swing angle characteristics) so as to control it. This control can be performed to apply a drive voltage to the second optical deflector 201$_{(2)}$ so that the vertical width and the horizontal width of the luminance distribution formed in the wide-zone scanning area A$_{Wide}$ become those of luminance distribution (light intensity distribution) represented by the wide-zone divided light distribution data as illustrated in FIG. 47B.

Furthermore, the imaging engine CPU 504 can output a drive signal to the second current-strengthened laser driver 510$_{(2)}$ on the basis of the wide-zone divided light distribution data (and current-brightness characteristics) so as to control it. This control can be performed to apply a drive current to the second excitation light source 12$_{(2)}$ so that the luminance distribution formed in the wide-zone scanning area A$_{Wide}$ becomes the luminance distribution (light intensity distribution) represented by the wide-zone divided light distribution data.

Then, the second driver/controller 508$_{(2)}$ can apply the drive voltage to the second optical deflector 201$_{(2)}$ according to the control (drive signal) by the imaging engine CPU 504, with the drive voltage having been adjusted such that the vertical width and the horizontal width of the luminance distribution formed in the wide-zone scanning area A$_{Wide}$ become those of luminance distribution represented by the wide-zone divided light distribution data. Here, the drive voltage can be a drive voltage for resonantly driving the optical deflector and/or a drive voltage for nonresonantly driving the optical deflector, for example, those illustrated in FIG. 12.

Furthermore, in synchronization with this control, the second current-strengthened laser driver 510$_{(2)}$ can apply the drive current to the second excitation light source 12$_{(2)}$ according to the control (drive signal) by the imaging engine CPU 504, with the drive current having been adjusted such that the luminance distribution formed in the wide-zone scanning area A$_{Wide}$ becomes the luminance distribution represented by the wide-zone divided light distribution data. Here, the drive current can be one illustrated in FIG. 12.

Similarly, the imaging engine CPU 504 can output a drive signal to the third driver/controller 508$_{(3)}$ on the basis of the middle-zone divided light distribution data (and middle-zone swing angle data and voltage-swing angle characteristics) so as to control it. This control can be performed to apply a drive voltage to the third optical deflector 201$_{(3)}$ so that the vertical width and the horizontal width of the luminance distribution formed in the middle-zone scanning area A$_{Mid}$ become those of luminance distribution (light intensity distribution) represented by the middle-zone divided light distribution data as illustrated in FIG. 47B.

Furthermore, the imaging engine CPU 504 can output a drive signal to the third current-strengthened laser driver 510$_{(3)}$ on the basis of the middle-zone divided light distribution data (and current-brightness characteristics) so as to control it. This control can be performed to apply a drive current to the third excitation light source 12$_{(3)}$ so that the luminance distribution formed in the middle-zone scanning area A$_{Mid}$ becomes the luminance distribution (light intensity distribution) represented by the middle-zone divided light distribution data.

Then, the third driver/controller 508$_{(3)}$ can apply the drive voltage to the third optical deflector 201$_{(3)}$ according to the control (drive signal) by the imaging engine CPU 504, with the drive voltage having been adjusted such that the vertical width and the horizontal width of the luminance distribution formed in the middle-zone scanning area A$_{Mid}$ become those of luminance distribution represented by the middle-zone divided light distribution data. Here, the drive voltage can be a drive voltage for resonantly driving the optical deflector and/or a drive voltage for nonresonantly driving the optical deflector, for example, those illustrated in FIG. 12.

Furthermore, in synchronization with this control, the third current-strengthened laser driver 510$_{(3)}$ can apply the drive current to the third excitation light source 12$_{(3)}$ according to the control (drive signal) by the imaging engine CPU 504, with the drive current having been adjusted such that the luminance distribution formed in the middle-zone scanning area A$_{Mid}$ becomes the luminance distribution represented by the middle-zone divided light distribution data. Here, the drive current can be one illustrated in FIG. 12.

As described above, the control unit, or the imaging engine CPU 504, can control the three excitation light sources 12$_{(1)}$, 12$_{(2)}$, and 12$_{(3)}$ and the three optical deflectors 201$_{(1)}$, 201$_{(2)}$, and 201$_{(3)}$ to form the luminance distributions (see FIG. 47B) assigned to the respective optical deflectors 201$_{(1)}$, 201$_{(2)}$, and 201$_{(3)}$. Specifically, the control can be performed to form the wide-zone luminance distribution, the middle-zone luminance distribution, and the hot-zone luminance distribution on the wavelength converting member 18 so that the luminance distributions are coincident with the first target luminance distribution.

Accordingly, since the three excitation light sources 12$_{(1)}$, 12$_{(2)}$, and 12$_{(3)}$ and the three optical deflectors 201$_{(1)}$, 201$_{(2)}$, and 201$_{(3)}$ can be controlled in synchronization with one another, the three optical deflectors 201$_{(1)}$, 201$_{(2)}$, and 201$_{(3)}$ can draw two-dimensional images on the three scanning areas A$_{Wide}$, A$_{Mid}$, and A$_{Hot}$ by the excitation light rays two-dimensionally scanning in the horizontal and vertical directions by the mirror parts 202 of the respective optical deflectors 201$_{(1)}$, 201$_{(2)}$, and 201$_{(3)}$. As a result, the luminance distributions coincident with or substantially coincident with the first target luminance distribution can be formed on the wavelength converting member 18.

The luminance distributions formed on the wavelength converting member 18 can be projected forward by the projection lens assembly 20 to form a predetermined light distribution pattern corresponding to the luminance distributions on a virtual vertical screen.

The above-mentioned steps S102 to S110 are repeatedly performed until the headlamp switch (not illustrated) is turned off (Yes in step S112).

When the headlamp switch is turned off (Yes in step S112), the three excitation light sources 12$_{(1)}$, 12$_{(2)}$, and 12$_{(3)}$ and the three optical deflectors 201$_{(1)}$, 201$_{(2)}$, and 201$_{(3)}$ are stopped (step S114). In other words, the imaging engine CPU 504 can control to stop the driver/controllers 508$_{(1)}$, 508$_{(2)}$, and 508$_{(3)}$ and the current-strengthened laser drivers 510$_{(1)}$, 510$_{(2)}$, and 510$_{(3)}$.

Then, the content of the assigned scanning region register 504b is changed (step S116). Since the mode B (or data representing the mode B) has been stored in the assigned scanning region register 504b, the content (mode B) of the assigned scanning region register 504b is changed to the mode C (or data representing the mode C).

As described above, the imaging engine CPU 504 can change the mode B (or data representing the mode B) to the mode C (or data representing the mode C) in the assigned scanning region register 504b at the timing when the headlamp switch is turned off. Thus, the luminance distributions assigned to the respective optical deflectors $201_{(1)}$, $201_{(2)}$, and $201_{(3)}$ can be changed such that the respective optical deflectors $201_{(1)}$, $201_{(2)}$, and $201_{(3)}$ are assigned to luminance distributions different in size from those assigned to the respective optical deflectors $201_{(1)}$, $201_{(2)}$, and $201_{(3)}$ before the mode change. For example, the luminance distribution assigned to the first optical deflector $201_{(1)}$ is changed from the hot-zone divided luminance distribution to the middle-zone divided luminance distribution. Furthermore, the luminance distribution assigned to the second optical deflector $201_{(2)}$ is changed from the wide-zone divided luminance distribution to the hot-zone divided luminance distribution, and the luminance distribution assigned to the third optical deflector $201_{(3)}$ is changed from the middle-zone divided luminance distribution to the wide-zone divided luminance distribution.

In this manner, the operation in the mode B is terminated.

Next, a description will be given of the operation example when the mode C (or data representing the mode C) is stored in the assigned scanning area register 504b as a result of the aforementioned changing process (see FIG. 47C). In the description, a different point of this example from the above-described operation example of the mode A will be mainly described, and the same or similar steps as those in the above-described operation example of the mode A are denoted by the same reference numerals and descriptions thereof will be appropriately omitted.

<Operation Example of Mode C>

When the headlamp switch (not illustrated) is turned on (Yes in step S101), the process from S102 to S116 is performed.

Specifically, the imaging engine CPU 504 can control the three excitation light sources $12_{(1)}$, $12_{(2)}$, and $12_{(3)}$ and the three optical deflectors $201_{(1)}$, $201_{(2)}$, and $201_{(3)}$ to form the luminance distributions (see FIG. 47C) assigned to the respective optical deflectors $201_{(1)}$, $201_{(2)}$, and $201_{(3)}$ indicated by the assigned scanning region register 504b (the mode C stored in this register 504b) that has been referred to in step S107. Specifically, the control can be performed to form the middle-zone luminance distribution assigned to the first optical deflector $201_{(1)}$, the hot-zone luminance distribution assigned to the second optical deflector $201_{(2)}$, and the wide-zone luminance distribution assigned to the third optical deflector $201_{(3)}$, on the wavelength converting member 18 (step S110).

The imaging engine CPU 504 can output a drive signal to the first driver/controller $508_{(1)}$ on the basis of the middle-zone divided light distribution data (and middle-zone swing angle data and voltage-swing angle characteristics) so as to control it. This control can be performed to apply a drive voltage to the first optical deflector $201_{(1)}$ so that the vertical width and the horizontal width of the luminance distribution formed in the middle-zone scanning area $A_{Mid}$ become those of luminance distribution (light intensity distribution) represented by the middle-zone divided light distribution data as illustrated in FIG. 47C.

Furthermore, the imaging engine CPU 504 can output a drive signal to the first current-strengthened laser driver $510_{(1)}$ on the basis of the middle-zone divided light distribution data (and current-brightness characteristics) so as to control it. This control can be performed to apply a drive current to the first excitation light source $12_{(1)}$ so that the luminance distribution formed in the middle-zone scanning area $A_{Mid}$ becomes the luminance distribution (light intensity distribution) represented by the middle-zone divided light distribution data.

Then, the first driver/controller $508_{(1)}$ can apply the drive voltage to the first optical deflector $201_{(1)}$ according to the control (drive signal) by the imaging engine CPU 504, with the drive voltage having been adjusted such that the vertical width and the horizontal width of the luminance distribution formed in the middle-zone scanning area $A_{Mid}$ become those of luminance distribution represented by the middle-zone divided light distribution data. Here, the drive voltage can be a drive voltage for resonantly driving the optical deflector and/or a drive voltage for nonresonantly driving the optical deflector, for example, those illustrated in FIG. 12.

Furthermore, in synchronization with this control, the first current-strengthened laser driver $510_{(1)}$ can apply the drive current to the first excitation light source $12_{(1)}$ according to the control (drive signal) by the imaging engine CPU 504, with the drive current having been adjusted such that the luminance distribution formed in the middle-zone scanning area $A_{Mid}$ becomes the luminance distribution represented by the middle-zone divided light distribution data. Here, the drive current can be one illustrated in FIG. 12.

Similarly, the imaging engine CPU 504 can output a drive signal to the second driver/controller $508_{(2)}$ on the basis of the hot-zone divided light distribution data (and hot-zone swing angle data and voltage-swing angle characteristics) so as to control it. This control can be performed to apply a drive voltage to the second optical deflector $201_{(2)}$ so that the vertical width and the horizontal width of the luminance distribution formed in the hot-zone scanning area $A_{Hot}$ become those of luminance distribution (light intensity distribution) represented by the hot-zone divided light distribution data as illustrated in FIG. 47C.

Furthermore, the imaging engine CPU 504 can output a drive signal to the second current-strengthened laser driver $510_{(2)}$ on the basis of the hot-zone divided light distribution data (and current-brightness characteristics) so as to control it. This control can be performed to apply a drive current to the second excitation light source $12_{(2)}$ so that the luminance distribution formed in the hot-zone scanning area $A_{Hot}$ becomes the luminance distribution (light intensity distribution) represented by the hot-zone divided light distribution data.

Then, the second driver/controller $508_{(2)}$ can apply the drive voltage to the second optical deflector $201_{(2)}$ according to the control (drive signal) by the imaging engine CPU 504, with the drive voltage having been adjusted such that the vertical width and the horizontal width of the luminance distribution formed in the hot-zone scanning area $A_{Hot}$ become those of luminance distribution represented by the hot-zone divided light distribution data. Here, the drive voltage can be a drive voltage for resonantly driving the optical deflector and/or a drive voltage for nonresonantly driving the optical deflector, for example, those illustrated in FIG. 12.

Furthermore, in synchronization with this control, the second current-strengthened laser driver $510_{(2)}$ can apply the drive current to the second excitation light source $12_{(2)}$ according to the control (drive signal) by the imaging engine CPU 504, with the drive current having been adjusted such that the luminance distribution formed in the hot-zone scanning area $A_{Hot}$ becomes the luminance distribution represented by the hot-zone divided light distribution data. Here, the drive current can be one illustrated in FIG. 12.

Similarly, the imaging engine CPU 504 can output a drive signal to the third driver/controller $508_{(3)}$ on the basis of the wide-zone divided light distribution data (and wide-zone swing angle data and voltage-swing angle characteristics) so as to control it. This control can be performed to apply a drive voltage to the third optical deflector $201_{(3)}$ so that the vertical width and the horizontal width of the luminance distribution formed in the wide-zone scanning area $A_{Wide}$ become those of luminance distribution (light intensity distribution) represented by the wide-zone divided light distribution data as illustrated in FIG. 47C.

Furthermore, the imaging engine CPU 504 can output a drive signal to the third current-strengthened laser driver $510_{(3)}$ on the basis of the wide-zone divided light distribution data (and current-brightness characteristics) so as to control it. This control can be performed to apply a drive current to the third excitation light source $12_{(3)}$ so that the luminance distribution formed in the wide-zone scanning area $A_{Wide}$ becomes the luminance distribution (light intensity distribution) represented by the wide-zone divided light distribution data.

Then, the third driver/controller $508_{(3)}$ can apply the drive voltage to the third optical deflector $201_{(3)}$ according to the control (drive signal) by the imaging engine CPU 504, with the drive voltage having been adjusted such that the vertical width and the horizontal width of the luminance distribution formed in the wide-zone scanning area $A_{Wide}$ become those of luminance distribution represented by the wide-zone divided light distribution data. Here, the drive voltage can be a drive voltage for resonantly driving the optical deflector and/or a drive voltage for nonresonantly driving the optical deflector, for example, those illustrated in FIG. 12.

Furthermore, in synchronization with this control, the third current-strengthened laser driver $510_{(3)}$ can apply the drive current to the third excitation light source $12_{(3)}$ according to the control (drive signal) by the imaging engine CPU 504, with the drive current having been adjusted such that the luminance distribution formed in the wide-zone scanning area $A_{Wide}$ becomes the luminance distribution represented by the wide-zone divided light distribution data. Here, the drive current can be one illustrated in FIG. 12.

As described above, the control unit, or the imaging engine CPU 504, can control the three excitation light sources $12_{(1)}$, $12_{(2)}$, and $12_{(3)}$ and the three optical deflectors $201_{(1)}$, $201_{(2)}$, and $201_{(3)}$ to form the luminance distributions (see FIG. 47C) assigned to the respective optical deflectors $201_{(1)}$, $201_{(2)}$, and $201_{(3)}$. Specifically, the control can be performed to form the wide-zone luminance distribution, the middle-zone luminance distribution, and the hot-zone luminance distribution on the wavelength converting member 18 so that the luminance distributions are coincident with the first target luminance distribution.

Accordingly, since the three excitation light sources $12_{(1)}$, $12_{(2)}$, and $12_{(3)}$ and the three optical deflectors $201_{(1)}$, $201_{(2)}$, and $201_{(3)}$ can be controlled in synchronization with one another, the three optical deflectors $201_{(1)}$, $201_{(2)}$, and $201_{(3)}$ can draw two-dimensional images on the three scanning areas $A_{Wide}$, $A_{Mid}$, and $A_{Hot}$ by the excitation light rays two-dimensionally scanning in the horizontal and vertical directions by the mirror parts 202 of the respective optical deflectors $201_{(1)}$, $201_{(2)}$, and $201_{(3)}$. As a result, the luminance distributions coincident with or substantially coincident with the first target luminance distribution can be formed on the wavelength converting member 18.

The luminance distributions formed on the wavelength converting member 18 can be projected forward by the projection lens assembly 20 to form a predetermined light distribution pattern corresponding to the luminance distributions on a virtual vertical screen.

The above-mentioned steps S102 to S110 are repeatedly performed until the headlamp switch (not illustrated) is turned off (Yes in step S112).

When the headlamp switch is turned off (Yes in step S112), the three excitation light sources $12_{(1)}$, $12_{(2)}$, and $12_{(3)}$ and the three optical deflectors $201_{(1)}$, $201_{(2)}$, and $201_{(3)}$ are stopped (step S114). In other words, the imaging engine CPU 504 can control to stop the driver/controllers $508_{(1)}$, $508_{(2)}$, and $508_{(3)}$ and the current-strengthened laser drivers $510_{(1)}$, $510_{(2)}$, and $510_{(3)}$.

Then, the content of the assigned scanning region register 504b is changed (step S116). Since the mode C (or data representing the mode C) has been stored in the assigned scanning region register 504b, the content (mode C) of the assigned scanning region register 504b is changed to the mode A (or data representing the mode A).

As described above, the imaging engine CPU 504 can change the mode C (or data representing the mode C) to the mode A (or data representing the mode A) in the assigned scanning region register 504b at the timing when the headlamp switch is turned off. Thus, the luminance distributions assigned to the respective optical deflectors $201_{(1)}$, $201_{(2)}$, and $201_{(3)}$ can be changed such that the respective optical deflectors $201_{(1)}$, $201_{(2)}$, and $201_{(3)}$ are assigned to luminance distributions different in size from those assigned to the respective optical deflectors $201_{(1)}$, $201_{(2)}$, and $201_{(3)}$ before the mode change. For example, the luminance distribution assigned to the first optical deflector $201_{(1)}$ is changed from the middle-zone divided luminance distribution to the wide-zone divided luminance distribution. Furthermore, the luminance distribution assigned to the second optical deflector $201_{(2)}$ is changed from the hot-zone divided luminance distribution to the middle-zone divided luminance distribution, and the luminance distribution assigned to the third optical deflector $201_{(3)}$ is changed from the wide-zone divided luminance distribution to the hot-zone divided luminance distribution.

In this manner, the operation in the mode C is terminated.

As described above, the imaging engine CPU 504 can change the content of the assigned scanning region register 504b from the mode A to the mode B, the mode C, the mode A, and so on (not limited to this sequence) at the timing when the headlamp switch (not illustrated) is turned off (or at any timing according to the desired specification). Thus, the imaging engine CPU 504 can control such that the respective optical deflectors $201_{(1)}$, $201_{(2)}$, and $201_{(3)}$ are assigned to luminance distributions different in size from those assigned to the respective optical deflectors $201_{(1)}$, $201_{(2)}$, and $201_{(3)}$ before the mode change.

According to this reference example, the vehicle lighting fixture 500A utilizing the three optical deflectors $201_{(1)}$, $201_{(2)}$, and $201_{(3)}$ for the excitation light to scan can be miniaturized, and the parts number, which may become a cause for cost increase, can be decreased.

The use of the single wavelength converting member 18 with respect to the three optical deflectors $201_{(1)}$, $201_{(2)}$, and $201_{(3)}$ can contribute to obtain the advantageous effects.

Furthermore, according to this reference example, when compared with a case where the respective luminance distributions assigned to the plurality of optical deflectors $201_{(1)}$, $201_{(2)}$, and $201_{(3)}$ are not changed, the vehicle lighting fixture with the above-described configuration can extend the lives of the respective optical deflectors $201_{(1)}$, $201_{(2)}$, and $201_{(3)}$, by extension, can extend the life of the vehicle lighting fixture 500A itself.

When a vehicle lighting fixture like the conventional one does not change the luminance distributions assigned to the respective optical deflectors, the load borne by one of them that is assigned to form a larger luminance distribution (for example, wide-zone divided luminance distribution) can relatively become larger, and as a result, that optical deflector assigned to form the larger luminance distribution may likely be damaged. Contrary to this, when the luminance distributions assigned to the respective optical deflectors $201_{(1)}$, $201_{(2)}$, and $201_{(3)}$ are changed at a predetermined timing, specifically, when the luminance distributions are changed to luminance distributions with different sizes from each other among the optical deflectors $201_{(1)}$, $201_{(2)}$, and $201_{(3)}$, and that are luminance distributions different in size from those assigned to the optical deflectors $201_{(1)}$, $201_{(2)}$, and $201_{(3)}$ before the predetermined timing (mode change), the loads borne by the respective optical deflectors $201_{(1)}$, $201_{(2)}$, and $201_{(3)}$ are averaged in the vehicle lighting fixture 500A.

According to this reference example, the vehicle lighting fixture 500A can form a predetermined light distribution pattern that has a relatively high light intensity in part and is a gradually decreased pattern having changing light intensities decreasing from the position of relatively high light intensity toward the periphery. For example, the center light intensity is relatively high and then the light intensity is gradually decreased therefrom to the periphery, and the resulting light distribution pattern can be suitable for far-distance visibility and have an excellent light distribution sense of feeling.

These advantageous effects can be derived from the first luminance distribution (wide-zone luminance distribution), the second luminance distribution (middle-zone luminance distribution) smaller than the first luminance distribution and configured to overlap the first luminance distribution, and the third luminance distribution (hot-zone luminance distribution) smaller than the second luminance distribution and configured to overlap the second luminance distribution. These light luminance distributions can form a first light intensity distribution, a second light intensity distribution, and a third light intensity distribution, each having a higher light intensity and a smaller size in this order. The predetermined light distribution pattern can be formed by projecting these first light intensity distribution, second light intensity distribution, and third light intensity distribution.

Next, a description will be given of a variable light-distribution type vehicle lighting fixture 600 (variable light-distribution type vehicle headlight) using optical deflectors 201 of the one-dimensional nonresonance/one-dimensional resonance type (2-D optical scanner (fast resonant and slow static combination)) as an exemplary embodiment with reference to the associated drawings. It is appreciated that the aforementioned various types of optical deflectors discussed in the above reference examples can be used in place of the one-dimensional nonresonance/one-dimensional resonance type optical deflector 201.

Figure 49:
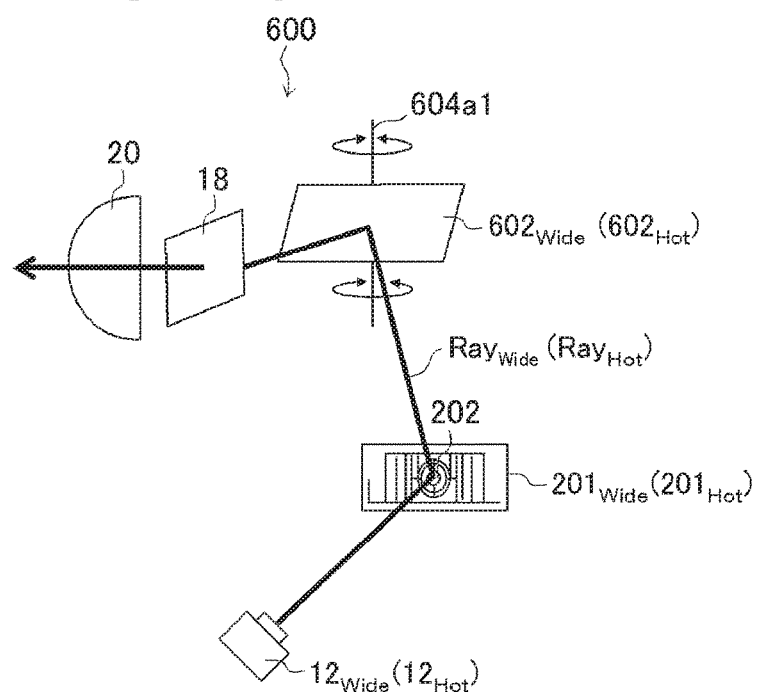
FIG. 49 is a schematic diagram illustrating a vehicle lighting fixture 600 of an exemplary embodiment made in accordance with principles of the presently disclosed subject matter.
Figure 50A:
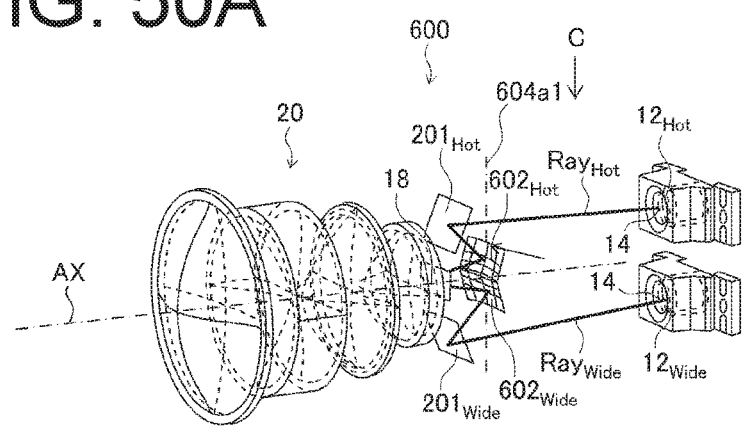
FIG. 50A is a perspective view of the vehicle lighting fixture 600.

FIG. 49 is a schematic diagram illustrating the vehicle lighting fixture 600 of the exemplary embodiment made in accordance with principles of the presently disclosed subject matter. FIG. 50A is a perspective view of the vehicle lighting fixture 600, and FIG. 50B is a cross-sectional view of the vehicle lighting fixture 600.

Figure 50B:
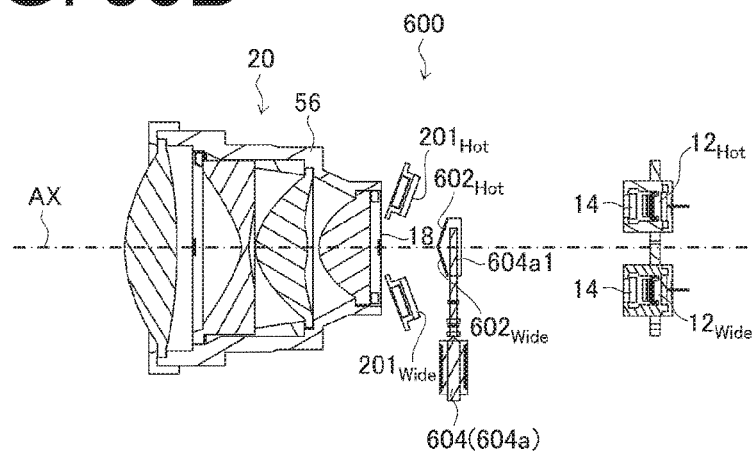
FIG. 50B is a cross-sectional view of the vehicle lighting fixture 600.

As illustrated in FIGS. 49 and 50A and 50B, the vehicle lighting fixture 600 of this exemplary embodiment can include rotary reflecting members $602_{Wide}$ and $602_{Hot}$ in addition to the components of the vehicle lighting fixture 400 illustrated in FIG. 32. Specifically, the vehicle lighting fixture 600 can be configured to form luminance distributions A1 and A2 at any position on the wavelength converting member 18, for example, at a reference position (for example, at a position illustrated in FIG. 51A to be described later) or a position shifted with respect to the reference position in the horizontal direction (for example, at a position illustrated in FIG. 51C to be described later), in accordance with a rotational direction and a rotational amount of each of the rotary reflecting members $602_{Wide}$ and $602_{Hot}$. With this configuration, as a result, the vehicle lighting fixture 600 can form predetermined light distribution patterns $P_{A1}$ and $P_{A2}$ on a virtual vertical screen at a reference position (for example, at a position illustrated in FIG. 51B to be described later) or a position shifted in the horizontal direction with respect to the reference position (for example, at a position illustrated in FIG. 51D to be described later).

Figure 51A:
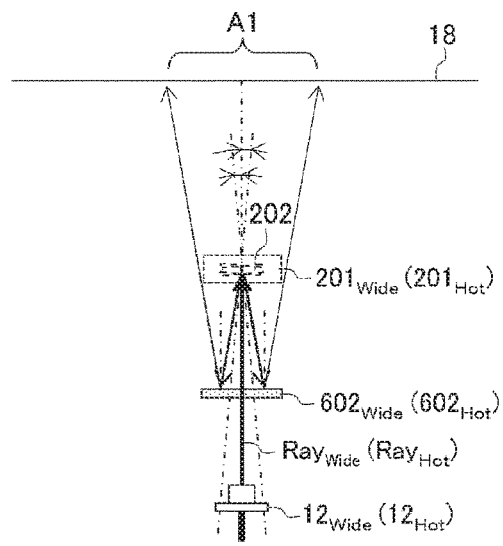
FIG. 51A is a diagram illustrating a state in which the excitation light rays $Ray_{Wide}$ and $Ray_{Hot}$ from excitation light sources $12_{Wide}$ and $12_{Hot}$ are drawing a luminance distribution A1 at a reference position on a wavelength converting member 18 and FIG. 51B is a diagram illustrating a predetermined light distribution pattern $P_{A1}$ formed on a virtual vertical screen (assumed to be disposed in front of a vehicle body approximately 25 m away from the vehicle front face) by projecting the luminance distribution A1 of FIG. 51A with a projection lens assembly 20.
Figure 51B:
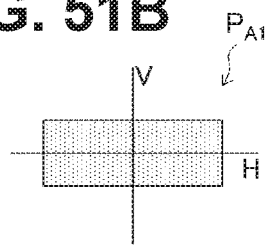

Here, FIG. 51A is a schematic diagram of the vehicle lighting fixture 600 of FIG. 50A when observed in a direction of an arrow C and illustrating a state in which the excitation light rays $Ray_{Wide}$ and $Ray_{Hot}$ from the excitation light sources $12_{Wide}$ and $12_{Hot}$ are reflected by the mirror parts 202 of the optical deflectors $201_{Wide}$ and $201_{Hot}$ and then by the rotary reflecting members $602_{Wide}$ and $602_{Hot}$ and are drawing the luminance distribution A1 at the reference position on the wavelength converting member 18. FIG. 51B is a diagram illustrating a predetermined light distribution pattern $P_{A1}$ formed on a virtual vertical screen (assumed to be disposed in front of a vehicle body approximately 25 m away from the vehicle front face) by projecting the luminance distribution A1 of FIG. 51A with the projection lens assembly 20.

Figure 51C:
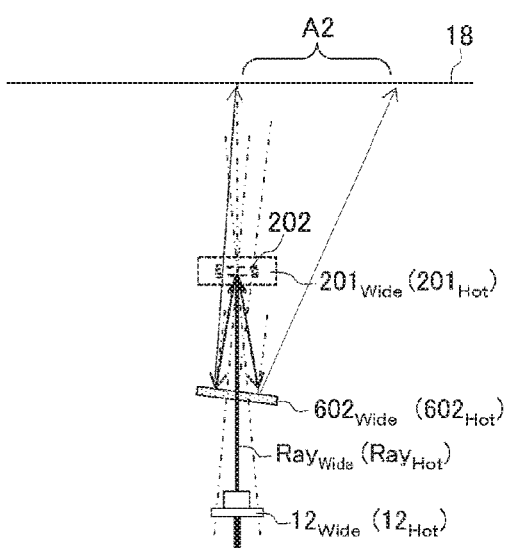
FIG. 51C is a diagram illustrating a state in which the excitation light rays $Ray_{Wide}$ and $Ray_{Hot}$ from the excitation light sources $12_{Wide}$ and $12_{Hot}$ are drawing a luminance distribution A2 at a position shifted in a horizontal direction with respect to the reference position on the wavelength converting member 18 and FIG. 51D is a diagram illustrating a predetermined light distribution pattern $P_{A2}$ formed on the virtual vertical screen by projecting the luminance distribution A2 of FIG. 51C with the projection lens assembly 20.
Figure 51D:
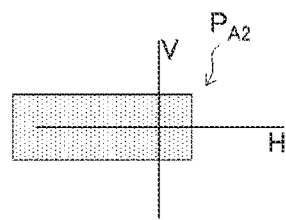

FIG. 51C is a schematic diagram of the vehicle lighting fixture 600 of FIG. 50A when observed in the direction of the arrow C and illustrating a state in which the excitation light rays $Ray_{Wide}$ and $Ray_{Hot}$ from the excitation light sources $12_{Wide}$ and $12_{Hot}$ are reflected by the mirror parts 202 of the optical deflectors $201_{Wide}$ and $201_{Hot}$ and then by the rotary reflecting members $602_{Wide}$ and $602_{Hot}$ and are drawing the luminance distribution A2 at a position shifted with respect to the reference position in the horizontal direction on the wavelength converting member 18. FIG. 51D is a diagram illustrating a predetermined light distribution pattern $P_{A2}$ formed on the virtual vertical screen by projecting the luminance distribution A2 of FIG. 51C with the projection lens assembly 20.

Hereinbelow, a description will be given of the different point of this exemplary embodiment from the vehicle lighting fixture 400 illustrated in FIG. 32, and the same or similar components of this exemplary embodiment as those in the previously described reference example will be denoted by the same reference numerals and a description thereof will be omitted as appropriate.

The vehicle lighting fixture 600 of this exemplary embodiment can be configured, as illustrated in FIGS. 50A and 50B, as a vehicle headlamp. The vehicle lighting fixture 600 can include the two excitation light sources $12_{Wide}$ and $12_{Hot}$; the two optical deflectors $201_{Wide}$ and $201_{Hot}$ each including a mirror part 202, the two optical deflectors $201_{Wide}$ and $201_{Hot}$ provided corresponding to the two excitation light sources $12_{Wide}$ and $12_{Hot}$; the two rotary reflecting member $602_{Wide}$ and $602_{Hot}$ provided corresponding to the two optical deflectors $201_{Wide}$ and $201_{Hot}$; the wavelength converting member 18 on which luminance distributions are formed by the excitation light rays reflected from the two rotary reflecting member $602_{Wide}$ and $602_{Hot}$; the projection lens assembly 20 configured to serve as an optical system and project the luminance distributions formed on the wavelength converting member 18 to form a predetermined light distribution pattern; and a rotary control unit 604 configured to control the rotational direction and the rotational amount of each of the two rotary reflecting members $602_{Wide}$ and $602_{Hot}$. Note that the number of the excitation light sources 12, the optical deflectors 201, and the rotary reflecting member 602 is not limited to two, and may be one or three or more.

As illustrated, the projection lens assembly 20, the wavelength converting member 18, the optical deflectors $201_{Wide}$ and $201_{Hot}$, the rotary reflecting members $602_{Wide}$ and $602_{Hot}$, and the excitation light sources $12_{Wide}$ and $12_{Hot}$ can be disposed in this order along a reference axis AX (or referred to as an optical axis) extending in the front-rear direction of a vehicle body. These members can be disposed by being fixed to a not-illustrated holder as in the vehicle lighting fixture 400 illustrated in FIG. 32. By the common holder for holding the respective components together with the two excitation light sources $12_{Wide}$ and $12_{Hot}$, the parts number can be reduced as well as the assembly errors can decrease.

The excitation light sources $12_{Wide}$ and $12_{Hot}$ can be disposed to surround the reference axis AX with a posture tilted in such a manner that excitation light rays $Ray_{Wide}$ and $Ray_{Hot}$ are directed forward.

A condenser lens 14 can be disposed in front of each of the excitation light sources $12_{Wide}$ and $12_{Hot}$. The excitation light rays $Ray_{Wide}$ and $Ray_{Hot}$ can be output from the respective excitation light sources $12_{Wide}$ and $12_{Hot}$ and condensed by the respective condenser lenses 14 (for example, collimated) to be incident on the respective mirror parts 202 of the optical deflectors $201_{Wide}$ and $201_{Hot}$.

The optical deflectors $201_{Wide}$ and $201_{Hot}$ with the above-described configuration can be disposed to surround the reference axis AX with a posture tilted so that the excitation light rays output from the respective excitation light sources $12_{Wide}$ and $12_{Hot}$ can be incident on the corresponding mirror parts 202 of the optical deflectors $201_{Wide}$ and $201_{Hot}$ and reflected by the same to be directed rearward and closer to the reference axis AX.

The rotary reflecting members $602_{Wide}$ and $602_{Hot}$ can be disposed to surround the reference axis AX and be closer to the reference axis AX than the optical deflectors $201_{Wide}$ and $201_{Hot}$. Specifically, the rotary reflecting members $602_{Wide}$ and $602_{Hot}$ can be disposed such that the excitation light rays reflected from the mirror parts 202 of the corresponding optical deflectors $201_{Wide}$ and $201_{Hot}$ can be incident thereon and reflected by the same to the wavelength converting member 18.

By disposing the rotary reflecting members $602_{Wide}$ and $602_{Hot}$ posterior to the optical deflectors $201_{Wide}$ and $201_{Hot}$ to irradiate the anteriorly disposed wavelength converting member 18 with the excitation light rays, the size increase due to the addition of the rotary reflecting members $602_{Wide}$ and $602_{Hot}$ in the front-rear direction of the vehicle lighting fixture 600 can be suppressed.

The optical deflectors $201_{Wide}$ and $201_{Hot}$ can be arranged so that the first axis X1 (see FIG. 4) is contained in a vertical plane containing the reference axis AX and the second axis X2 (see also FIG. 4) is contained in a horizontal plane. With this arrangement of the optical deflectors $201_{Wide}$ and $201_{Hot}$, a predetermined light distribution pattern (two-dimensional image corresponding to the required predetermined light distribution pattern) being wide in the horizontal direction and narrow in the vertical direction for use in a vehicular headlamp can be easily formed (drawn).

The wide-zone optical deflector $201_{Wide}$ can draw a first two-dimensional image with the excitation light rays $Ray_{Wide}$ two-dimensionally scanning in the horizontal and vertical directions by the mirror part 202 thereof, to thereby form a first light intensity distribution (luminance distribution) on the wavelength converting member 18.

The hot-zone optical deflector $201_{Hot}$ can draw a second two-dimensional image with the excitation light rays $Ray_{Hot}$ two-dimensionally scanning in the horizontal and vertical directions by the mirror part 202 thereof in such a manner that the second two-dimensional image overlaps the first two-dimensional image in part, to thereby form a second light intensity distribution (luminance distribution) on the wavelength converting member 18 with a higher light intensity than that of the first light intensity distribution.

The rotary control unit 604 can be configured to control the rotational direction and the rotational amount of the rotary reflecting members $602_{Wide}$ and $602_{Hot}$. The rotary control unit 604 can include an actuator 604a as illustrated in FIG. 50B, a controlling unit 24, an actuator power circuit 606, etc.

The actuator 604a, which has a rotary shaft 604a1, can be a stepping motor disposed with the rotary shaft 604a1 coincident with the vertical axis and contained in a vertical plane containing the reference axis AX, as illustrated in FIG. 50B. In this case, the actuator 604a constituted by the stepping motor can be feed-back controlled on the basis of an angle detected by a rotary encoder or the like.

Another example of the actuator 604a can be a movable plate with the rotary reflecting members $602_{Wide}$ and $602_{Hot}$ attached thereto, where the movable plate can be driven by a Lorentz force generated by a coil or permanent magnet disposed around it. In this case, the rotational directions and the rotary amounts of the respective rotary reflecting members $602_{Wide}$ and $602_{Hot}$ can be controlled by adjusting the value of a current to pass through the coil.

The rotary reflecting members $602_{Wide}$ and $602_{Hot}$ can include a reflecting surface formed by metal deposition, such as aluminum, and be fixed to the rotary shaft 604a1 of the actuator 604a. The rotary reflecting members $602_{Wide}$ and $602_{Hot}$ may include a Galvano mirror instead.

The size of the rotary reflecting members $602_{Wide}$ and $602_{Hot}$ can be made smaller as the distance to the optical deflectors $201_{Wide}$ and $201_{Hot}$ is shorter. Accordingly, it is desirable that the rotary reflecting members $602_{Wide}$ and $602_{Hot}$ be disposed closer to the optical deflectors $201_{Wide}$ and $201_{Hot}$. The reflecting surface of each of the rotary reflecting members $602_{Wide}$ and $602_{Hot}$ can be a flat surface or a free-curved surface. In the latter case, the deformation of an image formed by the scanning of the optical deflectors $201_{Wide}$ and $201_{Hot}$ can be corrected. It is desirable that the rotary reflecting members $602_{Wide}$ and $602_{Hot}$ be subjected to a surface treatment such as aluminum deposition or formation of enhanced reflecting film in order to reduce the optical loss due to reflection.

Figure 52:
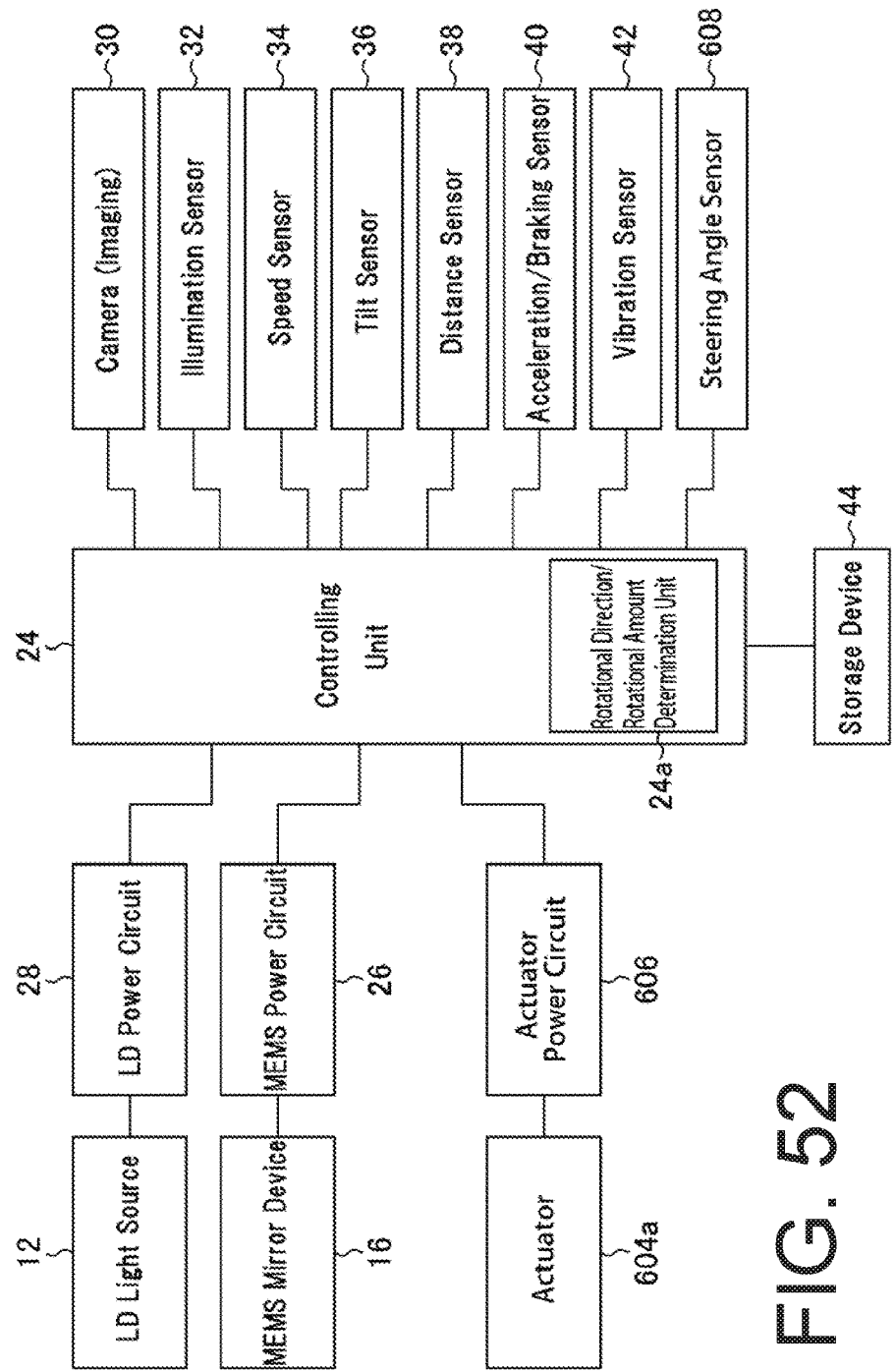
FIG. 52 is a block diagram illustrating a configuration example of a control system configured to control the vehicle lighting fixture 600.

A description will now be given of a configuration example of a control system configured to control the vehicle lighting fixture 600 with the above-described configuration, which is illustrated in FIG. 52.

The control system illustrated in FIG. 52 can include the actuator 604a, the actuator power circuit 606, a steering angle sensor 608, and a rotational direction/rotational amount determination unit 24a in addition to the components of the control system illustrated in FIG. 11.

The actuator power circuit 606 can be configured to apply an electric pulse to the actuator 604a in accordance with the control by the controlling unit 24, to thereby control the rotational direction and the rotational amount of each of the rotary reflecting members $602_{Wide}$ and $602_{Hot}$.

The controlling unit 24 can function as the rotational direction/rotational amount determination unit 24a by reading out a predefined program from the storage device 44 into a not-illustrated RAM and executing the program. Here, the rotational direction/rotational amount determination unit 24a can calculate the rotational direction and the rotational amount of each of the rotary reflecting members $602_{Wide}$ and $602_{Hot}$.

Figure 53:
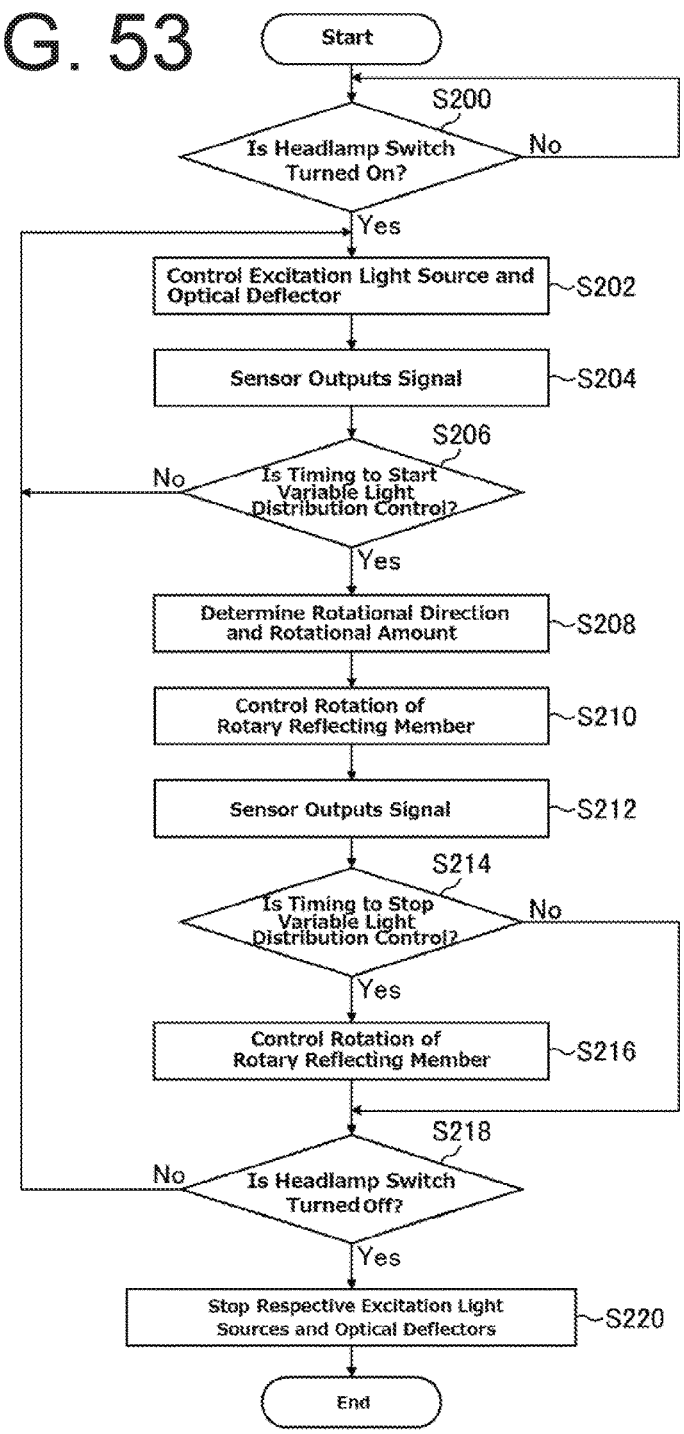
FIG. 53 is a flow chart illustrating an operation example of the vehicle lighting fixture 600.
Figure 54A:
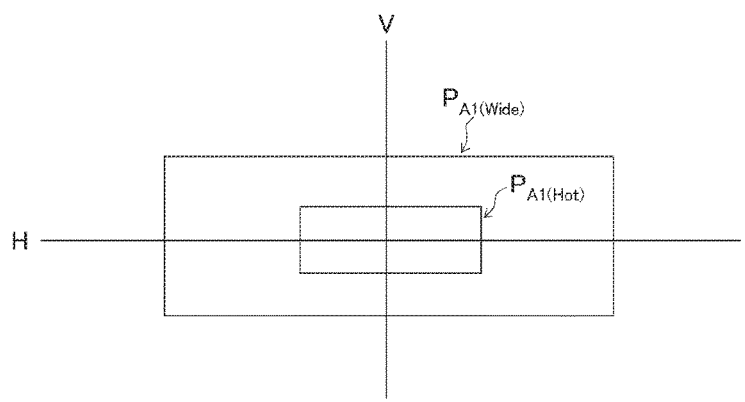
FIGS. 54A and 54B are each a diagram illustrating the predetermined light distribution patterns $P_{A2(Wide)}$ and $P_{A2(Hot)}$ formed on the virtual vertical screen.
Figure 54B:
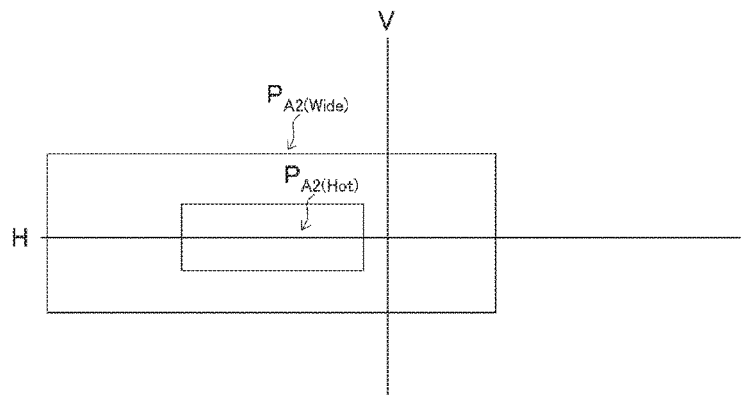

A description will now be given of an operation example of the vehicle lighting fixture 600 with the above-described configuration, with reference to FIG. 53. FIG. 53 is a flow chart illustrating the operation example of the vehicle lighting fixture 600.

The following processing can be achieved by the controlling unit 24 that reads out a predefined program from the storage device 44 in a not-illustrated RAM, and executes the program.

When a not-illustrated headlamp switch is turned on (Yes in step S200), as in the previously described reference examples, the respective excitation light sources $12_{Wide}$ and $12_{Hot}$ are applied with a drive current and the respective optical deflectors $201_{Wide}$ and $201_{Hot}$ are applied with a drive voltage (step S202). In this case, as illustrated in FIG. 51A, the excitation light rays $Ray_{Wide}$ and $Ray_{Hot}$ from the excitation light sources $12_{Wide}$ and $12_{Hot}$ can be reflected by the mirror parts 202 of the respective optical deflectors $201_{Wide}$ and $201_{Hot}$ and then by the respective rotary reflecting members $602_{Wide}$ and $602_{Hot}$ (can be two-dimensionally scanned) to form (draw) the luminance distribution A1 at the reference position on the wavelength converting member 18. Then, as illustrated in FIG. 51B, a predetermined light distribution pattern $P_{A1}$ corresponding to the luminance distribution A1 can be formed at the reference position on the virtual vertical screen by projecting the luminance distribution A1 formed on the wavelength converting member 18 at the reference position, by the projection lens assembly 20. Note that although FIG. 51B illustrates the single light distribution pattern $P_{A1}$ as the predetermined light distribution pattern, the light distribution pattern $P_{A1}$ is actually composed of two light distribution patterns $P_{A1(Wide)}$ and $P_{A1(Hot)}$ corresponding to the two optical deflectors $201_{Wide}$ and $201_{Hot}$.

Next, a sensor provided to a vehicle body on which the vehicle lighting fixture 600 is installed, such as any of sensors 30 to 42 and 608 in FIG. 52, can output a signal to the controlling unit 24 (step S204) to determine when to start the variable light distribution control on the basis of the sensor signal obtained (step S206).

When to start the variable light distribution control can be determined in the following manner.

For example, when to start the variable light distribution control can be determined on the basis of comparison results obtained by comparing a rotational angle of a steering wheel detected by the steering angle sensor 608 with a predetermined threshold value and also comparing a vehicle speed detected by the speed sensor 34 with a predetermined threshold value. For example, if the rotational angle of the steering wheel detected by the steering angle sensor 608 exceeds the predetermined threshold value and the vehicle speed detected by the speed sensor 34 is less than the predetermined threshold value, it can be determined that the variable light distribution control should be started at this timing.

Accordingly, the traffic environment is recognized by at least one sensor, and when to start the variable light distribution control can be determined according to whether the recognized result is a preset situation or not. If it is determined that the timing is to start the variable light distribution control, the deflection angles of the optical deflectors $201_{Wide}$ and $201_{Hot}$ are varied to change the scanning areas of the excitation light rays, to thereby converge or diverge the light.

Then, if it is determined that the timing is to start the variable light distribution control in step S206 (Yes in step S206), the rotational direction/rotational amount determination unit 24a can determine the rotational direction and the rotational amount of each of the rotary reflecting members $602_{Wide}$ and $602_{Hot}$ (step S208) For example, the timing can be determined on the basis of the rotational direction and the rotational angle of a steering wheel detected by the steering sensor 608. Furthermore, a table including data of the relationships between the rotational direction and rotational amount of the steering wheel and those of the rotary reflecting members $602_{Wide}$ and $602_{Hot}$ can be stored in the storage device 44 in advance, and with reference to the data of the table, the rotational direction and rotational amount of the rotary reflecting members $602_{Wide}$ and $602_{Hot}$ corresponding to the rotational direction and rotational amount of the steering wheel obtained can be determined.

Next, the controlling unit 24 can control the actuator power circuit 606 to rotate the rotary reflecting members $602_{Wide}$ and $602_{Hot}$ in the rotational direction and by the rotational amount determined in step S208 (step S210). In accordance with the control by the controlling unit 24, the actuator power circuit 606 can apply an electric pulse to the actuator 604a with the electric pulse having been adjusted so as to rotate the rotary reflecting members $602_{Wide}$ and $602_{Hot}$ in the rotational direction and by the rotational amount determined in step S208.

In this manner, the rotary reflecting members $602_{Wide}$ and $602_{Hot}$ can be rotated in the rotational direction and by the rotational amount determined in step S208 (see, for example, FIG. 51C). In this case, as illustrated in FIG. 51C, the excitation light rays $Ray_{Wide}$ and $Ray_{Hot}$ from the excitation light sources $12_{Wide}$ and $12_{Hot}$ can be reflected by the mirror parts 202 of the optical deflectors $201_{Wide}$ and $201_{Hot}$ and then by the rotary reflecting members $602_{Wide}$ and $602_{Hot}$ (can be two-dimensionally scanned) to form (draw) the luminance distribution A2 at a position shifted in the horizontal direction with respect to the reference position on the wavelength converting member 18. Then, as illustrated in FIG. 51D, a predetermined light distribution pattern $P_{A2}$ corresponding to the luminance distribution A2 can be formed at a position shifted in the horizontal direction with respect to the reference position on the virtual vertical screen by projecting the luminance distribution A2 formed on the wavelength converting member 18 at the position shifted in the horizontal direction with respect to the reference position, by the projection lens assembly 20. Note that although FIG. 51D illustrates the single light distribution pattern $P_{A2}$ as the predetermined light distribution pattern, the light distribution pattern $P_{A2}$ is actually composed of two light distribution patterns $P_{A2(Wide)}$ and $P_{A2(Hot)}$ corresponding to the two optical deflectors $201_{Wide}$ and $201_{Hot}$.

Next, any of the sensors provided to the vehicle body on which the vehicle lighting fixture 600 is installed, such as any of the sensors 30 to 42 and 608 in FIG. 52, can output a signal to the controlling unit 24 (step S212) to determine when to stop the variable light distribution control on the basis of the sensor signal obtained (step S214).

When to stop the variable light distribution control can be determined in the following manner.

For example, when to stop the variable light distribution control can be determined on the basis of comparison results obtained by comparing a rotational angle of the steering wheel detected by the steering angle sensor 608 with a predetermined threshold value and also comparing a vehicle speed detected by the speed sensor 34 with a predetermined threshold value. For example, if the rotational angle of the steering wheel detected by the steering angle sensor 608 is less than the predetermined threshold value and the vehicle speed detected by the speed sensor 34 exceeds the predetermined threshold value, it can be determined that the variable light distribution control should be stopped at this timing.

Next, if the stopping of the variable light distribution control is determined in step S214 (Yes in step S214), the controlling unit 24 can control the actuator power circuit 606 to return the rotary reflecting members 602$_{Wide}$ and 602$_{Hot}$ to the respective original positions (the original positions before the rotational control in step S210) (step S216). In accordance with the control by the controlling unit 24, the actuator power circuit 606 can apply an electric pulse to the actuator 604a with the electric pulse having been adjusted so as to return the rotary reflecting members 602$_{Wide}$ and 602$_{Hot}$ to the original positions.

In this manner, the rotary reflecting members 602$_{Wide}$ and 602$_{Hot}$ are caused to rotate to return to the original positions (see, for example, FIG. 51A).

The above-mentioned steps S202 to S216 are repeatedly performed until the headlamp switch is turned off (No in step S218).

When the headlamp switch is turned off (Yes in step S218), the excitation light sources 12$_{Wide}$ and 12$_{Hot}$ and the optical deflectors 201$_{Wide}$ and 201$_{Hot}$ are stopped (step S220). In other words, the application of the drive current to each of the excitation light sources 12$_{Wide}$ and 12$_{Hot}$ and the application of the drive voltage to each of the optical deflectors 201$_{Wide}$ and 201$_{Hot}$ are stopped.

According to this exemplary embodiment, the vehicle lighting fixture 600 utilizing the optical deflectors 201$_{Wide}$ and 201$_{Hot}$ that can scan with the excitation light rays can form a predetermined light distribution pattern at a position shifted, for example, in the horizontal direction with respect to the reference position.

This configuration can be achieved by controlling the rotational direction and rotational amount of each of the rotary reflecting members 602$_{Wide}$ and 602$_{Hot}$ so as to form the luminance distribution at the reference position (for example, at the position illustrated in FIG. 51A) or a position shifted with respect to the reference position (for example, at the position illustrated in FIG. 51C), and further by causing the projection lens assembly 20 to project the luminance distribution thus formed on the wavelength converting member 18 (luminance distribution formed at the reference position or the position shifted with respect to the reference position). Thus, the predetermined light distribution pattern (for example, one illustrated in FIG. 51B or FIG. 51D) can be formed at the desired position.

Figure 66A:
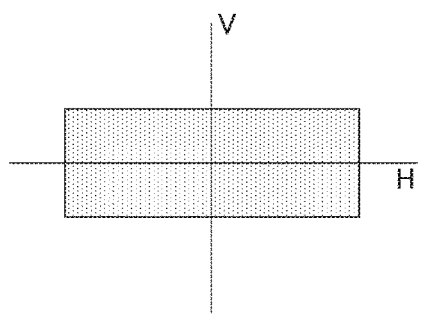
FIGS. 66A and 66B are each a diagram illustrating a predetermined light distribution pattern formed on the virtual vertical screen.
Figure 66B:
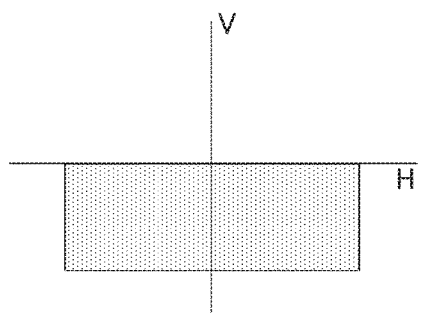

When the rotational shaft 604a1 of the actuator 604a is made parallel or substantially parallel with the second axis X2 of each of the optical deflectors 201$_{Wide}$ and 201$_{Hot}$ (see FIG. 4), the luminance distribution can be formed at any position on the wavelength converting member 18, for example, at the reference position or the position shifted in the vertical direction with respect to the reference position, in accordance with the rotational direction and the rotational amount of each of the rotary reflecting members 602$_{Wide}$ and 602$_{Hot}$. With this configuration, as a result, the vehicle lighting fixture 600 can form a predetermined light distribution pattern at any position on a virtual vertical screen, for example, at a reference position (for example, at a position illustrated in FIG. 66A) or a position shifted in the vertical direction with respect to the reference position (for example, at a position illustrated in FIG. 66B).

As described above, the control of the rotational direction and rotational amount of the control target, i.e., the rotary reflecting members 602$_{Wide}$ and 602$_{Hot}$, about the vertical axis can properly form the predetermined light distribution pattern at a position horizontally shifted with respect to the reference position. Thus, for example, an adaptive front-lighting system (AFS) function can be achieved.

Furthermore, the control of the rotational direction and rotational amount of the rotary reflecting members 602$_{Wide}$ and 602$_{Hot}$ about the horizontal axis can properly form the predetermined light distribution pattern at a position vertically shifted with respect to the reference position. This configuration can achieve a manual or automatic leveling function.

According to this exemplary embodiment, the vehicle lighting fixture 600 utilizing the plurality of optical deflectors 201$_{Wide}$ and 201$_{Hot}$ that can scan with light can be miniaturized, and the parts number, which may become a cause for cost increase, can be decreased. The use of the single wavelength converting member 18 with respect to the plurality of deflectors 201$_{Wide}$ and 201$_{Hot}$ can contribute to obtain the advantageous effects.

A description will now be given of a modified example.

Figure 55:
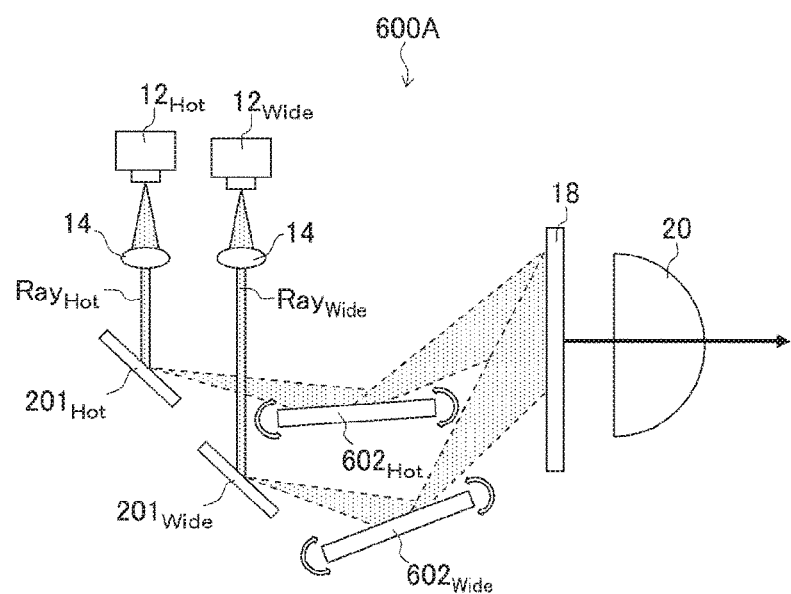
FIG. 55 is a schematic diagram illustrating a vehicle lighting fixture 600A as a modified example.
Figure 56A:
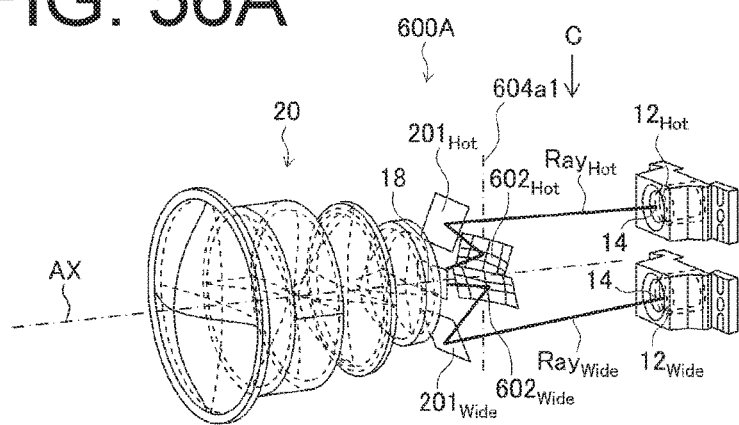
FIG. 56A is a perspective view of the vehicle lighting fixture 600A.
Figure 56B:
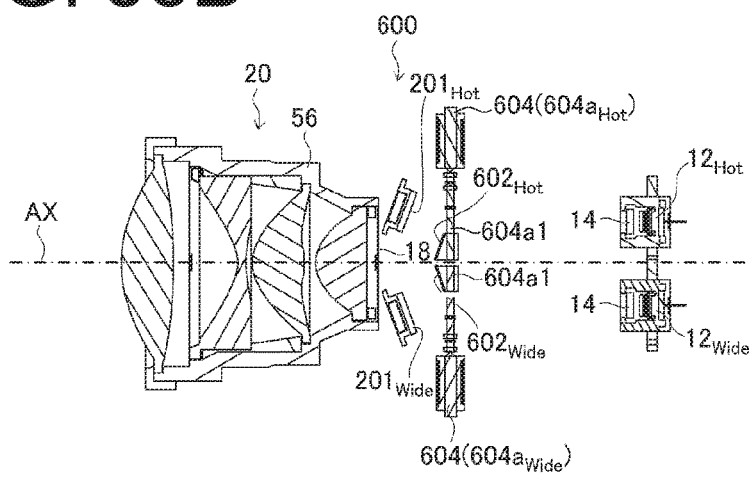
FIG. 56B is a cross-sectional view of the vehicle lighting fixture 600A.

FIG. 55 is a schematic diagram illustrating a vehicle lighting fixture 600A as a modified example. FIG. 56A is a perspective view of the vehicle lighting fixture 600A, and FIG. 56B is a cross-sectional view of the vehicle lighting fixture 600A.

When the vehicle lighting fixture 600A of the modified example is compared with the vehicle lighting fixture 600 of the above-described exemplary embodiment, the following point is the difference.

The vehicle lighting fixture 600 of the above-described exemplary embodiment can control the rotational direction and the rotational amount of each of the rotary reflecting members 602$_{Wide}$ and 602$_{Hot}$ with the single actuator 604a provided with respect to the two rotary reflecting members 602$_{Wide}$ and 602$_{Hot}$ as illustrated in FIG. 50B. On the contrary thereto, the vehicle lighting fixture 600A of the modified example can separately control the respective rotational directions and the respective rotational amounts of the rotary reflecting members 602$_{Wide}$ and 602$_{Hot}$ by providing two actuators 604a$_{Wide}$ and 604a$_{Hot}$ with respect to the respective rotary reflecting members 602$_{Wide}$ and 602$_{Hot}$ as illustrated in FIG. 56B.

According to this modified example, the respective rotational directions and the respective rotational amounts of the rotary reflecting members 602$_{Wide}$ and 602$_{Hot}$ can be separately controlled by the respective actuators 604a$_{Wide}$ and 604a$_{Hot}$. Thus, predetermined light distribution patterns P$_{A2(Wide)}$ and P$_{A2(Hot)}$ can be formed at respective different positions on the virtual vertical screen, as illustrated in FIGS. 57A and 57B.

Figure 57A:
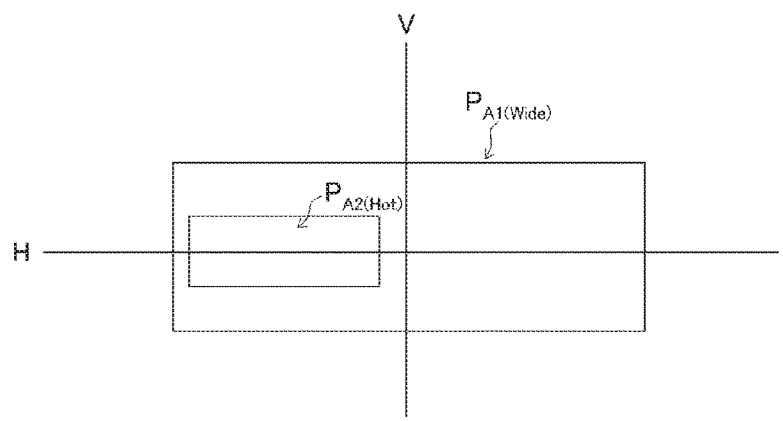
FIGS. 57A and 57B are each a diagram illustrating the predetermined light distribution patterns $P_{A1(Wide)}$ and $P_{A1(Hot)}$ formed on the virtual vertical screen.
Figure 57B:
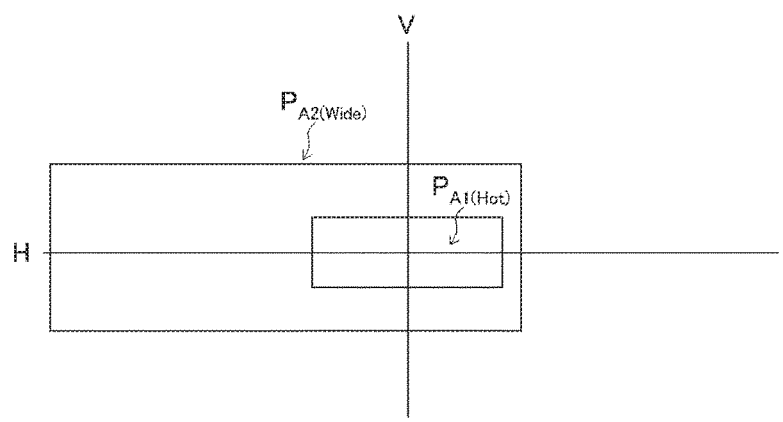

As illustrated in FIG. 57A, the predetermined light distribution pattern P$_{A2(Wide)}$ wide in the left-right direction can be formed at a reference position while the predetermined converged light distribution pattern P$_{A2(Hot)}$ can be formed at a position shifted in the horizontal direction with respect to the reference position. Thus, when, for example, an automobile including the vehicle lighting fixture 600A is turning left or right at an intersection, the vehicle lighting fixture 600A can irradiate the position in the vehicle travelling direction with brighter light while the vehicle lighting fixture 600A can secure the irradiation with light leftward and rightward.

A description will now be given of another modified example.

Figure 58:
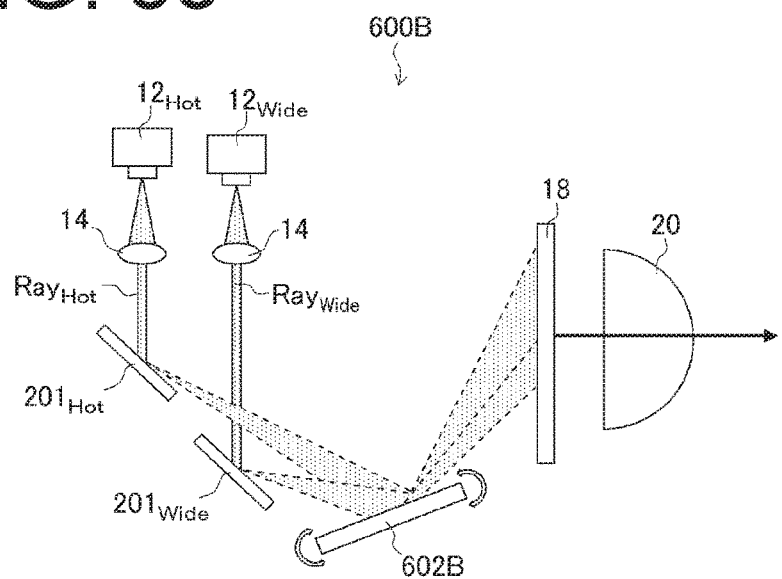
FIG. 58 is a schematic diagram illustrating a vehicle lighting fixture 600B as another modified example.

FIG. 58 is a schematic diagram illustrating a vehicle lighting fixture 600B as another modified example.

When the vehicle lighting fixture 600B of the modified example is compared with the vehicle lighting fixture 600 of the above-described exemplary embodiment, the following point is the difference.

The vehicle lighting fixture 600 of the above-described exemplary embodiment includes the two rotary reflecting members $602_{Wide}$ and $602_{Hot}$ as illustrated in FIG. 50B. On the contrary thereto, the vehicle lighting fixture 600B of this modified example can include a single common rotary reflecting member 602B as illustrated in FIG. 58.

With this configuration, the vehicle lighting fixture 600B of this modified example can form luminance distributions formed on the wavelength converting member 18 with the excitation light rays from the respective excitation light sources $12_{Wide}$ and $12_{Hot}$ uniformly at the same shifted position with respect to the reference position.

Next, a description will be given of still another modified example.

In the vehicle lighting fixture 600 of the above-described exemplary embodiment, the excitation light sources $12_{Wide}$ and $12_{Hot}$, the optical deflectors $201_{Wide}$ and $201_{Hot}$, the rotary reflecting members $602_{Wide}$ and $602_{Hot}$, and the wavelength converting member 18 are arranged as illustrated in FIG. 51A.

Figure 67:
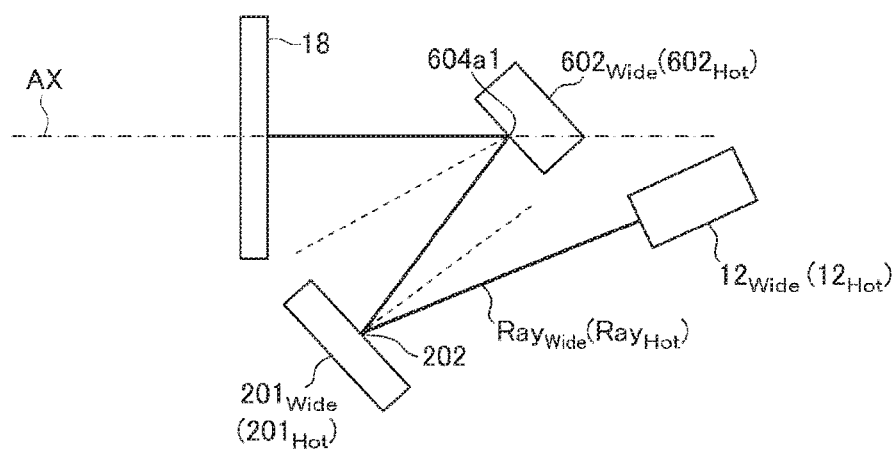
FIG. 67 is a schematic diagram illustrating the excitation light sources $12_{Wide}$ and $12_{Hot}$, optical deflectors $201_{Wide}$ and $201_{Hot}$, rotary reflecting members $602_{Wide}$ and $602_{Hot}$, and a wavelength converting member 18.

On the contrary thereto, this modified example can be configured to dispose the excitation light sources $12_{Wide}$ and $12_{Hot}$, the optical deflectors $201_{Wide}$ and $201_{Hot}$, the rotary reflecting members $602_{Wide}$ and $602_{Hot}$, and the wavelength converting member 18 with the positional relationship illustrated in FIG. 67. FIG. 67 is a schematic diagram illustrating an arrangement example of the excitation light sources $12_{Wide}$ and $12_{Hot}$, the optical deflectors $201_{Wide}$ and $201_{Hot}$, the rotary reflecting members $602_{Wide}$ and $602_{Hot}$, and the wavelength converting member 18 when observed in a direction of an arrow C in FIG. 50A. When they are arranged in this manner, the excitation light ray $Ray_{Wide}$ and $Ray_{Hot}$ from the excitation light sources $12_{Wide}$ and $12_{Hot}$ can be prevented from being shielded by the rotary shaft 604a1 of the actuator 604a to allow them to be directly incident on the mirror parts 202 of the optical deflectors $201_{Wide}$ and $201_{Hot}$.

Next, a description will be given of a variable light-distribution type vehicle lighting fixture 610 (variable light-distribution type vehicle headlight) using optical deflectors 201 of the one-dimensional nonresonance/one-dimensional resonance type (2-D optical scanner (fast resonant and slow static combination)) as another exemplary embodiment with reference to the associated drawings. It is appreciated that the aforementioned various types of optical deflectors discussed in the above reference examples can be used in place of the one-dimensional nonresonance/one-dimensional resonance type optical deflector 201.

Figure 59:
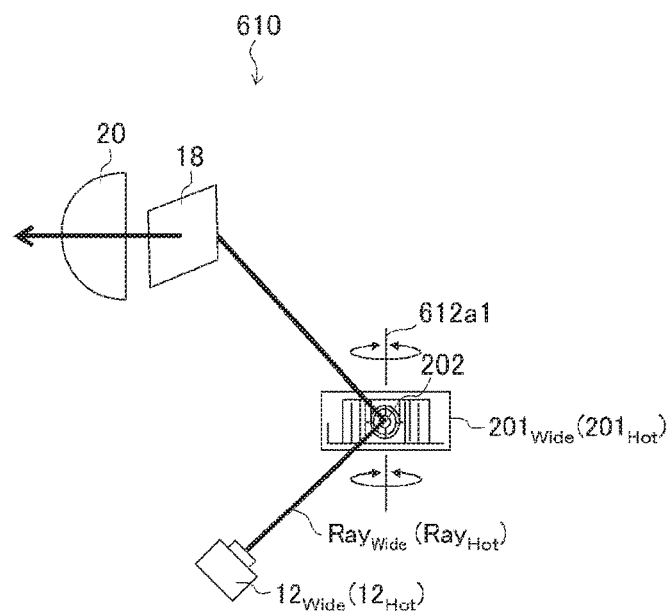
FIG. 59 is a schematic diagram illustrating a vehicle lighting fixture 610 of another exemplary embodiment made in accordance with the principles of the presently disclosed subject matter.
Figure 60:
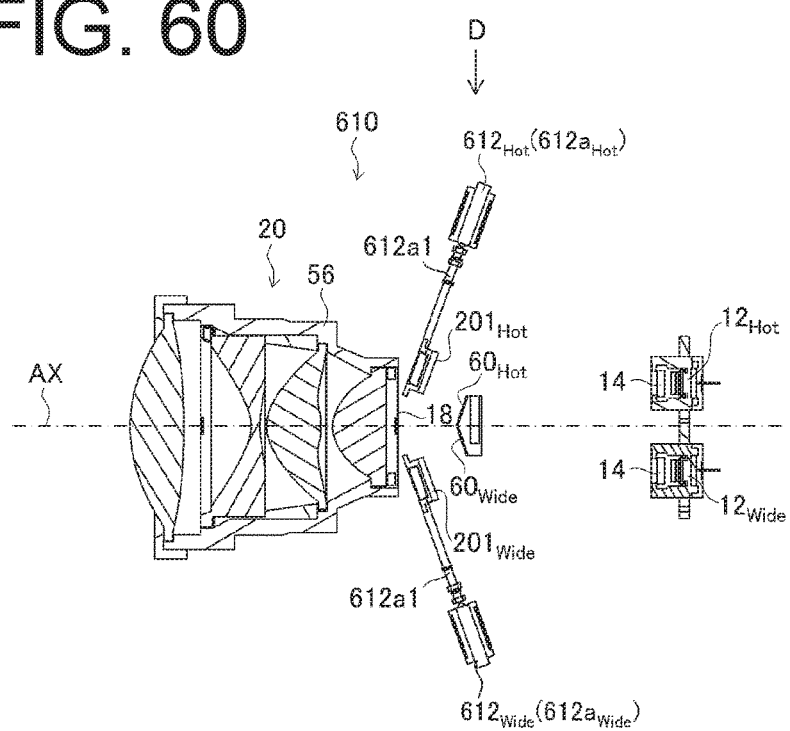
FIG. 60 is a cross-sectional view of the vehicle lighting fixture 610.

FIG. 59 is a schematic diagram illustrating the vehicle lighting fixture 610 of this exemplary embodiment made in accordance with the principles of the presently disclosed subject matter, and FIG. 60 is a cross-sectional view of the vehicle lighting fixture 610.

As illustrated in FIGS. 59 and 60, the vehicle lighting fixture 610 of this exemplary embodiment can be configured to rotate the optical deflectors $201_{Wide}$ and $201_{Hot}$ themselves, which is different from the vehicle lighting fixture 600 illustrated in FIG. 50 etc. Specifically, the vehicle lighting fixture 610 can be configured to form luminance distributions A1 and A2 at any position on the wavelength converting member 18, for example, at a reference position (for example, at a position illustrated in FIG. 61A to be described later) or a position shifted with respect to the reference position in the horizontal direction (for example, at a position illustrated in FIG. 61C to be described later), in accordance with a rotational direction and a rotational amount of each of the optical deflectors $201_{Wide}$ and $201_{Hot}$. With this configuration, as a result, the vehicle lighting fixture 610 can form predetermined light distribution patterns $P_{A1}$ and $P_{A2}$ at any position on a virtual vertical screen, for example, at a reference position (for example, at a position illustrated in FIG. 61B to be described later) or a position shifted in the horizontal direction with respect to the reference position (for example, at a position illustrated in FIG. 61D to be described later).

Figure 61A:
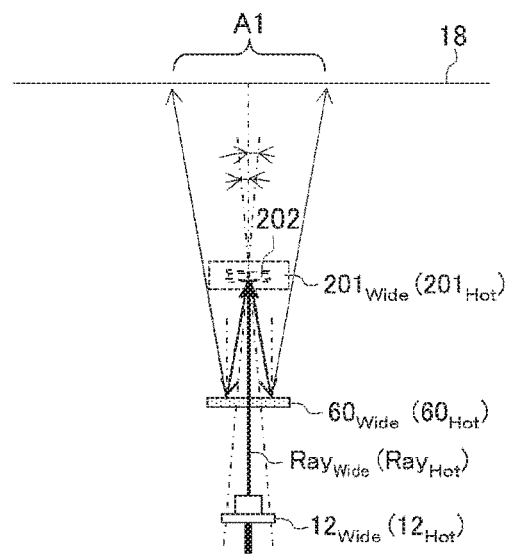
FIG. 61A is a diagram illustrating a state in which the excitation light rays $Ray_{Wide}$ and $Ray_{Hot}$ from excitation light sources $12_{Wide}$ and $12_{Hot}$ are drawing a luminance distribution A1 at a reference position on a wavelength converting member 18 and FIG. 61B is a diagram illustrating a predetermined light distribution pattern $P_{A1}$ formed on a virtual vertical screen (assumed to be disposed in front of a vehicle body approximately 25 m away from the vehicle front face) by projecting the luminance distribution A1 of FIG. 61A with a projection lens assembly 20.
Figure 61B:
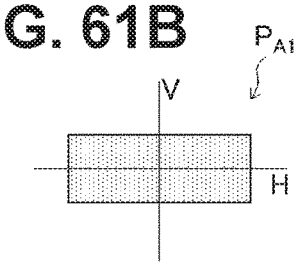

FIG. 61A is a schematic diagram of the vehicle lighting fixture 610 of FIG. 60 when observed in a direction of an arrow D and illustrating a state in which the excitation light rays $Ray_{Wide}$ and $Ray_{Hot}$ from the excitation light sources $12_{Wide}$ and $12_{Hot}$ are reflected by the mirror parts 202 of the optical deflectors $201_{Wide}$ and $201_{Hot}$ and then by reflecting members $60_{Wide}$ and $60_{Hot}$ and drawing the luminance distribution A1 at the reference position on the wavelength converting member 18. FIG. 61B is a diagram illustrating a predetermined light distribution pattern $P_{A1}$ formed on a virtual vertical screen (assumed to be disposed in front of a vehicle body approximately 25 m away from the vehicle front face) by projecting the luminance distribution A1 of FIG. 61A with the projection lens assembly 20.

Figure 61C:
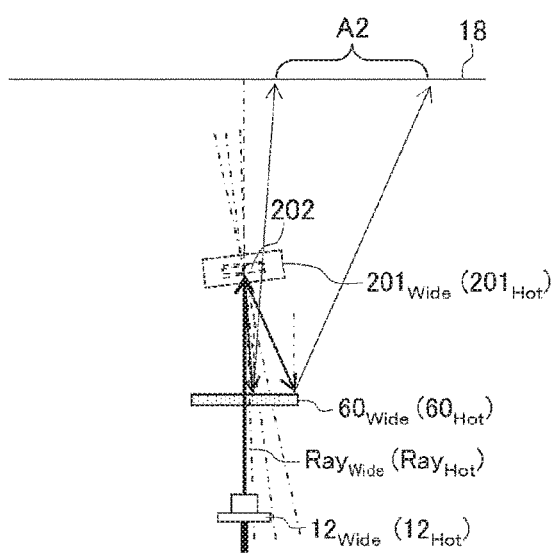
FIG. 61C is a diagram illustrating a state in which the excitation light rays $Ray_{Wide}$ and $Ray_{Hot}$ from the excitation light sources $12_{Wide}$ and $12_{Hot}$ are drawing a luminance distribution A2 at a position shifted in a horizontal direction with respect to the reference position on the wavelength converting member 18 and FIG. 61D is a diagram illustrating a predetermined light distribution pattern $P_{A2}$ formed on the virtual vertical screen by projecting the luminance distribution A2 of FIG. 61C with the projection lens assembly 20.
Figure 61D:
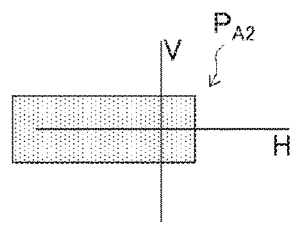

FIG. 61C is a schematic diagram of the vehicle lighting fixture 610 of FIG. 60 when observed in the direction of the arrow C and illustrating a state in which the excitation light rays $Ray_{Wide}$ and $Ray_{Hot}$ from the excitation light sources $12_{Wide}$ and $12_{Hot}$ are reflected by the mirror parts 202 of the optical deflectors $201_{Wide}$ and $201_{Hot}$ and then by the reflecting members $60_{Wide}$ and $60_{Hot}$ and drawing a luminance distribution A2 at a position shifted in the horizontal direction with respect to the reference position on the wavelength converting member 18. FIG. 61D is a diagram illustrating a predetermined light distribution pattern $P_{A2}$ formed on the virtual vertical screen by projecting the luminance distribution A2 of FIG. 61C with the projection lens assembly 20.

Hereinbelow, a description will be given of the different point of the vehicle lighting fixture 610 of this exemplary embodiment from the vehicle lighting fixture 600 of the previous exemplary embodiment, and the same or similar components of this exemplary embodiment as those in the previous exemplary embodiment will be denoted by the same reference numerals and a description thereof will be omitted as appropriate.

The vehicle lighting fixture 610 of this exemplary embodiment can be configured, as illustrated in FIG. 60, as a vehicle headlamp. The vehicle lighting fixture 610 can include the two excitation light sources $12_{Wide}$ and $12_{Hot}$; the two optical deflectors $201_{Wide}$ and $201_{Hot}$ each including a mirror part 202, the two optical deflectors $201_{Wide}$ and $201_{Hot}$ provided corresponding to the two excitation light sources $12_{Wide}$ and $12_{Hot}$; the two reflecting member $60_{Wide}$ and $60_{Hot}$ provided corresponding to the two optical deflectors $201_{Wide}$ and $201_{Hot}$; the wavelength converting member 18 on which luminance distributions are formed by the excitation light rays reflected from the two reflecting member $60_{Wide}$ and $60_{Hot}$; the projection lens assembly 20 configured to serve as an optical system and project the luminance distributions formed on the wavelength converting member 18 to form a predetermined light distribution pattern; and rotary control units $612_{Wide}$ and $612_{Hot}$ configured to control the rotational direction and the rotational amount of each of the two optical deflectors $201_{Wide}$ and $201_{Hot}$. Note that the number of the excitation light sources 12, the optical deflectors 201, and the reflecting member 60 is not limited to two, and may be one or three or more.

As illustrated, the projection lens assembly 20, the wavelength converting member 18, the optical deflectors $201_{Wide}$ and $201_{Hot}$, the reflecting members $60_{Wide}$ and $60_{Hot}$, and the excitation light sources $12_{Wide}$ and $12_{Hot}$ can be disposed in this order along a reference axis AX (or referred to as an optical axis) extending in the front-rear direction of a vehicle body. These members can be disposed by being fixed to a not-illustrated holder as in the vehicle lighting fixture 400 illustrated in FIG. 32.

The excitation light sources $12_{Wide}$ and $12_{Hot}$ can be disposed to surround the reference axis AX with a posture tilted in such a manner that excitation light rays $Ray_{Wide}$ and $Ray_{Hot}$ are directed forward.

A condenser lens 14 can be disposed in front of each of the excitation light sources $12_{Wide}$ and $12_{Hot}$. The excitation light rays $Ray_{Wide}$ and $Ray_{Hot}$ can be output from the respective excitation light sources $12_{Wide}$ and $12_{Hot}$ and condensed by the respective condenser lenses 14 (for example, collimated) to be incident on the respective mirror parts 202 of the optical deflectors $201_{Wide}$ and $201_{Hot}$.

The optical deflectors $201_{Wide}$ and $201_{Hot}$ with the above-described configuration can be disposed to surround the reference axis AX with a posture tilted so that the excitation light rays output from the respective excitation light sources $12_{Wide}$ and $12_{Hot}$ can be incident on the corresponding mirror parts 202 of the optical deflectors $201_{Wide}$ and $201_{Hot}$ and reflected by the same to be directed rearward and closer to the reference axis AX.

The reflecting members $60_{Wide}$ and $60_{Hot}$ (corresponding to the fixed reflecting members in the presently disclosed subject matter) can be disposed to surround the reference axis AX and be closer to the reference axis AX than the optical deflectors $201_{Wide}$ and $201_{Hot}$. Specifically, the reflecting members $60_{Wide}$ and $60_{Hot}$ can be disposed such that the excitation light rays reflected from the mirror parts 202 of the corresponding optical deflectors $201_{Wide}$ and $201_{Hot}$ can be incident thereon and reflected by the same to the wavelength converting member 18.

The rotary control units $612_{Wide}$ and $612_{Hot}$ can be configured to control the respective rotational directions and rotational amounts of the optical deflectors $201_{Wide}$ and $201_{Hot}$. The rotary control units $612_{Wide}$ and $612_{Hot}$ can each include an actuator $612a_{Wide\ (Hot)}$ as illustrated in FIG. 60, and a controlling unit 24 and an actuator power circuit 606 as illustrated in FIG. 52, etc. In this case, the actuator $612a_{Wide(Hot)}$ when constituted by a stepping motor can be feed-back controlled on the basis of an angle detected by a rotary encoder or the like.

Another example of the actuator $612a_{Wide(Hot)}$ can be a movable plate with the optical deflectors $201_{Wide}$ and $201_{Hot}$ attached thereto, where the movable plate can be driven by a Lorentz force generated by a coil or permanent magnet disposed around it. In this case, the rotational directions and the rotary amounts of the respective optical deflectors $201_{Wide}$ and $201_{Hot}$ can be controlled by adjusting the value of a current to pass through the coil.

The actuators $612a_{Wide}$ and $612a_{Hot}$, which each have a rotary shaft 604a1, can be a stepping motor disposed with the rotary shaft 604a1 coaxial with (or parallel to) the first axis X1 of the optical deflectors $201_{Wide}$ and $201_{Hot}$ and contained in a vertical plane containing the reference axis AX, as illustrated in FIG. 60.

The optical deflectors $201_{Wide}$ and $201_{Hot}$ can be fixed to the respective rotary shafts 612a1 of the actuators $612a_{Wide}$ and $612a_{Hot}$ so that the first axis X1 (see FIG. 4) is contained in a vertical plane containing the reference axis AX and the second axis X2 (see also FIG. 4) is contained in a horizontal plane. With this arrangement of the optical deflectors $201_{Wide}$ and $201_{Hot}$, a predetermined light distribution pattern (two-dimensional image corresponding to the required predetermined light distribution pattern) being wide in the horizontal direction and narrow in the vertical direction for use in a vehicular headlamp can be easily formed (drawn).

The wide-zone optical deflector $201_{Wide}$ can draw a first two-dimensional image with the excitation light rays $Ray_{Wide}$ two-dimensionally scanning in the horizontal and vertical directions by the mirror part 202 thereof, to thereby form a first light intensity distribution (luminance distribution) on the wavelength converting member 18.

The hot-zone optical deflector $201_{Hot}$ can draw a second two-dimensional image with the excitation light rays $Ray_{Hot}$ two-dimensionally scanning in the horizontal and vertical directions by the mirror part 202 thereof in such a manner that the second two-dimensional image overlaps the first two-dimensional image in part, to thereby form a second light intensity distribution (luminance distribution) on the wavelength converting member 18 with a higher light intensity than that of the first light intensity distribution.

A description will now be given of an operation example of the vehicle lighting fixture 610 with the above-described configuration, with reference to FIG. 53.

The following processing can be achieved by the controlling unit 24 that reads out a predefined program from the storage device 44 in a not-illustrated RAM, and executes the program.

When a not-illustrated headlamp switch is turned on (Yes in step S200), as in the previously described reference examples, the respective excitation light sources $12_{Wide}$ and $12_{Hot}$ are applied with a drive current and the respective optical deflectors $201_{Wide}$ and $201_{Hot}$ are applied with a drive voltage (step S202). In this case, as illustrated in FIG. 61A, the excitation light rays $Ray_{Wide}$ and $Ray_{Hot}$ from the excitation light sources $12_{Wide}$ and $12_{Hot}$ can be reflected by the mirror parts 202 of the respective optical deflectors $201_{Wide}$ and $201_{Hot}$ and then by the respective reflecting members $60_{Wide}$ and $60_{Hot}$ (can be two-dimensionally scanned) to form (draw) the luminance distribution A1 at the reference position on the wavelength converting member 18. Then, as illustrated in FIG. 61B, a predetermined light distribution pattern $P_{A1}$ corresponding to the luminance distribution A1 can be formed at the reference position on the virtual vertical screen by projecting the luminance distribution A1 formed on the wavelength converting member 18 at the reference position, by the projection lens assembly 20. Note that although FIG. 61B illustrates the single light distribution pattern $P_{A1}$ as the predetermined light distribution pattern, the light distribution pattern $P_{A1}$ is actually composed of two light distribution patterns $P_{A1(Wide)}$ and $P_{A1(Hot)}$ corresponding to the two optical deflectors $201_{Wide}$ and $201_{Hot}$.

Next, a sensor provided to a vehicle body on which the vehicle lighting fixture 610 is installed, such as any of sensors 30 to 42 and 608 in FIG. 52, can output a signal to the controlling unit 24 (step S204) to determine when to start the variable light distribution control on the basis of the sensor signal obtained (step S206).

When to start the variable light distribution control can be determined in the same manner as in the previous exemplary embodiment.

Then, if it is determined that the timing is to start the variable light distribution control in step S206 (Yes in step S206), the rotational direction/rotational amount determination unit 24a can determine the rotational direction and the rotational amount of each of the optical deflectors $201_{Wide}$ and $201_{Hot}$ (step S208).

Next, the controlling unit 24 can control the actuator power circuit 606 to rotate the optical deflectors $201_{Wide}$ and $201_{Hot}$ in the rotational direction and by the rotational amount determined in step S208 (step S210). In accordance with the control by the controlling unit 24, the actuator power circuit 606 can apply an electric pulse to the actuators $612a_{Wide}$ and $612a_{Hot}$ with the electric pulse having been adjusted so as to rotate the optical deflectors $201_{Wide}$ and $201_{Hot}$ in the rotational direction and by the rotational amount determined in step S208.

In this manner, the optical deflectors $201_{Wide}$ and $201_{Hot}$ can be rotated in the rotational direction and by the rotational amount determined in step S208 (see, for example, FIG. 61C). In this case, as illustrated in FIG. 61C, the excitation light rays $Ray_{Wide}$ and $Ray_{Hot}$ from the excitation light sources $12_{Wide}$ and $12_{Hot}$ can be reflected by the mirror parts 202 of the optical deflectors $201_{Wide}$ and $201_{Hot}$ and then by the reflecting members $60_{Wide}$ and $60_{Hot}$ (can be two-dimensionally scanned) to form (draw) the luminance distribution A2 at a position shifted in the horizontal direction with respect to the reference position on the wavelength converting member 18. Then, as illustrated in FIG. 71D, a predetermined light distribution pattern $P_{A2}$ corresponding to the luminance distribution A2 can be formed at a position shifted in the horizontal direction with respect to the reference position on the virtual vertical screen by projecting the luminance distribution A2 formed on the wavelength converting member 18 at the position shifted in the horizontal direction with respect to the reference position, by the projection lens assembly 20. Note that although FIG. 61D illustrates the single light distribution pattern $P_{A2}$ as the predetermined light distribution pattern, the light distribution pattern $P_{A2}$ is actually composed of two light distribution patterns $P_{A2(Wide)}$ and $P_{A2(Hot)}$ corresponding to the two optical deflectors $201_{Wide}$ and $201_{Hot}$.

Next, any of the sensors provided to the vehicle body on which the vehicle lighting fixture 610 is installed, such as any of the sensors 30 to 42 and 608 in FIG. 52, can output a signal to the controlling unit 24 (step S212) to determine when to stop the variable light distribution control on the basis of the sensor signal obtained (step S214).

When to stop the variable light distribution control can be determined in the same manner as in the previous exemplary embodiment.

Next, if the stopping of the variable light distribution control is determined in step S214 (Yes in step S214), the controlling unit 24 can control the actuator power circuit 606 to return the optical deflectors $201_{Wide}$ and $201_{Hot}$ to the respective original positions (the original positions before the rotational control in step S210) (step S216). In accordance with the control by the controlling unit 24, the actuator power circuit 606 can apply an electric pulse to the actuators $612a_{Wide}$ and $612a_{Hot}$ with the electric pulse having been adjusted so as to return the optical deflectors $201_{Wide}$ and $201_{Hot}$ to the original positions.

In this manner, the optical deflectors $201_{Wide}$ and $201_{Hot}$ are caused to rotate to return to the original positions (see, for example, FIG. 61A).

The above-mentioned steps S202 to S216 are repeatedly performed until the headlamp switch is turned off (No in step S218).

When the headlamp switch is turned off (Yes in step S218), the excitation light sources $12_{Wide}$ and $12_{Hot}$ and the optical deflectors $201_{Wide}$ and $201_{Hot}$ are stopped (step S220). In other words, the application of the drive current to each of the excitation light sources $12_{Wide}$ and $12_{Hot}$ and the application of the drive voltage to each of the optical deflectors $201_{Wide}$ and $201_{Hot}$ are stopped.

As described above, the luminance distributions A1 and A2 can be formed on the wavelength converting member 18 at the reference position (for example, at the position illustrated in FIG. 61A) or the position shifted in the horizontal direction with respect to the reference position (for example, at the shifted position illustrated in FIG. 61C), in accordance with the rotational direction and the rotational amount of each of the optical deflectors $201_{Wide}$ and $201_{Hot}$. With this configuration, as a result, the vehicle lighting fixture 610 can form the predetermined light distribution patterns $P_{A1}$ and $P_{A2}$ on a virtual vertical screen at a reference position (for example, at the position illustrated in FIG. 61B) or a position shifted in the horizontal direction with respect to the reference position (for example, at the shifted position illustrated in FIG. 61D). This technique can be applied not only to the vehicle lighting fixture 610 including the reflecting members $60_{Wide}$ and $60_{Hot}$ but also to the vehicle lighting fixture 10 without such reflecting members $60_{Wide}$ and $60_{Hot}$ as illustrated in FIG. 2.

According to this exemplary embodiment, the vehicle lighting fixture 610 utilizing the optical deflectors $201_{Wide}$ and $201_{Hot}$ that can scan with the excitation light rays can form a predetermined light distribution pattern at a position shifted, for example, in the horizontal direction with respect to the reference position.

This configuration can be achieved by controlling the rotational direction and rotational amount of each of the optical deflectors $201_{Wide}$ and $201_{Hot}$ so as to form the luminance distribution at the reference position (for example, at the position illustrated in FIG. 61A) or the position shifted with respect to the reference position (for example, at the position illustrated in FIG. 61C), and further by causing the projection lens assembly 20 to project the luminance distribution thus formed on the wavelength converting member 18 (luminance distribution formed at the reference position or the position shifted with respect to the reference position). Thus, the predetermined light distribution pattern (for example, one illustrated in FIG. 61B or FIG. 61D) can be formed at the desired position.

When the rotational shafts $604a1$ of the actuators $612a_{Wide}$ and $612a_{Hot}$ are made parallel or substantially parallel with the second axis X2 of each of the optical deflectors $201_{Wide}$ and $201_{Hot}$ (see FIG. 4), the luminance distribution can be formed at any position on the wavelength converting member 18, for example, at the reference position or the position shifted in the vertical direction with respect to the reference position, in accordance with the rotational direction and the rotational amount of each of the optical deflectors $201_{Wide}$ and $201_{Hot}$. With this configuration, as a result, the vehicle lighting fixture 610 can form a predetermined light distribution pattern at any position on the virtual vertical screen, for example, at a reference position (for example, at the position illustrated in FIG. 66A) or a position shifted in the vertical direction with respect to the reference position (for example, at a position illustrated in FIG. 66B).

As described above, the control of the rotational direction and rotational amount of the control target, i.e., the optical deflectors $201_{Wide}$ and $201_{Hot}$ about the vertical axis can properly form the predetermined light distribution pattern at a position horizontally shifted with respect to the reference position. Thus, for example, an adaptive front-lighting system (AFS) function can be achieved.

Furthermore, the control of the rotational direction and rotational amount of the optical deflectors $201_{Wide}$ and $201_{Hot}$ about the horizontal axis can properly form the predetermined light distribution pattern at a position vertically shifted with respect to the reference position. This configuration can achieve a manual or automatic leveling function.

According to this exemplary embodiment, the vehicle lighting fixture 610 utilizing the plurality of optical deflectors $201_{Wide}$ and $201_{Hot}$ that can scan with light can be miniaturized, and the parts number, which may become a cause for cost increase, can be decreased. The use of the single wavelength converting member 18 with respect to the plurality of deflectors $201_{Wide}$ and $201_{Hot}$ can contribute to obtain the advantageous effects.

Next, a description will be given of a variable light-distribution type vehicle lighting fixture 620 (variable light-distribution type vehicle headlight) using optical deflectors 201 of the one-dimensional nonresonance/one-dimensional resonance type (2-D optical scanner (fast resonant and slow static combination)) as still another exemplary embodiment with reference to the associated drawings. It is appreciated that the aforementioned various types of optical deflectors discussed in the above reference examples can be used in place of the one-dimensional nonresonance/one-dimensional resonance type optical deflector 201.

Figure 62:
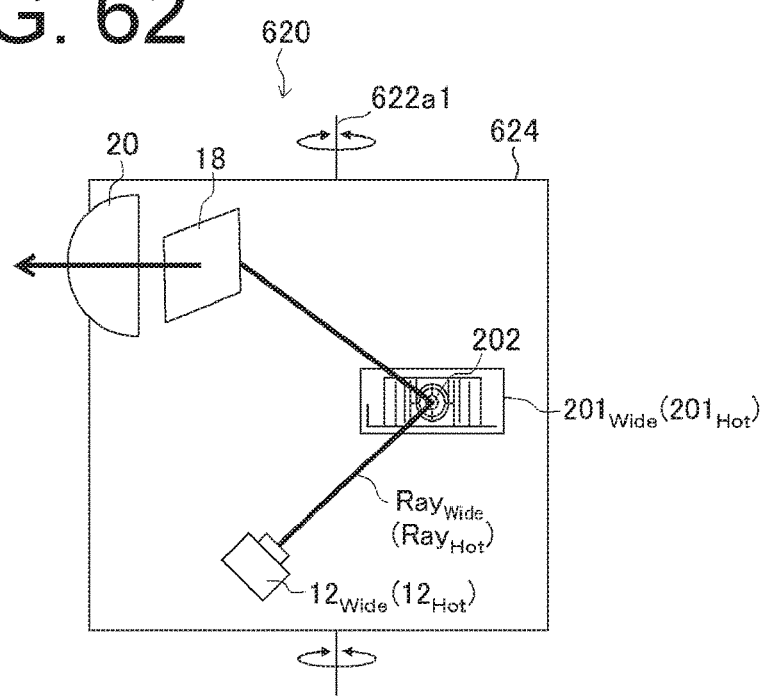
FIG. 62 is a schematic diagram illustrating a vehicle lighting fixture 620 of still another exemplary embodiment made in accordance with the principles of the presently disclosed subject matter.
Figure 63:
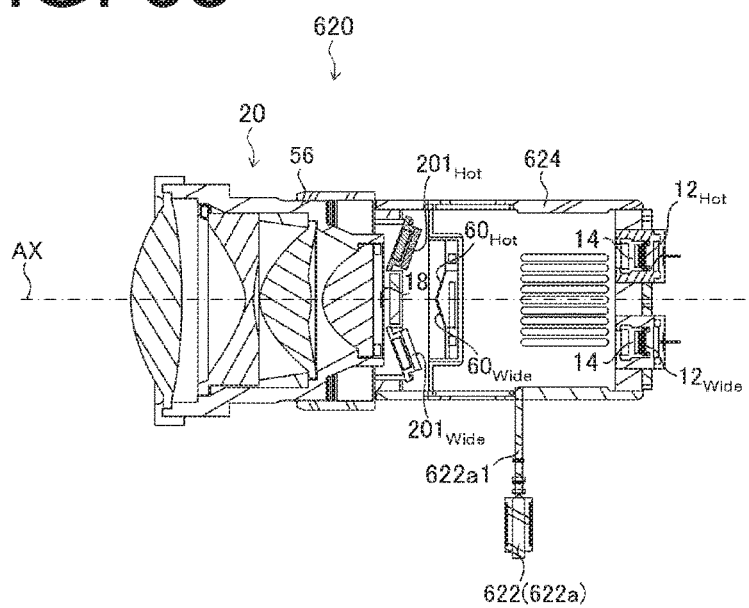
FIG. 63 is a cross-sectional view of the vehicle lighting fixture 620.

FIG. 62 is a schematic diagram illustrating the vehicle lighting fixture 620 of this exemplary embodiment made in accordance with the principles of the presently disclosed subject matter, and FIG. 63 is a cross-sectional view of the vehicle lighting fixture 620.

Unlike the configuration of the vehicle lighting fixture 610 of the previous exemplary embodiment as illustrated in FIG. 60 etc., the vehicle lighting fixture 620 of this exemplary embodiment as illustrated in FIGS. 62 and 63 can be configured such that the projection lens assembly 20, the wavelength converting member 18, the optical deflectors $201_{Wide}$ and $201_{Hot}$, the reflecting members $60_{Wide}$ and $60_{Hot}$, and the excitation light sources $12_{Wide}$ and $12_{Hot}$ are arranged on and fixed to a holder 624, and that the holder 624 (corresponding to the optical unit of the presently disclosed subject matter) can be configured to rotate. Specifically, the vehicle lighting fixture 620 can be configured to form predetermined light distribution patterns $P_{A1}$ and $P_{A2}$ at any position on a virtual vertical screen, for example, at a reference position (for example, at the position illustrated in FIG. 61B) or a position shifted in the horizontal direction with respect to the reference position (for example, at the position illustrated in FIG. 61D) in accordance with a rotational direction and a rotational amount of the holder 624 itself. Except for this feature, the vehicle lighting fixture 620 of this exemplary embodiment can have the same configuration as that of the vehicle lighting fixture 610 of the previous exemplary embodiment.

Hereinbelow, a description will be given of the different point of the vehicle lighting fixture 620 of this exemplary embodiment from the vehicle lighting fixture 610 of the previous exemplary embodiment, and the same or similar components of this exemplary embodiment as those in the previous exemplary embodiment will be denoted by the same reference numerals and a description thereof will be omitted as appropriate.

The vehicle lighting fixture 620 of this exemplary embodiment can be configured, as illustrated in FIG. 63, as a vehicle headlamp. The vehicle lighting fixture 620 can include the two excitation light sources $12_{Wide}$ and $12_{Hot}$; the two optical deflectors $201_{Wide}$ and $201_{Hot}$ each including a mirror part 202, the two optical deflectors $201_{Wide}$ and $201_{Hot}$ provided corresponding to the two excitation light sources $12_{Wide}$ and $12_{Hot}$; the two reflecting member $60_{Wide}$ and $60_{Hot}$ provided corresponding to the two optical deflectors $201_{Wide}$ and $201_{Hot}$; the wavelength converting member 18 on which luminance distributions are formed by the excitation light rays reflected from the two reflecting member $60_{Wide}$ and $60_{Hot}$; the projection lens assembly 20 configured to serve as an optical system and project the luminance distributions formed on the wavelength converting member 18 to form a predetermined light distribution pattern; and a rotary control unit 622 configured to control the rotational direction and the rotational amount of the holder 624. Note that the number of the excitation light sources 12, the optical deflectors 201, and the reflecting member 60 is not limited to two, and may be one or three or more.

The rotary control unit 622 can be configured to control the rotational direction and rotational amount of the holder 624. The rotary control unit 622 can include an actuator 622a as illustrated in FIG. 63, and a controlling unit 24 and an actuator power circuit 606 as illustrated in FIG. 52, etc.

The actuator 622a, which has a rotary shaft 622a1, can be a stepping motor disposed with the rotary shaft 622a1 coincident with the vertical axis as illustrated in FIG. 63. In this case, the actuator 622a constituted by the stepping motor can be feed-back controlled on the basis of an angle detected by a rotary encoder or the like.

Here, the holder 624 can be fixed to the rotary shaft 622a1 of the actuator 622a.

A description will now be given of an operation example of the vehicle lighting fixture 620 with the above-described configuration, with reference to FIG. 53.

The following processing can be achieved by the controlling unit 24 that reads out a predefined program from the storage device 44 in a not-illustrated RAM, and executes the program.

When a not-illustrated headlamp switch is turned on (Yes in step S200), as in the previously described reference examples, the respective excitation light sources $12_{Wide}$ and $12_{Hot}$ are applied with a drive current and the respective optical deflectors $201_{Wide}$ and $201_{Hot}$ are applied with a drive voltage (step S202). In this case, as illustrated in FIG. 61A, the excitation light rays $\text{Ray}_{Wide}$ and $\text{Ray}_{Hot}$ from the excitation light sources $12_{Wide}$ and $12_{Hot}$ can be reflected by the mirror parts 202 of the respective optical deflectors $201_{Wide}$ and $201_{Hot}$ and then by the respective reflecting members $60_{Wide}$ and $60_{Hot}$ (can be two-dimensionally scanned) to form (draw) the luminance distribution A1 at the reference position on the wavelength converting member 18. Then, as illustrated in FIG. 61B, a predetermined light distribution pattern $P_{A1}$ corresponding to the luminance distribution A1 can be formed at the reference position on the virtual vertical screen by projecting the luminance distribution A1 formed on the wavelength converting member 18 at the reference position, by the projection lens assembly 20. Note that although FIG. 61B illustrates the single light distribution pattern $P_{A1}$ as the predetermined light distribution pattern, the light distribution pattern $P_{A1}$ is actually composed of two light distribution patterns $P_{A1(Wide)}$ and $P_{A1(Hot)}$ corresponding to the two optical deflectors $201_{Wide}$ and $201_{Hot}$.

Next, a sensor provided to a vehicle body on which the vehicle lighting fixture 620 is installed, such as any of sensors 30 to 42 and 608 in FIG. 52, can output a signal to the controlling unit 24 (step S204) to determine when to start the variable light distribution control on the basis of the sensor signal obtained (step S206).

When to start the variable light distribution control can be determined in the same manner as in the first exemplary embodiment.

Then, if it is determined that the timing is to start the variable light distribution control in step S206 (Yes in step S206), the rotational direction/rotational amount determination unit 24a can determine the rotational direction and the rotational amount of the holder 624 in the same manner as in the first exemplary embodiment (step S208).

Next, the controlling unit 24 can control the actuator power circuit 606 to rotate the holder 624 in the rotational direction and by the rotational amount determined in step S208 (step S210). In accordance with the control by the controlling unit 24, the actuator power circuit 606 can apply an electric pulse to the actuator 622a with the electric pulse having been adjusted so as to rotate the holder 624 in the rotational direction and by the rotational amount determined in step S208.

In this manner, the holder 624 can be rotated in the rotational direction and by the rotational amount determined in step S208. Also in this case, as illustrated in FIG. 61A, the excitation light rays $Ray_{Wide}$ and $Ray_{Hot}$ from the excitation light sources $12_{Wide}$ and $12_{Hot}$ can be reflected by the mirror parts 202 of the optical deflectors $201_{Wide}$ and $201_{Hot}$ and then by the reflecting members $60_{Wide}$ and $60_{Hot}$ (can be two-dimensionally scanned) to form (draw) the luminance distribution A1 at a reference position on the wavelength converting member 18. Then, as illustrated in FIG. 61D, a predetermined light distribution pattern $P_{A2}$ corresponding to the luminance distribution A1 can be formed at a position shifted in the horizontal direction with respect to the reference position on the virtual vertical screen by projecting the luminance distribution A1 formed on the wavelength converting member 18 at the reference position on the wavelength converting member 18, by the projection lens assembly 20. Note that although FIG. 61D illustrates the single light distribution pattern $P_{A2}$ as the predetermined light distribution pattern, the light distribution pattern $P_{A2}$ is actually composed of two light distribution patterns $P_{A2(Wide)}$ and $P_{A2(Hot)}$ corresponding to the two optical deflectors $201_{Wide}$ and $201_{Hot}$.

Next, any of the sensors provided to the vehicle body on which the vehicle lighting fixture 620 is installed, such as any of the sensors 30 to 42 and 608 in FIG. 52, can output a signal to the controlling unit 24 (step S212) to determine when to stop the variable light distribution control on the basis of the sensor signal obtained (step S214).

When to stop the variable light distribution control can be determined in the same manner as in the first exemplary embodiment.

Next, if the stopping of the variable light distribution control is determined in step S214 (Yes in step S214), the controlling unit 24 can control the actuator power circuit 606 to return the holder 624 to the original position (the original position before the rotational control in step S210) (step S216). In accordance with the control by the controlling unit 24, the actuator power circuit 606 can apply an electric pulse to the actuator 622a with the electric pulse having been adjusted so as to return the holder 624 to the original position.

In this manner, the holder 624 is caused to rotate to return to the original position.

The above-mentioned steps S202 to S216 are repeatedly performed until the headlamp switch is turned off (No in step S218).

When the headlamp switch is turned off (Yes in step S218), the excitation light sources $12_{Wide}$ and $12_{Hot}$ and the optical deflectors $201_{Wide}$ and $201_{Hot}$ are stopped (step S220). In other words, the application of the drive current to each of the excitation light sources $12_{Wide}$ and $12_{Hot}$ and the application of the drive voltage to each of the optical deflectors $201_{Wide}$ and $201_{Hot}$ are stopped.

As described above, the vehicle lighting fixture 620 can form the predetermined light distribution patterns $P_{A1}$ and $P_{A2}$ on a virtual vertical screen at a reference position (for example, at the position illustrated in FIG. 61B) or a position shifted in the horizontal direction with respect to the reference position (for example, at the shifted position illustrated in FIG. 61D) in accordance with the rotational direction and the rotational amount of the holder 624. This technique can be applied not only to the vehicle lighting fixture 620 including the reflecting members $60_{Wide}$ and $60_{Hot}$ but also to the vehicle lighting fixture 10 without such reflecting members $60_{Wide}$ and $60_{Hot}$ as illustrated in FIG. 2.

According to this exemplary embodiment, the vehicle lighting fixture 620 utilizing the optical deflectors $201_{Wide}$ and $201_{Hot}$ that can scan with the excitation light rays can form a predetermined light distribution pattern at a position shifted, for example, in the horizontal direction with respect to the reference position.

This configuration can be achieved by controlling the rotational direction and rotational amount of the holder 624 (corresponding to the optical unit of the presently disclosed subject matter) so as to form the predetermined light distribution pattern at the reference position (for example, at the position illustrated in FIG. 61B) or the position shifted with respect to the reference position (for example, at the position illustrated in FIG. 61D).

When the rotational shaft 622a1 of the actuator 622a is horizontally set as a horizontal axis, the vehicle lighting fixture 620 can form a predetermined light distribution pattern at any position on the virtual vertical screen, for example, at a reference position (for example, at the position illustrated in FIG. 66A) or a position shifted in the vertical direction with respect to the reference position (for example, at a position illustrated in FIG. 66B) in accordance with the rotational direction and the rotational amount of the holder 624.

As described above, the control of the rotational direction and rotational amount of the control target, i.e., the holder 624, about the vertical axis can properly form the predetermined light distribution pattern at a position horizontally shifted with respect to the reference position. Thus, for example, an adaptive front-lighting system (AFS) function can be achieved.

Furthermore, the control of the rotational direction and rotational amount of the holder 624 about the horizontal axis can properly form the predetermined light distribution pattern at a position vertically shifted with respect to the reference position. This configuration can achieve a manual or automatic leveling function.

According to this exemplary embodiment, the vehicle lighting fixture 620 utilizing the plurality of optical deflectors $201_{Wide}$ and $201_{Hot}$ that can scan with light can be miniaturized, and the parts number, which may become a cause for cost increase, can be decreased. The use of the single wavelength converting member 18 with respect to the plurality of deflectors $201_{Wide}$ and $201_{Hot}$ can contribute to obtain the advantageous effects.

Next, a description will be given of a variable light-distribution type vehicle lighting fixture 630 (variable light-distribution type vehicle headlight) using optical deflectors 201 of the one-dimensional nonresonance/one-dimensional resonance type (2-D optical scanner (fast resonant and slow static combination)) as further another exemplary embodiment with reference to the associated drawings. It is appreciated that the aforementioned various types of optical deflectors discussed in the above reference examples can be used in place of the one-dimensional nonresonance/one-dimensional resonance type optical deflector 201.

Figure 64A:
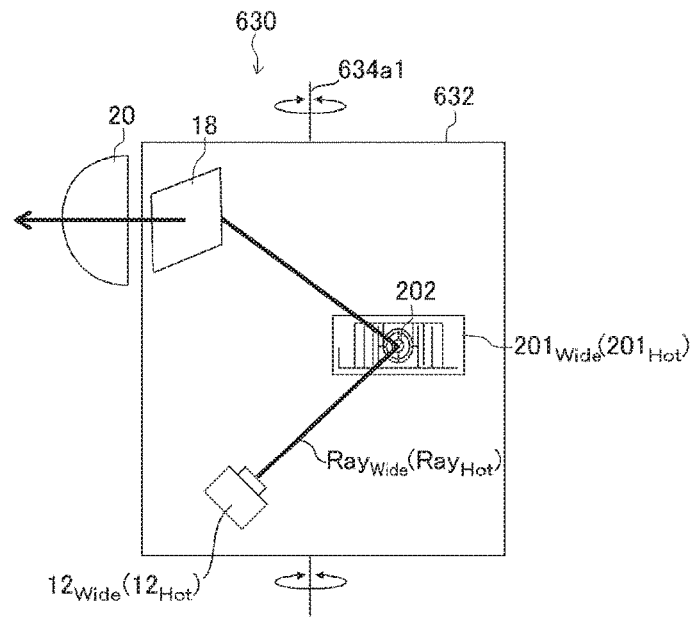
FIGS. 64A and 64B are each a schematic diagram illustrating a vehicle lighting fixture 630 of further another exemplary embodiment made in accordance with the principles of the presently disclosed subject matter.
Figure 64B:
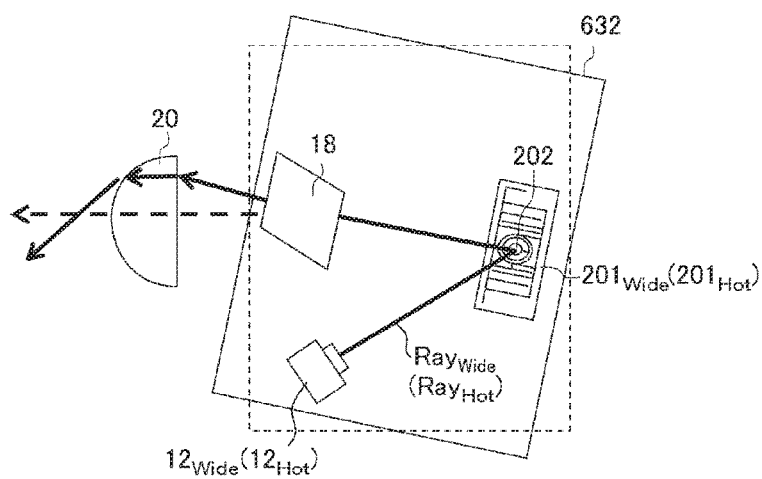
Figure 65:
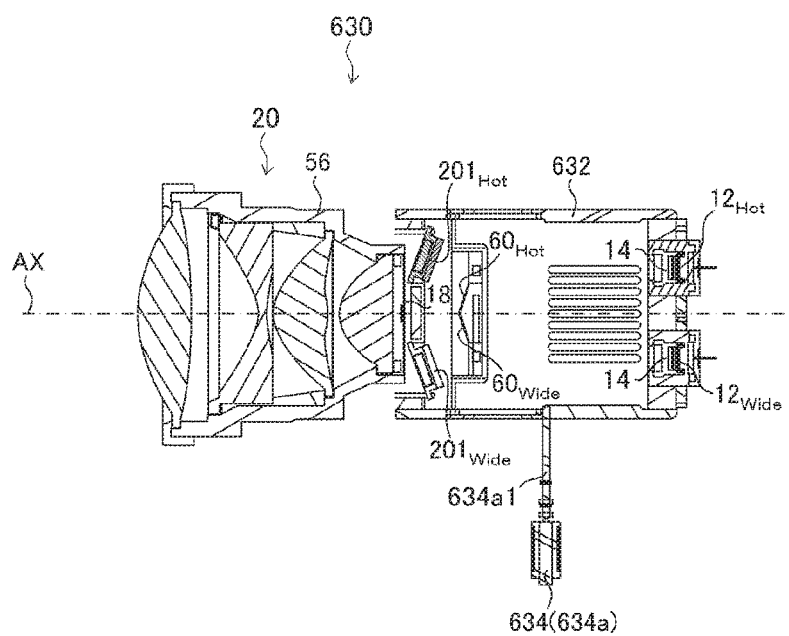
FIG. 65 is a cross-sectional view of the vehicle lighting fixture 630.

FIGS. 64A and 64B are each a schematic diagram illustrating the vehicle lighting fixture 630 of further another exemplary embodiment made in accordance with the principles of the presently disclosed subject matter, and FIG. 65 is a cross-sectional view of the vehicle lighting fixture 630.

Unlike the configuration of the vehicle lighting fixture 620 of the previous exemplary embodiment as illustrated in FIG. 63 etc., the vehicle lighting fixture 630 of this exemplary embodiment as illustrated in FIGS. 64A and 64B and 65 can be configured such that the projection lens assembly 20 can be arranged on and fixed to a not-illustrated holder such as a housing, that the wavelength converting member 18, the optical deflectors $201_{Wide}$ and $201_{Hot}$, the reflecting members $60_{Wide}$ and $60_{Hot}$, and the excitation light sources $12_{Wide}$ and $12_{Hot}$ are arranged on and fixed to a holder 632, and that the holder 632 (corresponding to the optical unit of the presently disclosed subject matter) can be configured to rotate. Specifically, the vehicle lighting fixture 630 can be configured to form predetermined light distribution patterns $P_{A1}$ and $P_{A2}$ at any position on a virtual vertical screen, for example, at a reference position (for example, at the position illustrated in FIG. 61B) or a position shifted in the horizontal direction with respect to the reference position (for example, at the position illustrated in FIG. 61D) in accordance with a rotational direction and a rotational amount of the holder 632 itself with respect to the projection lens assembly 20. Except for this feature, the vehicle lighting fixture 630 of this exemplary embodiment can have the same configuration as that of the vehicle lighting fixture 620 of the previous exemplary embodiment.

Hereinbelow, a description will be given of the different point of the vehicle lighting fixture 630 of this exemplary embodiment from the vehicle lighting fixture 620 of the previous exemplary embodiment, and the same or similar components of this exemplary embodiment as those in the previous exemplary embodiment will be denoted by the same reference numerals and a description thereof will be omitted as appropriate.

The vehicle lighting fixture 630 of this exemplary embodiment can be configured, as illustrated in FIG. 65, as a vehicle headlamp. The vehicle lighting fixture 630 can include the two excitation light sources $12_{Wide}$ and $12_{Hot}$; the two optical deflectors $201_{Wide}$ and $201_{Hot}$ each including a mirror part 202, the two optical deflectors $201_{Wide}$ and $201_{Hot}$ provided corresponding to the two excitation light sources $12_{Wide}$ and $12_{Hot}$; the two reflecting member $60_{Wide}$ and $60_{Hot}$ provided corresponding to the two optical deflectors $201_{Wide}$ and $201_{Hot}$; the wavelength converting member 18 on which luminance distributions are formed by the excitation light rays reflected from the two reflecting member $60_{Wide}$, the projection and lens assembly 20 configured to serve as an optical system and project the luminance distributions formed on the wavelength converting member 18 to form a predetermined light distribution pattern; and a rotary control unit 634 configured to control the rotational direction and the rotational amount of the holder 632. Note that the number of the excitation light sources 12, the optical deflectors 201, and the reflecting member 60 is not limited to two, and may be one or three or more.

The rotary control unit 634 can be configured to control the rotational direction and rotational amount of the holder 632. The rotary control unit 634 can include an actuator 634a as illustrated in FIG. 65, and a controlling unit 24 and an actuator power circuit 606 as illustrated in FIG. 52, etc.

The actuator 634a, which has a rotary shaft 634a1, can be a stepping motor disposed with the rotary shaft 634a1 coincident with the vertical axis as illustrated in FIG. 65. In this case, the actuator 634a constituted by the stepping motor can be feed-back controlled on the basis of an angle detected by a rotary encoder or the like.

Here, the holder 632 can be fixed to the rotary shaft 634a1 of the actuator 634a.

A description will now be given of an operation example of the vehicle lighting fixture 630 with the above-described configuration, with reference to FIG. 53.

The following processing can be achieved by the controlling unit 24 that reads out a predefined program from the storage device 44 in a not-illustrated RAM, and executes the program.

When a not-illustrated headlamp switch is turned on (Yes in step S200), as in the previously described reference examples, the respective excitation light sources $12_{Wide}$ and $12_{Hot}$ are applied with a drive current and the respective optical deflectors $201_{Wide}$ and $201_{Hot}$ are applied with a drive voltage (step S202). In this case, as illustrated in FIG. 61A, the excitation light rays $Ray_{Wide}$ and $Ray_{Hot}$ from the excitation light sources $12_{Wide}$ and $12_{Hot}$ can be reflected by the mirror parts 202 of the respective optical deflectors $201_{Wide}$ and $201_{Hot}$ and then by the respective reflecting members $60_{Wide}$ and $60_{Hot}$ (can be two-dimensionally scanned) to form (draw) the luminance distribution A1 at the reference position on the wavelength converting member 18. Then, as illustrated in FIG. 61B, a predetermined light distribution pattern $P_{A1}$ corresponding to the luminance distribution A1 can be formed at the reference position on the virtual vertical screen by projecting the luminance distribution A1 formed on the wavelength converting member 18 at the reference position, by the projection lens assembly 20. Note that although FIG. 61B illustrates the single light distribution pattern $P_{A1}$ as the predetermined light distribution pattern, the light distribution pattern $P_{A1}$ is actually composed of two light distribution patterns $P_{A1(Wide)}$ and $P_{A1(Hot)}$ corresponding to the two optical deflectors $201_{Wide}$ and $201_{Hot}$.

Next, a sensor provided to a vehicle body on which the vehicle lighting fixture 630 is installed, such as any of sensors 30 to 42 and 608 in FIG. 52, can output a signal to the controlling unit 24 (step S204) to determine when to start the variable light distribution control on the basis of the sensor signal obtained (step S206).

When to start the variable light distribution control can be determined in the same manner as in the first exemplary embodiment.

Then, if it is determined that the timing is to start the variable light distribution control in step S206 (Yes in step S206), the rotational direction/rotational amount determination unit 24a can determine the rotational direction and the rotational amount of the holder 632 in the same manner as in the first exemplary embodiment (step S208).

Next, the controlling unit 24 can control the actuator power circuit 606 to rotate the holder 632 in the rotational direction and by the rotational amount determined in step S208 (step S210). In accordance with the control by the controlling unit 24, the actuator power circuit 606 can apply an electric pulse to the actuator 634a with the electric pulse having been adjusted so as to rotate the holder 632 in the rotational direction and by the rotational amount determined in step S208.

In this manner, the holder 632 can be rotated in the rotational direction and by the rotational amount determined in step S208. Also in this case, as illustrated in FIG. 61A, the excitation light rays $Ray_{Wide}$ and $Ray_{Hot}$ from the excitation light sources $12_{Wide}$ and $12_{Hot}$ can be reflected by the mirror parts 202 of the optical deflectors $201_{Wide}$ and $201_{Hot}$ and then by the reflecting members $60_{Wide}$ and $60_{Hot}$ (can be two-dimensionally scanned) to form (draw) the luminance distribution A1 at a reference position on the wavelength converting member 18. Then, as illustrated in FIG. 61D, a predetermined light distribution pattern $P_{A2}$ corresponding to the luminance distribution A1 can be formed at a position shifted in the horizontal direction with respect to the reference position on the virtual vertical screen by projecting the luminance distribution A1 formed on the wavelength converting member 18 at the reference position on the wavelength converting member 18, by the projection lens assembly 20.

With this configuration, the predetermined light distribution pattern $P_{A2}$ corresponding to the luminance distribution A1 can be formed at the position shifted in the horizontal direction with respect to the reference position on the virtual vertical screen. This is because the rotation of the holder 632 with respect to the projection lens assembly 20 can change the relative position at which the light rays from the wavelength converting member 18 can enter the projection lens assembly 20 (see FIG. 64B).

Note that although FIG. 61D illustrates the single light distribution pattern $P_{A2}$ as the predetermined light distribution pattern, the light distribution pattern $P_{A2}$ is actually composed of two light distribution patterns $P_{A2(Wide)}$ and $P_{A2(Hot)}$ corresponding to the two optical deflectors $201_{Wide}$ and $201_{Hot}$.

Next, any of the sensors provided to the vehicle body on which the vehicle lighting fixture 620 is installed, such as any of the sensors 30 to 42 and 608 in FIG. 52, can output a signal to the controlling unit 24 (step S212) to determine when to stop the variable light distribution control on the basis of the sensor signal obtained (step S214).

When to stop the variable light distribution control can be determined in the same manner as in the first exemplary embodiment.

Next, if the stopping of the variable light distribution control is determined in step S214 (Yes in step S214), the controlling unit 24 can control the actuator power circuit 606 to return the holder 632 to the original position (the original position before the rotational control in step S210) (step S216). In accordance with the control by the controlling unit 24, the actuator power circuit 606 can apply an electric pulse to the actuator 634a with the electric pulse having been adjusted so as to return the holder 632 to the original position.

In this manner, the holder 632 is caused to rotate to return to the original position.

The above-mentioned steps S202 to S216 are repeatedly performed until the headlamp switch is turned off (No in step S218).

When the headlamp switch is turned off (Yes in step S218), the excitation light sources $12_{Wide}$ and $12_{Hot}$ and the optical deflectors $201_{Wide}$ and $201_{Hot}$ are stopped (step S220). In other words, the application of the drive current to each of the excitation light sources $12_{Wide}$ and $12_{Hot}$ and the application of the drive voltage to each of the optical deflectors $201_{Wide}$ and $201_{Hot}$ are stopped.

As described above, the vehicle lighting fixture 630 can form the predetermined light distribution patterns $P_{A1}$ and $P_{A2}$ on a virtual vertical screen at a reference position (for example, at the position illustrated in FIG. 61B) or a position shifted in the horizontal direction with respect to the reference position (for example, at the shifted position illustrated in FIG. 61D) in accordance with the rotational direction and the rotational amount of the holder 632 with respect to the projection lens assembly 20. This technique can be applied not only to the vehicle lighting fixture 630 including the reflecting members $60_{Wide}$ and $60_{Hot}$ but also to the vehicle lighting fixture 10 without such reflecting members $60_{Wide}$ and $60_{Hot}$ as illustrated in FIG. 2.

According to this exemplary embodiment, the vehicle lighting fixture 630 utilizing the optical deflectors $201_{Wide}$ and $201_{Hot}$ that can scan with the excitation light rays can form a predetermined light distribution pattern at a position shifted, for example, in the horizontal direction with respect to the reference position.

This configuration can be achieved by controlling the rotational direction and rotational amount of the holder 632 (corresponding to the optical unit of the presently disclosed subject matter) with respect to the projection lens assembly 20 so as to form the predetermined light distribution pattern at the reference position (for example, at the position illustrated in FIG. 61B) or the position shifted with respect to the reference position (for example, at the position illustrated in FIG. 61D).

When the rotational shaft 634a1 of the actuator 634a is horizontally set as a horizontal axis, the vehicle lighting fixture 630 can form a predetermined light distribution pattern at any position on the virtual vertical screen, for example, at a reference position (for example, at the position illustrated in FIG. 66A) or a position shifted in the vertical direction with respect to the reference position (for example, at a position illustrated in FIG. 66B) in accordance with the rotational direction and the rotational amount of the holder 632 with respect to the projection lens assembly 20.

As described above, the control of the rotational direction and rotational amount of the control target, i.e., the holder 632, about the vertical axis can properly form the predetermined light distribution pattern at a position horizontally shifted with respect to the reference position. Thus, for example, an adaptive front-lighting system (AFS) function can be achieved.

Furthermore, the control of the rotational direction and rotational amount of the holder 632 about the horizontal axis can properly form the predetermined light distribution pattern at a position vertically shifted with respect to the reference position. This configuration can achieve a manual or automatic leveling function.

Furthermore, further another advantageous effect can be derived from this exemplary embodiment. The vehicle lighting fixture 620 of the previous exemplary embodiment illustrated in FIG. 63 etc. can be configured such that the holder 624 itself to which the projection lens assembly 20 (corresponding to the optical system of the presently disclosed subject matter) is attached can rotate. In order to configure like this, the projection lens assembly 20 attached to the holder 624 should be prevented from coming into contact with an extension and a grill (not illustrated) of the vehicle body, and to cope with this matter, there must be provided a certain gap between the projection lens assembly 20 and the extension and the grill. On the contrary thereto, according to this exemplary embodiment, since the projection lens assembly 20 is not arranged on and attached to the holder 632 but is attached to another holding member such as a housing (not illustrated), it is not necessary to pay attention to provide a gap between the projection lens assembly 20 and the extension and the grill. As a result, the degree of design freedom as a lighting fixture can be increased.

According to this exemplary embodiment, the vehicle lighting fixture 630 utilizing the plurality of optical deflectors $201_{Wide}$ and $201_{Hot}$ that can scan with light can also be miniaturized, and the parts number, which may become a cause for cost increase, can also be decreased. The use of the single wavelength converting member 18 with respect to the plurality of deflectors $201_{Wide}$ and $201_{Hot}$ can contribute to obtain the advantageous effects.

The above-described respective exemplary embodiments have dealt with the case where white images corresponding to a predetermined pattern are formed (drawn) on the wavelength converting member 18 (corresponding to the screen member of the presently disclosed subject matter) by irradiating the wavelength converting member 18 with excitation light rays from the excitation light sources 12. However, this configuration is not limitative, and the excitation light source 12 may be composed of a white light source, such as a white laser light source. Such a white laser light source can be configured by, for example, introducing RGB laser light rays into an optical fiber for mixing them. Furthermore, a combination of a blue LD element and a YAG phosphor wavelength converting member emitting yellow light may be used.

When a white light source is used in place of the excitation light source 12, the process of wavelength conversion is not necessary. Therefore, a diffusing member may be used in place of the wavelength converting member 18. In this case, white laser light rays emitted from the white laser light source can scan the diffusing member by the optical deflectors 201 to thereby form (draw) a white image corresponding to a predetermined light distribution pattern.

The diffusing member may be a diffusion plate configured to diffuse the laser light and preferably having the same shape as that of the wavelength converting member 18. Examples of the material for the diffusing member may include a complex material (sintered body) of alumina and YAG not containing any activator (such as Ce) (for example, a material containing 75% $Al_2O_3$ and 25% YAG), a complex material of YAG and glass, a material containing alumina with bubbles dispersed therein, and a material containing glass with bubbles dispersed therein.

When such a white light source and a diffusing member are used in the above-described exemplary embodiments in place of the excitation light source 12 and the wavelength converting member 18, respectively, the respective optical deflectors 201 can form the luminance distributions assigned thereto with the white light from the white light source on the diffusing member serving as the screen member. Accordingly, the same advantageous effects can also be obtained in this case.

Furthermore, the respective numerical values employed in the respective exemplary embodiments, modified examples, examples, and reference examples are illustrative, and therefore, any suitable numerical value can be adopted for the purpose of the achievement of the vehicle lighting fixture of the presently disclosed subject matter.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A vehicle lighting fixture configured to form a predetermined light distribution pattern, the vehicle lighting fixture comprising:
    a light source;
    an optical deflector configured to include a mirror part that can scan with light from the light source;
    a rotary reflecting member configured to reflect light having been reflected by the mirror part of the optical deflector;
    a screen member configured to form a luminance distribution by the light reflected by the rotary reflecting member;
    an optical system configured to project the luminance distribution formed in the screen member to form the predetermined light distribution pattern; and
    a rotary control unit configured to control the rotary reflecting member to form the luminance distribution at a reference position or a position shifted with respect to the reference position, the rotary control unit controlling any of a rotational direction and a rotational amount of the rotary reflecting member.

2. The vehicle lighting fixture according to claim 1, comprising:
    a plurality of the light sources;
    a plurality of the optical deflectors provided to correspond to the respective light sources, each of the optical deflectors including a mirror part that can scan with light from a corresponding one of the light sources; and
    a plurality of the rotary reflecting members provided to correspond the respective optical deflectors, each of the rotary reflecting members configured to reflect light reflected from the mirror part of a corresponding one of the optical deflectors.

3. The vehicle lighting fixture according to claim 2, wherein:
    the vehicle lighting fixture has a reference axis so that the optical system, the screen member, the plurality of optical deflectors, the plurality of rotary reflecting members, and the plurality of light sources are disposed along the reference axis in this order;
    the plurality of light sources are disposed to surround the reference axis with respective postures so that each of the light sources can emit light forward;
    the plurality of optical deflectors are disposed to surround the reference axis and be inclined so that the light from the corresponding one of the light sources can be incident on the corresponding one of the mirror parts and be reflected by the mirror part to be directed rearward and closer to the reference axis; and
    the plurality of rotary reflecting members are disposed to be closer to the reference axis than the plurality of optical deflectors and surround the reference axis so that the light reflected from the corresponding one of the mirror parts of the optical deflectors can be incident thereon and be reflected by the one rotary reflecting member to be directed to the screen member.

4. The vehicle lighting fixture according to claim 2, wherein the rotary control unit separately controls the rotational direction and the rotational amount of each of the plurality of rotary reflecting members.

5. The vehicle lighting fixture according to claim 3, wherein the rotary control unit separately controls the rotational direction and the rotational amount of each of the plurality of rotary reflecting members.

6. The vehicle lighting fixture according to claim 1, comprising:
   a plurality of the light sources; and
   a plurality of the optical deflectors provided to correspond to the respective light sources, each of the optical deflectors including a mirror part that can scan with light from a corresponding one of the light sources, and
   wherein the rotary reflecting member is provided so as to be common to the plurality of optical deflectors, and is configured to reflect light reflected from the mirror parts of the optical deflectors.

7. A vehicle lighting fixture configured to form a predetermined light distribution pattern, the vehicle lighting fixture comprising:
   a light source;
   an optical deflector configured to include a mirror part that can scan with light from the light source;
   a screen member configured to form a luminance distribution by the light reflected by the mirror part of the optical deflector;
   an optical system configured to project the luminance distribution formed in the screen member to form the predetermined light distribution pattern; and
   a rotary control unit configured to control the optical deflector to form the luminance distribution at a reference position or a position shifted with respect to the reference position, the rotary control unit controlling any of a rotational direction and a rotational amount of the optical deflector.

8. The vehicle lighting fixture according to claim 7, comprising:
   a plurality of the light sources; and
   a plurality of the optical deflectors provided to correspond to the respective light sources, each of the optical deflectors including a mirror part that can scan with light from a corresponding one of the light sources, and
   wherein the rotary control unit separately controls the rotational direction and the rotational amount of each of the plurality of optical deflectors.

9. A vehicle lighting fixture configured to form a predetermined light distribution pattern, comprising:
   an optical unit and a rotary control unit,
   wherein the optical unit including:
      a light source;
      an optical deflector configured to include a mirror part that can scan with light from the light source;
      a screen member configured to form a luminance distribution by the light reflected by the mirror part of the optical deflector; and
      an optical system configured to project the luminance distribution formed in the screen member to form the predetermined light distribution pattern, and
      the rotary control unit is configured to control the optical unit to form the predetermined light distribution pattern at a reference position or a position shifted with respect to the reference posit on, the rotary control unit controlling any of a rotational direction and a rotational amount of the optical unit.

10. A vehicle lighting fixture configured to form a predetermined light distribution pattern, comprising
    an optical unit,
    an optical system, and
    a rotary control unit,
    wherein the optical unit including:
       a light source; an optical deflector configured to include a mirror part that can scan with light from the light source; and
       a screen member configured to form a luminance distribution by the light reflected by the mirror part of the optical deflector,
       the optical system is configured to project the luminance distribution formed in the screen member to form the predetermined light distribution pattern, and
       the rotary control unit is configured to control the optical unit to form the predetermined light distribution pattern at a reference position or a position shifted with respect to the reference posit on, the rotary control unit controlling any of a rotational direction and a rotational amount of the optical unit with respect to the optical system.

11. The vehicle lighting fixture according to claim 9, comprising:
    a plurality of the light sources; and
    a plurality of the optical deflectors provided to correspond to the respective light sources, each of the optical deflectors including a mirror part that can scan with light from a corresponding one of the light sources.

12. The vehicle lighting fixture according to claim 10, comprising:
    a plurality of the light sources; and
    a plurality of the optical deflectors provided to correspond to the respective light sources, each of the optical deflectors including a mirror part that can scan with light from a corresponding one of the light sources.

13. The vehicle lighting fixture according to claim 1, further comprising
    a plurality of fixed reflecting members and having a reference axis so that the optical system, the screen member, the plurality of optical deflectors, the plurality of fixed reflecting members, and the plurality of light sources are disposed along the reference axis in this order, wherein
    the plurality of light sources are disposed to surround the reference axis with respective postures so that each of the light sources can emit light forward,
    the plurality of optical deflectors are disposed to surround the reference axis and be inclined so that the light from the corresponding one of the light sources can be incident on the corresponding one of the mirror parts and be reflected by the mirror part to be directed rearward and closer to the reference axis, and
    the plurality of fixed reflecting members are disposed to be closer to the reference axis than the plurality of optical deflectors and surround the reference axis so that the light reflected from the corresponding one of the mirror parts of the optical deflectors can be incident thereon and be reflected by the one fixed reflecting member to be directed to the screen member.

14. The vehicle lighting fixture according to claim 12, further comprising
    a plurality of fixed reflecting members and having a reference axis so that the optical system, the screen member, the plurality of optical deflectors, the plurality of fixed reflecting members, and the plurality of light sources are disposed along the reference axis in this order, wherein
    the plurality of light sources are disposed to surround the reference axis with respective postures so that each of the light sources can emit light forward, the plurality of optical deflectors are disposed to surround the reference axis and be inclined so that the light from the corresponding one of the light sources can be incident on the corresponding one of the mirror parts and be reflected by the mirror part to be directed rearward and closer to the reference axis, and the plurality of fixed reflecting members are disposed to be closer to the reference axis than the plurality of optical deflectors and surround the reference axis so that the light reflected from the corresponding one of the mirror parts of the optical deflectors can be incident thereon and be reflected by the one fixed reflecting member to be directed to the screen member.

15. The vehicle lighting fixture according to claim 1, wherein the mirror part scans with the light from the light source two-dimensionally in a horizontal direction and a vertical direction, so that the luminance distribution is formed in the screen member by drawing a two-dimensional image with the light scanned two-dimensionally in the horizontal and vertical directions by the mirror part of the optical deflector.

16. The vehicle lighting fixture according to claim 7, wherein the mirror part scans with the light from the light source two-dimensionally in a horizontal direction and a vertical direction, so that the luminance distribution is formed in the screen member by drawing a two-dimensional image with the light scanned two-dimensionally in the horizontal and vertical directions by the mirror part of the optical deflector.

17. The vehicle lighting fixture according to claim 9, wherein the mirror part scans with the light from the light source two-dimensionally in a horizontal direction and a vertical direction, so that the luminance distribution is formed in the screen member by drawing a two-dimensional image with the light scanned two-dimensionally in the horizontal and vertical directions by the mirror part of the optical deflector.

18. The vehicle lighting fixture according to claim 10, wherein the mirror part scans with the light from the light source two-dimensionally in a horizontal direction and a vertical direction, so that the luminance distribution is formed in the screen member by drawing a two-dimensional image with the light scanned two-dimensionally in the horizontal and vertical directions by the mirror part of the optical deflector.

19. The vehicle lighting fixture according to claim 1, further comprising at least one sensor attached to a vehicle body, and
wherein the rotary control unit controls the rotational direction and the rotational amount on the basis of a signal detected by the sensor.

20. The vehicle lighting fixture according to claim 7, further comprising at least one sensor attached to a vehicle body, and
wherein the rotary control unit controls the rotational direction and the rotational amount on the basis of a signal detected by the sensor.

21. The vehicle lighting fixture according to claim 9, further comprising at least one sensor attached to a vehicle body, and
wherein the rotary control unit controls the rotational direction and the rotational amount on the basis of a signal detected by the sensor.

22. The vehicle lighting fixture according to claim 10, further comprising at least one sensor attached to a vehicle body, and
wherein the rotary control unit controls the rotation direction and the rotational amount on the basis of a signal detected by the sensor.

23. The vehicle lighting fixture according to claim 1, wherein the rotary control unit controls the rotational direction and the rotational amount about least one of a vertical axis and a horizontal axis.

24. The vehicle lighting fixture according to claim 7, wherein the rotary control unit controls the rotational direction and the rotational amount about at least one of a vertical axis and a horizontal axis.

25. The vehicle lighting fixture according to claim 9, wherein the rotary control unit controls the rotational direction and the rotational amount about at least one of a vertical axis and a horizontal axis.

26. The vehicle lighting fixture according to claim 10, wherein the rotary control unit controls the rotational direction and the rotational amount about at least one of a vertical axis and a horizontal axis.

27. The vehicle lighting fixture according to claim 1, wherein the light source is configured by any of a semiconductor light emitting element and a combination of a light emitting element and an optical fiber guiding light from the light emitting element so that the optical fiber has a light incident end face and a light exiting end face, and the light exiting end face is located at a light source position.

28. The vehicle lighting fixture according to claim 7, wherein the light source is configured by any of a semiconductor light emitting element and a combination of a light emitting element and an optical fiber guiding light from the light emitting element so that the optical fiber has a light incident end face and a light exiting end face, and the light exiting end face is located at a light source position.

29. The vehicle lighting fixture according to claim 9, wherein the light source is configured by any of a semiconductor light emitting element and a combination of a light emitting element and an optical fiber guiding light from the light emitting element so that the optical fiber has a light incident end face and a light exiting end face, and the light exiting end face is located at a light source position.

30. The vehicle lighting fixture according to claim 10, wherein the light source is configured by any of a semiconductor light emitting element and a combination of a light emitting element and an optical fiber guiding light from the light emitting element so that the optical fiber has a light incident end face and a light exiting end face, and the light exiting end face is located at a light source position.

31. The vehicle lighting fixture according to claim 1, wherein the optical system is a projector lens configured by a plurality of lenses so as to compensate aberration to form a flat image plane, and
the screen member is configured to be a flat shape and disposed along the flat image plane.

32. The vehicle lighting fixture according to claim 7, wherein the optical system is a projector lens configured by a plurality of lenses so as to compensate aberration to form a flat image plane, and
the screen member is configured to be a flat shape and disposed along the flat image plane.

33. The vehicle lighting fixture according to claim 9, wherein the optical system is a projector lens configured by a plurality of lenses so as to compensate aberration to flat image plane, and
the screen member is configured to be a flat shape and disposed along the flat image plane.

34. The vehicle lighting fixture according to claim 10, wherein the optical system is a projector lens configured by a plurality of lenses so as to compensate aberration to form a flat image plane, and the screen member is configured to be a flat shape and disposed along the flat image plane.

35. The vehicle lighting fixture according to claim 1, wherein the optical deflector is of a one-dimensional non-resonance/one-dimensional resonance type (2-D optical scanner (fast resonant and slow static combination)), including the mirror part; a movable frame disposed to surround the mirror part while supporting the mirror part so as to allow the mirror part to be reciprocately swung about a first axis; a base disposed to surround the movable frame while supporting the movable frame so as to allow the movable frame to be reciprocately swung about a second axis perpendicular to the first axis; a first piezoelectric actuator configured to cause the mirror part to be reciprocally swung about the first axis with respect to the movable frame due to resonance driving; and a second piezoelectric actuator configured to cause the movable frame and the mirror part supported by the movable frame to be reciprocally swung about the second axis with respect to the base due to nonresonance driving, and the optical deflector is disposed such that the first axis is contained in a vertical plane and the second axis is contained in a horizontal plane.

36. The vehicle lighting fixture according to claim 7, wherein the optical deflector is of a one-dimensional non-resonance/one-dimensional resonance type (2-D optical scanner (fast resonant and slow static combination)), including the mirror part; a movable frame disposed to surround the mirror part while supporting the mirror part so as to allow the mirror part to be reciprocately swung about a first axis; a base disposed to surround the movable frame while supporting the movable frame so as to allow the movable frame to be reciprocately swung about a second axis perpendicular to the first axis; a first piezoelectric actuator configured to cause the mirror part to be reciprocally swung about the first axis with respect to the movable frame due to resonance driving; and a second piezoelectric actuator configured to cause the movable frame and the mirror part supported by the movable frame to be reciprocal swung about the second axis with respect to the base due to nonresonance driving, and the optical deflector is disposed such that the first axis is contained in a vertical plane and the second axis is contained in a horizontal plane.

37. The vehicle lighting fixture according to claim 9, wherein the optical deflector is of a one-dimensional non-resonance/one-dimensional resonance type (2-D optical scanner fast resonant and slow static combination)), including the mirror part; a movable frame disposed to surround the mirror part white supporting the mirror part so as to allow the mirror part to be reciprocately swung about a first axis; a base disposed to surround the movable frame while supporting the movable frame so as to allow the movable frame to be reciprocately swung about a second axis perpendicular to the first axis; a first piezoelectric actuator configured to cause the mirror part to be reciprocally swung about the first axis with respect to the movable frame due to resonance driving; and a second piezoelectric actuator configured to cause the movable frame and the mirror part supported by the movable frame to be reciprocally swung about the second axis with respect to the base due to nonresonance driving, and the optical deflector is disposed such that the first axis is contained in a vertical plane and the second axis is contained in a horizontal plane.

38. The vehicle lighting fixture according to claim 10, wherein the optical deflector is of a one-dimensional non-resonance/one-dimensional resonance type (2-D optical scanner (fast resonant and slow static combination)), including the mirror part; a movable frame disposed to surround the mirror part while supporting the mirror part so as to allow the mirror part to be reciprocately swung about a first axis; a base disposed to surround the movable frame while supporting the movable frame so as to allow the movable frame to be reciprocately swung about a second axis perpendicular to the first axis; a first piezoelectric actuator configured to cause the mirror part to be reciprocally swung about the first axis with respect to the movable frame due to resonance driving; and a second piezoelectric actuator configured to cause the movable frame and the mirror part supported by the movable frame to be reciprocal swung about the second axis with respect to the base due to nonresonance driving, and the optical deflector is disposed such that the first axis is contained in a vertical plane and the second axis is contained in a horizontal plane.

39. The vehicle lighting fixture according to claim 1, wherein the light source is an excitation light source, and the screen member is a wavelength converting member.

40. The vehicle lighting fixture according to claim 7, wherein the light source is an excitation light source, and the screen member is a wavelength converting member.

41. The vehicle lighting fixture according to claim 9, wherein the light source is an excitation light source, and the screen member is a wavelength converting member.

42. The vehicle lighting fixture according to claim 10, wherein the light source is an excitation light source, and the screen member is a wavelength converting member.

43. The vehicle lighting fixture according to claim 1, wherein the light source is a white light source, and the screen member is a diffusion member.

44. The vehicle lighting fixture according to claim 7, wherein the light source is a white light source, and the screen member is a diffusion member.

45. The vehicle lighting fixture according to claim 9, wherein the light source is a white light source, and the screen member is a diffusion member.

46. The vehicle lighting fixture according to claim 10, wherein the light source is a white light source, and the screen member is a diffusion member.

* * * * *